United States Patent [19]
Hidaka

[11] Patent Number: 6,100,550
[45] Date of Patent: Aug. 8, 2000

[54] CIRCUIT CELL BASED SEMICONDUCTOR INTEGRATED CIRCUIT DEVICE AND METHOD OF ARRANGEMENT-INTERCONNECTION THEREFOR

[75] Inventor: Hideto Hidaka, Hyogo, Japan

[73] Assignee: Mitsubishi Denki Kabushiki Kaisha, Tokyo, Japan

[21] Appl. No.: 09/241,079

[22] Filed: Feb. 1, 1999

Related U.S. Application Data

[62] Division of application No. 08/868,046, Jun. 3, 1997, Pat. No. 5,880,493, which is a continuation of application No. 08/568,226, Dec. 6, 1995, abandoned.

[30] Foreign Application Priority Data

| Dec. 9, 1994 | [JP] | Japan | 6-306409 |
| Mar. 29, 1995 | [JP] | Japan | 7-071930 |
| Aug. 29, 1995 | [JP] | Japan | 7-220877 |

[51] Int. Cl.$^7$ .................................................. H01L 27/10
[52] U.S. Cl. ........................................... 257/210; 257/207
[58] Field of Search .................................... 257/206, 207, 257/208, 209, 210, 211

[56] References Cited

U.S. PATENT DOCUMENTS

| 4,716,452 | 12/1987 | Kondoh et al. . | |
| 4,974,049 | 11/1990 | Sueda et al. . | |
| 4,989,062 | 1/1991 | Takahashi et al. . | |
| 5,075,753 | 12/1991 | Kozono . | |
| 5,187,555 | 2/1993 | Kuroda et al. . | |
| 5,397,906 | 3/1995 | Kumagai | 257/207 |
| 5,416,431 | 5/1995 | Strauss . | |
| 5,444,275 | 8/1995 | Kugishima et al. | 257/206 |
| 5,452,245 | 9/1995 | Hickman et al. | 257/206 |
| 5,493,135 | 2/1996 | Yin | 257/206 |

FOREIGN PATENT DOCUMENTS

| 58-197747 | 11/1983 | Japan . | |
| 58-200570 | 11/1983 | Japan | 257/210 |
| 61-240652 | 10/1986 | Japan . | |
| 1-232743 | 9/1989 | Japan . | |
| 3-255665 | 11/1991 | Japan . | |
| 4-340252 | 11/1992 | Japan . | |

OTHER PUBLICATIONS

"A Smart Design Methodology for Advanced Memories", K. Arimoto et al., International Symposium on VLSI Technology, Systems, and Application Proceedings of Technical Papers, May 12–14, 1993, pp. 348–352.

*Primary Examiner*—David Hardy
*Attorney, Agent, or Firm*—McDermott, Will & Emery

[57] ABSTRACT

In a circuit cell band having circuit cells arranged aligned along a linear array, an on-a-cell line is arranged over a prescribed number of circuit cells, in a region different from a line region in which line band is formed on both sides of the circuit cells, for example, and the on-the-cell line is connected to a feed through in a feed through region provided between adjacent circuit cells. Restrictions on the feed through, size of the circuit cell and the lines are removed as much as possible. The circuit cell has also island-shaped impurity regions for fixing a substrate potential, so that latch up immunity is improved. Transistor forming regions having different conductivity types in a circuit cell are arranged in a sandwiched structure, and the circuit cell can be inverted horizontally and/or vertically while maintaining the transistor arrangement in the circuit cell. Therefore, position of the signal input/output port of the circuit cell can be changed in accordance with the layout of external lines, whereby optimization of the external line layout is facilitated.

29 Claims, 83 Drawing Sheets

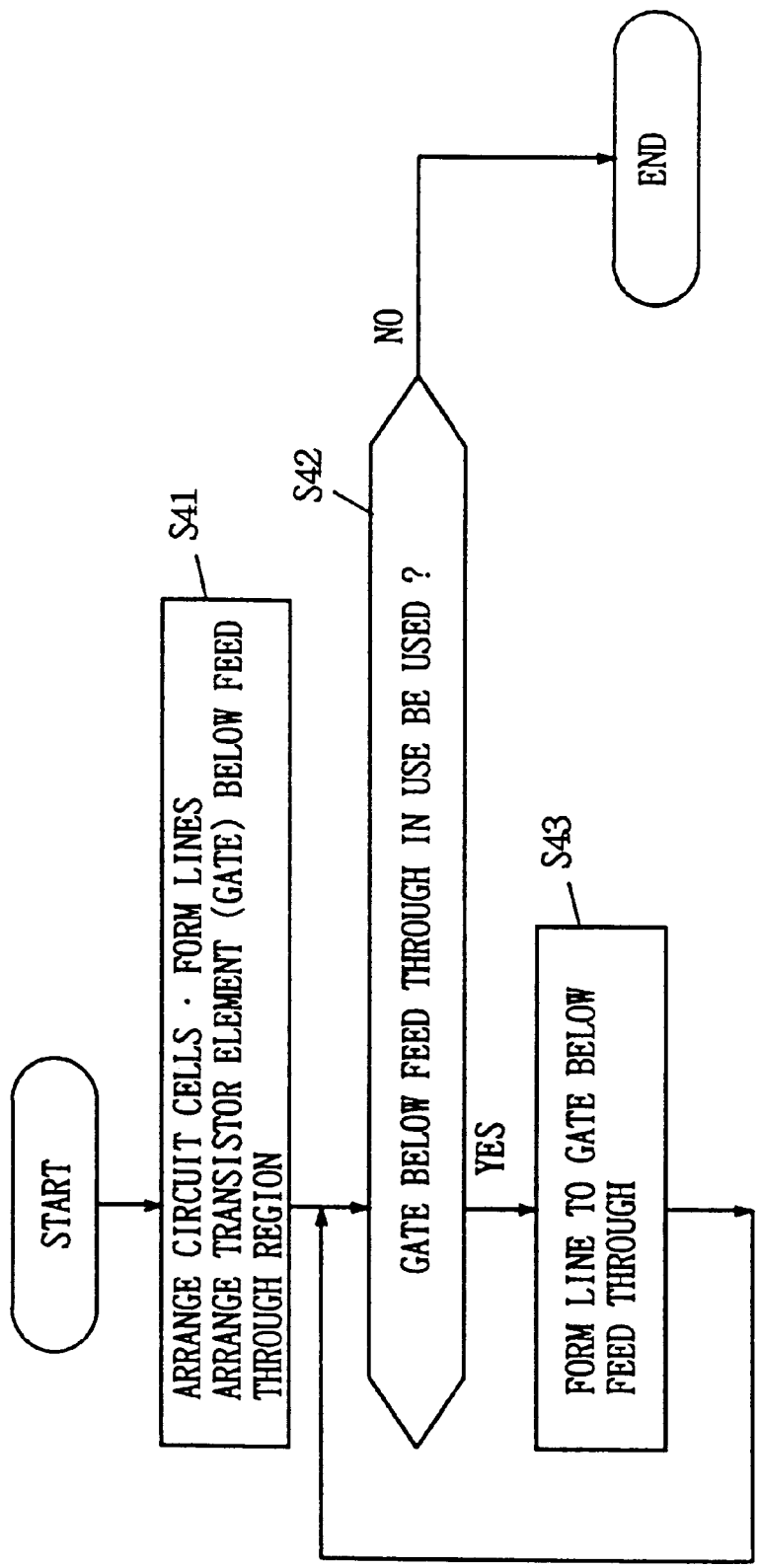

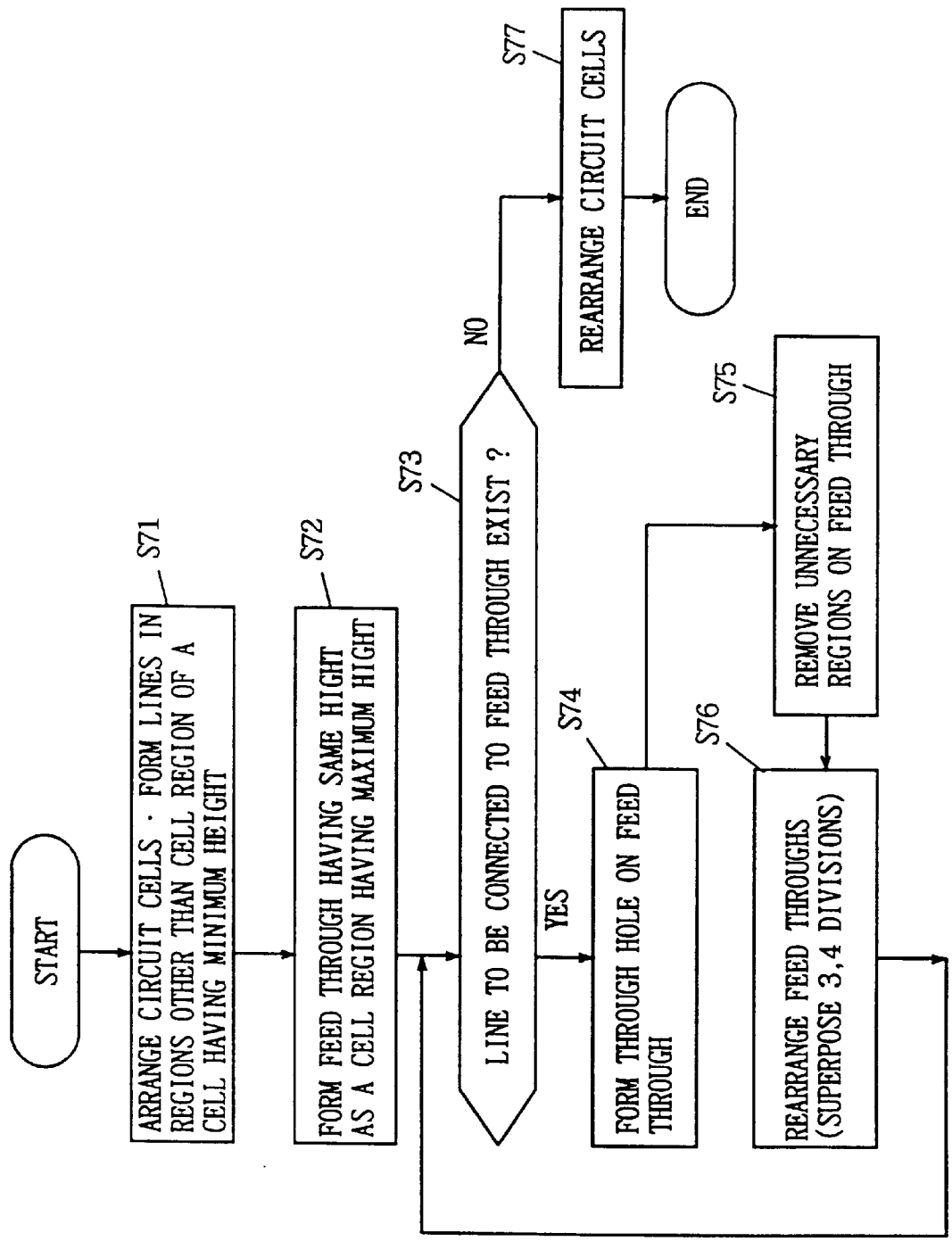

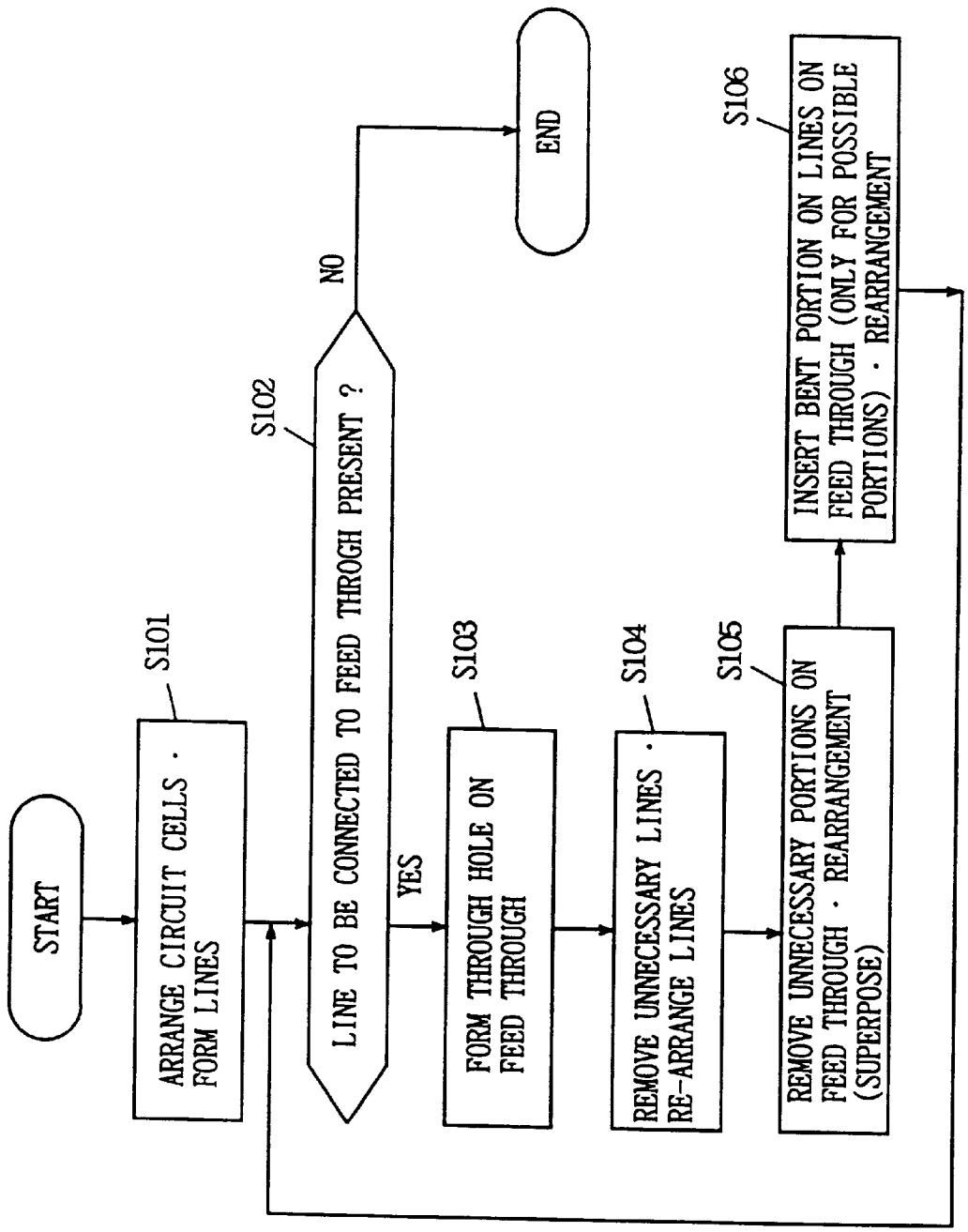

(S204 MAY PRECEDE S202)

FIG. 74
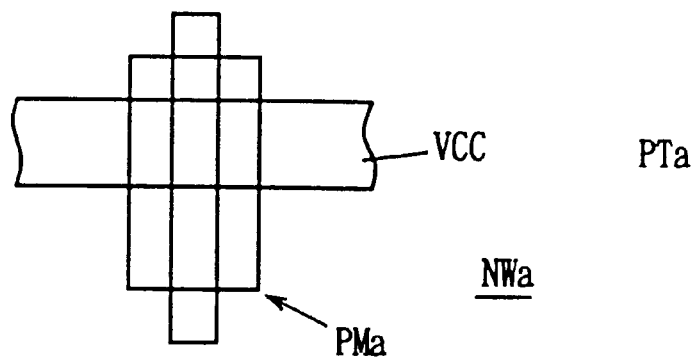
PTa
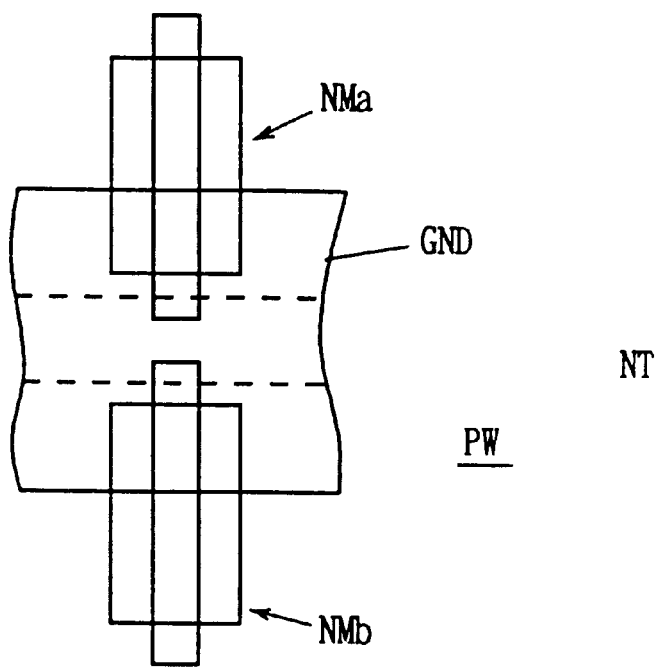
NT
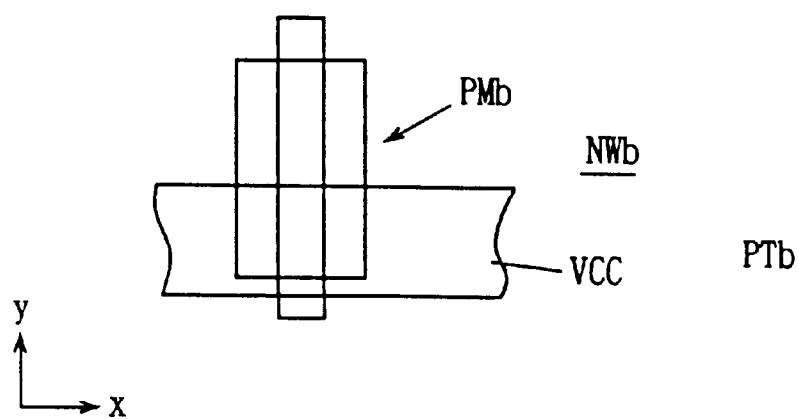
PTb

CIRCUIT CELL BASED SEMICONDUCTOR INTEGRATED CIRCUIT DEVICE AND METHOD OF ARRANGEMENT-INTERCONNECTION THEREFOR

This application is a divisional of application Ser. No. 08/868,046 filed Jun. 3, 1997 now U.S. Pat. No. 5,880,493, which is a continuation of application Ser. No. 08/568,226 filed Dec. 6, 1995 now abandoned.

BACKGROUND OF THE INVENTION

1. Field of the Invention

The present invention relates to a semiconductor integrated circuit device and, more specifically, to a semiconductor integrated circuit device suitable for automatic design and having interconnection layout superior in area efficiency and to a method of arrangement and interconnection of circuit cells (functional circuit blocks) which are the components of the device.

2. Description of the Background Art

In a large scale semiconductor integrated circuit device, not less than $10^8$ transistor elements are formed on one chip. In such a large scale device, arrangement and interconnection of transistor elements on the chip come to be extremely complicated, and hence computer aided design is used in order to design circuit device efficiently in short period of time for development. In such computer aided design, functional circuit blocks each implementing prescribed function are arranged, and thereafter, there is a step of arranging interconnections for transmitting signals to each of the functional circuit blocks.

FIG. 77 schematically shows a whole structure of a semiconductor integrated circuit device. FIG. 77 shows a dynamic random access memory (DRAM) as an example of a semiconductor integrated circuit device.

Referring to FIG. 77, the DRAM includes four memory arrays MA1, MA2, MA3 and MA4. Though not explicitly shown, each of the memory arrays MA1 to MA4 includes a plurality of memory cells arranged in rows and columns. Between memory arrays MA1 and MA3, a peripheral circuit block PH1 is arranged, and between memory arrays MA2 and M4, a peripheral circuit block PH2 is arranged. Between memory arrays MA1 and MA2, a peripheral circuit block PH3 is arranged, and between memory arrays MA3 and MA4, peripheral circuit block PH4 is arranged. Functions to be implemented by peripheral circuit blocks PH1 to PH4 are determined dependent on internal structures of memory arrays MA1 to MA4, and the functions include a control for controlling various control signals, row selecting operation and column selecting operation in memory arrays MA1 to MA4, and data input/output operation in accordance with externally applied signals. These peripheral circuit blocks PH1 to PH4 may include a circuit for generating a prescribed internal voltage.

Upon these peripheral circuit blocks PH1 to PH4, circuit layout utilizing automatic arrangement interconnection will be described, taking a small peripheral circuit PHB included in peripheral circuit block PH1 shown in FIG. 77 as an example.

FIG. 78 schematically shows the structure of the small peripheral circuit block PHB shown in FIG. 77. Referring to FIG. 77, the small peripheral circuit block PHB includes two circuit cell bands KCA and KCB. Circuit cell band KCA includes circuit cells CCAa to CCAz as functional circuit blocks, and circuit cell band KCB includes circuit cells CCBa to CCBr. Each of the circuit cells CCAa to CCAz and CCBa to CCBr has its size determined dependent on the function implemented by itself, and serves as a design unit or functional unit implementing the prescribed function. Generally, in layout, circuit cells CCAa to CCaz and CCBa to CCBr are designed respectively, and these are arranged alignedly along one line (linear array) (X direction in FIG. 78). Here, X and Y directions refer to horizontal and vertical directions in FIG. 78. However, these are not directly related to the X (row) and Y (column) directions generally used in a dynamic random access memory. It is simply defined that a direction along which the circuit cells are aligned is X direction (first direction) and a direction orthogonally crossing the X direction is Y direction (second direction).

Between circuit cell bands KCA and KCB, a line band LB in which inter-cell lines for transmitting signal between circuit cell is provided. In the line band LB, lines (main lines) extending along the X direction are arranged. In FIG. 78, line band LB is shown including main lines La to Le. In a direction orthogonal to the main lines La to Le, sub lines Ha to Hj for transmitting signals on main lines La to Le to the circuit cell are arranged. The main lines La to Le and sub lines Ha to Hj belong to different interconnection layers. By physically connecting main lines La to Le included in line band LB to sub lines Ha to Hj through connection holes (contact holes, through holes or via holes), interconnection between circuit cells is established. Here "physically connect" means "forming a connection allowing propagation of electrical signal", and hence physical connection may be "indirective connection through another line such as a barrier metal."

FIG. 79 shows, in enlargement, the structure of the circuit cell portions shown in FIG. 78. FIG. 79 shows two circuit cells CC1 and CC2 as representative. In regions (line regions) adjacent to circuit cells CC1 and CC2 along the Y direction, line bands LB1 and LB2 are arranged. Line band LB1 is shown including main lines L1 and L2, and line band LB2 is shown including a main line L3.

In order to transmit a signal transmitted on main line L1 to circuit cell CC1, a sub line H1 is arranged, and to transmit a signal on main line L3 to circuit cell CC2, a sub line H2 is arranged. These sub lines H1 and H2 are both arranged along the Y direction. Sub line H1 is physically connected to main line L1 through a connection hole V1, and sub line H2 is connected to main line L3 through a connection hole V3. In FIG. 79, a signal transmitted on sub line H1 is shown input to an input portion of a gate circuit g1 included in circuit cell CC1. An output from gate circuit (inverter circuit g1 is applied to one input of a gate circuit (NAND circuit) g2. A line for transmitting the signal from the sub line H1 to the input portion of gate circuit g1 is implemented by an internal line in circuit cell CC1. The internal line of the circuit cell includes a line belonging to the same interconnection layer as the sub line.

In order to transmit operational voltage to circuit cells CC1 and CC2 as well as to circuit cells not shown, a power supply line VCC and a ground line GND are arranged extending along the X direction across the circuit cells CC1 and CC2. The power supply line VCC and the ground line GND are formed in the same interconnection layer as the main lines L1 to L3 included in the line bands LB1 and LB2. Generally, in a semiconductor memory device such as a dynamic random access memory, lines (main lines L1 to L3 and power supply line VCC and ground line GND) extending in the X direction are formed in a second layer of aluminum interconnection layer, while lines (sub lines H1 and H2) extending along the Y direction are formed in a first layer of aluminum interconnection existing below the second layer of aluminum interconnection. Since the second layer aluminum interconnection has smaller number of heat treatment cycles and smaller stress as compared with the first layer of aluminum interconnection, purity of aluminum is made higher, and hence the second layer of aluminum interconnection has smaller electrical resistance and superior electrical property as compared with the first layer of aluminum interconnection layer. Therefore, the second layer of aluminum interconnection is used for the lines transmitting signals over longer distance. For the sub lines which has only to transmit signals over a short distance, the first layer of aluminum interconnection having superior electrical property to a polysilicon interconnection is used.

When a signal is to be transmitted from a main line included in one line band LB1 to another line band LB2 or to a circuit cell band different from the circuit cell band including circuit cells CC1 and CC2, such sub lines cannot be arranged on a circuit cell region (since internal lines in the circuit cells belongs to the same interconnection layer as the sub lines). Therefore, in such a case, a region on which a transistor element is not formed, that is, a feed through region FTR must be provided between circuit cells CC1 and CC2, so that the sub line is arranged through the feed through region FTR. A line arranged in such a feed through region is referred to as a feed through FT. The feed through region FTR conventionally represents only a region between circuit cells adjacent in the column direction (X direction) of the circuit cells, and it does not include the region on which a line band is arranged. By the provision of the feed through region, a line (feed through FT) satisfying the condition that a line extending in the Y direction is formed by using the first layer of aluminum interconnection can be arranged.

FIG. 80 shows a structure near the feed through region. FIG. 80 shows a feed through FT arranged adjacent to one circuit cell CC included in one circuit cell band KC. The circuit cell CC includes a p channel MOS transistor forming (arrangement) region PT on which only a p channel MOS transistor (insulated gate type field effect transistor) is formed (arranged) and an n channel MOS transistor forming (arrangement) region NT on which an n channel MOS transistor is formed (arranged). FIG. 80 shows one p channel MOS transistor PM and one n channel MOS transistor NM as representative. The p channel transistor forming region PT and the n channel transistor forming region NT are arranged extending along the X direction in circuit cell band KC. Parallel to p channel transistor forming region PT, a power supply line VCC, which is formed in the second layer of aluminum interconnection is arranged, and on the n channel transistor forming region NT, a ground line GND which is formed in the second layer of aluminum interconnection, is arranged.

On both sides of the circuit cell CC (in Y direction), line bands LBA and LBB are arranged. Main line La1 of line band LBA and main line Lb3 of line band LBB are mutually connected by sub line Ha. Main line La1 is connected to sub line Ha through a via hole V4, and main line Lb3 is connected to sub line Ha through via hole V5. The p channel MOS transistor PM has its source region SP connected to the power supply line VCC, while the n channel MOS transistor NM has its source region SN connected to the ground line GND. Drain region DP of p channel MOS transistor PM and drain region DN of n channel MOS transistor NM are interconnected by means of an inner line IH formed in the first layer of aluminum interconnection.

Parallel to the sub line Ha and to inner line IH, a feed through FT formed by the first layer of aluminum interconnection is arranged along the Y direction. The feed through FT is physically connected to main line Lb2 included in line band LBB by means of a via hole V6. These MOS transistors PM and NM constitute an inverter.

FIG. 81 schematically shows a cross section of the p channel MOS transistor PM shown in FIG. 80 along a line A–A'. Referring to FIG. 81, the source region SP of p channel MOS transistor PM includes an impurity diffusion region D1 formed at a surface of a semiconductor substrate (or in a well region), and an intermediate connection layer AI constituted in the first layer of aluminum interconnection which is physically connected to impurity diffusion region D1. The intermediate connection layer AI is also connected to the power supply line VCC by means of another contact. By connecting the source impurity diffusion region D1 to the power supply line VCC through the intermediate connection layer AI, aspect ratio at the contact portion is improved.

Drain region DP includes an impurity diffusion region D2 formed at a surface of the semiconductor substrate (or in a well region). Impurity diffusion region D2 is connected to an inner line IH through a contact. Intermediate connection layer AI and inner line IH are formed in the first layer of aluminum interconnection. Sub line Ha and feed through FT are also formed in the first layer of aluminum interconnection. Therefore, the feed through FT cannot be arranged in a region where a transistor element is formed. Therefore, it is necessary to arrange a feed through region between the circuit cells, which means that there exists a region in the circuit cell band where a circuit cell cannot be arranged. This results in the problem of increased area occupied by the circuit cell band.

When a feed through is to be connected to an internal node of a circuit cell and there is not an object circuit cell (to which a signal is transmitted) in the direction of extension of the feed through, it becomes necessary to provide a line L15 for changing substantial position (in Y direction) of the feed through FT in the line band (line band LBA in FIG. 82), as shown in FIG. 82. The reason for this is that according to the conventional design rule, connection holes other than the connection holes (through hole or via hole: both are used for the same meaning) for the interconnection of inner lines in a circuit cell must be provided in the line band, as will be described later. Therefore, when a signal transmitted on feed through FT is to be transmitted to an input portion of gate circuit g10 in circuit cell CC1 as shown in FIG. 82, the feed through FT is connected to gate circuit g10 by means of through hole V10 in line band LBA, line L15, through hole V11 and sub line H10. Therefore, in line band LBA, a line L15 which is used only for changing the substantial position of the feed through FT is provided in addition to the main lines L10 and L11 which are used for connection between circuit cells, so that area occupied by line band LBA in Y direction is increased. Increase in the area of occupation in Y direction by line band LBA results in increased area of occupation of the circuit formed in accordance with this circuit cell method, whereby a circuit having small area of occupation cannot be formed and higher degree of integration is hindered.

FIG. 83 schematically shows a whole structure of a conventional automatic interconnection-arrangement apparatus. Referring to FIG. 83, the automatic interconnection-arrangement apparatus includes an input device 1 for inputting data to be processed and a command or the like indicating a process to be executed, a processing portion 2 for performing a prescribed process in accordance with the data and the command input through input device 2, a display device 3 displaying necessary information under the control of processing portion 2, and a data memory 4 for storing data input through input device 1 and data generated in the process performed by the processing portion 2. The input device 1 may be any device having a function of inputting information, such as a keyboard, a mouse or a light pen. Input device 1, processing portion 2 and display device 3 are connected to each other by means of a data bus 5.

Processing portion 2 includes a control portion 21 for executing necessary processing, and a program memory 23 for storing information such as rules for interconnection and arrangement, procedure for executing interconnection and arrangement. Control portion 21 is connected to data bus 5 by means of an interface 22. Data memory 4 may be a disk device using a magnetic recording medium, or an external memory device such as an RAM disk. Processing operation of the device shown in FIG. 83 when information is input will be described with reference to FIGS. 84A and 84B. FIG. 84A shows a display on a display screen of the display device 3 when information is input, and FIG. 84B shows an operational flow when the information is input.

Referring to FIG. 84B, the apparatus is powered on, and thereafter a command is input from input device 1 to processing portion 2 through internal data bus 5, so as to activate a program controlling the interconnection and arrangement processing operation (step ST1). In accordance with the activated program, control portion 21 displays necessary menu for processing on the display screen of display device 3. A designer (user) selects a menu displayed on the display screen, and inputs information required by the selected menu through input device 1. Namely, as shown in step ST1 of FIG. 84B, first, description of a circuit cell is required, and the user describes the circuit cell of which arrangement and interconnection are desired (information of the circuit cell is input). Accordingly, as shown in FIG. 84A, circuits cells CC#1 and CC#2 are displayed on the display screen of display device 3. The information input at the time of description of the circuit cell includes the size of the circuit cell (information of lengths in z and Y directions). Thereafter, in accordance with a request from processing portion 2, the designer describes a signal input/output terminal (port) for each of the described circuit cells (step ST2). In accordance with the port description, a state is described in which input terminals P1*a*, P1*b* and P1*c* as well as output terminals P1*d* and P1*e* are arranged for circuit cell CC#1. Similarly, description is given for circuit cell CC#2 in which input terminals P2*a* and P2*b* and an output terminal P2*c* are arranged.

Thereafter, connection between ports is described (step ST3). For the input of the connection information, a structure may be used by which the connection information is directly input through the display screen of display device 3 by using a light pen or a mouse, or a structure in which input and output ports are directly described in texture format. By the description of connection between ports, the state is described in which a signal S1 is commonly applied to ports P1*a* and P2*a*, signals S2 and S3 are applied to ports P1*b* and P1*c*, respectively, a signal S4 is output from P1*d* to be transmitted to a line or a circuit cell not shown, and a signal S5 from port P1*e* is applied to port P2*b* of circuit cell CC#2. Further, it is described that signal S6 is output from port P2*c*.

After the input of these necessary information is completed, a command instructing the arrangement and interconnection is applied from input device 1 to processing portion 2. In processing portion 2, control portion 21 arranges lines between circuit cells CC#1 and CC#2 in accordance with the information input through input device 1 (stored in data memory 4) and interconnection rule stored in program memory 23.

Control portion 21 executes the following process in step ST4. Namely, control portion 21 extracts information indicative of connecting relation of ports (including circuit cells specifying information) in accordance with the input information, and based on the extracted port connection information, generates information of main lines (lines in X direction) and information on sub lines (lines in Y direction).

FIG. 85 shows an example of the structure of main line and sub line information. Referring to FIG. 85, connection information 130 of one main line includes a main line identifier 131 for identifying a main line uniquely allotted to the main line, and information 132 on sub lines to be connected to the main line. Sub line information 132 includes information of one or a plurality of sub lines. Sub line information 132 includes a sub line identifier 133 for specifying a sub line, and connection information 134 of the sub line. Sub line identifier 133 is uniquely allotted to a sub line. Connection information 134 includes port information 135 specifying a port to which a sub line is connected, and a contact information 136 of a main line to which the sub line is to be connected. Port information 135 includes a circuit cell specifying information. Contact information 136 includes positional information of Y direction on main line. Port information 135 also includes positional information of X and Y directions. After these data are extracted, control portion 21 shown in FIG. 83 performs arrangement and connection of lines in accordance with the processing procedures shown in FIG. 86. The method of arrangement and connection of lines will be described with reference to FIG. 86.

First, in accordance with the described circuit cell and port information, ports are rearranged with respect to each of the circuit cells (step ST10). According to a conventional design rule, in the re-arrangement of ports, ports of the circuit cells are arranged on a side opposing to the line band (on both opposite sides of the circuit cell along the Y direction). Therefore, the described ports are arranged on the upper or lower side along the Y direction, in accordance with the position on the circuit cell.

Thereafter, in the line region determined in accordance with the arrangement of the circuit cell, necessary number of main lines (lines in X direction) are arranged (step ST12). Each main line is identified by main line identifier 131. In accordance with sub line information 132, sub lines are arranged (step ST14). At this time, each sub line is identified by sub line identifier 133. However, if port information 135 includes a port of a circuit cell belonging to different circuit cell band, or if contact information 136 includes contact information of a different main line, then it is determined that the sub line should form a feed through, so that a new main line is added, and sub line and feed through are connected to the added main line. This identification is realized in the following manner. Positional information of X and Y directions are included in the port information. More specifically, when ports are arranged, positional information of X and Y directions are added to each of the ports, and the added positional information of the ports is stored in port information 135 included in connection information 134. Contact information 136 also includes positional information of main line identifier (or position in Y direction) and X direction. Therefore, whether or not a feed through is to be generated is determined.

After main lines and sub lines are arranged, unnecessary lines are deleted (step ST16) in the following way: contact information 136 is tracked for each main line, and the unnecessary main line is removed in accordance with the positional information of X direction included in the contact information. As for the deletion of unnecessary sub line, unnecessary portion of the sub line is removed, so that the sub line terminates at the contact portion. If removal of the unnecessary lines results in an empty region in the line band, and if a line may be arranged in the empty region by shifting the position of the line, the lines are re-arranged.

FIG. 87 shows connection of interconnected circuit cells. The circuit connection shown in FIG. 87 corresponds to the input formation shown in FIG. 84A. Ports of circuit cells CC#1 and CC#2 are arranged at portions in contact with the line region. Referring to FIG. 87, signal line S1 is connected to port P1a through main line S1X and sub line S1Ya, and to port P2a through main line S1X and sub line S1Yb. Signal line S2 is connected to port P1b through main line S2X and sub line S2Y. A signal line S4 connected to port P1d is represented by sub line S4Ya, main line S4X and sub line S4Yb. Signal line S3 is connected to port P1c, through main line S3X and sub line S3Y. Signal line S5 is constituted by sub line S5Ya connected to port P1e, a sub line S5Yb connected to port P2b, and main line S5X interconnecting these sub lines S5Ya and S5Yb. Signal line S6 is implemented by sub line S6Y connected to port P2c, and a main line S6X connected to sub line S6Y. Referring to FIG. 87, main lines denoted by the dotted lines are line portions which are removed in the step of removing unnecessary lines shown in FIG. 86 (step ST16). After the portions denoted by the dotted lines are removed, main lines are re-arranged.

As already described, in accordance with the rule that ports of the circuit cells are arranged at portions in contact with the line bands, a feed through line S4Yb is first connected to main line S4X, and then connected to port P1b through sub line S4Ya. Therefore, sub line S4X used only for arranging the feed through (sub line S4Yb) is arranged, which increases the area occupied by the line band.

Size of a circuit cell differs dependent on a function implemented by the circuit cell. Now, referring to FIG. 88, consider a circuit cell band in which circuit cells CC#A and CC#B having different lengths in Y direction are arranged. According to the conventional rule of arrangement and interconnection, line bands ARA and ARB are arranged on external regions along the Y direction of circuit cell CC#B having the longest direction in Y direction. This is because passage of main lines over the circuit cells is inhibited. Therefore, in such a case, there would be regions NUR on which lines are not arranged, on both sides of circuit cells CC#A in the Y direction, which circuit cell is short in Y direction. This hinders efficient use of the chip area.

FIG. 89 schematically shows an internal structure of a circuit cell CC. Referring to FIG. 89, circuit cell CC includes N well NW for implementing a p channel MOS transistor arrangement region PT, and a P well PW for implementing an n channel MOS transistor arrangement region NT. In N well NW, impurity regions (active regions) PR1 to PR4 for forming p channel MOS transistors are arranged aligned in one line. In impurity regions PR1 to PR4 for forming p channel MOS transistors, gate electrode lines PG1 to PG4 are arranged, respectively. On N well NW, a power supply line VCC formed by the second layer of aluminum interconnection is arranged crossing the gate electrode layer.

In P well PW, impurity regions NR1 to NR4 for forming n channel MOS transistors are arranged. The impurity regions NR1 to NR4 for forming MOS transistors are arranged aligned with the impurity regions PR1 to PR4 for forming MOS transistors provided in N well NW. For impurity regions NR1 to NR4 for forming MOS transistors, gate electrodes NG1 to NG4 are arranged aligned with gate electrodes PG1 to PG4, respectively. On P well PW, a ground line GND formed by the second layer of aluminum interconnection is arranged, in a direction crossing the gate electrodes NG1 to NG4.

In the mutually opposing peripheral regions of N well NW and P well PW, a P well collar PCR and an N well collar NCR formed by highly doped impurity regions are provided. P well collar PCR is formed by a P type impurity region having high impurity concentration, and N well collar NCR is formed by an N type impurity region having high impurity concentration. These collars NCR and PCR are arranged continuously extended along peripheral regions of N well NW and P well PW, respectively, and apply a prescribed potential to corresponding wells. In circuit cell CC, in order to connected transistors to each other and to perform signal input/output from and to the outside of the circuit cell, inner lines HV formed in the first layer of aluminum interconnection are arranged.

FIG. 90A schematically shows a cross sectional structure of the MOS transistor forming region shown in FIG. 89, and FIG. 90B shows an electrical equivalent circuit of a parasitic thyristor formed in N well NW and P well PW.

Referring to FIG. 90A, on a P type semiconductor substrate SB, P well PW and N well NW are formed. In order to separate P well PW and N well NW from each other, a field insulating film LOC formed of a thermal oxide film, for example, is formed in the boundary between the P well and N well. Adjacent to the field insulating film LOC, in P well PW, P well collar PCR formed of highly doped P type impurity region is formed, and in N well NW, N well collar NCR formed by highly doped N type impurity region is arranged.

On the surface of P well PW, an N type impurity region NR (generally referring to NR1 to NR4) for forming n channel MOS transistors is formed. On the surface of N well NW, highly doped P type impurity region PR for forming p channel MOS transistors is formed. Gate electrode layers are not shown.

In the structure shown in FIG. 90A, an npn bipolar transistor Q1 is parasitically formed, in which P well PW serves as a base, N type impurity region NR serves as an emitter and the semiconductor substrate SB serves as a collector. In N well NW, a pnp bipolar transistor Q2 is parasitically formed, in which P type impurity region PR serves as an emitter, N well NW serves as a base and semiconductor substrate SB serves as a collector. The base of the parasitic bipolar transistor Q1 is connected to P well collar PCR through well resistance rs, and receives a constant bias voltage VS (a voltage generally lower than the ground potential). Collector of the parasitic bipolar transistor Q1 is connected to the base of parasitic bipolar transistor Q2. The base of parasitic of bipolar transistor Q2 is connected to N well collar NCR through well resistance rw. To the N well collar NCR, a constant bias voltage (generally a voltage level higher than the power supply voltage) VC is applied.

As shown in FIG. 90B, pnp bipolar transistor Q2 receives the bias voltage VC at its base through resistance rw, and receives the power supply voltage VCC at its emitter through impurity region PR. Meanwhile, parasitic bipolar transistor Q1 has its emitter connected to the level of the ground potential through N type impurity region NR, and receives at its base the bias voltage VS through resistance rs. For simplicity of description, assume that the bias voltage VC is equal to the power supply voltage VCC and the bias voltage VS is equal to the ground voltage (denoted by the dotted lines in FIG. 90B). In this case, bipolar transistors Q1 and Q2 constitute a thyristor.

A state in which parasitic thyristor shown in FIG. 90B is rendered conductive is generally referred to as "latch up phenomenon." The latch up phenomenon is triggered by a changing current incidental to fluctuation of power supply voltage, a punch through current at a well boundary, and so on. Such current serves as a trigger current introduced to the base terminal of the parasitic thyristor circuit shown in FIG. 90B. When a trigger current is generated in P well PW, the current flows through resistance rs, and voltage drop across the resistance rs turns on the bipolar transistor Q1. When bipolar transistor Q1 turns on, collector current of bipolar transistor Q1 flows through resistance rw and bias power supply VC. When the base-emitter of bipolar transistor Q2 is biased in forward direction, the bipolar transistor Q2 turns on. When bipolar transistor Q2 turns on and collector current of bipolar transistor Q2 flows, the collector current flows through resistance rs, and further increases the base potential of bipolar transistor Q1 which has already been turned on. Consequently, the collector current of bipolar transistor Q1 is again increased, driving bipolar transistor Q2 more deeply on.

As a result, bipolar transistors Q1 and Q2 are completely turned on, and a large current flows from the bias power supply VC to the bias voltage VS. Such latch up phenomenon is generated when one of the bipolar transistors Q1 and Q2 is biased in the forward direction and the other has its base-emitter biased in the forward direction. The trigger current may be generated by a noise in P well PW or N well NW. Generation of a trigger current is suppressed to prevent the latch up phenomenon by providing P well collar PCR and N well collar NCR so as to fixedly set the potentials of P well PW and N well NW.

However, as shown in FIG. 89, when P well PW and N well NW are both provided with collars PCR and NCR, a problem that the latch up resistance becomes lower than when only one collar is arranged on one well region, arises.

FIG. 91 shows relation between the arrangement of collars and the hold voltage VH at the time of a latch up. In FIG. 91, the abscissa shows distance (by the unit of μm) between impurity regions formed in the well, and the ordinate represents holding voltage Vh.

Referring to FIG. 92A, the distance between the P+–N+ represents the distance between N type impurity region formed in a P well and a P type impurity region formed in an N well. Referring to FIG. 92B, holding voltage Vh represents a voltage applying a hold current Ih when the parasitic thyristor circuit turns on.

FIG. 91 shows holding voltages when a P well collar is arranged on the P well region, the collars are arranged on both P and N wells, and when the collar is not provided, obtained through experiments by the inventor. The higher the value of the holding voltage Vh, the higher the voltage at which the parasitic thyristor is turned on, that is, the smaller the possibility of latch up phenomenon. More specifically, it can be seen from FIG. 91 that when a collar is provided only on the N well, latch up resistance is higher than when collars are provided for both P and N wells. Therefore, when collars are arranged on the N well and P well opposing regions in order to suppress generation of a trigger current both in the P well and N well, immunity to latch up phenomenon becomes inferior conversely. Here, the collars are arranged in the periphery of opposing regions of P well and N well in order to make smaller the values of resistances rw and rs shown in FIG. 90B, so that the collars can also function as guard rings.

Collars NCR and PCR are arranged continuously extending along the peripheral regions of N well NW and P well PW. In this case, in order to connect gates of p channel MOS transistors and n channel MOS transistors, it is necessary to use the first layer of aluminum interconnection HV as shown in FIG. 89. When the gates of p channel and n channel MOS transistors are connected to each other by using a gate interconnection layer, impurity regions are formed in self alignment with respect to the gate electrode and therefore in N well collar NCR and P well collar PCR, MOS transistors would be formed. In that case, since impurity region is not formed below the gate electrode layer of collars NCR and PCR, the MOS transistors in collars NCR and PCR are rendered conductive dependently on the signal potential on the corresponding gate electrode layer. Therefore, in this case, there is not an adverse effect on the function of applying a bias voltage of the collars NCR and PCR. However, there is provided an additional MOS transistor formed to the gate electrode layer, so that additional gate capacitance is provided to the gate electrode layer, parasitic capacitance of the signal lines increases resulting in delay in signal propagation, which leads to degradation of the circuit performance. Therefore, a gate electrode layer cannot be formed across the collars NCR and PCR. For this reason, in order to connect gate electrodes of p channel and n channel MOS transistors to each other as shown in FIG. 89, another line such as the first layer of aluminum interconnection HV must be used, another first layer of aluminum interconnection cannot be arranged additionally in this region, and hence degree of freedom in interconnection is decreased.

In addition, N collar NCR can not be made contact with P collar PCR because the reverse breakdown voltage of P+/N+ junction structure is low. Thus, P well PW and N well NW are formed being isolated from each other, and there is a space between P well PW and N well NW, and the cell size can not be reduced.

Further, a circuit cell includes one p channel MOS transistor arrangement region PT and one n channel MOS transistor arrangement region NT. In this case, it is possible to optimize the arrangement of p channel MOS transistor and n channel MOS transistor in the circuit cell. However, in the semiconductor integrated circuit device, there are a plurality of circuit cells arranged aligned with each other, and these plurality of circuit cells are connected to each other. Therefore, signal input/output nodes of circuit cells CC must be arranged taking into consideration connection with other circuit cells. However, if the arrangement of the transistors in a circuit cell is optimized in accordance with the input/output port A of the circuit cell CC, it becomes quite difficult to change the positions of ports to optimize connection with other circuit cells while maintaining the original optimal arrangement. Therefore, in this case, referring to FIG. 93, when a signal on main line La is to be input to or output from a signal input/output port A of circuit cell CC, it becomes necessary to connect the input/output port A and main line La by means of a feed through FT and another main line Lb. Therefore, in this case, optimization of the arrangement of lines taking into considerations the lines (external lines) of the semiconductor integrated circuit device as a whole is not possible, the feed through FT is necessary, increasing the area occupied by the lines, and the size of the semiconductor integrated circuit device as a whole becomes large.

SUMMARY OF THE INVENTION

An object of the present invention is to reduce area of occupation of circuits formed in accordance with the circuit cell method.

Another object of the present invention is to provide a semiconductor integrated circuit having a layout superior in circuit area efficiency.

A further object of the present invention is to provide a semiconductor integrated circuit device suitable for automatic design in which area occupied by lines is reduced.

A still further object of the present invention is to provide a method of arrangement and interconnection of circuit cells (functional circuit blocks) efficiently, in a circuit formed in accordance with the circuit cell method.

A still further object of the present invention is to provide a method of arranging and interconnecting circuit cells (functional circuit blocks) which can implement layout superior in circuit area efficiency.

A still further object of the present invention is to provide a method of arranging and interconnecting circuit cells (functional circuit blocks) which can reduce area occupied by lines.

A still further object of the present invention is to provide a circuit cell having improved latch up resistance (immunity) and higher degree of freedom of internal interconnection and a method of arrangement therefor.

A still further object of the present invention is to provide a circuit cell which can implement a semiconductor integrated circuit having improved degree of freedom of external interconnection and method of arrangement therefor.

A still further another object is to reduce a cell size and therefore to reduce a layout area of the circuit device.

The semiconductor integrated circuit device in accordance with the present invention includes a plurality of functional circuit blocks each realizing a prescribed function. The plurality of functional circuit blocks are arranged aligned along at least one line.

In the present invention, interconnection between the feed through and another line is permitted. Further, the feed through is allowed to exist in an empty region in the circuit cell. Further, position of the feed through in the feed through region can be changed.

The feed through is allowed to have a divided structure. Further, the feed through is allowed to terminate at a connecting portion of lines. Further, divided feed throughs are allowed to be aligned in the feed through region.

The circuit cells may have different lengths in a direction orthogonal to the direction of alignment. Outside a circuit cell which is shorter, a line extending over a longer circuit cell may be arranged. Further, lines may be arranged over circuit cells.

In the feed through region, arrangement of signal input/output port for a circuit cell is allowed.

The circuit cell includes, at least one of opposing peripheral regions of first and second transistor forming regions, an island-shaped impurity region for fixing substrate potential.

The circuit cell includes a first transistor forming region and a second transistor forming region arranged on both sides of the first transistor forming region. For interconnection and layout, the circuit cell is subjected to rotation in left and right directions (right-side left reflection) and/or rotation in upward and downward directions (up-side down reflection).

Various regulations with respect to the feed through, circuit cell size and lines in the line region are eliminated, degree of freedom in arrangement of lines is increased, and accordingly, the area of the device can be reduced.

As a region for fixing substrate potential is provided in an island-shape, a structure equivalent to the one in which such region is arranged only one side can be obtained, and hence resistance (immunity) to latch up can be improved.

Since transistor forming regions of the circuit cell are arranged like a sandwich, circuit cells can be rotated without arranging internal transistor, ports can be arranged optimally with respect to external lines, degree of freedom of external lines (main lines) can be increased, and optimal layout or interconnection can be realized.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 21 is a flow chart showing a process sequence of arrangement and interconnection of circuit cells in accordance with the fourth embodiment of the present invention.

FIG. 33 is a flow chart showing process sequence of arrangement and interconnection of circuit cells in accordance with the seventh embodiment of the present invention.

FIG. 40 is a flow chart showing a process sequence for implementing arrangement and interconnection of circuit cells in accordance with the tenth embodiment of the preset invention.

FIG. 74 shows a manner of arrangement of power supply/ground lines and transistors in circuit cells shown in FIG. 70 or 71.

DESCRIPTION OF THE PREFERRED EMBODIMENTS

Embodiment 1

Figure 1:
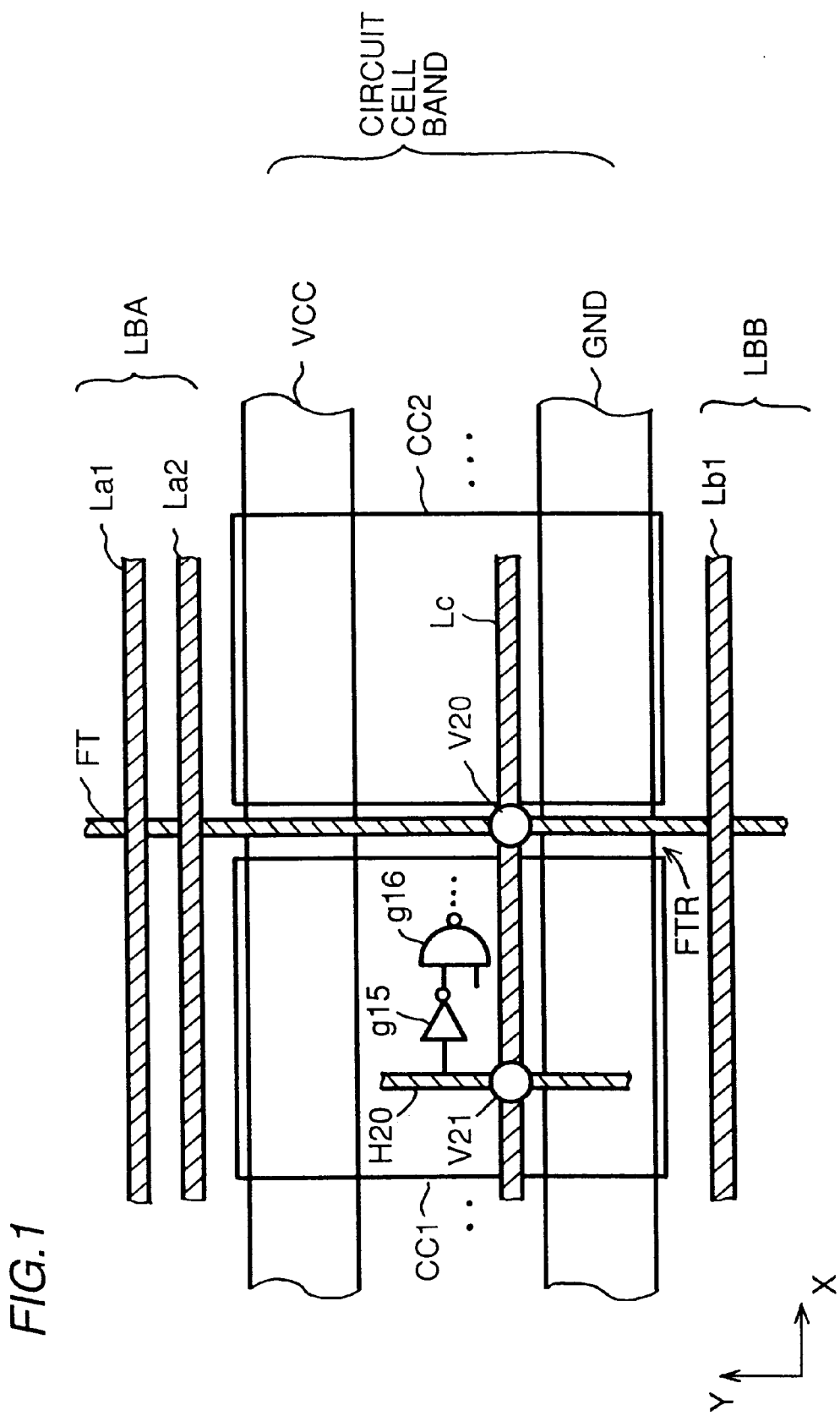
FIG. 1 schematically shows a structure of a main portion of a semiconductor integrated circuit device in accordance with a first embodiment of the present invention.

FIG. 1 shows a structure of a main portion of a semiconductor integrated circuit device in accordance with a first embodiment of the present invention. FIG. 1 shows two circuit cells CC1 and CC2 as representatives. On both sides of circuit cells CC1 and CC2 along the Y direction, line regions extending along the same direction (X direction) as the array of circuit cells are formed. In the line regions, line bands LBA and LBB are arranged. Line band LBA is shown including main lines La1 and La2 formed, for example, of the second layer of aluminum interconnection, and line band LBB is shown including a main line Lb1 formed of the second layer of aluminum interconnection. In the region for forming circuit cells CC1 and CC2, a power supply line VCC and a ground line GND formed of the second layer of aluminum interconnection extending along the direction of the circuit cell array (X direction) are arranged. The power supply line VCC and the ground line GND are arranged on the sides of circuit cells CC1 and CC2 opposing to each other along the Y direction. As will be described in greater detail later, below the power supply line VCC and the ground line GND, p channel MOS transistor forming region and an n channel MOS transistor forming region are arranged.

A feed through FT for transmitting a signal from a main line or a circuit cell, not shown, is arranged extending along the Y direction across a feed through region FTR between circuit cells CC1 and CC2. The feed through FT is formed in the first layer of aluminum interconnection layer, for example, which is a layer lower than the main line. On the circuit cell CC1 and CC2 forming region, an on-the-cell line Lc formed in the second layer of aluminum interconnection is arranged. On-the-cell line Lc is physically connected to the feed through FT by means of a connection hole (via hole or a through hole) V20 in the feed through region FTR. On-the-cell line Lc may be arranged to extend over all the circuit cells included in the circuit cell band in which circuits cells CC1 and CC2 are aligned, or it may be arranged to extend only in a necessary region (from the feed through to the circuit cell transmitting/receiving the signal).

On-the-cell line Lc is physically connected to sub line H20 through connection hole V21, in circuit cell CC1 forming region. The sub line H20 is formed in the first layer aluminum interconnection, and transmits a signal to an input portion of a target circuit portion (gate circuit g15) in the circuit cell CC1. Signal transmission from sub line H20 to the gate circuits g15 and g16 of circuit cell CC1 is the same as in the structure shown in FIG. 76.

Referring to FIG. 1, by providing on-the-cell line Lc over the circuit cell and by physically connecting the line to the feed through FT in feed through region FTR by connection hole V20, the following advantages can be obtained. More specifically, when feed through FT is to be connected to an internal node of circuit cell CC1, as already shown in FIG. 76, a line for changing substantial position (along the Y direction) of the feed through becomes necessary in line band LBA or LBB, and the area of line region is increased. However, since formation of the connection hole V20 is allowed in the feed through region FTR, it becomes possible to arrange the on-the-cell line over circuit cells CC1 and CC2, the line for changing the substantial position of the feed through FT need not be provided in the line band, and hence increase in the area occupied by line region can be prevented. Further, one-the-cell line Lc is formed in the same second layer of aluminum interconnection as the power supply line VCC and the ground line GND. Therefore, on-the-cell line Lc may be extended across necessary range, without affecting at all the internal lines in circuit cells CC1 and CC2 (since internal line of circuit cells are provided by using the polysilicon layer and the first layer of aluminum interconnection existing below the second layer of aluminum interconnection).

Modification 1

Figure 2:
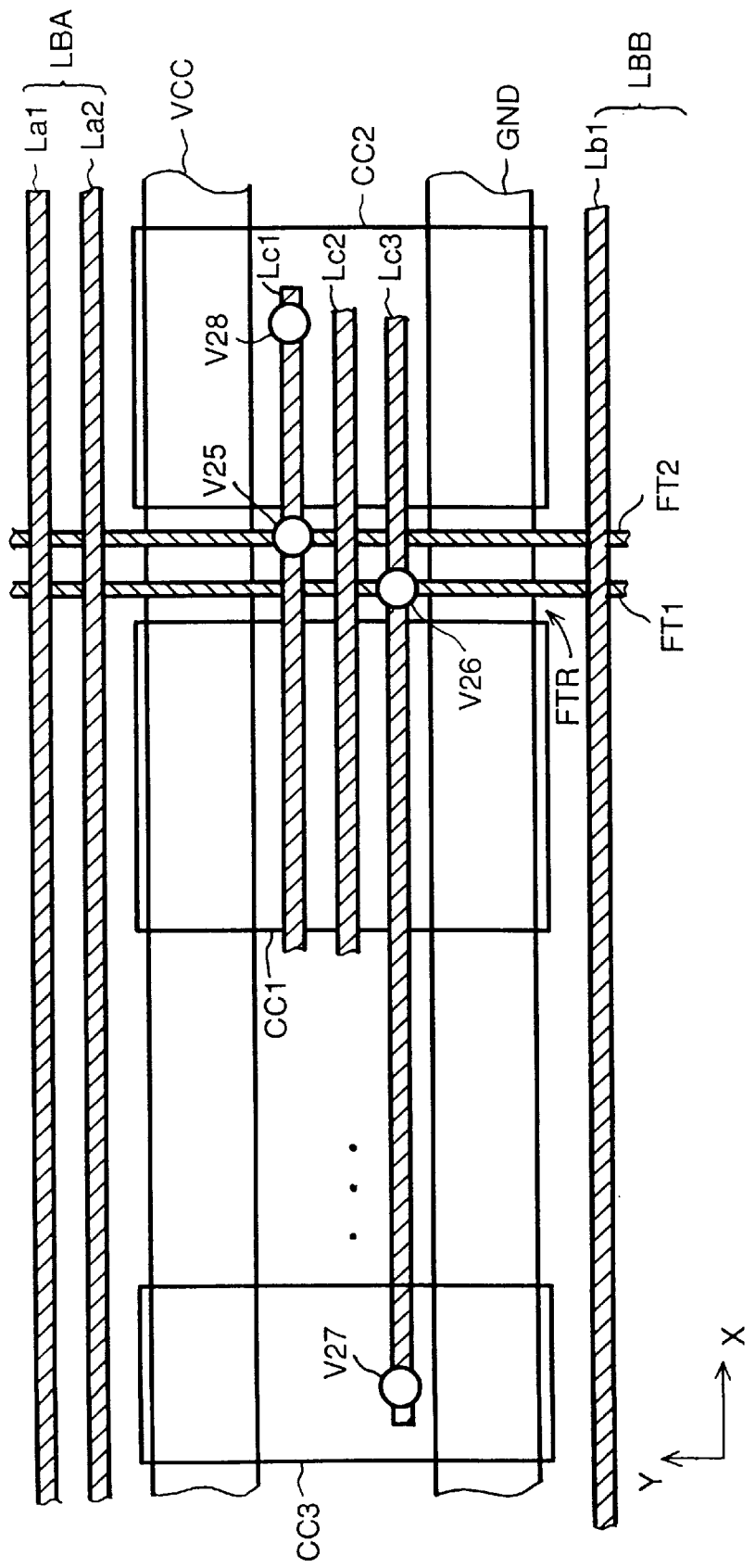
FIG. 2 shows a modification of the first embodiment of the present invention.

FIG. 2 shows a structure of a modification of the first embodiment of the present invention. In the structure of FIG. 2, two feed throughs FT1 and FT2 are arranged in feed through region FTR between circuit cells CC1 and CC2. On the circuit cell forming region and between power supply line VCC and the ground line GND, on-the-cell lines Lc1, Lc2 and Lc3 are arranged. Lengths of on-the-cell lines Lc1 to Lc3 are determined as needed. Referring to FIG. 2, on-the-cell line Lc1 is physically connected to feed through FT2 via connection hole V25 in feed through region FTR, and connected to an internal node of circuit cell CC2 via connection hole V28. On-the-cell line Lc3 is physically connected to feed through FT1 through connection hole V26 in feed through region FTR, and to an internal node of circuit cell CC3 arranged aligned with circuit cells CC1 and CC2 through connection hole V27.

By the structure including a plurality of (two in FIG. 2) feed throughs in one feed through region, the following advantages can be obtained, in addition to suppression of increase of the area of line regions. For example, when mutually complementary signals are to be transmitted from one circuit cell to separate circuit cells through the feed through, it is possible to arrange the feed through region near the complementary signal generating portion, and to transmit the signals from the feed through region to separate target circuits through the on-the-cell lines. Therefore, layout of the complementary signal transmission path becomes very easy.

Figure 3:
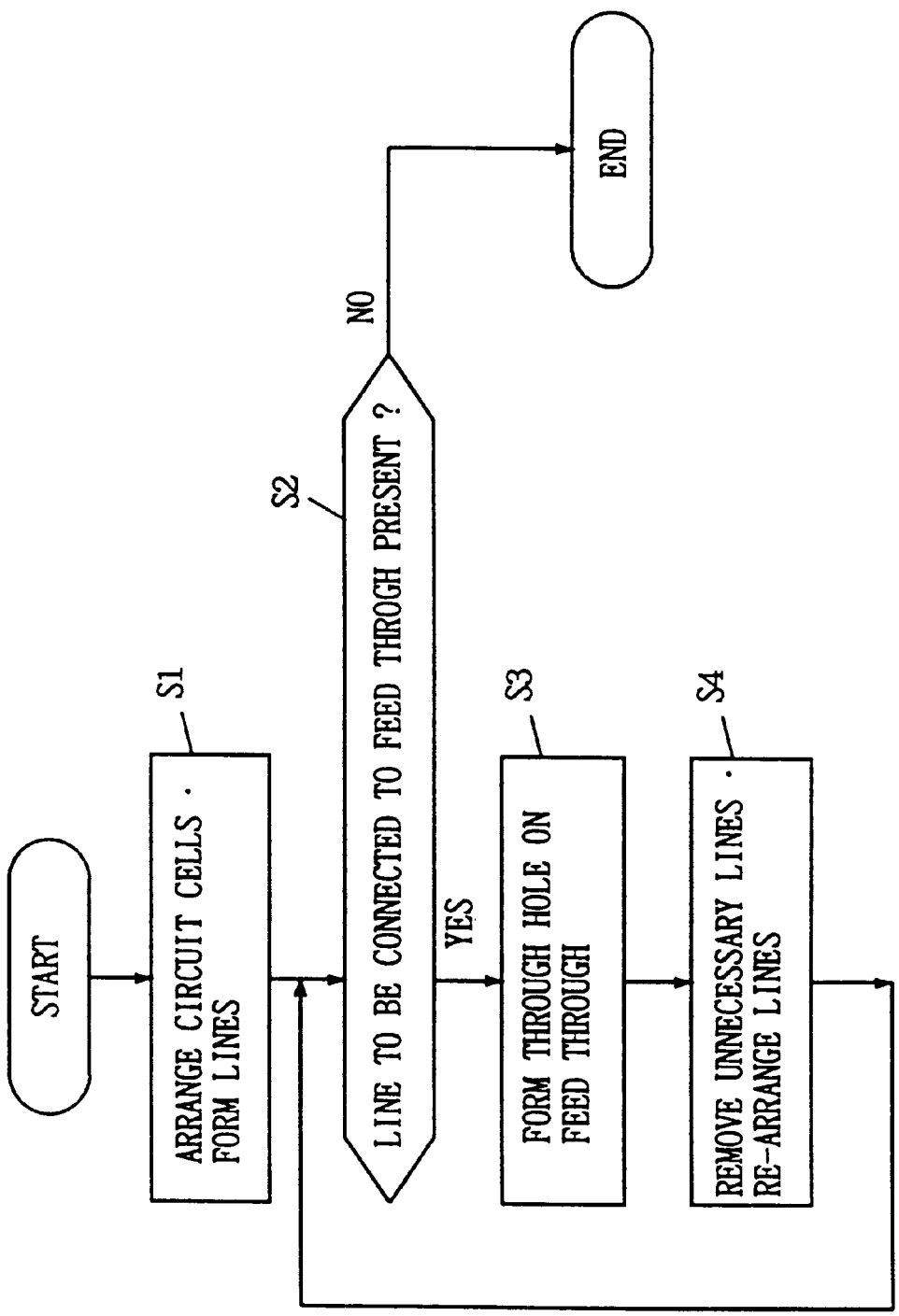
FIG. 3 is a flow chart showing a method of arrangement and interconnection of circuit cells in a semiconductor integrated circuit device in accordance with the first embodiment of the present invention.

FIG. 3 is a flow chart representing a method of implementing the line connection in accordance with the first embodiment of the present invention. The method of interconnection in accordance with the present invention will be described with reference to FIG. 3.

First, in the similar manner as in the prior art, circuit cell information, signal line information and port information are described. In accordance with the described information, arrangement and interconnection of circuit cells are provided (step S1). In forming the lines, in addition to the conventional design rule, new rules are applied, that is, (a) arrangement of a main line over a circuit cell is allowed and (b) connection between a feed through and an on-the-cell line (main line arranged over a circuit cell) is allowed in the feed through region.

After the lines are formed in step S1, whether or not there is an on-the-cell line to be connected to the feed through is determined (step S2). If there is not an on-the-cell line to be connected to the feed through, the process is terminated (circuit cells and lines are re-arranged).

Meanwhile, if there is an on-the-cell line to be connected to the feed through, a through hole is formed at a crossing between the feed through and the on-the-cell line (step S3). After the connection between the on-the-cell line and the feed through is provided, lines which become unnecessary are removed, and lines are re-arranged so as to fill empty regions of the line region caused by the removal (step S4). These steps S2 to S4 are performed for every feed through, and after all the necessary connections between the feed through and the on-the-cell lines for every feed through are completed, the process is finished. The processes in steps S2 and S3 may be performed in an interactive manner between the user and the automatic interconnection apparatus (see FIG. 67). More specifically, the feed through may be successively displayed on the screen, and the designer (user) may designate instruction indicating whether or not there is a connection to on-the-cell line for the displayed feed through by using a light pen, a mouse or a command (through keyboards). In the following, a method in which the apparatus determines whether or not there is a connection to the feed through will be described.

Figure 4:
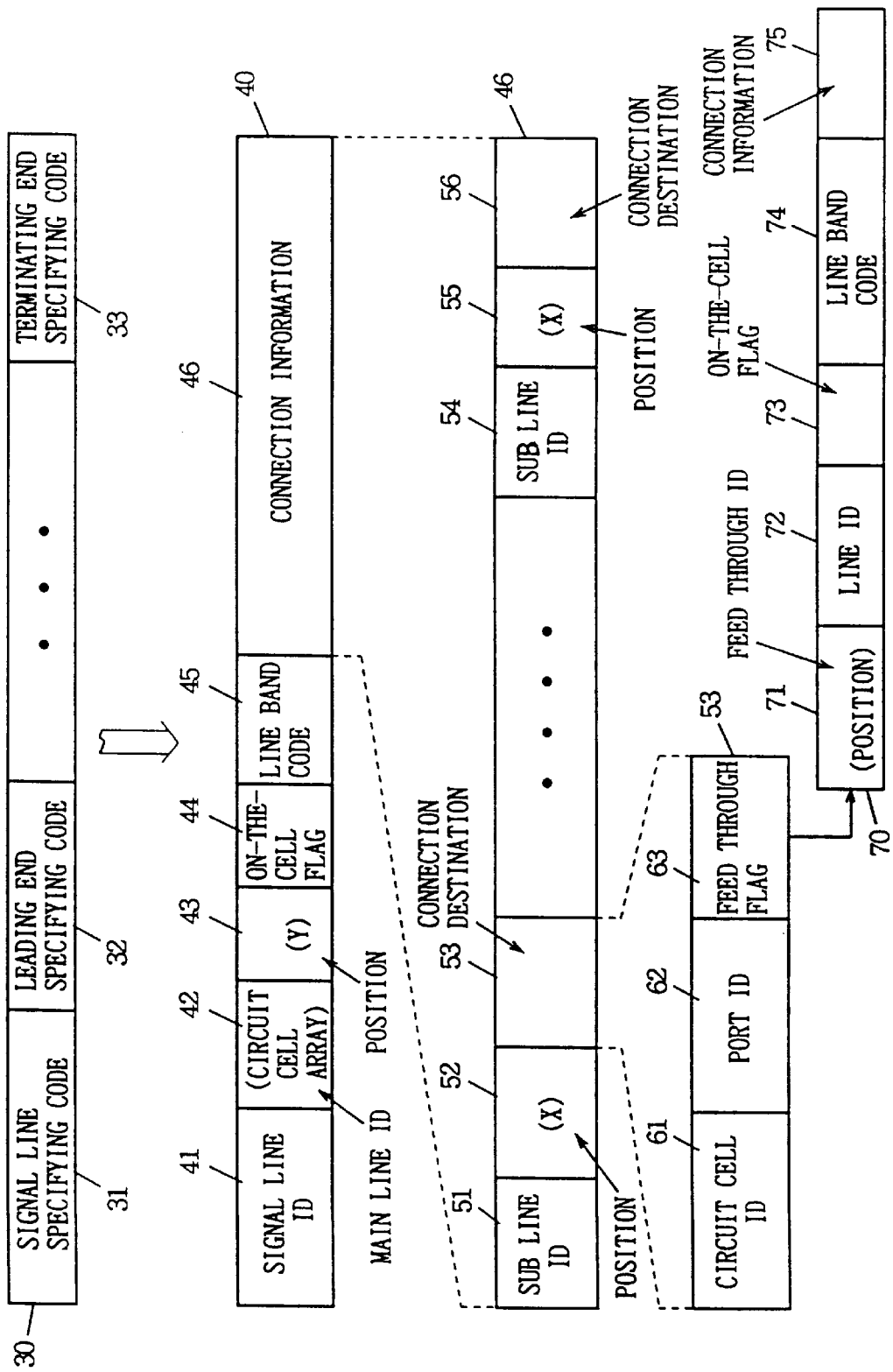
FIG. 4 illustrates data structure and operation thereof for implementing the flow of FIG. 3.

FIG. 4 shows a structure of signal line connection information. Referring to FIG. 4, based on the circuit cells specifying information, port information and signal line information input by the designer (user), connection information is formed for each signal line. The signal line information 30 includes a signal line specifying code (ID) 31 for specifying a signal line, an initial end specifying code 32 for showing a start point of the signal line, and terminal specifying code 33 for indicating destination of input of the signal line, which destinations can be provided as needed. The initial end specifying code 32 specifies either an input terminal of a circuit formed by the circuit cell or a port (output port) of the circuit cell. The terminal specifying code 33 specifies a port (input port) of the circuit cell or an output terminal of circuit formed by the circuit cell.

Based on the signal line information 30 formed by the information input by the designer (user), information for forming main lines, sub lines and feed through for implementing the connection of the signal line is formed. More specifically, from the signal line information, interconnection information 40 is formed. Interconnection information 40 includes a signal line ID 41 corresponding to the signal line specifying code 31, a main line ID 42 for specifying a main line for transmitting the signal line, a positional information 43 (of the position along the Y direction) of the main line, an on-the-cell flag 44 indicating whether or not the main line is the on-the-cell line, a line band code 45 for specifying a line band on which the main line is arranged if the main line is not the on-the-cell line, and connection information 46 including sub line information to be connected to the main line. Main line ID 42 specifies the main line, and includes information for specifying a circuit cell array for which the main line is arranged. The main line ID 42 is formed in accordance with the initial end specifying code 32.

Connection information 46 includes a sub line ID 51 for specifying a sub line connected to the main line, positional information 52 along the X direction along which the sub lines specified by the sub line ID 51 is arranged, and connection destination information 53 indicating the connection destination of the sub line. The connection information 46 is arranged by the number corresponding to the number of sub lines connected to the main line. In FIG. 4, sub line ID 54, positional information 55 and destination information 56 are further illustrated.

Connection destination information 53 includes a circuit cell ID 61 specifying the destination circuit cell, a port ID 62 specifying the destination port, and a feed through flag 63 indicating whether or not the sub line is a feed through. Determination as to whether the sub line is a feed through or not is performed in the following manner. Mainly, if a circuit cell identified by the circuit cell ID 61 specifies a circuit cell included in a circuit cell array which is different from the circuit cell array specified by the main line ID 42, the sub line is determined to be a feed through. The connection destination information is formed in accordance with the terminal specifying code 33. Therefore, destination information 53 may not specify a circuit cell but may specify an output terminal of a circuit formed by the circuit cell only.

If feed through flag 63 is set specifying that the sub line is a feed through, feed through information 70 is newly formed, and thus generated feed through information 70 is linked to the destination information 53 specified by the sub line ID 51. Feed through information 70 includes a feed through ID 71 specifying the feed through, a line ID 72 specifying a line to which the feed through is connected, a on-the-cell flag 73 indicating whether or not the line specified by the line ID is an on-the-cell line, and a line band code (ID) 74 specifying the line band to which the line belongs, if it is not the on-the-cell line. Feed through ID 71 also includes positional information with respect to the X direction. Line ID 72 similarly includes positional information with respect to the Y direction. Feed through information 70 further includes, in connection information 75, sub line information and connection information with respect to the line to which the feed through is connected. The connection information 75 is hierarchically linked for the necessary number of feed throughs, corresponding to the connection destinations.

Figure 77:
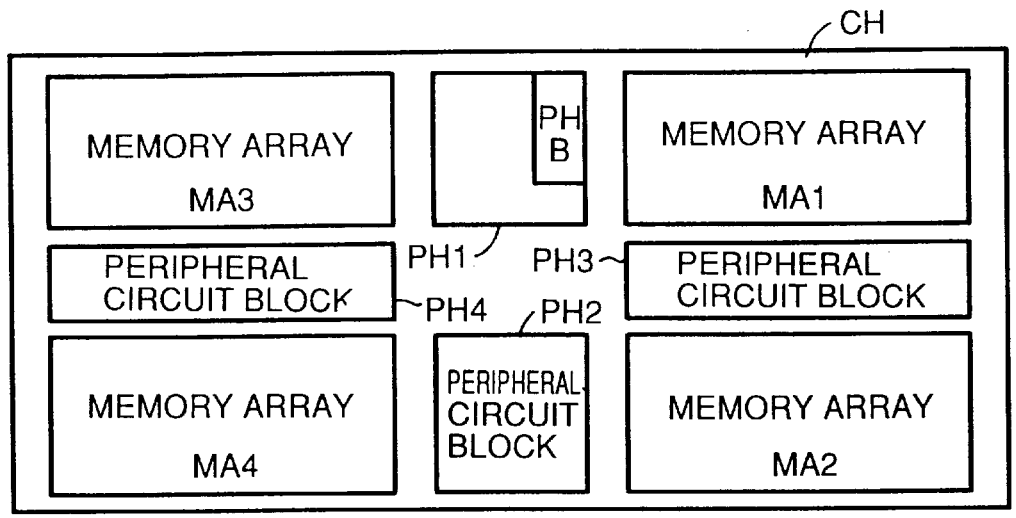
FIG. 77 schematically shows a whole structure of a semiconductor integrated circuit device to which the present invention is applied.
Figure 78:
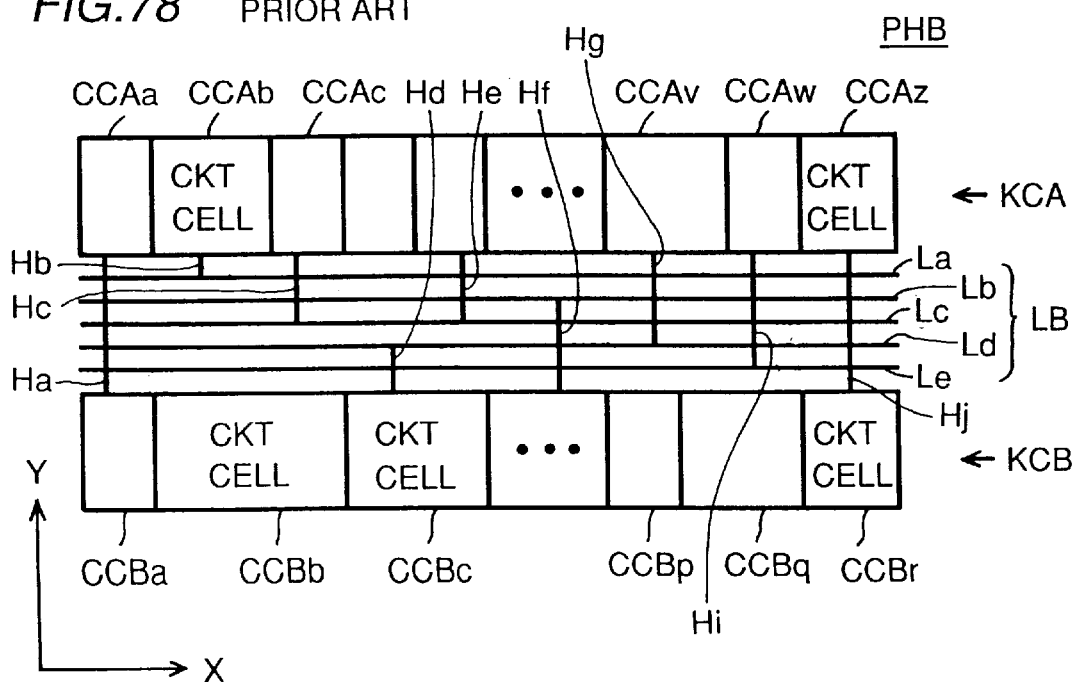
FIG. 78 schematically shows a structure of a peripheral circuit block shown in FIG. 77.
Figure 79:
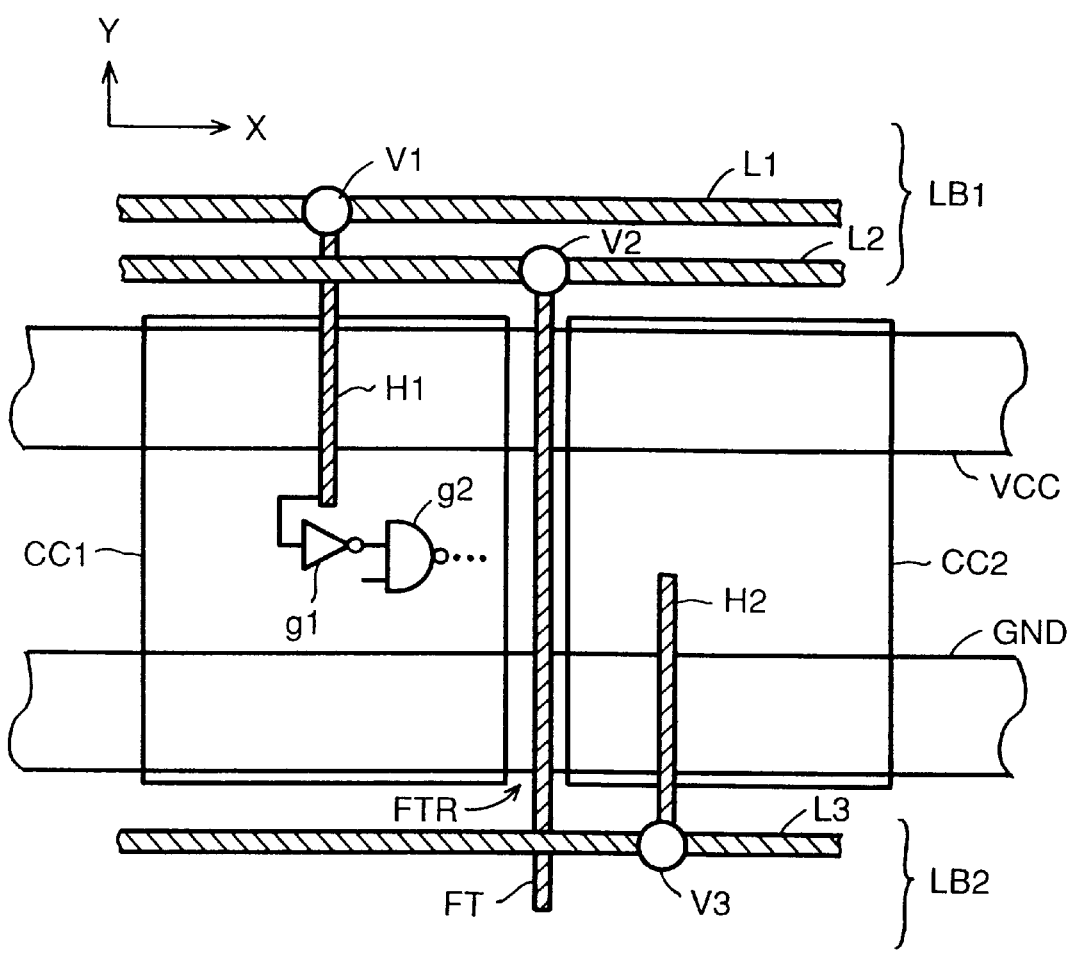
FIG. 79 schematically shows a structure of a circuit cell portion shown in FIG. 78.
Figure 80:
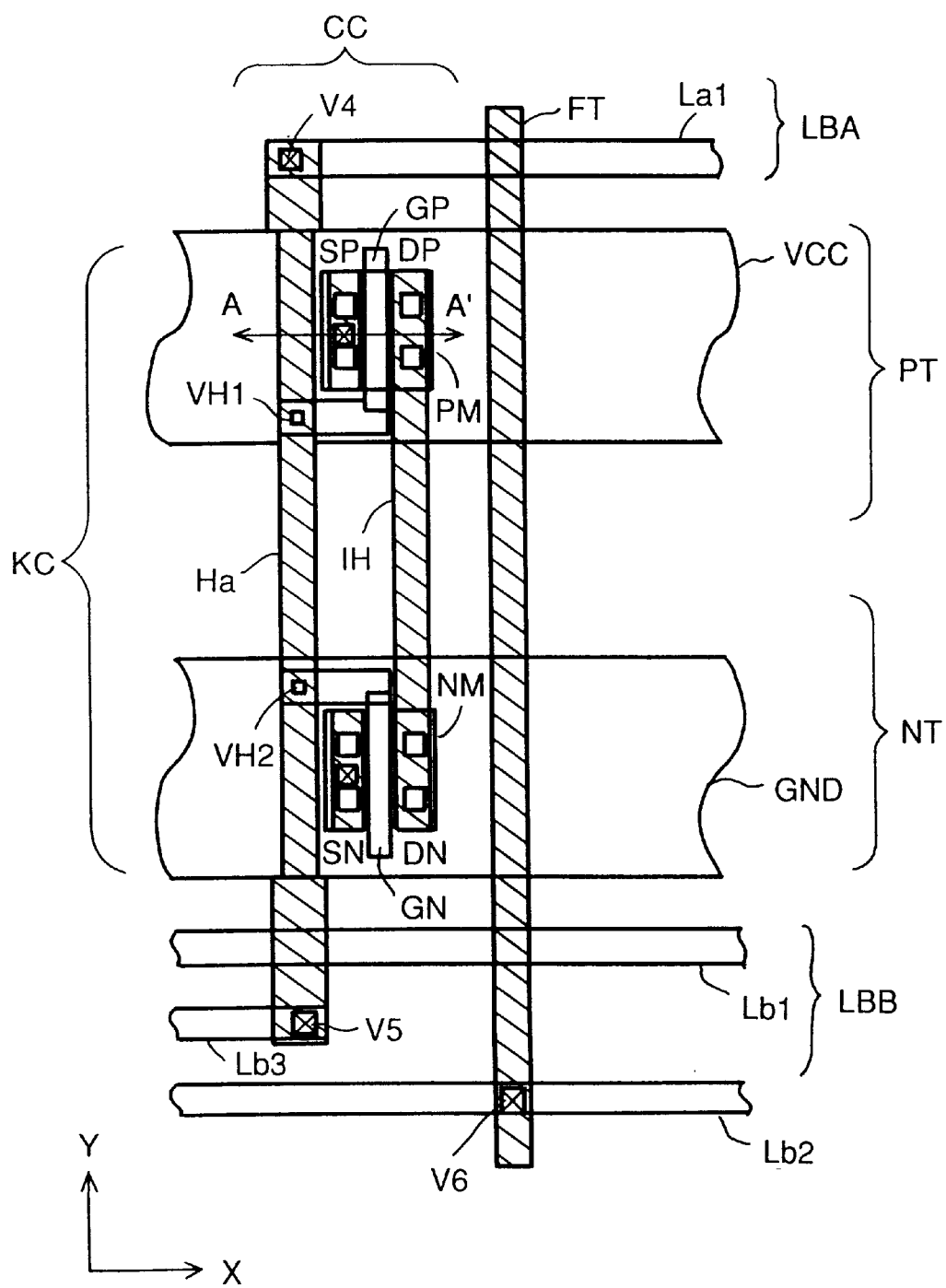
FIG. 80 shows an example of a layout of circuit cells and feed through shown in FIG. 79.
Figure 81:
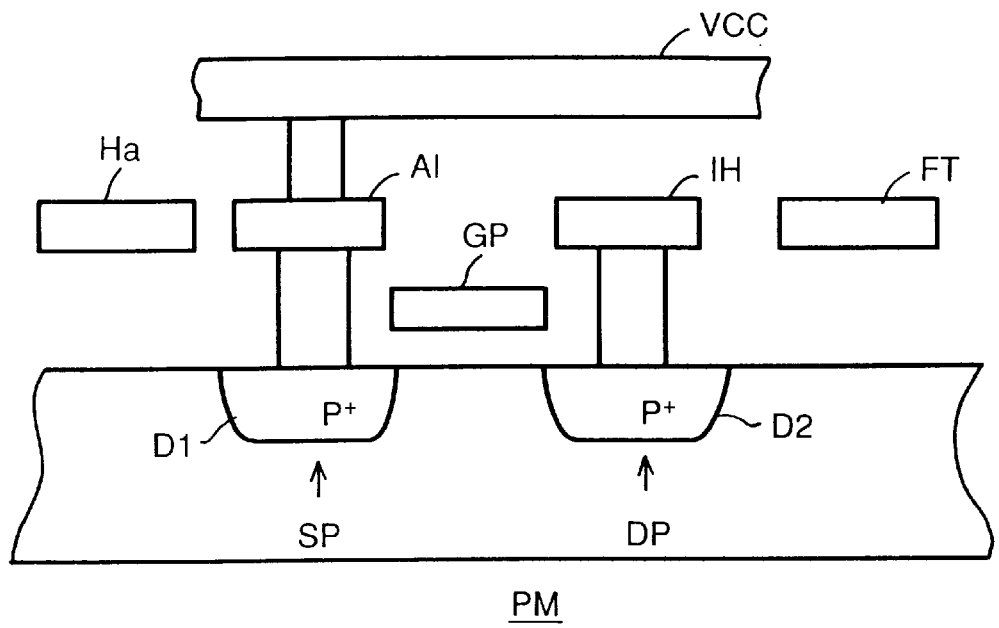
FIG. 81 schematically shows a cross sectional structure taken along the line A–A' of FIG. 80.
Figure 82:
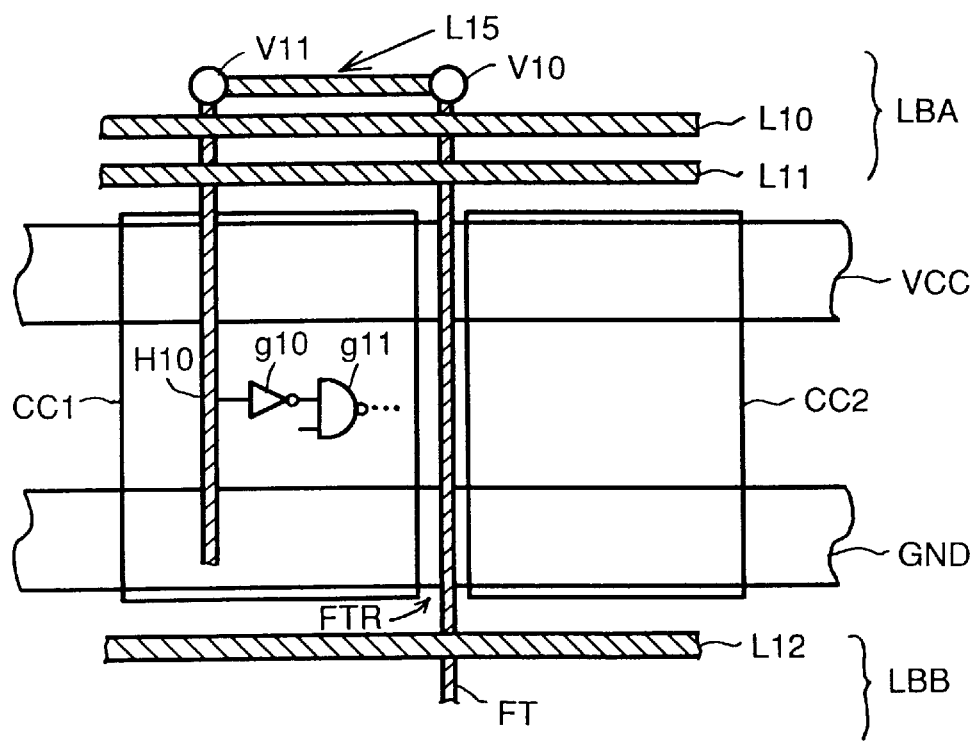
FIG. 82 is an illustration showing problems of the conventional circuit cell type semiconductor integrated circuit device.
Figure 83:
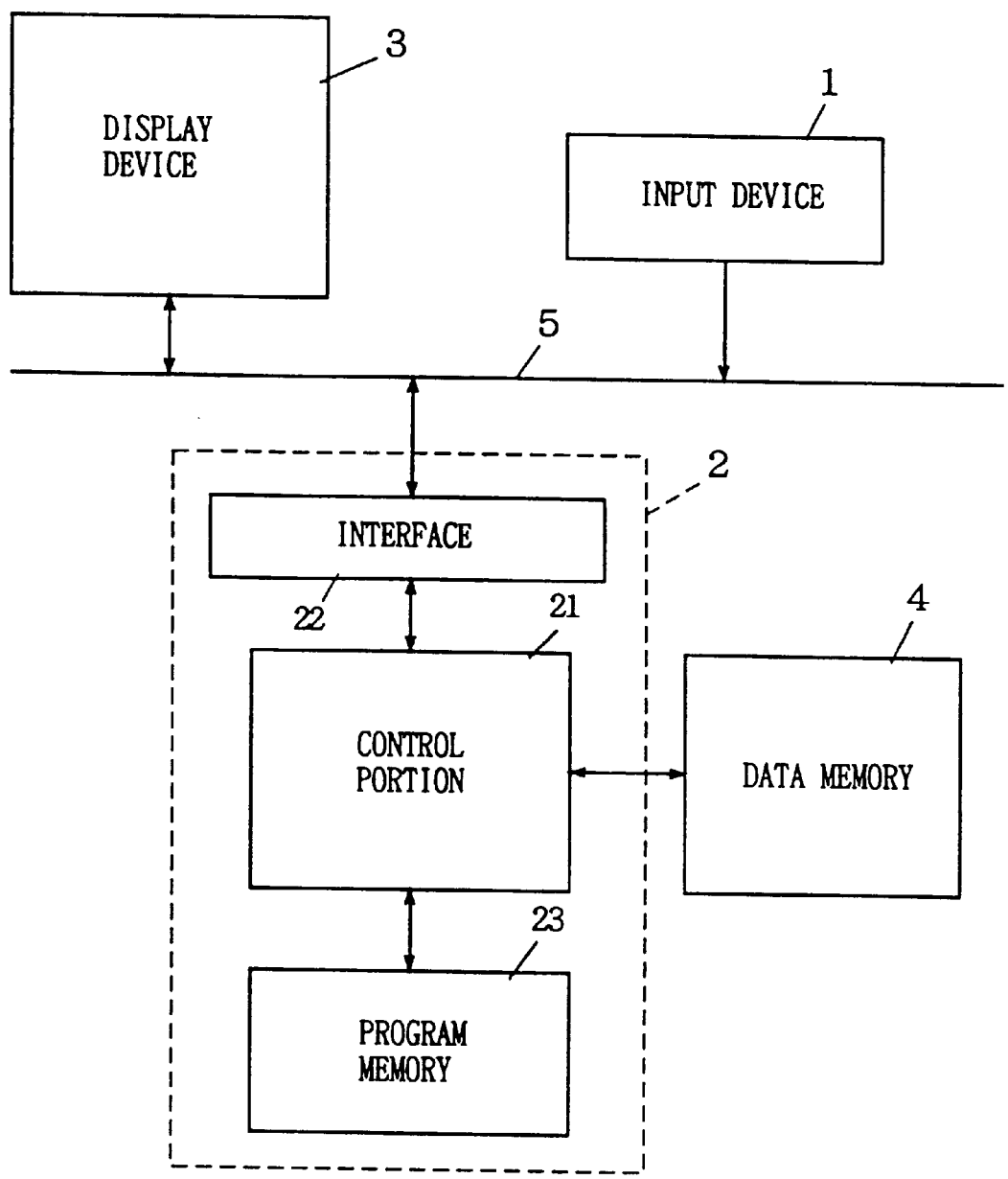
FIG. 83 schematically shows a structure of a processing device implementing the conventional automatic circuit arrangement interconnection.
Figure 84A:
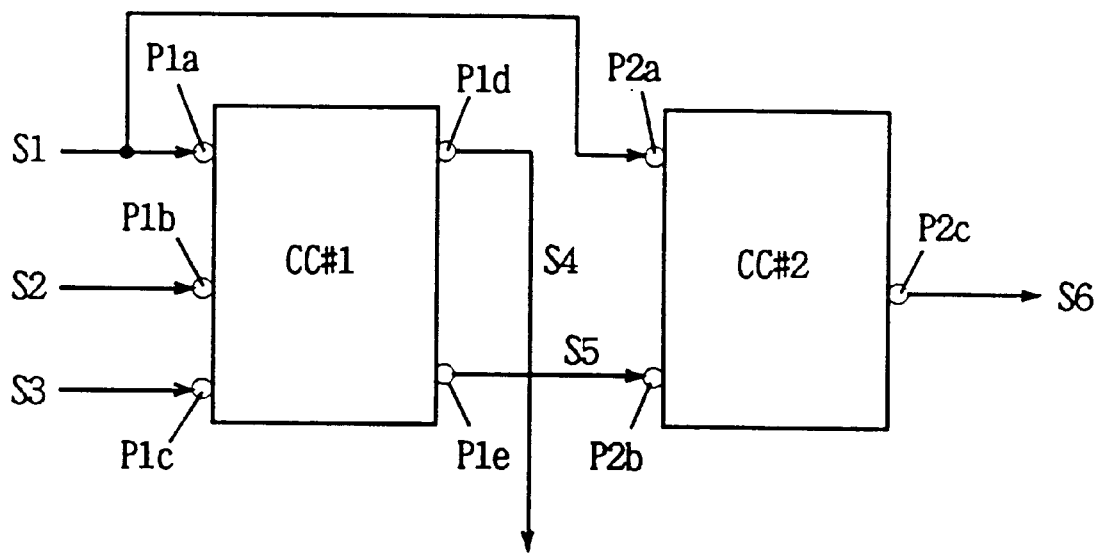
FIG. 84A is an illustration of information input by a user, in the conventional automatic arrangement interconnection apparatus.
Figure 84B:
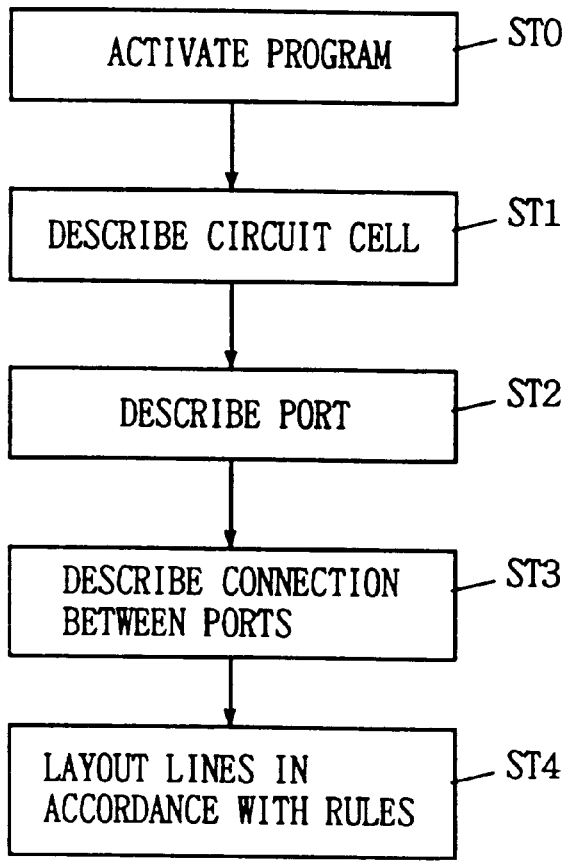
FIG. 84B shows an example of description sequence of the input information.

By forming the signal line connection information shown in FIG. 4, signal line interconnection can be formed based on the respective main line IDs, sub line IDs and connection information thereof. On the display screen of the display device shown in FIG. 77, interconnection formed in accordance with the connection information is displayed. Control operation when the feed through is connected to an on-the-cell line will be described with reference to FIG. 5, which is the flow chart of this operation. The control operation shown in FIG. 5 is executed in accordance with a program memory in the control portion 21 shown in FIG. 77.

First, based on signal line information 30 input by a designer (user), connection path of the signal lines is extracted (step S6). By the step S6, signal connection information 40 shown in FIG. 4 is formed. Thereafter, in accordance with the thus formed signal line information, a feed through is extracted (step S7). Extraction of the feed through is performed by checking whether or not feed through flag 60 is set. Thereafter, a connection path of the extracted feed through is extracted in accordance with the feed through information 70 (step S8). In the connection path of the feed through, dependent on whether or not an on-the-cell flag 73 is set, whether or not there is an on-the-cell line to be connected to the feed through is determined (step S9). If it is determined that there is an on-the-cell line, the connection is formed, and connection thereof is displayed on the screen of the display device (step S10). As to whether the feed through and the on-the-cell line are connected or not, such a rule may be applied that when a line is shown to be connected to a circuit cell of a circuit cell array associated with the line in the feed through connection information 70, the on-the-cell line is used as the line.

In utilizing the on-the-cell lines, a rule may be applied that all the lines connected to the feed through are on-the-cell lines, and a rule that when the number of ports of the circuit cell exceeds a prescribed number and arrangement of sub lines becomes difficult, the on-the-cell lines are utilized, may be applied.

Figure 5:
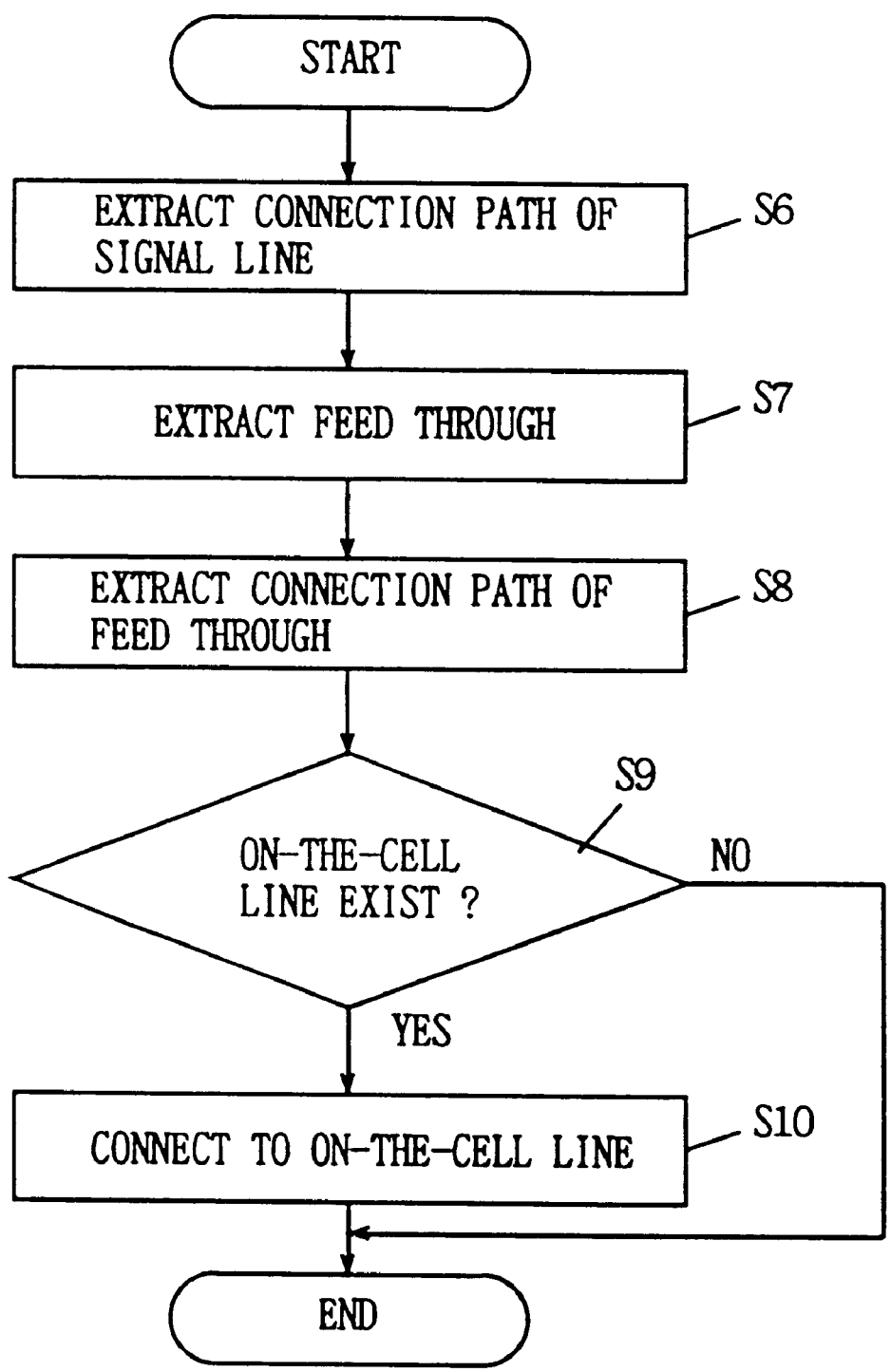
FIG. 5 is a flow chart showing in greater detail the sequence of forming connection of feed through shown in FIG. 3.

By the series of operations shown in FIG. 5, a line connection path for the connection between the on-the-cell line and the feed through and for the signal lines is established. The established signal line connection path is displayed on the screen of the display device. The process operation of removing unnecessary lines and rearrangement of lines shown in FIG. 3 (step S4) will be described.

Figure 6A:
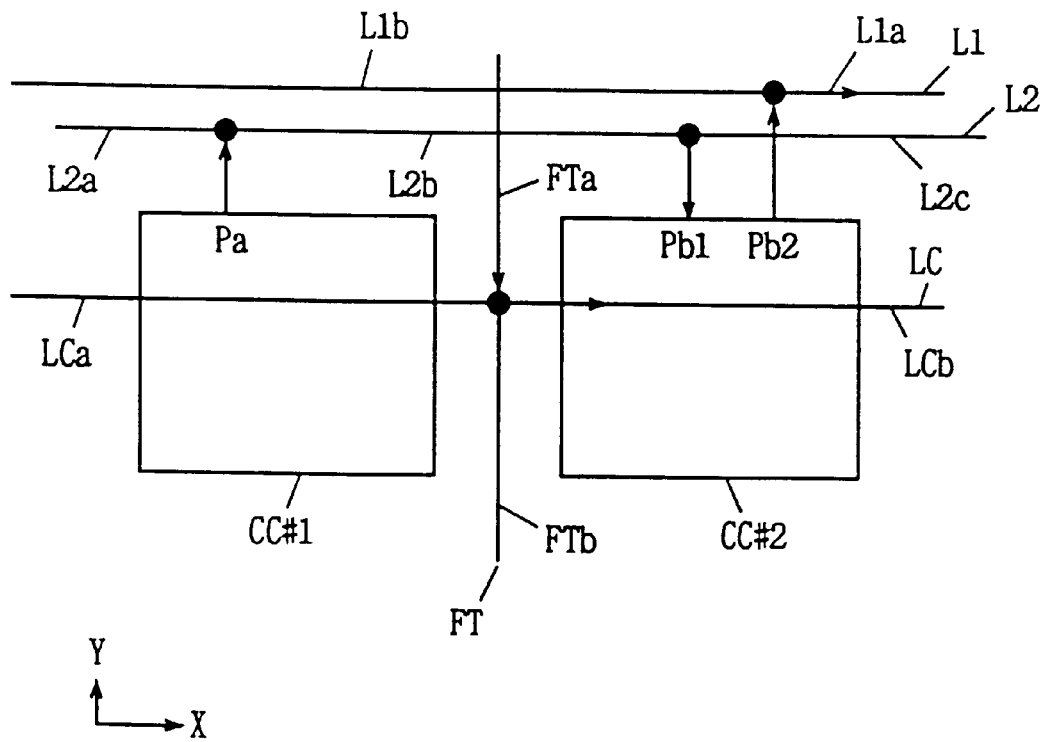
FIGS. 6A and 6B illustrate manner of arrangement and interconnection of circuit cells in accordance with the first embodiment of the present invention.
Figure 6B:
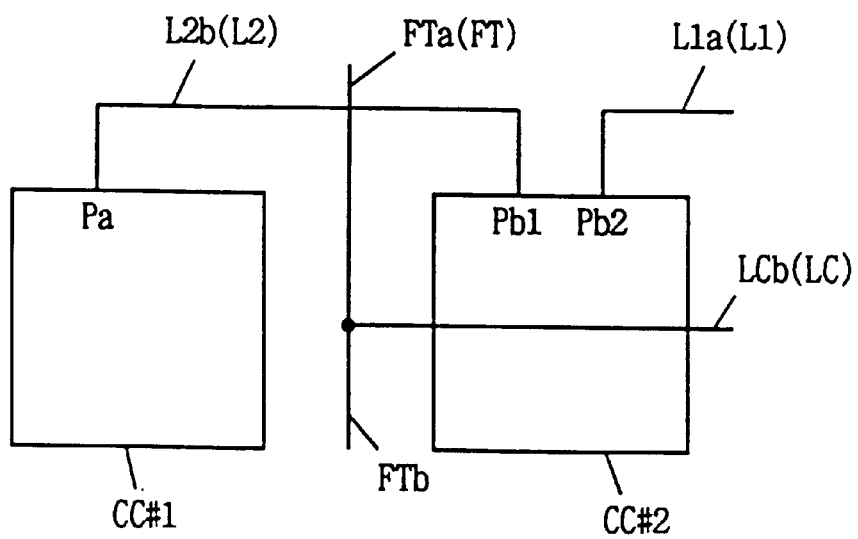

FIGS. 6A and 6B are illustrations of the operation for removing unnecessary lines and rearrangement of the lines. FIG. 6A shows a state of removing unnecessary lines and FIG. 6B shows the manner of connection of the lines after re-arrangement.

Let us consider a state shown in FIG. 6A, in which port Pa of circuit cell CC#1 is connected to port Pb1 of circuit cell CC#2 by main line L2, main line L1 is connected to port Pb2 of circuit cell CC#2 and feed through FT is connected to on-the-cell line LC.

Generally, the feed through is arranged passing entirely through the feed through region along the Y direction. Main line is also arranged over the entire region along the X direction. For main lines L1 and L2, connection points are formed in accordance with connection information of sub lines, respectively. In the arrangement shown in FIG. 6A, in main line L1, if signal from port Pb2 is transmitted to segment L1a and signal is not at all transmitted to segment L1b, segment L1b is determined to be an unnecessary line. The determination can be done by successively tracing the initial end and terminating end of positional information of the main line L1. In information 40 shown in FIG. 4, it is identified by referring to the first sub line of connection information 46 and 75 (the sub line having the smallest value of positional information (X) 52 (or, alternatively, the sub line ID 51 may indicate the input terminal of the circuit itself) to the information of the sub line having the largest value in the X direction of the last positional information 55.

As for the main line L2, ports Pa and Pb1 are connected to each other by means of segment L2b, segments L2a and L2c are unnecessary, and therefore segments L2a and L2c are removed as unnecessary lines. As for the feed through FT, segment Lca transmits a signal to segment Lcb of on-the-cell line LC through the node. Therefore, segment LCa on the on-the-cell line LC is removed as unnecessary line. The removal information is arranged linked to each main line (in other words, positional information of leading point and terminating point are provided). Thus, unnecessary lines are removed.

Then, referring to FIG. 6B, re-arrangement of the lines with the unnecessary lines removed is performed. In this case, in each line band, leading point and terminating point information of main lines are compared, and for the main lines having regions not overlapped with each other, positional information (positional information along the Y direction) is changed, and the same positional information with respect to the Y direction is added. Main line ID for identifying another main line is maintained. Thus lines are re-arranged, main lines not overlapping with each other are arranged at the same position along the Y direction, and hence line region can be reduced.

A structure may be used in which removal of unnecessary lines and re-arrangement of lines are performed in interactive manner by the designer (user) while monitoring the screen of the display device.

In this manner, according to the first embodiment of the present invention, provision of a connection hole in the feed through region is allowed, a region on the circuit cell between the power supply line and the ground line is utilized as an interconnection region, and the feed through and the on-the-cell line are physically connected in the feed through region. Therefore, it becomes unnecessary to form a line for changing substantial position of the feed through, whereby the area occupied by lines can be reduced.

Embodiment 2

Figure 7:
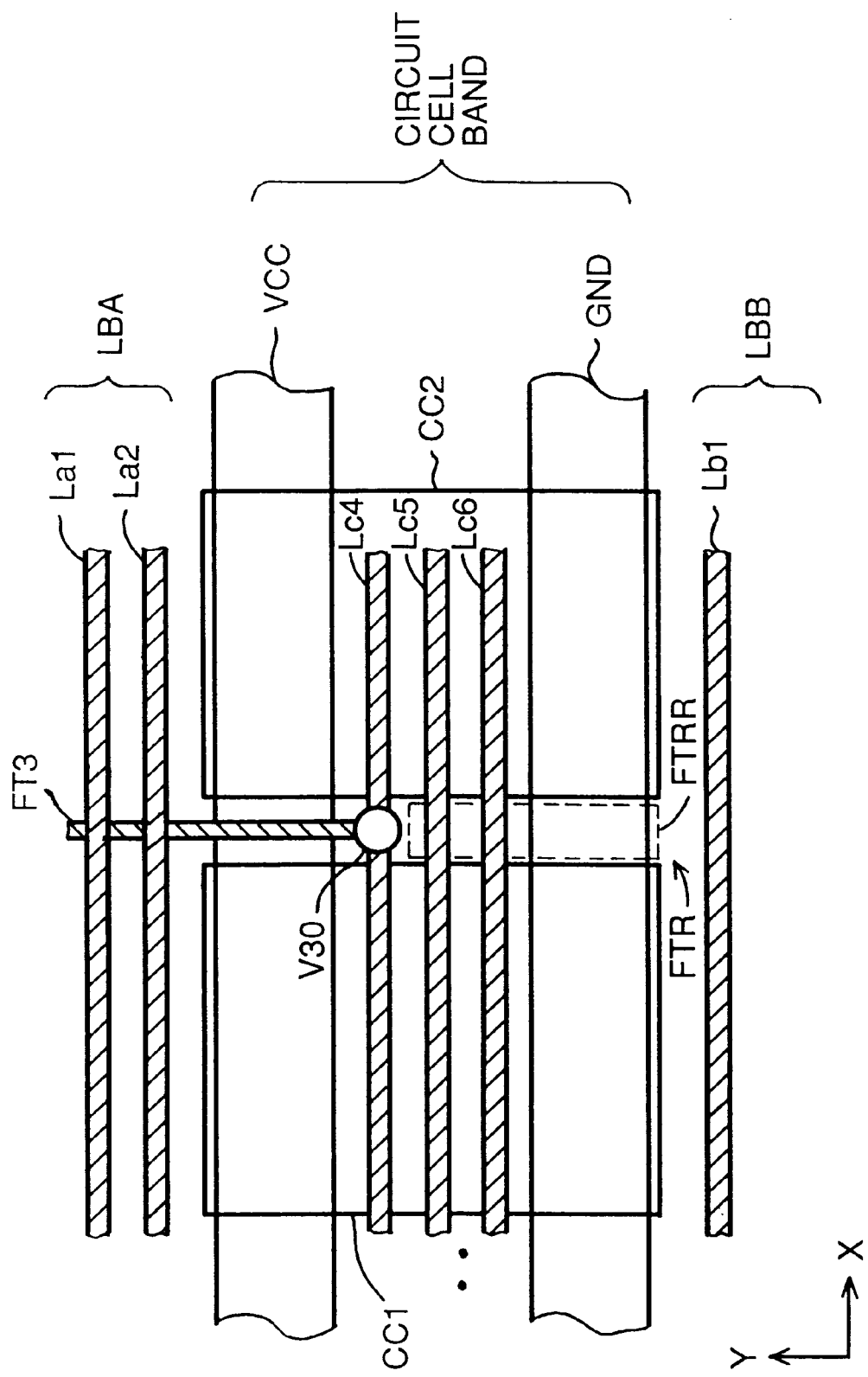
FIG. 7 schematically shows a structure of a main portion of a semiconductor integrated circuit device in accordance with a second embodiment of the present invention.

FIG. 7 shows a structure of a main portion of a semiconductor integrated circuit device in accordance with a second embodiment of the present invention. FIG. 7 shows a portion of a feed through region FTR between two circuit cells CC1 and CC2 as a representative. In the second embodiment, on both sides of circuit cells CC1 and CC2 along the Y direction, line bands LBA and LBB are arranged. Line band LBA includes, as an example, two main lines La1 and LA2, while line band LBB includes a main line Lb1. Along the direction of alignment of circuit cells CC1 and CC2, that is, along the X direction, power supply line VCC and ground line GND are arranged on circuit cell CC1 and CC2 forming regions. Between power supply line VCC and ground line GND, on-the-cell lines Lc4, Lc5 and Lc6 are arranged, which lines are formed in the same interconnection layer as the power supply line VCC and the ground line GND.

In feed through region FTR, a feed through FT3 is arranged. The feed through FT3 is connected to on-the-cell line Lc4 by means of a connection hole V30 in the feed through region FTR. The feed through FT3 terminates at the portion of the connection hole V30. More specifically, in the region FTRR denoted by the dotted lines in feed through region FTR, a line extending in the Y direction is not formed. Though not explicitly shown, on-the-cell line Lc4 is connected to an internal node of a destination circuit cell. The on-the-cell line Lc4 may be connected to an internal node of a circuit cell CC1 and/or CC2.

What is required of the feed through FT3 is simply a physical connection to on-the-cell line Lc4. Therefore, it is not necessary for the feed through to be connected to a circuit cell of another circuit cell over the line band LBB or a main line included in line band LBB. By extending feed through FT3 only to the portion necessary, as shown in FIG. 3, unnecessary line portion can be eliminated, interconnection layout can be simplified, and stray capacitance on the unnecessary line can be reduced. At this time, in the region FTRR in the feed through region FT3, after the circuit cell layout is completed, a gate circuit which is newly required may be arranged, and the newly formed gate circuit may be interconnected by using a line belonging to the same layer as the internal interconnection layer of the circuit cell, and hence change in circuit designs can be readily accommodated. The gate circuit formed in the region FTRR may be connected to the on-the-cell line or to the feed through.

Modification

Figure 8:
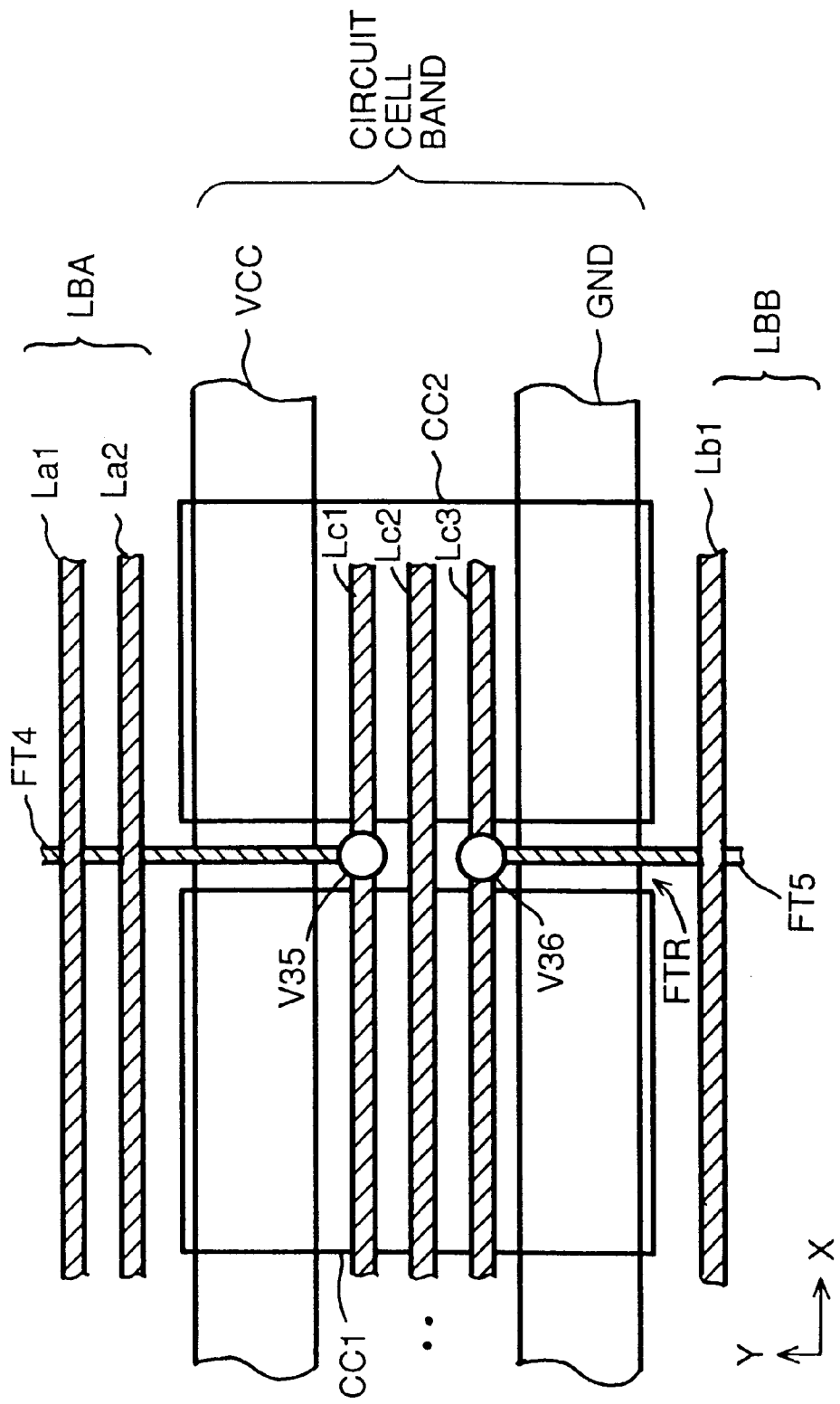
FIG. 8 shows a modification of the second embodiment of the present invention.

FIG. 8 shows a modification of the second embodiment of the present invention. In FIG. 8, feed throughs FT4 and FT5 as two divided feed throughs are arranged in one feed through region FTR. Feed through FT4 has an end connected to a line in line band LBA or passes over line band LBA to have an end connected to a circuit cell of another circuit cell band or over said another circuit cell band to have an end physically connected to another line band, and the other end physically connected to an on-the-cell line Lc1 by means of a connection hole V35 formed in the feed through region FTR. Feed through FT5 has one end connected to a line in line band LBB or to a circuit cell of another circuit cell band over the line band LBB or to another line band of said another circuit cell over the circuit cell band, and has the other end physically connected to an on-the-cell line Lc3 through a connection hole V36 formed in feed through region FTR. Feed throughs FT4 and FT5 are arranged along the Y direction in the feed through region FTR.

As the feed throughs FT4 and FT5 are terminated at portions of contact holes V35 and V36 formed in feed through region FTR, two feed throughs can be arranged only by forming a feed through region having the area required for one feed through. Accordingly, the area occupied by the feed through region can be reduced, and accordingly, the area occupied by the circuit cell band or the circuit block can be reduced.

As in the arrangement shown in FIG. 3, on-the-cell lines Lc1 to Lc3 are formed in a region between the power supply line VCC and the ground line GND on circuit cells CC1 and CC2 by the same interconnection layer as the power supply line VCC and the ground line GND, and extend along the X direction. The on-the-cell lines Lc1 to Lc3 are connected to internal nodes of appropriate circuit cells. The appropriate circuit cells may be circuit cell CC1 and/or CC2.

Figure 9:
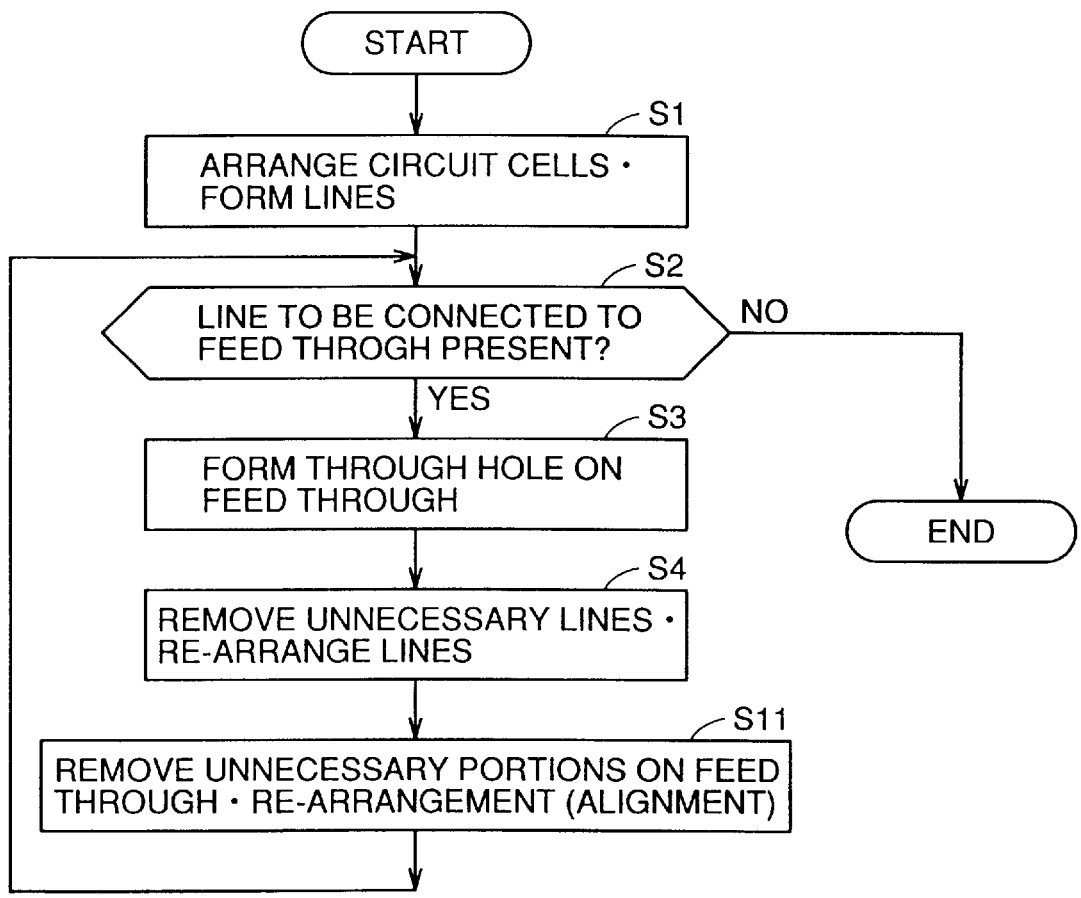
FIG. 9 is a flow chart showing a sequence of arrangement and interconnection operation in accordance with the second embodiment of the present invention.

FIG. 9 is a flow chart showing process sequence of interconnection in accordance with the second embodiment of the present invention. In the process sequence shown in FIG. 9, in addition to the process sequence shown in FIG. 3, removal of unnecessary line on the feed through and re-arrangement of the feed through (alignment along the Y direction) are performed, after the step S4. Except this point, the process sequence is the same as that shown in FIG. 3, and corresponding portions are denoted by the same step numbers. Removal of unnecessary portions and re-arrangement of the feed through may be performed in interactive manner by the designer (user) using a display screen of the display device, with the processing apparatus. In the following, a method in which the processing apparatus itself performs this processing without the necessity of waiting for the instruction from the designer (user) will be described.

Figure 10A:
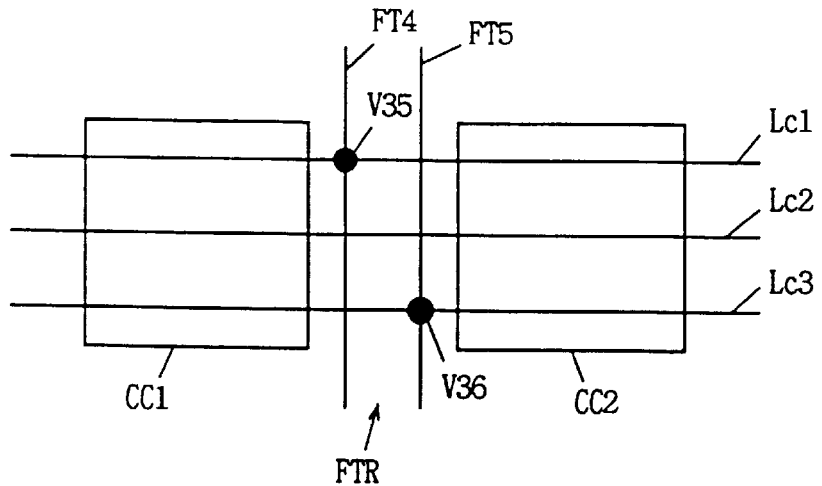
FIGS. 10A to 10C illustrate a method of arranging lines in accordance with the second embodiment of the present invention.
Figure 10B:
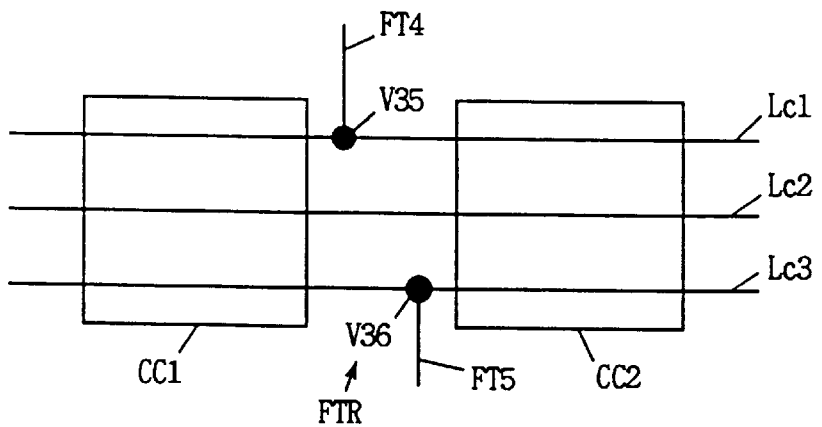
Figure 10C:
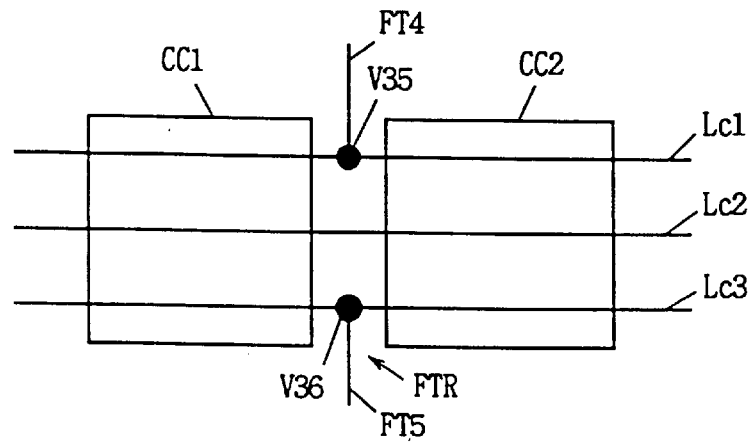

FIGS. 10A to 10C show, as an example, the sequence of re-arrangement of the feed through shown in FIG. 8.

First, as shown in FIG. 10A, in accordance with the signal line connection information, feed through FT4 is physically connected to on-the-cell line Lc1 via a connection hole V35, and feed through FT5 is connected to on-the-cell line Lc3 via connection hole V36. The feed throughs FT4 and FT5 are arranged parallel along the Y direction in feed through region FTR.

Then, as shown in FIG. 10B, in accordance with feed through connection information, unnecessary portions of feed throughs FT4 and FT5 are removed. In FIG. 10, lower portion of feed through FT4 and upper portion of feed through FT5 are removed.

Then, referring to FIG. 10C, as the feed throughs FT4 and FT5 extend in opposite directions, these are aligned along the Y direction.

Figure 11:
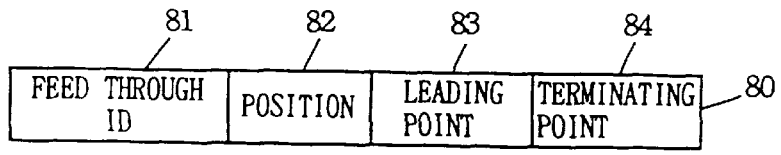
FIG. 11 shows a data structure for eliminating unnecessary portions of the feed through shown in FIG. 10.

FIG. 11 shows a data structure used for implementing re-arrangement of the feed through. As shown in FIG. 11, feed through connection information 80 is formed from the feed through connection information shown in FIG. 4. The feed through connection information 80 includes a feed through ID 81 specifying the feed through, a positional information 82 indicating the position of the feed through, a leading point information 83 showing the start point of the feed through and a terminating point information 84 showing the terminating point of the feed through. The leading point information 83 and the terminating point information 84 may be the on-the-cell line, the main line or the port of the circuit cell. Preferably, a point having smaller value of position along the Y direction is set as the leading point. Positional information 82 includes information for specifying the feed through region which includes the feed through specified by the feed through ID 81, and positional relation in the feed through region or along the Y direction in the whole circuit. By using the leading point information 83 and the terminating point information 84, whether or not the feed through is to be terminated on the on-the-cell line is determined.

Figure 12:
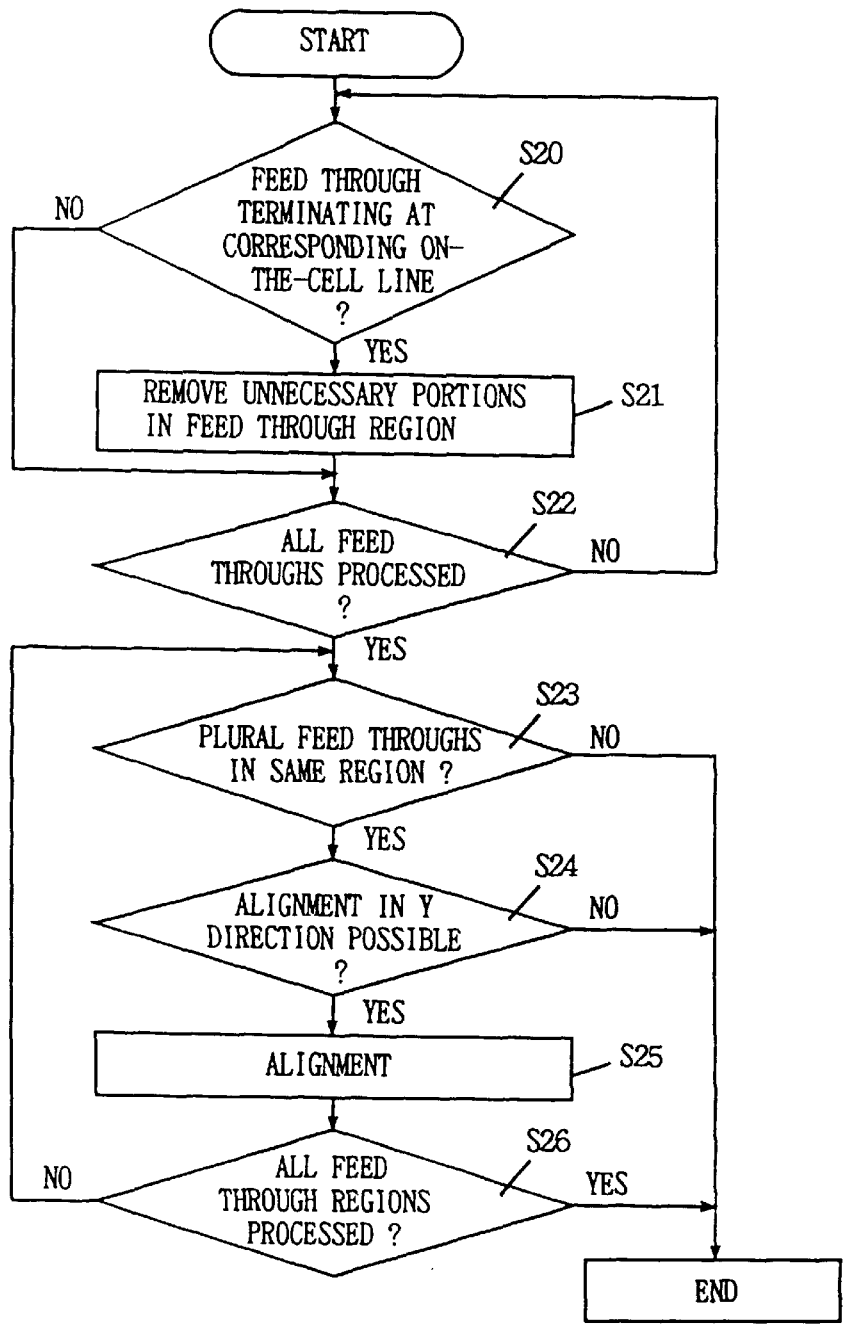
FIG. 12 is a flow chart showing a process sequence of removing unnecessary portions of the feed through in accordance with the second embodiment of the present invention.

FIG. 12 is a flow chart showing a process sequence for executing re-arrangement of the feed through by using the feed through connection information 84 shown in FIG. 11. When there is an instruction of re-arrangement of the feed through, whether or not the feed through is terminated on the on-the-cell line is determined for each feed through (S20). Whether or not it terminates on the on-the-cell line is determined by confirming whether the leading point information 83 or the terminating point information 84 designates the on-the-cell line. If it is determined that the feed through is terminated on the on-the-cell line, unnecessary portion in the feed through region is removed (step S21). The information for removing unnecessary portion is defined by adding a flag to the feed through connection information 80 (flag not shown). This process is executed for every feed through (step S22). In step S22, if it is determined that the process for every feed through is completed (unnecessary portion removed), whether or not there is a plurality of feed throughs in the same feed through region is determined (step S23). This is done by extracting a feed through region specifying information included in positional information 82. When there is a plurality of feed throughs existing in the same feed through region, whether or not there are feed throughs which can be aligned along the Y direction is determined, by identifying whether or not there is an overlapping region in the leading point information 83 and the terminating point information 84 (step S24).

If it is determined that the feed throughs can be aligned along the Y direction, the feed throughs which can be aligned are aligned (step S25). In this alignment process, position information of the positional information 82 (position in the feed through region or the position along the X direction in the whole circuit) is updated. Then, the flow proceeds to step S26 in which whether or not process for every feed through region has been completed is determined, and processes from steps S23 to S25 are executed for every feed through region. If the processes for all the feed through regions are completed, the process for removing unnecessary portion and re-arrangement of the feed throughs are completed. In steps S23 and S24, if there is one feed through existing in the feed through region or even when there are a plurality of feed throughs, they extend in the same direction and cannot be aligned along the Y direction, the alignment process is not performed and the process is completed.

Thereafter, in accordance with a flow not shown, re-arrangement of circuit cells in the circuit cell array (band) is performed, so as to reduce the width along the X direction of the feed through region.

By the above-described series of processes, the processing of the divided feed throughs can be easily performed.

As described above, in accordance with the second embodiment of the present invention, the on-the-cell lines and the feed throughs are physically connected in the feed through region and the feed through is terminated at the connection hole portion. Therefore, in the remaining portion of the feed through region, a line belonging to the same interconnection layer as the feed through can be arranged, and thus efficiency in using area can be improved. Especially, as the divided feed throughs are arranged along the Y direction (feed throughs terminating in the feed through region), the area necessary for the feed throughs can be reduced and the layout area of the circuit can be reduced.

Embodiment 3

Figure 13:
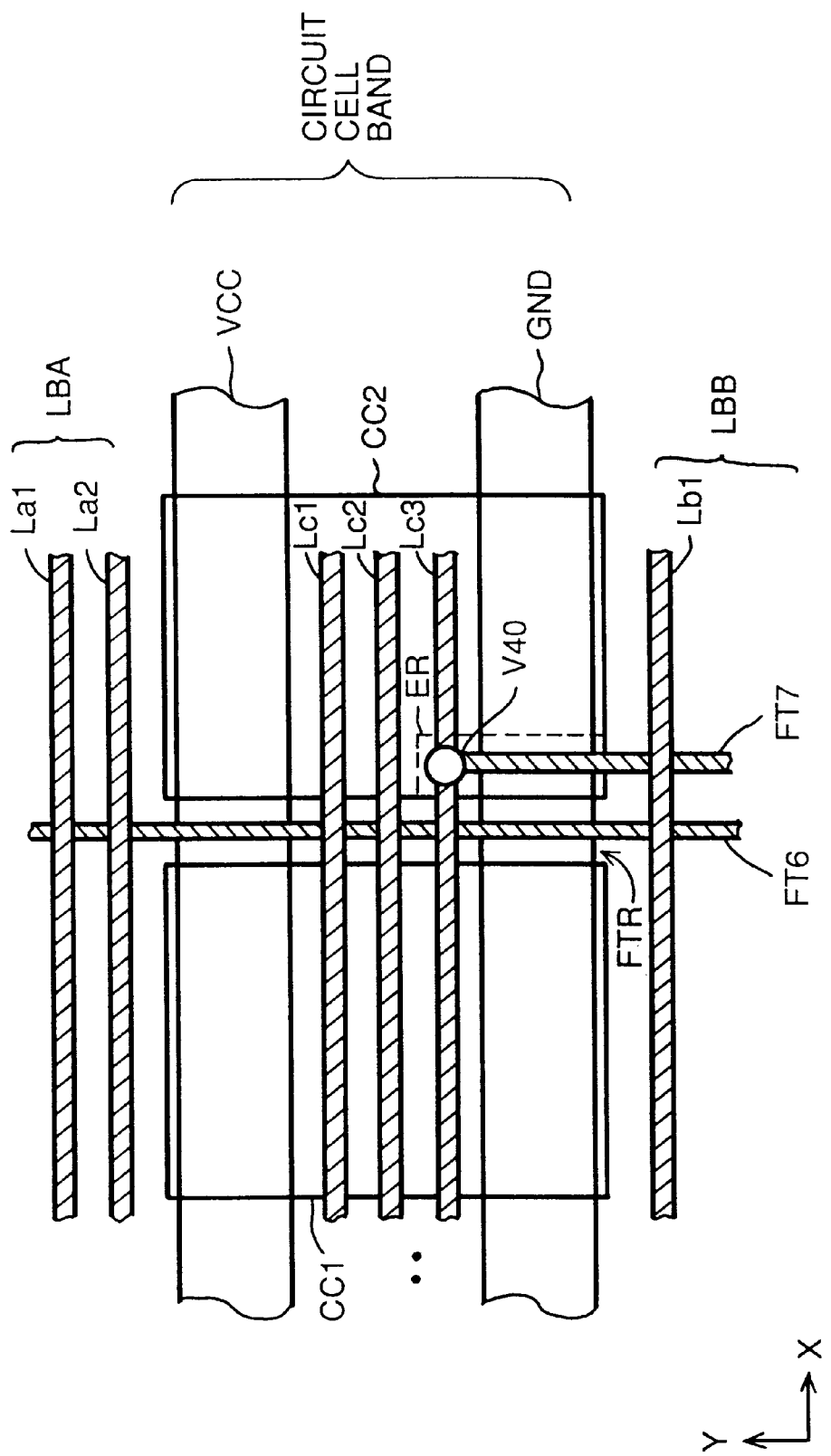
FIG. 13 schematically shows a structure of a main portion of a semiconductor integrated circuit device in accordance with a third embodiment of the present invention.

FIG. 13 shows a structure of a main portion of a semiconductor integrated circuit device in accordance with a third embodiment of the present invention. As in the embodiment described above, FIG. 13 shows a portion of a feed through region FTR formed between two circuit cells CC1 and CC2 as a representative. Similar to the embodiments above, on-the-cell lines Lc1 to Lc3 are arranged along the X direction, between the power supply line VCC and the ground line GND for the circuit cell band. On both sides in Y direction of the circuit cell band including circuit cells CC1 and CC2, line bands LBA and LBB are arranged.

In feed through region FTR, a feed through FT6 passing through the feed through region FTR is arranged. The feed through FT6 is connected to a circuit cell not shown, or to a line in a line band.

As will be described in greater detail later, circuit cell CC2 has an empty region ER which is a region on which transistor element is not formed, or a region on which internal lines are not formed. A feed through FT7 extends over line band LBB to the empty region ER. Feed through FT7 is physically connected to on-the-cell line Lc3 via connection hole V40 on the empty region ER. On-the-cell lines Lc1 to Lc3 are respectively connected to internal nodes of appropriate circuit cells (connection not shown).

By utilizing the empty region ER existing in circuit cell CC2, feed through FT7 and on-the-cell line LC3 are physically connected on the empty region ER, whereby two feed throughs can be arranged without increasing the area of the feed through region FTR (width along the X direction) for one feed through, and hence area occupied by the lines can be reduced.

The feed through FT6 extending over the feed through region FTR may be a divided feed through which extends from the same side as feed through FT7 and physically connected to and terminating at the on-the-cell line in the feed through region FTR. The empty region will be described.

As already described with reference to FIG. 74, a circuit cell includes a p channel MOS transistor forming region PT near (below) the power supply line VCC, and an n channel MOS transistor forming region NT provided near (below) the ground line GND. Generally, in p channel MOS transistor, mobility of carriers is smaller than in an n channel MOS transistor and therefore, the current drivability per unit gate width thereof is small. Therefore, when a CMOS gate is fabricated, in order to set the current drivability of the p channel MOS transistor to be the same as that of n channel MOS transistor so as to provide the same discharging/charging rate at the output node of the CMOS gate, the gate width of the p channel MOS transistor is generally made larger than that of n channel MOS transistor. Generally, adjustment of the current drivability is realized by setting gate widths (or channels widths) differently for these transistors.

Now, for the simplicity of description, assume that p channel MOS unit transistors Pa, Pb and Pc having the same size (same gate width and gate length) are formed in the p channel MOS transistor forming region PT, an n channel MOS unit transistor Na having the same size as p channel MOS unit transistors Pa to Pc is formed in the n channel MOS transistor forming region NT, and by these unit transistors, a CMOS inverter is provided.

Figure 14A:
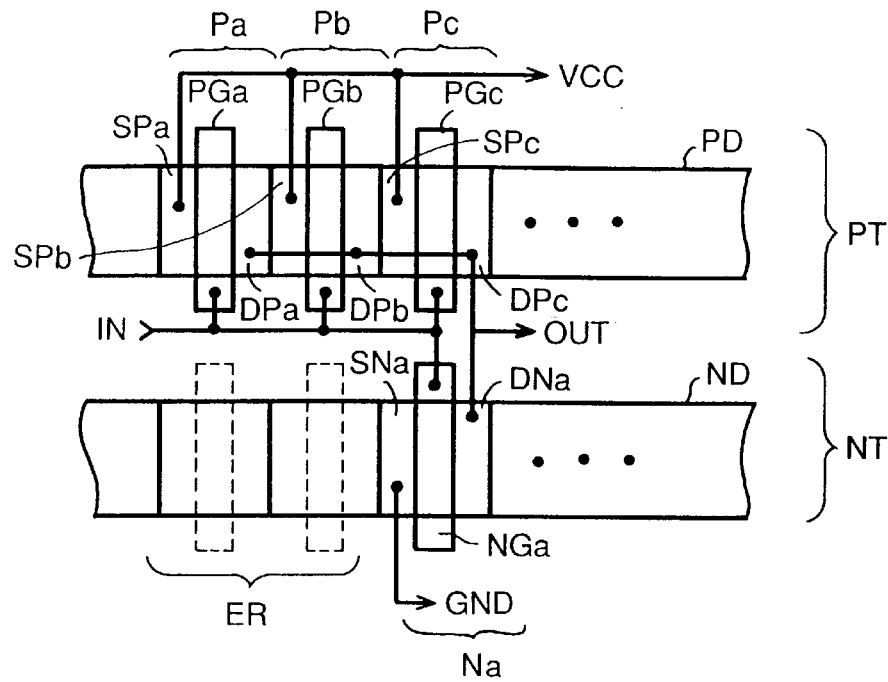
FIGS. 14A to 14D are illustrations showing empty regions in the third embodiment of the present invention.

Referring to FIG. 14A, unit transistors Pa to Pc are arranged along one direction (X direction). In p channel MOS transistor forming region PT, a region PD in which a P type impurity diffused layer is to be formed is arranged, and in n channel MOS transistor forming region NT, a region ND in which an N type impurity diffused layer is to be formed is arranged.

Unit transistor Pa has a source diffusion layer SPa coupled to the power supply line VCC, a gate electrode layer PGa receiving an input signal IN, and a drain diffusion layer DPa for generating an output signal OUT. Unit transistor Pb includes a source diffusion layer SPb connected to the power supply line VCC, a gate electrode PGb coupled to receive input signal IN, and a drain diffusion layer DPb connected to generate an output signal OUT. Unit transistor Pc includes a source diffusion layer SPc connected to the power supply line VCC, a gate electrode layer PGc connected to receive an input signal IN, and a drain diffusion layer DPc coupled to generate an output signal OUT. Unit transistor Na includes a source diffusion layer SNa connected to the ground line GND, a gate electrode layer NGa connected to receive an input signal IN, and a drain diffusion layer DNa connected to generate an output signal OUT.

Gate electrode layers PGa to PGc and NGa are connected to each other. Drain diffusion layers DPa to DPc and DNa are also connected to each other.

Figure 14B:
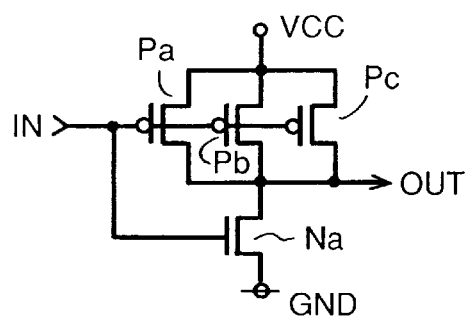

FIG. 14B shows an electrical equivalent circuit of the transistor connection shown in FIG. 14A. As shown in FIG. 14B, unit transistors Pa to Pc are connected in parallel between the power supply line VCC and an output node generating the output signal OUT, and these transistors receive at their gates the input signal IN. Unit transistor Na is connected between the ground line GND and the output node, and receives at its gates the input signal IN. Unit transistors Pa to Pc and Na have the same size. Therefore, as shown in FIG. 14B, the gate width (channel width) of the p channel MOS transistor for driving the output node from the power supply line VCC is third times that of the unit transistor Na, and hence current drivability thereof is third times that of the unit transistor. By this structure, current drivability of the p channel MOS transistor in the CMOS inverter is made approximately equal to the current drivability of the n channel MOS transistor.

In such a structure, as shown in FIG. 14A, in n channel MOS transistor forming region NT, transistor element is not formed in the region opposing to unit transistors Pa and Pb, and there is an empty region ER. Therefore, as shown in FIG. 14C, in the empty region ER, it is possible to arrange the feed through FT7 on the substrate SUB, and to connect the feed through FT7 to on-the-cell line Lc3 through a connection hole V40.

In FIG. 14A, for simplicity of description, MOS transistor elements are shown arranged aligned along one direction as in a common gate array. However, arrangement of transistor elements may be appropriately determined in accordance with the structure of the internal circuitry. Further, instead of the structure using unit transistors, a structure in which one MOS transistor is arranged may be used. When one transistor is used, there is a difference in current drivability of the MOS transistors, and the gate width (channel width) is made different accordingly, and therefore, there is similarly an empty region ER.

In FIG. 14A, the empty region ER is shown not including any transistor element formed therein. However, in the empty region ER, a transistor element may be formed as shown by the dotted line (showing gate only) in FIG. 14C and internal line for the transistor element may not exist. In that case also, non-interconnected gate electrode layer of the transistor element (shown by the dotted line) which is formed in the empty region is formed by the polysilicon layer which is an interconnection layer below the feed through FT7, and hence feed through FT7 can be arranged in the empty region ER.

Figure 14C:
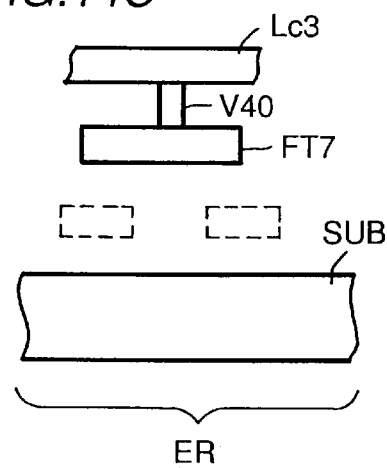

In the structure shown in FIGS. 14A to 14C, the empty region is described as a region formed by the difference in size (gate width) due to the difference in current drivability of the MOS transistors.

Figure 14D:
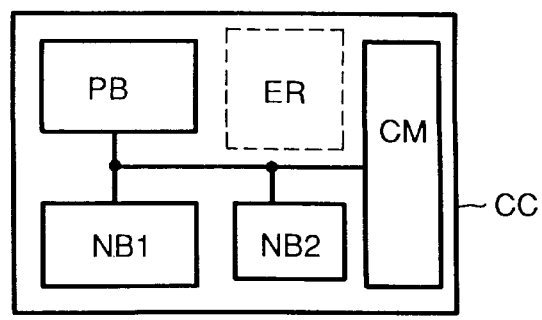

However, as shown in FIG. 14D, the empty region ER may be formed because of the structure of the internal circuitry in the circuit cell CC. In FIG. 14D, circuit cell CC includes a gate block PB formed by p channel MOS transistors, a gate block NB1 including an n channel MOS transistor formed opposing to the gate block PB, a gate block NB2 formed only by n channel MOS transistors and formed adjacent to gate block NB1, and a gate block CN including both p and n channel MOS transistors. There is an empty region ER between gate blocks PB and CM. A transistor element which is not interconnected may be formed in the empty region ER, or transistor element may not be formed at all.

What is required of the empty region ER is that there is not a line in that region which belongs to the same interconnection layer as the feed through (for example, the first layer of aluminum interconnection). The position in the circuit cell CC where such an empty region ER exists is determined in accordance with the function implemented by the circuit cell CC or in accordance with the arrangement of transistor elements. Therefore, it is not necessary for the empty region ER to be adjacent to the feed through region FTR such as shown in FIG. 13, and it may be formed at the central portion along the X direction of the circuit cell CC2. It goes without saying that different from the structure shown in FIG. 13, the empty region ER may be formed in the p channel MOS transistor forming region PT, that is, below the power supply line VCC.

Arrangement of the feed through (on-the-cell feed through) on the empty region ER of the circuit cell and connection of the feed through with the on-the-cell line in the empty region ER may be performed by the designer (user) in interactive manner with the processing apparatus. A method of arranging lines when there is an empty region in the circuit cell will be described.

Figure 15:
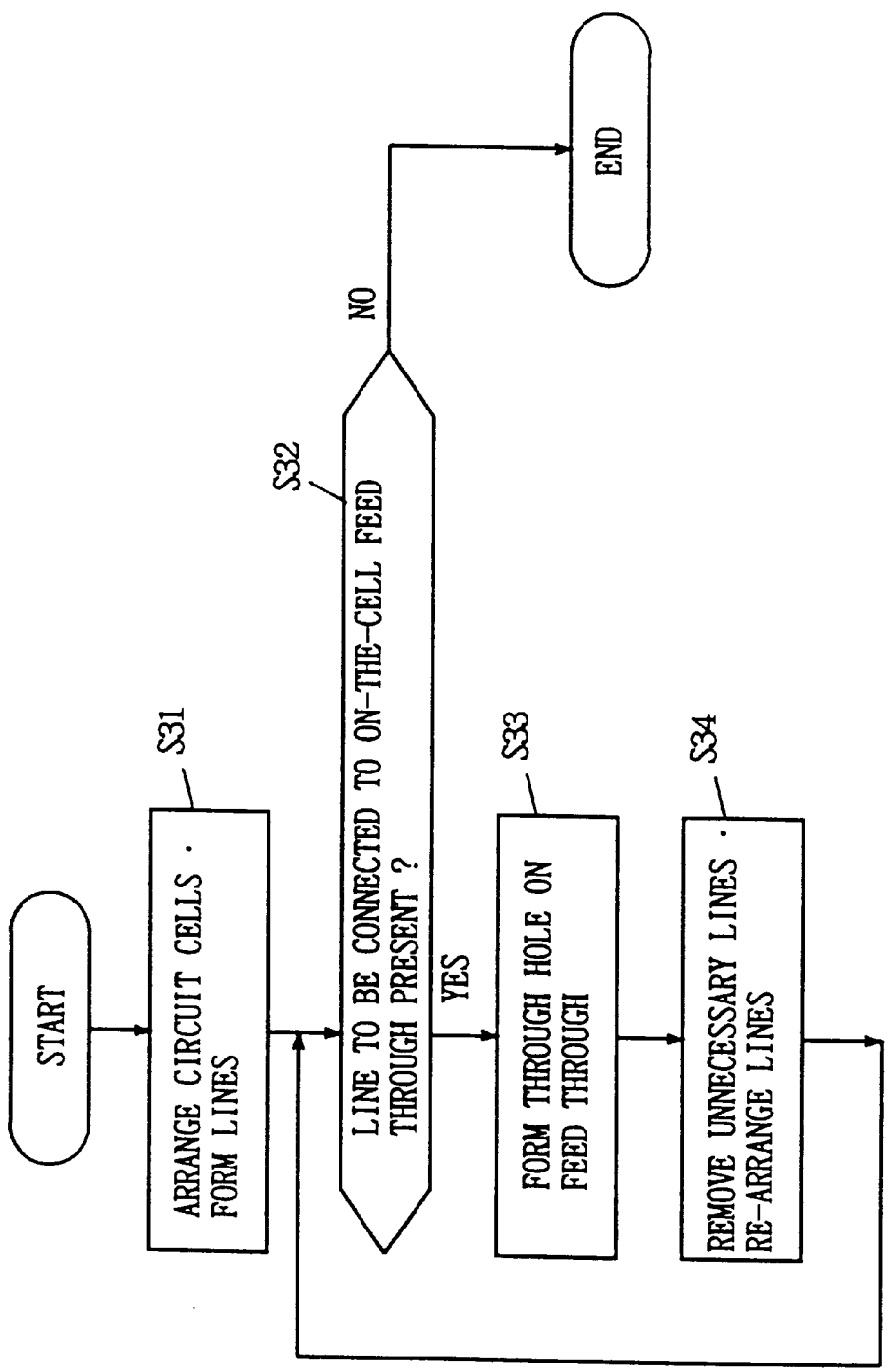
FIG. 15 is a flow chart showing a sequence of arrangement and interconnection process of circuit cells in accordance with the third embodiment of the present invention.

FIG. 15 is a flow chart showing a process sequence for implementing interconnection between the on-the-cell feed through and on-the-cell line in accordance with the third embodiment of the present invention. Connection of the on-the-cell feed through will be described with reference to FIG. 15.

First, as in the first and the second embodiments, circuit cells are arranged and lines are formed. At this time, whether or not there is an empty region for each circuit cell is identified in the similar manner. Identification of the empty region in the circuit cell is performed in accordance with empty region information input when each circuit cell is described (step S31).

In the circuit cell arrangement, for a circuit cell including the empty region, a feed through extending over the empty region (on-the-cell feed through) is arranged. Similarly, on-the-cell line is arranged. Thereafter, whether or not the on-the-cell feed through is available, and whether or not there is a line to be connected to the on-the-cell feed through are determined (step S32). The step of determination will be described in greater detail later. When there is a line to be connected to the on-the-cell feed through, the on-the-cell line is arranged, and on the empty region of the circuit cell, the on-the-cell line feed through is connected to the on-the-cell line (a through hole is formed). Further, for the on-the-cell feed through, another line or a connection to a circuit cell port is formed (step S33).

Thereafter, as in the first and second embodiments, unnecessary portion of the feed through is removed, and the feed through is re-arranged (step S34). Steps S32 to S34 are executed for every on-the-cell feed through, and when every on-the-cell line is processed, the process is completed (circuit cells and lines are re-arranged).

Figure 16:
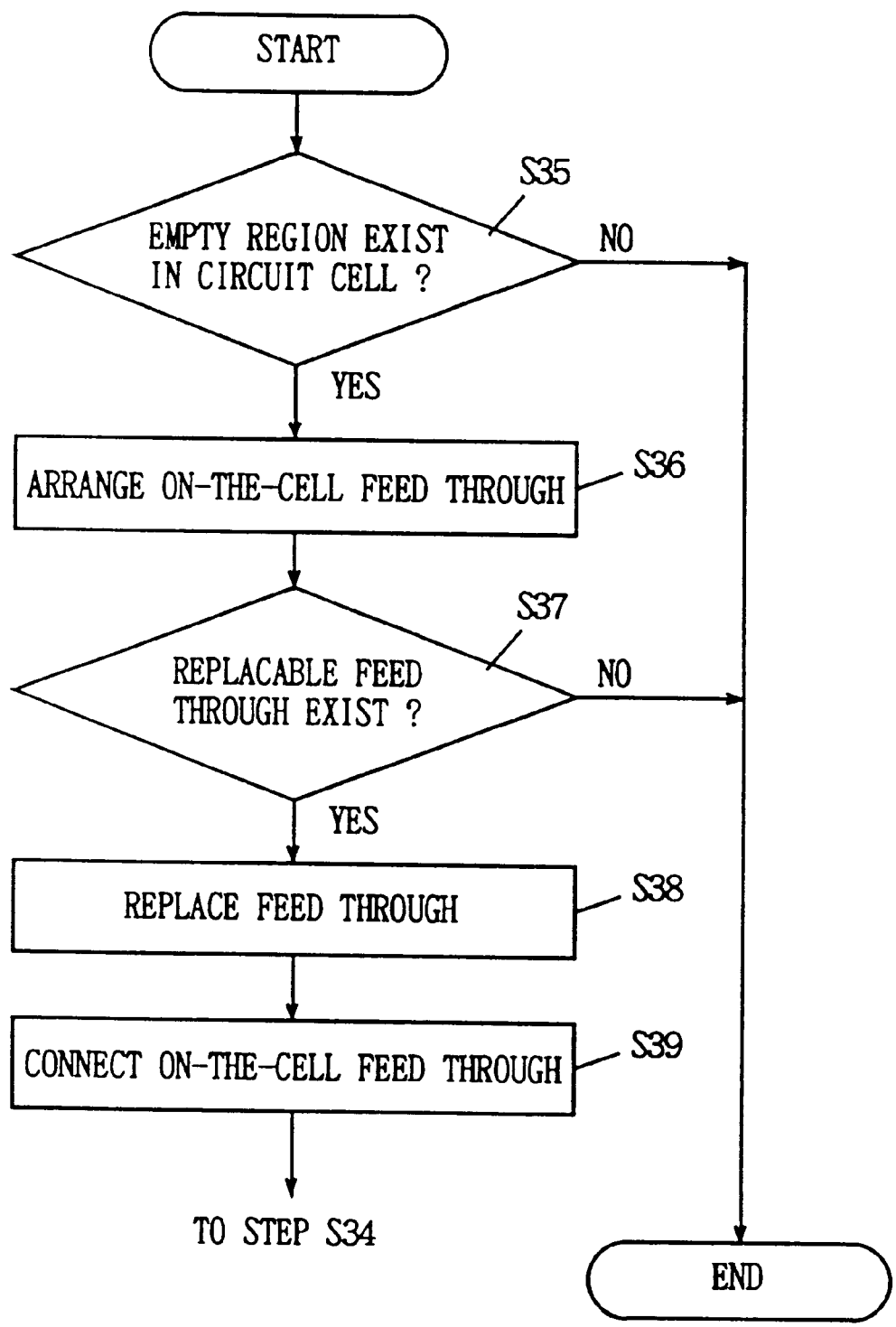
FIG. 16 is a flow chart showing a process sequence of forming connection of feed through shown in FIG. 15.

FIG. 16 is a flow chart showing in greater detail the process content of the step S32 shown in FIG. 15. Automatic connection of on-the-cell feed through will be described in the following.

First, circuit cells are arranged and interconnected, and thereafter whether or not there is an empty region in the arranged circuit cells is determined (step S35). Identification as to whether there is an empty region in the circuit cell and position of the empty region are determined based on information as to the presence/absence of the empty region and position of the empty region linked to each circuit cells specifying information in accordance with the information provided by the designer (user).

When there is an empty region in the circuit cell, a feed through is arranged on the empty region (S36). Thereafter, whether or not there is a feed through which can be replaced by the on-the-cell line feed through is determined (step S37). The feed through which can be replaced will be described in greater detail later. This is determined dependent on whether or not there is a feed through which exchanges a signal with a circuit cell included in the same circuit cell band as the circuit cell having the empty region, for example.

When there is a replaceable feed through, the feed through is replaced by the on-the-cell feed through (step S38). Thereafter, the replaced on-the-cell feed through is connected (connection hole is formed) (step S39). Thereafter, the process step S34 shown in FIG. 15 follows.

Figure 17A:
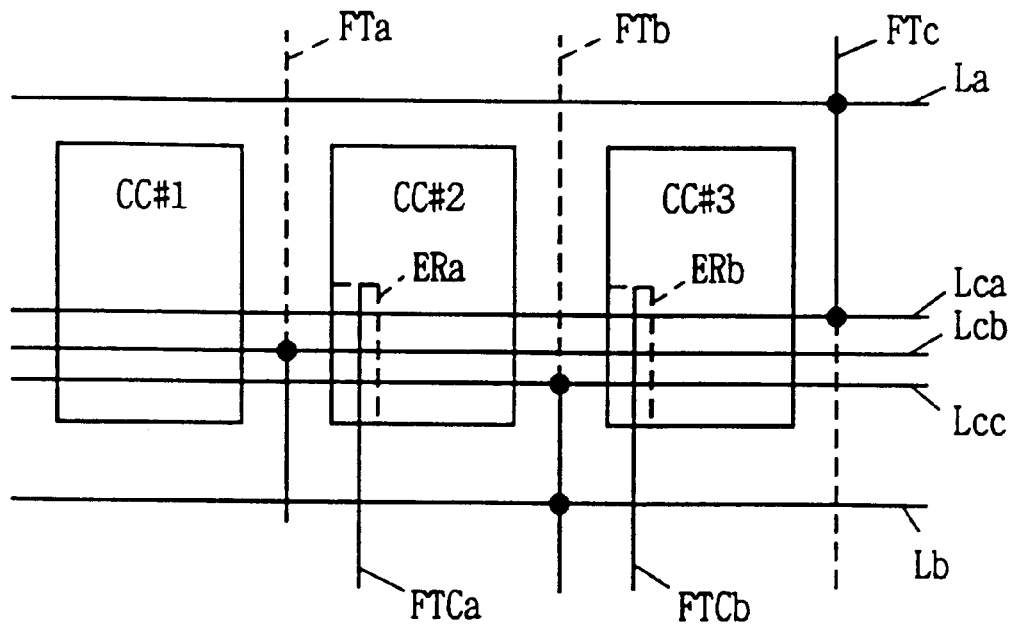
FIGS. 17A and 17B are illustrations showing manner of arrangement of the feed through in accordance with the third embodiment of the present invention.
Figure 17B:
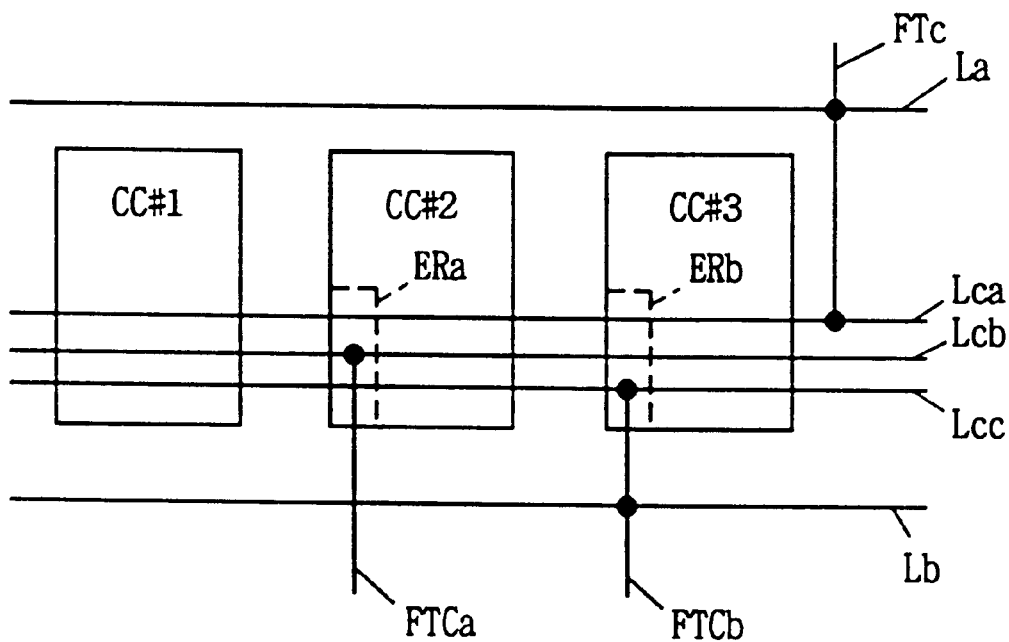

FIGS. 17A and 17B illustrates the method of replacing the on-the-cell feed through and another feed through. Referring to FIG. 17A, three circuit cells CC#1, CC#2 and CC#3 are shown as an example. Circuit cells CC#2 and CC#3 include empty regions ERa and ERb, respectively. According to the circuit cell arrangement and interconnection, feed throughs FTa, FTb and FTc are arranged in the feed through region. For the feed throughs, connection with corresponding lines (main lines and on-the-cell lines) are formed. In FIG. 17A, feed through FTa is connected to on-the-cell line Lcb in the feed through region, feed through FTb is connected to on-the-cell line Lcc in the feed through region and to the main line Lb in the line region. Feed through FTc is connected to main line La and to on-the-cell line Lca in the feed through region. In FIG. 17A, portions of the feed through represented by the dotted lines are unnecessary portions which will be removed. In this state, for the circuit cells CC#2 and CC#3 having empty regions, on-the-cell feed throughs FTCa and FTCb extending over the empty regions are arranged, respectively. The on-the-cell feed throughs FTC and FTCb extend from line region to empty regions ERa and ERb, and not arranged on the internal line forming region of the circuit cells CC#2 and CC#3.

In these states, feed throughs which can be replaced by the on-the-cell feed throughs FTCa and FTCba are identified. Feed through FTa can be replaced by the on-the-cell feed through FTCa and feed through FTb can be replaced by the on-the-cell feed through FTCb. Feed through FTc extends in opposite direction to the on-the-cell feed through, and hence it cannot be replaced. Whether or not the on-the-cell feed through can be replaced by the feed through is identified based on the information of leading point and terminating point information of each feed through and on the information of the direction of extension of the on-the-cell feed through (as shown in FIG. 11, leading point information and terminal point information are extracted for each feed through).

Then, as shown in FIG. 17B, the feed through which is determined to be replaceable is replaced by the on-the-cell feed through, and the replaced feed through is removed. In replacing the feed through by the on-the-cell feed through, the information of the replaced feed through is passed to each on-the-cell feed through (feed through specifying information). The leading point information and terminating point information are changed at the positions of the connection holes. Therefore, replacement of the feed through by the on-the-cell feed through is realized in the processing apparatus.

As described above, according to the third embodiment of the present invention, the feed through is extended to the empty region generated in the circuit cell, and the feed through is physically connected to the on-the-cell line on the empty region. Therefore, the empty region can be used as a feed through region, and the area occupied by the lines can be reduced.

Embodiment 4

Figure 18:
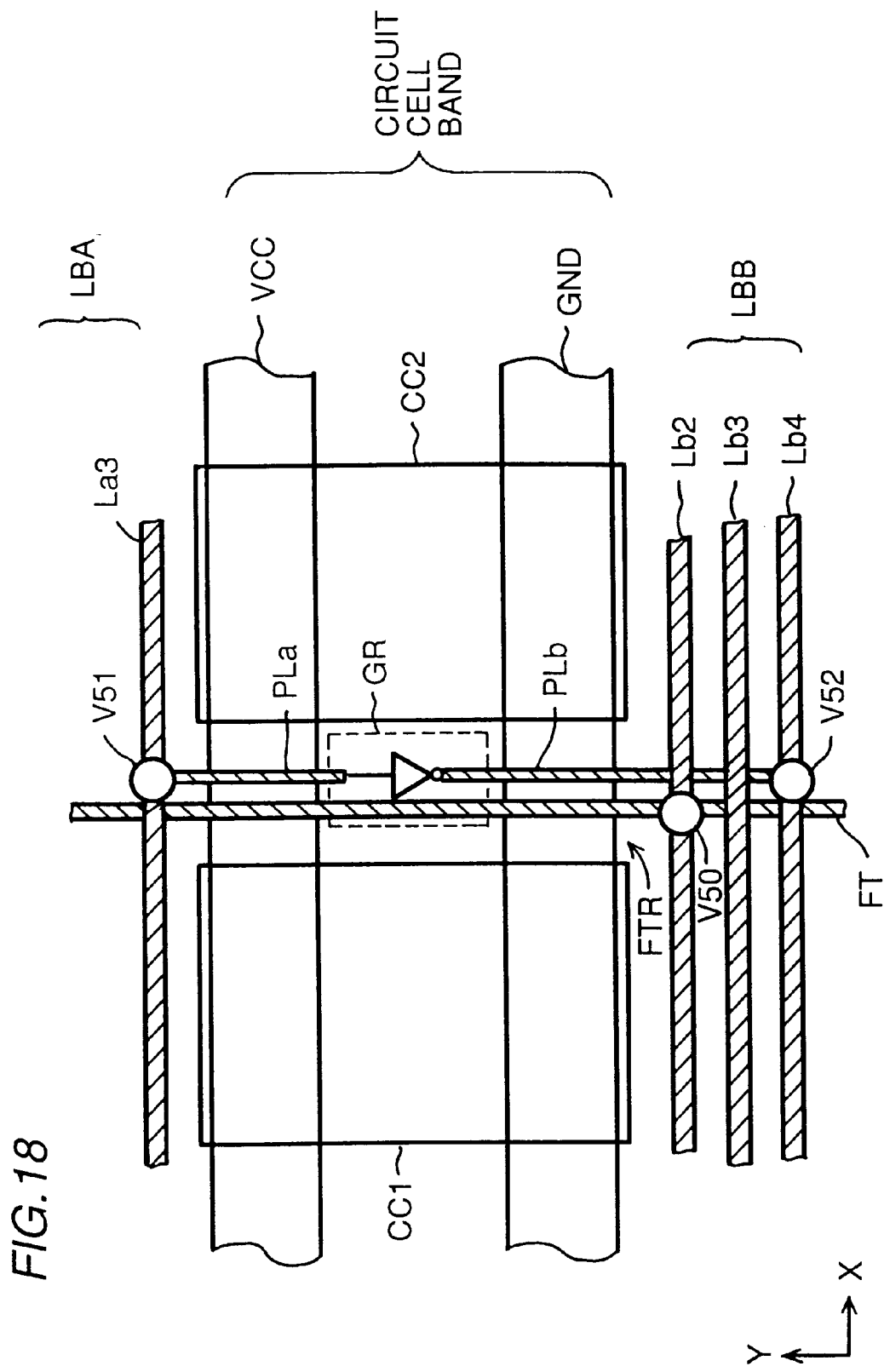
FIG. 18 schematically shows a structure of a main portion of a semiconductor integrated circuit device in accordance with a fourth embodiment of the present invention.

FIG. 18 schematically shows a structure of a main portion of a semiconductor integrated circuit device in accordance with a fourth embodiment of the present invention. In FIG. 18, a portion of the feed through region FTR between circuit cells CC1 and CC2 is shown similar to the first to third embodiments above. Referring to FIG. 18, line band LBA includes a main line La3, and line band LBB includes main lines Lb2, Lb3 and Lb4. A feed through FT for transmitting a signal to/from a circuit cell or a line band, not shown, through line band LBA is arranged on feed through region FTR. Feed through FT passes through feed through region FTR and is physically connected to main line Lb2 of line band LBB by means of a connection hole V50.

In the feed through region FTR, a transistor element forming region GR for forming a gate circuit (an inverter in FIG. 18) which is not physically connected to the feed through FT is arranged. The gate circuit formed in the transistor element forming region GR is utilized as a component of a target circuit when the design is changed. Here, the target circuit may be the circuit implemented by the whole circuit cells included in the circuit cell band, a circuit implemented by a plurality of circuit cells in the circuit cell band or it may be one circuit cell.

In FIG. 18, the gate circuit in the transistor element forming region GR is shown to have its input portion connected to main line La2 through line PLa and connection hole V51, and its output portion connected to main line Lb4 through line PLb and connection hole V52. The lines PLa and PLb have only to belong an interconnection layer different from the operational voltage transmitting lines (power supply line VCC and ground line GND) and main lines, and these are formed, for example, by using a polysilicon interconnection or the first layer of aluminum interconnection.

In the arrangement shown in FIG. 18, a signal on main line La3 is subjected to logic processing (inversion) and transmitted to main line LB4.

The gate circuit formed in the transistor element forming region GR may be connected to the on-the-cell line described with respect to the first to third embodiments above. By utilizing the on-the-cell line, change in designs such as addition of circuit function after completion of circuit layout can be readily met without using the line region.

Figure 19:
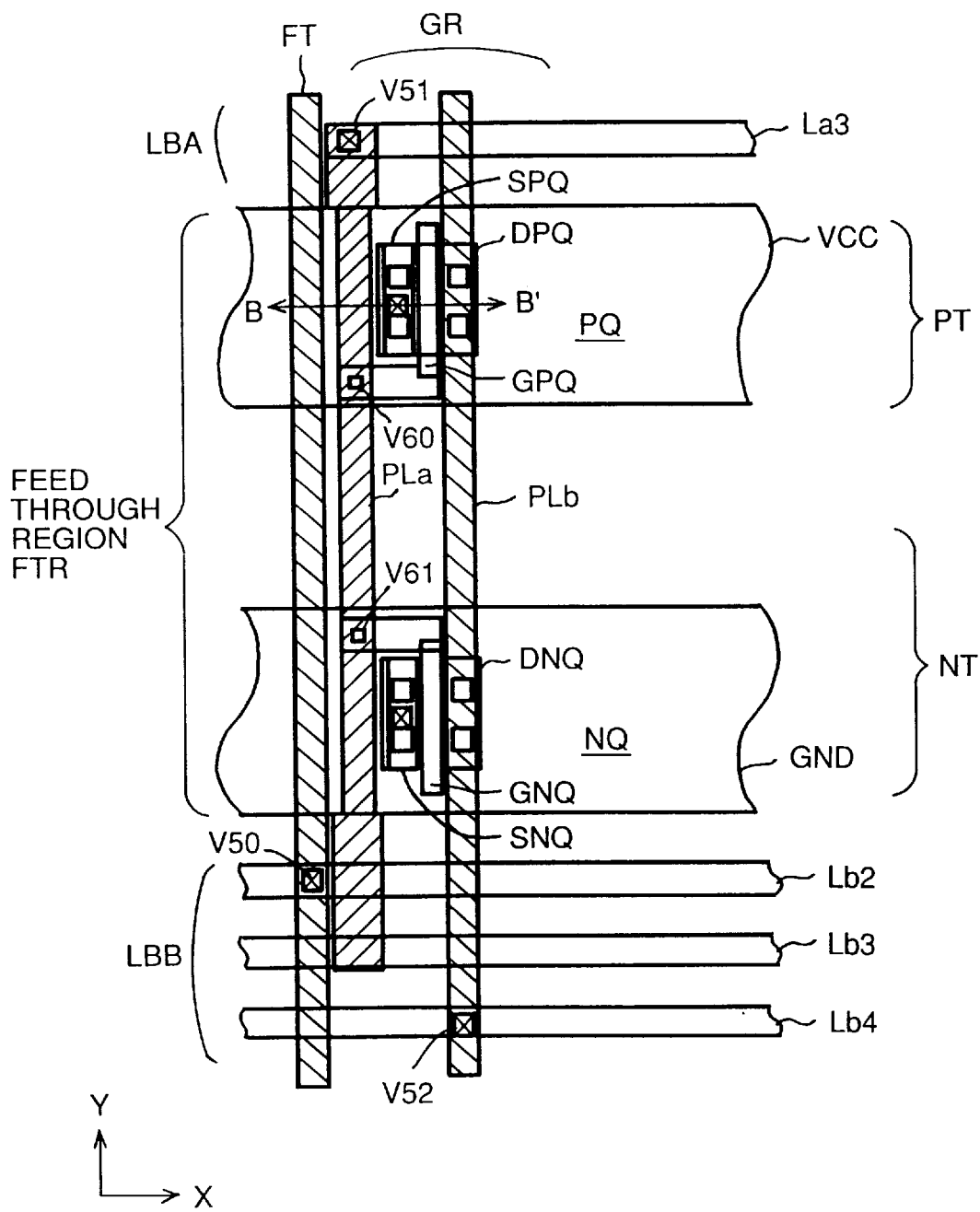
FIG. 19 shows an example of a layout of the feed through region shown in FIG. 18.

FIG. 19 is a layout of the feed through region FTR shown in FIG. 18. Referring to FIG. 19, the feed through FT passing through feed through region FTR along the Y direction is formed by the first layer of aluminum interconnection and connected to the main line Lb2 through connection hole V50. In order to utilize transistor forming regions PT and NT arranged in the circuit cells, transistor element forming region GR is arranged entirely over the feed through region FTR. The gate circuit formed in the transistor element forming region GR includes a p channel MOS transistor PQ formed in the p channel MOS transistor forming region PT below the power supply line VCC, and an n channel MOS transistor NQ formed in the n channel MOS transistor forming region NT below the ground line GND.

A line PLa for transmitting a signal on main line La3 to MOS transistors PQ and NQ is arranged entirely over the feed through region FTR. The line PLa is formed by an interconnection layer different from that of the feed through FT, for example, it is formed by a polysilicon interconnection layer. The line PLa is arranged adjacent to and parallel to the feed through FT (these may be partially overlapped with each other). Line PLb is formed by the first layer of aluminum interconnection as the feed through FT. As will be described alter, MOS transistors PQ and NQ utilize the first layer of aluminum interconnection for the connection to the power supply line VCC and the ground line GND, and therefore the feed through FT cannot be arranged in this region. Therefore, it is not possible to arrange the feed through completely overlapping the transistor elements.

P channel MOS transistor PQ has its gate electrode layer GPQ connected to line PLa through connection hole V60, its source region SPQ connected to the power supply line VCC and its drain region connected to line PLb. The n channel MOS transistor NQ has its source region SNQ connected to the ground line GND, its drain region DNQ connected to line PLb and its gate electrode layer GNQ connected to line PLa.

By using the first layer of aluminum interconnection for the line PLb, it becomes possible to arrange the line PLb overlapped with gate electrode layers GPQ and GNQ, the area of the transistor element forming region GR (length in the X direction) can be minimized, and increase in the area can be suppressed.

Figure 20A:
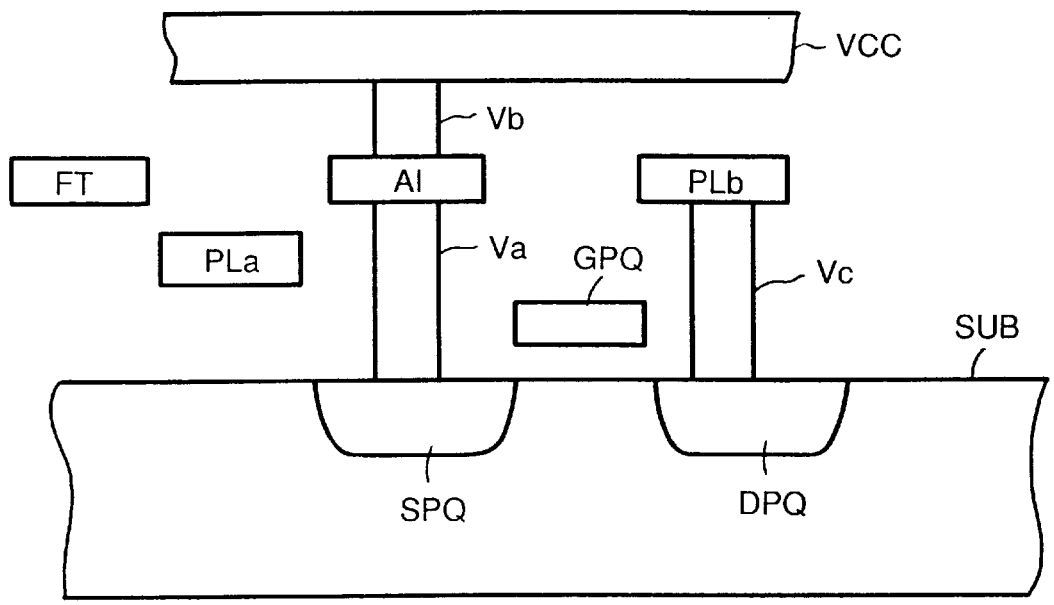
FIG. 20A shows a cross sectional structure taken along a line B–B' of FIG. 19.

FIG. 20A schematically shows a cross section taken along the line B–B' of FIG. 19. Referring to FIG. 20A, a source region SPQ formed at the surface of a substrate region (semiconductor substrate or well region) SUB is connected to an intermediate layer AI formed of the first layer of aluminum interconnection through a contact Va. The intermediate layer AI is connected to the power supply line VCC formed by the second layer of aluminum interconnection thereabove through contact Vb. Drain region DPQ is formed at the surface of substrate region SUB and connected to line PLb through contact Vc. The line PLb belongs to the first layer of aluminum interconnection. A line PLa transmitting a signal from main line La3 shown in FIG. 19 is formed by a polysilicon interconnection layer, which is different from the first layer or the second layer of aluminum interconnection. Adjacent to the line PLa, feed through FT is arranged. Consequently, transistors can be formed to implement a desired gate circuit without affecting the feed through FT at all in the gate transistor element forming region GR.

In FIG. 20A, line PLa is shown to be formed by the polysilicon interconnection layer below the first layer of aluminum interconnection. The aluminum interconnection PLa may be formed between the first and the second layers of aluminum interconnection. Namely, line PLa may be formed above the feed through FT. The line PLa may be formed not by polysilicon interconnection but a layer of silicide of metal having high melting point.

Modification

Figure 20B:
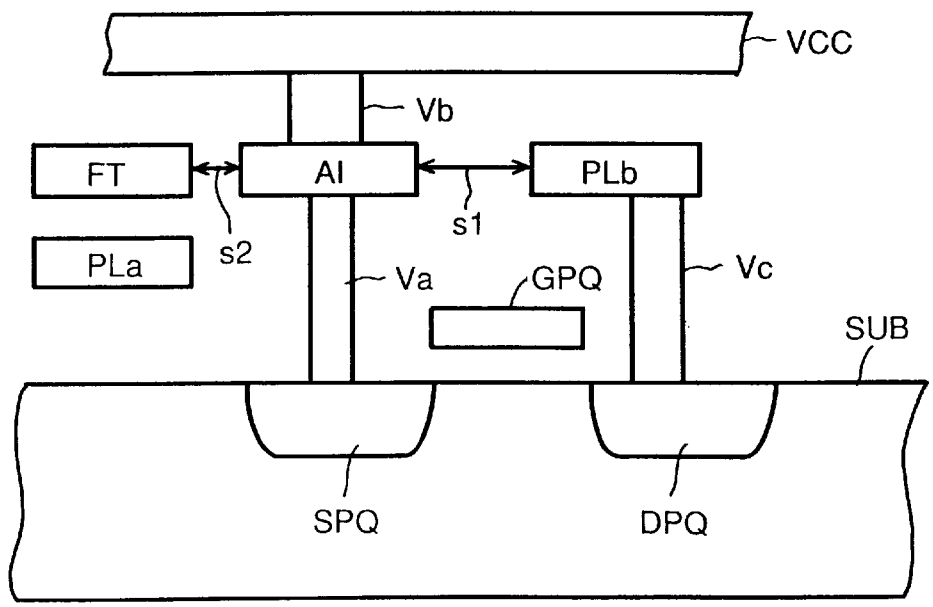
FIG. 20B shows a modification of the structure shown in FIG. 20A.

FIG. 20B shows a modification of the fourth embodiment of the present invention. In the structure shown in FIG. 20B, feed through FT and line PLa are arranged overlapping with each other in the vertical direction of FIG. 20B. Therefore, increase in the area of occupation of the feed through region (length along the X direction of FIG. 19) can be suppressed. Feed through FT is formed in the same interconnection layer as intermediate layer AI and line PLb. Therefore, line PLb is also arranged as close as possible to intermediate layer AI. By setting a distance (or pitch) s2 between feed through FT and intermediate layer AI equal to the distance (or pitch) s1 between intermediate layer AI and line PLb, the area of occupation of the feed through region (length along the X direction of FIG. 19) can be minimized.

FIG. 21 is a flow chart showing a sequence of forming lines in accordance with the fourth embodiment of the present invention. Referring to FIG. 21, the operation of forming lines in accordance with the fourth embodiment of the present invention will be described.

First, as in the first to third embodiments, circuit cells are arranged and lines are formed (step S41). At this time, transistor elements (gate) are arranged below each feed through region.

Thereafter, whether or not the gate formed in the feed through region is to be used to meet a change in design or the like is determined (step S42). At this time, whether or not there is a feed through arranged in the feed through region is also identified.

When a transistor element (gate) arranged in the feed through region is to be used, lines are provided for the transistor element (gate) (step S43). At this time, if a feed through has been arranged in the feed through region, the transistor element (gate) is connected by using the line below the feed through (for example, a polysilicon interconnection). When there is not a feed through arranged in the feed through region, lines may be provided by using the first layer of aluminum interconnection which is used for the feed through. When the circuit cells are re-arranged, if the feed through is not provided in the feed through region, arrangement of the transistor element (gate) may be inhibited (in order to reduce area). Alternatively, a transistor element (gate) may always be arranged in every feed through region no matter whether the transistor element (gate) is used or not.

The process of steps S42 and S43 is repeated for every transistor element (gate) arranged in each feed through region, and when the process for the transistor element (gate) of every feed through region is completed, the sequence of forming lines for the transistor element (gate) is completed.

When a transistor element (gate) arranged in the feed through region is to be used, it may be possible that a main line or a sub line is newly provided in addition to the internal lines (lines in the circuit cell). In that case, lines are re-arranged taking into account the newly added lines.

As described above, according to the structure of the fourth embodiment of the present invention, a region for forming a transistor element which is not physically connected to the feed through passing through the feed through region is provided, so that all the regions in the circuit cell band can be effectively used for forming transistor elements, and hence efficiency in using area can be improved. Further, when there is a change in designs such as addition of circuit function after the completion of circuit layout, the transistor element formed in the transistor element forming region GR may be utilized as circuit component by additional lines. Therefore, change in design can be readily met.

Further, the change in design can be readily met without increasing the area for lines, by using the on-the-cell line.

Embodiment 5

Figure 22A:
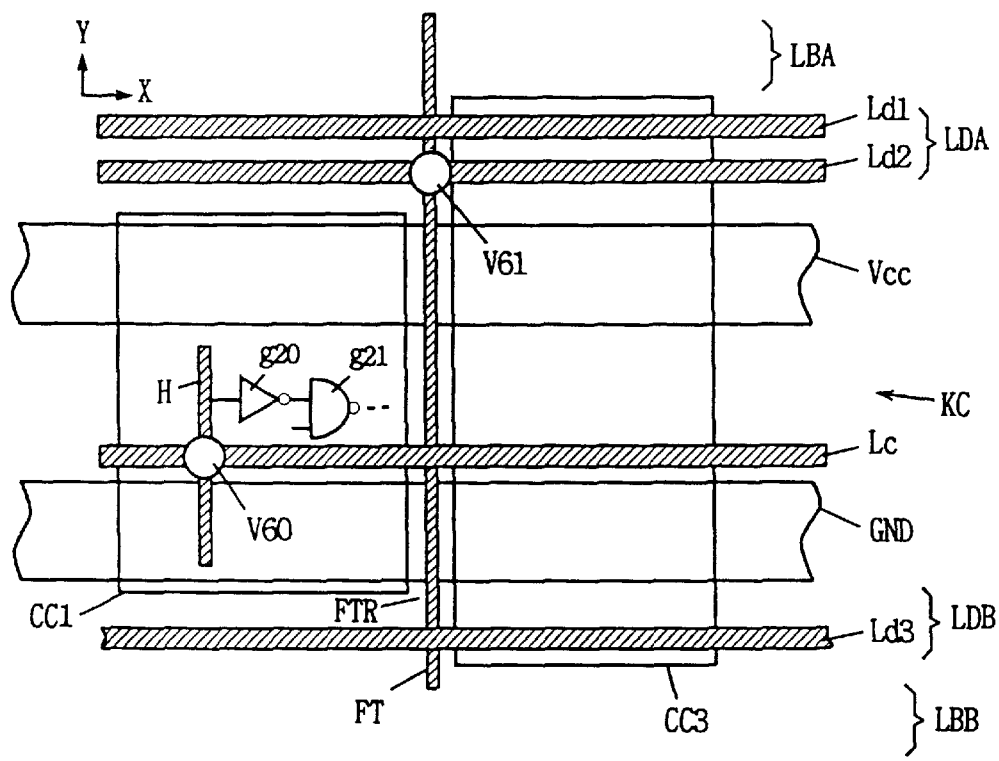
FIGS. 22A and 22B show structure of a main portion of a semiconductor integrated circuit device in accordance with a fifth embodiment of the present invention and modification thereof, respectively.
Figure 22B:
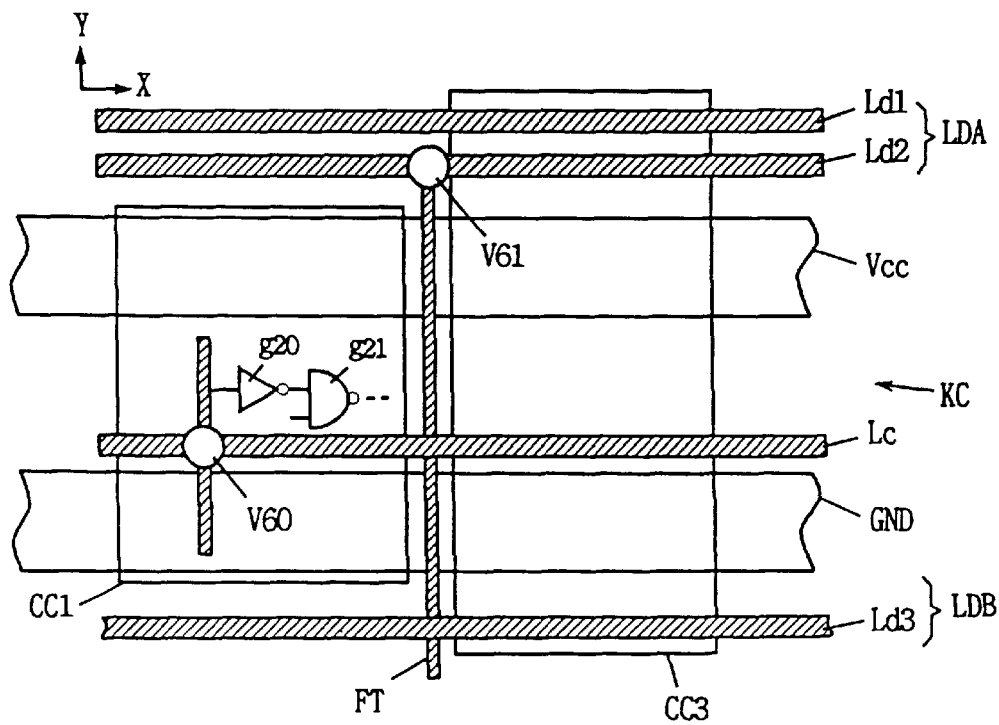

FIGS. 22A and 22B show arrangement of circuit cells and lines in accordance with a fifth embodiment of the present invention. Referring to FIG. 22A, in the fifth embodiment of the present invention, in a circuit cell band KC, circuit cells having different lengths in Y direction are arranged. In FIG. 22A, circuit cell CC3 is longer than circuit cell CC1 in length in the Y direction. Line bands LBA and LBB are arranged on outside regions of the circuit cell band with respect to the Y direction. More specifically, line bands LBA and LBB are arranged on external regions of circuit cell CC3 in the Y direction, which cell CC3 is longer.

In FIG. 22A, in addition to the on-the-cell line Lc arranged over a prescribed number of cells of all the cells in the circuit cell band KC, lines Ld1, Ld2 and Ld3 are arranged crossing a region of a circuit cell CC3 which region protruding in the Y direction. More specifically, in the circuit cell band KC, regions outside the circuit cell smallest in the Y direction are all regarded as line regions, and lines are arranged. In FIG. 22A, a cell passing line band LDA and a line band LBA are arranged in one direction outside the circuit cell CC1 with respect to the Y direction, and a cell passing line band LDB and a line band LBB are arranged on another region outside the circuit cell CC1.

A feed through FT is arranged in the feed through region FTR between circuit cells CC1 and CC3, and the feed through FT is connected to cell passing line Ld2 through a connection hole V61. An on-the-cell line Lc is connected to sub line H of circuit cell CC1 by a connection hole V60. The sub line H is connected to a gate g20 of circuit cell CC1, and an output from gate G20 is connected to an input of gate g21.

The power supply line VCC and the ground line GND are arranged to cross all the circuit cells in the circuit cell band KC. As arrangement of cell passing line bands LDA and LDB in regions outside the power supply line VCC and the ground line GND in the Y direction passing over circuit cells is allowed, a region in which lines are not formed can be reduced and the area which can be effectively used is increased.

FIG. 22B shows a state after the cell passing line Ld2 and feed through FT are connected at connection hole V61 as shown in FIG. 22A and unnecessary portions of feed through FT are removed.

Figure 23:
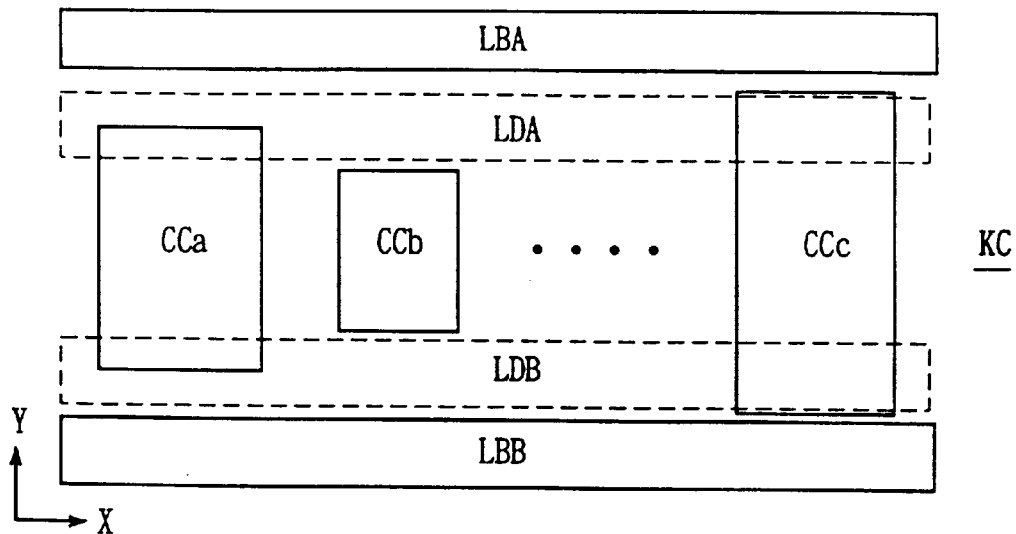
FIG. 23 shows arrangement of line bands and circuit cell bands in accordance with the fifth embodiment of the present invention.

FIG. 23 shows regions for forming lines in accordance with the fifth embodiment of the present invention. In FIG. 23, three circuit cells CCa, CCb and CCa are shown as representative in circuit cell band KC. In circuit cell band KC, circuit cell CCb is the shortest in the Y direction, and circuit cell CCc is the longest in the Y direction. Cell passing line bands LDA and LBB are arranged along the X direction in regions outside the circuit cell CCb along the Y direction. In regions outside the cell passing line bands LDA and LBB along the Y direction, general line bands LBA and LBB are arranged. These line bands LBA and LBB are arranged in regions outside the longest circuit cell CCc along the Y direction. In FIG. 23, a region for on-the-cell line is not shown for the simplicity of drawing. As shown in FIG. 23, arrangement of lines in the regions outside the smallest cell CCb in the Y direction is allowed, whereby the circuit cell forming region can also be utilized as the line region, and the area occupied by the lines can be reduced.

Figure 24:
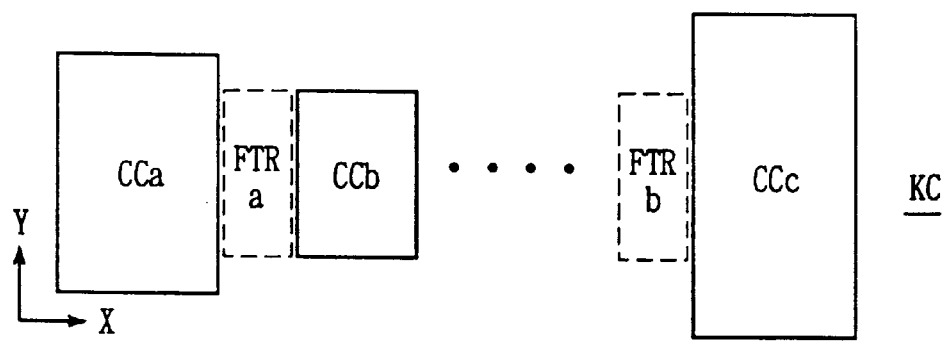
FIG. 24 shows a shape of a feed through region in accordance with the fifth embodiment of the present invention.

FIG. 24 shows the size of the feed through region in accordance with the fifth embodiment of the present invention.

As shown in FIG. 24, the length in the Y direction of the feed through regions FTRa and FTRb is determined dependent on the length in Y direction of the circuit cell CCb which is shortest in the Y direction in circuit cell band KC. In this case, it is not necessary to add a new rule to the rule that only the on-the-cell line is allowed to be connected with the feed through in the feed through region. Namely, since the cell passing line is arranged outside the feed through regions FTRa and FTRb along the Y direction, the cell passing line can be provided with a connection hole to the feed through at a necessary region. Therefore, with respect to the connection to the feed through, it is not necessary to distinguish the cell passing line from a normal line (lines included in line bands LBA and LBB), and hence interconnection control is easy.

Figure 25:
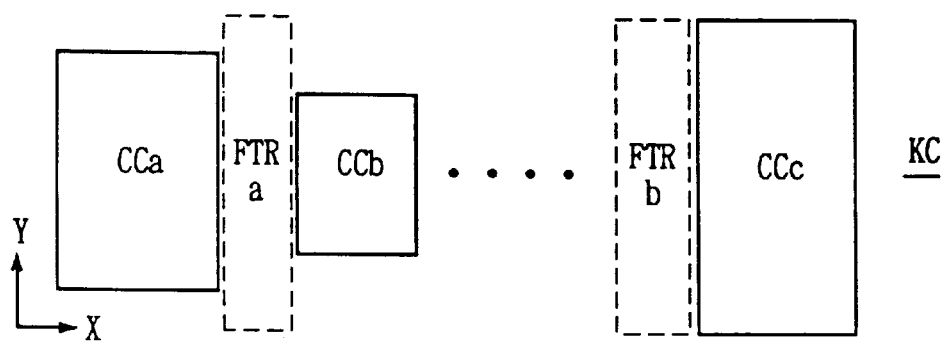
FIG. 25 shows another shape of the feed through region in accordance with the fifth embodiment of the present invention.

FIG. 25 shows another shape of the feed through region. In FIG. 25, feed through regions FTRa and FTRb have the same length in the Y direction as that of the circuit cell CCc which is the longest in the Y direction in the circuit cell band KC. In the arrangement shown in FIG. 25, a cell passing line can be handled in the same manner as an on-the-cell line so that connection between the cell passing line and the feed through can be formed in the feed through regions FTRa and FTRb in the same manner. In this case, as will be described later, when a transistor element (gate) is to be formed in the feed through region, sufficient area can be ensured for the transistor element (gate).

Figure 26:
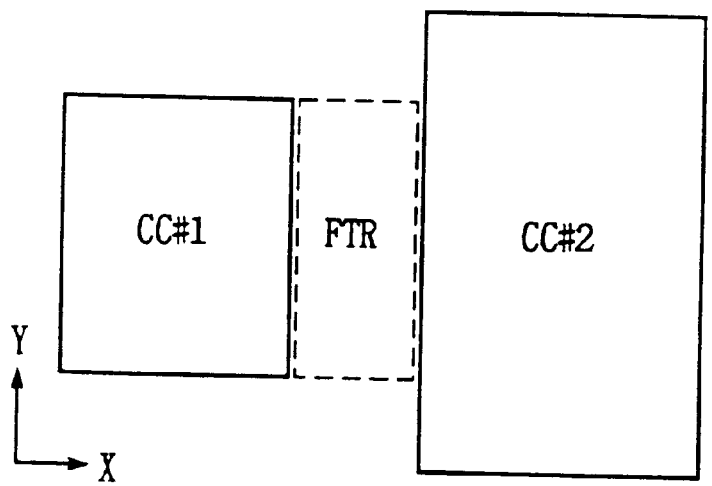
FIG. 26 shows a still further shape of the feed through region in accordance with the fifth embodiment of the present invention.

FIG. 26 shows another shape of the feed through region. In FIG. 26, the length of the feed through region FTR is determined in accordance with the length in Y direction of the circuit cell CC#1 which is shorter in the Y direction, out of adjacent circuit cells CC#1 and CC#2 in one circuit cell band.

Figure 27:
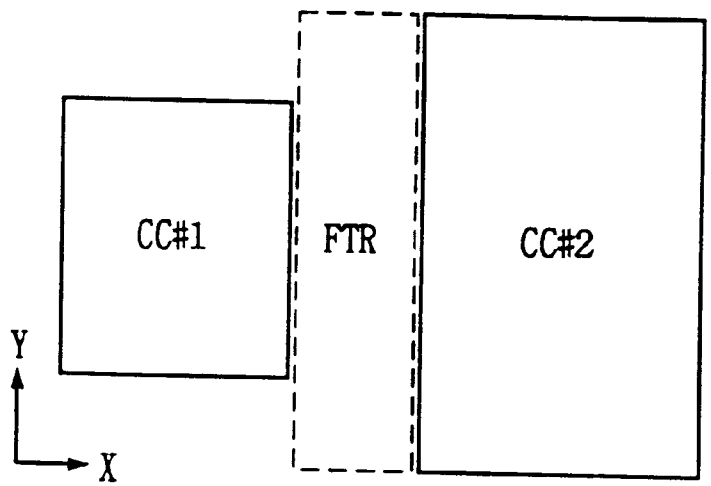
FIG. 27 shows a still further shape of the feed through region in accordance with the fifth embodiment of the present invention.

FIG. 27 shows a further shape of the feed through region. In FIG. 27, the length in the Y direction of the feed through region is determined by the length of circuit block CC#2 which is longer in Y direction, out of adjacent circuit cell blocks CC#1 and CC#2.

As shown in FIG. 26, in the structure in which lengths of the feed through region in Y direction is determined dependent on the length of the adjacent circuit cell in the Y direction, the length in Y direction of the feed through region FTR is the minimum length, and hence regions outside the feed through region FTR in the Y direction can be used for different purposes. In a structure of the feed through regions such as shown in FIG. 27, when arrangement of a transistor element (gate) which will be described later, in the feed through region FTR is allowed, sufficient area can be ensured depending on the size (length in Y direction) of the corresponding circuit cell.

Figure 28:
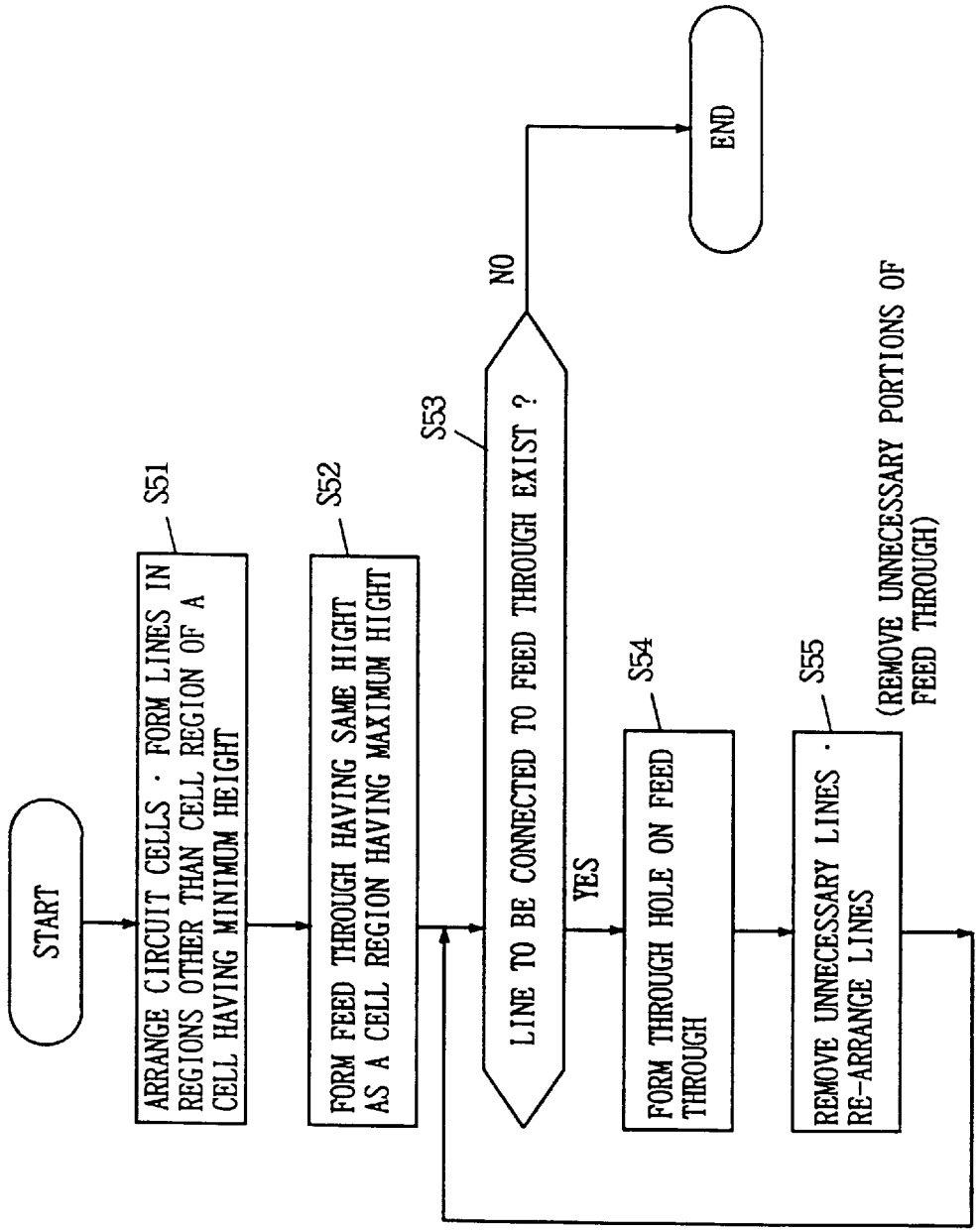
FIG. 28 is a flow chart showing a process sequence of arrangement and interconnection of circuit cells in accordance with the fifth embodiment of the present invention.

FIG. 28 is a flow chart showing the process sequence of arrangement of circuit cells and lines in accordance with the fifth embodiment of the present invention. The process sequence of the fifth embodiment of the present invention will be described with reference to FIG. 28.

First, circuit cells are arranged in accordance with input information from a designer (user). The information input by the designer (user) includes information of the length in Y direction and length in X direction of each circuit cell. After the circuit cells are arranged, in accordance with the input circuit cell information, a cell which has the smallest height (length in Y direction) is identified in each circuit cell band, and line region is acquired in a region outside the circuit cell region of the cell having the smallest height, in the Y direction (step S51). In step S51, a circuit cell, which is the highest in the circuit cell band is extracted, and the region between the highest and the lowest circuit cells in the Y direction is set as a cell passing line region.

Thereafter, in the circuit cell band, a feed through region having the same height as the height of the circuit region of the smallest cell (length in the Y direction) is formed (step S52). At this time, feed through regions having different shapes may be formed as shown in FIGS. 25 to 27. Thereafter, as in Embodiments 1 to 4, whether or not use of a feed through is necessary in each feed through region is determined. In other words, whether or not there is a line to be connected to the feed through is determined (step S53). If a feed through is used, a connection hole necessary for the feed through is provided, and the feed through is connected to the corresponding line (step S54). Thereafter, unnecessary lines are removed and lines are re-arranged (step S55). The series of processes are executed for each feed through region. In step S53, if the process for every feed through is completed, the connection forming process for the feed through is finished.

Each of the process steps shown in FIG. 28 may be performed by the designer (user) in interactive manner with the processing apparatus, for arranging the cell passing lines and connecting the feed through and the cell passing lines, and for the connection between the feed through and other lines or circuit cells.

Figure 29:
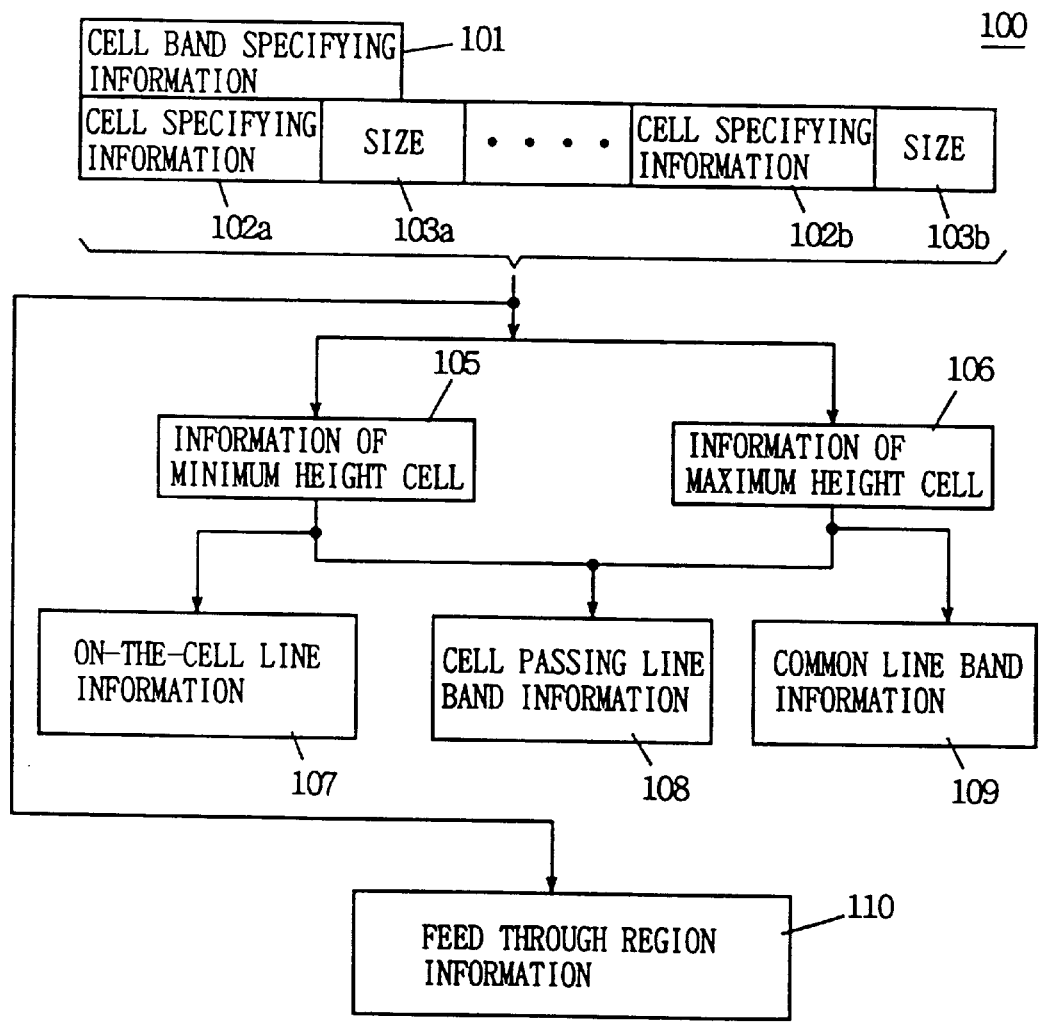
FIG. 29 is an illustration of data processing operation implementing the fifth embodiment of the present invention.

FIG. 29 shows a structure of data processed in process steps S51 and S52 shown in FIG. 28. In FIG. 29, input circuit cell information 100 includes a cell band specifying information 101 for specifying a circuit cell band, and cell specifying information 102 and size information 103 linked to the cell band specifying information 101. In FIG. 29, in order to specify a circuit cell included in the band specified by cell band specifying information 101, cell specifying information 102a and size information 103a linked to the cell specifying information 102a, as well as cell specifying information 102b and size information 103b linked to the cell specifying information 102b are included. Cell specifying information 102a and 102b include information of the position (or order) of arrangement in the circuit cell band specified by cell band specifying information 101. Size information 103a and 103b include information of lengths in X and Y directions of the circuit cells. Circuit cell information may further include information of empty region as described with reference to the embodiments above.

From circuit cell information 100, lowest cell information 105 specifying a cell having smallest height and highest cell information 106 for specifying a circuit cell which is the highest in the circuit cell band are extracted. Lowest cell information 105 and highest cell information 106 include size information and cell specifying information of the respective cells. From lowest cell information 107, on-the-cell line band information 107 is extracted. From both the lowest cell information 105 and highest cell information 106, cell passing line band information 108 is extracted. From highest cell information 106, normal line band information 109 is extracted. On-the-cell line band information 107 includes positional information in Y direction for specifying a region in which on-the-cell lines can be arranged (region between the power supply line VVC and the ground line GND). When the lines are formed, a line arranged in the on-the-cell line band is provided with a code indicating that it is an on-the-cell line in accordance with the on-the-cell line band information 107. Cell passing line band information 108 relates to lines arranged in a region between the lowest and the highest cells in the Y direction. The lines arranged in the cell passing line band are also provided with codes indicating that these are the cell passing lines, in accordance with the cell passing line band information 108. Normal line band information 109 is formed based on the highest cell information 106, and includes positional information (information of position in the Y direction). When the line is arranged, a code indicating that it is a normal line is added. The on-the-cell line band information 107, cell passing line band information 108 and normal line band information 109 are utilized in the following process.

More specifically, an on-the-cell line can be connected to an internal node of a desired circuit cell in the circuit cell band. Therefore, when a line is designated as an on-the-cell line, the on-the-cell line can be directly connected to the internal line of a corresponding circuit cell. Cell passing line band information 108 is for the arrangement in a region outside in Y direction of the circuit cell or on the circuit cell. For connection to the circuit cell, ports are arranged on opposing sides of circuit cell in Y direction. Therefore, in accordance with the cell passing line band information 108, whether or not a cell passing line is to be arranged outside the corresponding circuit cell is determined (as for the cell passing line, positional information (in Y direction) for each line is included), and in accordance with the size information of the corresponding circuit cell, whether it is possible to directly connect the cell passing line to the port of the circuit cell through a sub line or it is possible to connect the cell passing line through another line (main line) is identified. A line included in the normal line band can be connected to the port of every circuit cell by a sub line. By referring to the information 107, 108 and 109, respective lines can be correctly connected to the circuit cells.

In accordance with circuit cell information 100, feed through region information 110 is extracted. The feed through region information 110 includes information of the position in the circuit cell and the information of the size. Connection through necessary feed through is formed simultaneously referring to the feed through region information 110 and the feed through information 70 shown in FIG. 4.

As described above, according to the fifth embodiment of the present invention, it is allowed to arrange lines in regions different from the on-the-cell line band on the circuit cell, and hence regions utilized for the arrangement of lines can be increased and efficiency in using area can be improved.

Further, as shown in FIG. 22B, since unnecessary portions of the feed through FT are removed, stray capacitance incidental to the feed through FT can be reduced, area occupied by unnecessary lines can be reduced and efficiency in using area can further be improved.

Embodiment 6

Figure 30:
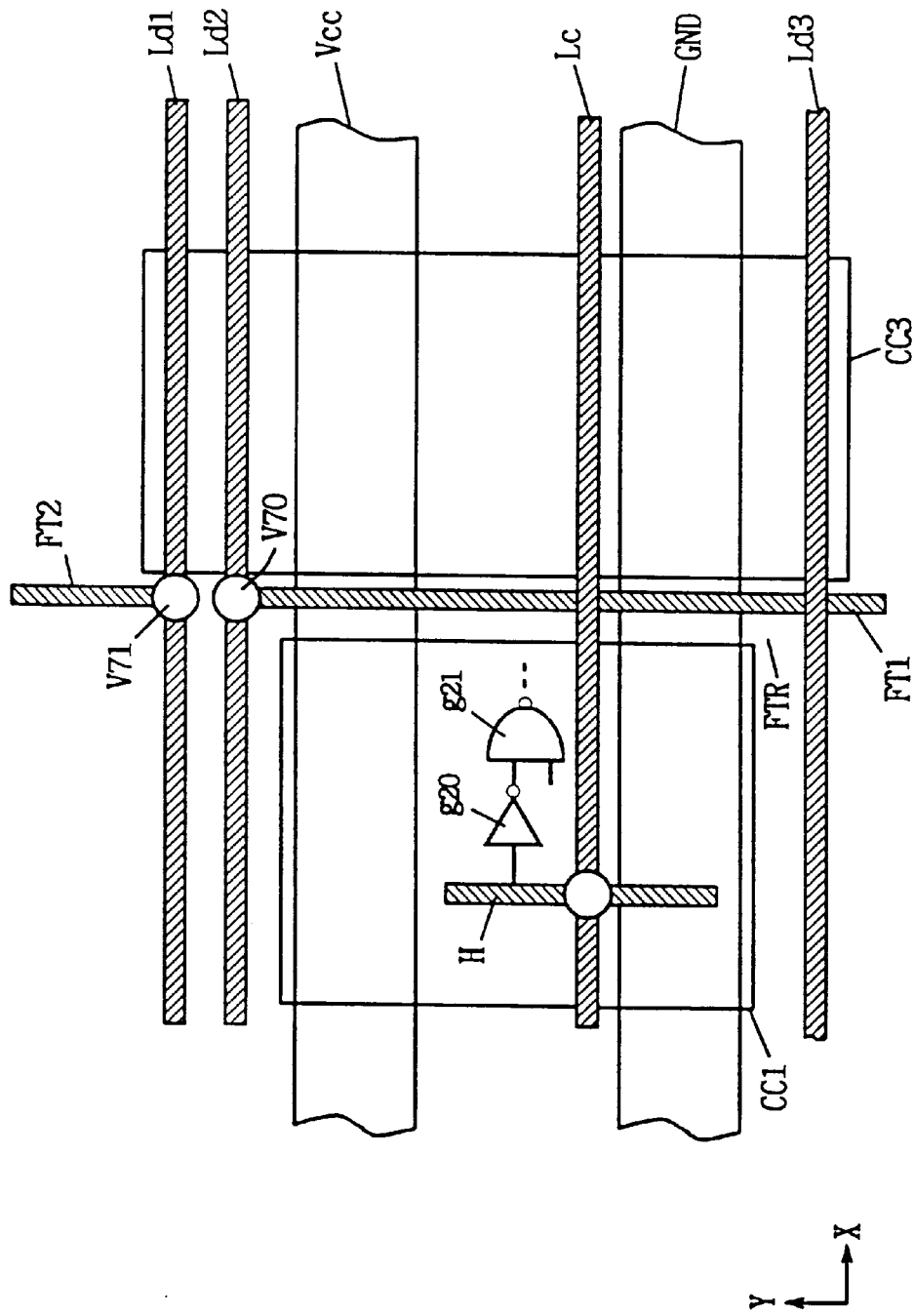
FIG. 30 shows a structure of a main portion of a semiconductor integrated circuit device in accordance with a sixth embodiment of the present invention.

FIG. 30 shows a manner of arrangement and interconnection of circuit cells in accordance with a sixth embodiment of the present invention. In FIG. 30, feed throughs FT1 and FT2 in a feed through region FTR between two circuit cells CC1 and CC3 are shown as examples. Referring to FIG. 30, circuit cell CC3 is longer in Y direction than circuit cell CC1, and in the protruded region, cell passing lines Ld1 and Ld2 are arranged, and a cell passing line Ld3 is arranged on the protruding region on the other side. Feed through FT1 is physically connected to cell passing line Ld2 through contact hole V70 and terminates thereat. Feed through FT2 extends from opposite direction to feed through FT1, and physically connected to cell passing line Ld1 through connection hole V71. Feed throughs FT1 and FT2 are arranged aligned in the Y direction. By this arrangement, the area occupied by the lines can be reduced, and further, the area occupied by the feed through FTR (length in the X direction) is also reduced, whereby the area occupied by the circuit cell band (length in the X direction) is also reduced.

Figure 31:
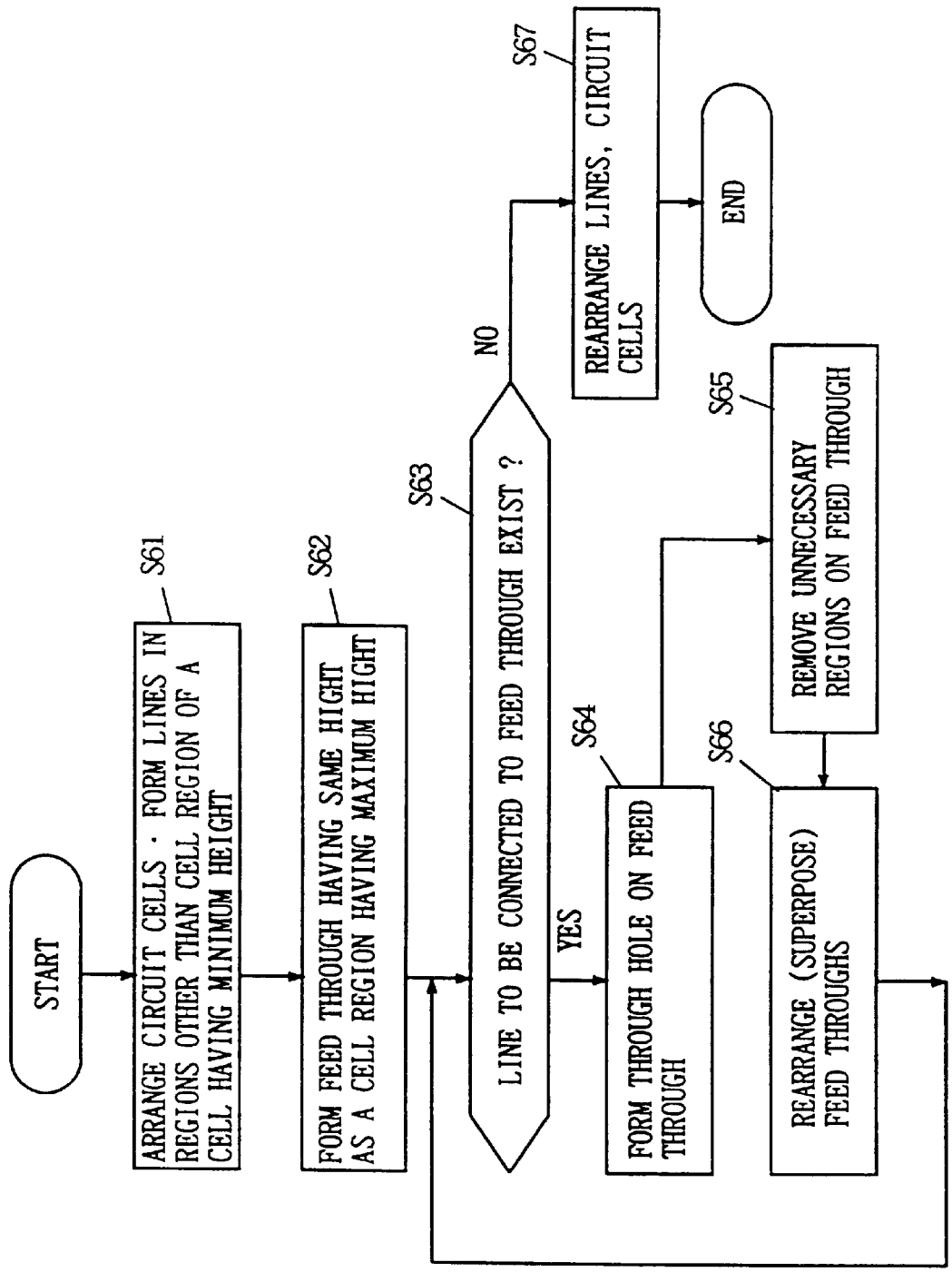
FIG. 31 is a flow chart showing a process sequence for implementing arrangement and interconnection of circuit cells in accordance with the sixth embodiment of the present invention.

FIG. 31 is a flow chart showing the process sequence of the arrangement and interconnection of the circuit cells shown in FIG. 30. First, in the similar manner as the fifth embodiment above, circuit cells are arranged, and lines are formed in regions outside the circuit cell region having the smallest height (arrangement of common line region and cell passing lines) (step S61). Thereafter, feed through region corresponding to the height of the circuit cell having the smallest height is formed (step S62). In step S62, similar to the fifth embodiment above, the height of the feed through region may be set to satisfy other conditions (see FIGS. 25 to 27). Thereafter, a feed through is arranged, and whether or not a feed through is to be used in each feed through region (whether or not there is a circuit cell and line to be connected) is determined (step S63). If not, the feed through is not utilized in the feed through region, and therefore re-arrangement of lines and circuit cells including elimination of the feed through region is performed (step S67).

When there is a feed through to be used, a connection hole (through hole) necessary for the feed through is formed (step S64). Thereafter, for this feed through, unnecessary region of the feed through is removed by tracking the connection path (see FIG. 4) (step S65). Consequently, as shown in FIG. 30, a state is realized in which feed throughs FT1 and FT2 are terminated on cell passing lines Ld2 and Ld1, respectively. Thereafter, direction of extension of the feed through is determined, and in accordance with the result of determination, the feed throughs are aligned along the Y direction (step S66). Thus, the state in which divided feed throughs FT1 and FT2 are aligned along the Y direction is realized as shown in FIG. 30. The series of operations in steps S63 to S66 is performed for every feed through region, and after every process is executed, re-arrangement of lines and circuit cells are performed (step S67).

Removal of unnecessary regions of the feed through and alignment in the Y direction are implemented in the similar manner as in the embodiments shown in FIGS. 8 to 12. What is different is that the length in Y direction of circuit cells on both sides of the feed through region differ from each other and that connection between the cell passing lines and the feed through is allowed.

As described above, in accordance with the sixth embodiment of the present invention, arrangement of cell passing lines is allowed and in the feed through region, when divided feed throughs can be aligned along the Y direction, the divided feed throughs are aligned in Y direction, so that area occupied by the lines (including the feed through region) can be reduced and efficiency in using area can be improved.

Embodiment 7

Figure 32:
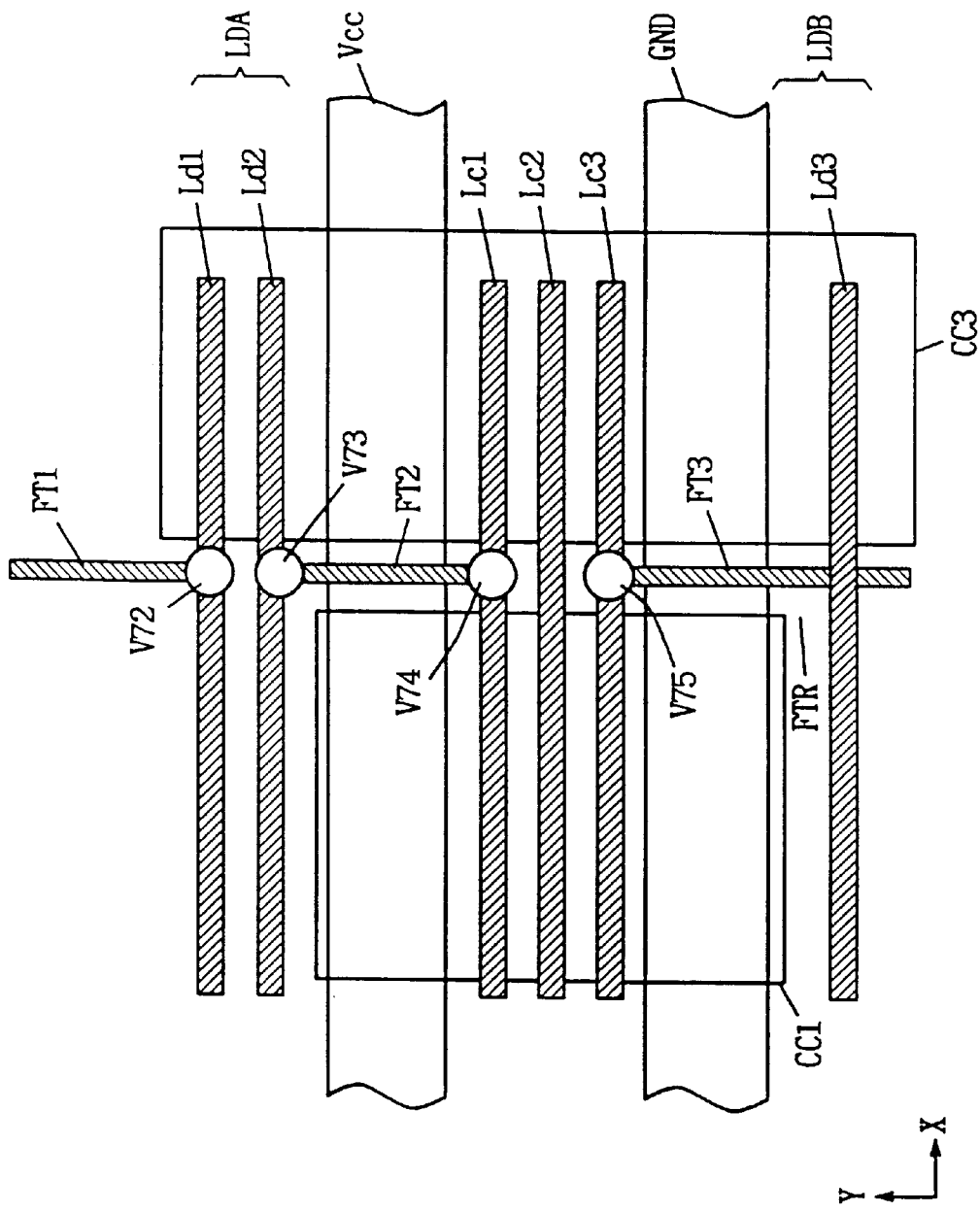
FIG. 32 shows a structure of a main portion of a semiconductor integrated circuit device in accordance with a seventh embodiment of the present invention.

FIG. 32 shows arrangement and interconnection of circuit cells in accordance with the seventh embodiment of the present invention. FIG. 32 also shows arrangement of circuit cells CC1 and CC2 having different lengths in Y direction and lines in the feed through region FTR therebetween. Referring to FIG. 32, a feed through FT1 connected to a line or a circuit cell not shown extends from one direction along the Y axis of FIG. 32, and physically connected to a cell passing line Ld1 included in cell passing line band LDA through a connection hole V72. Feed through FT1 terminates at the connection hole V72. A feed through FT2 is physically connected to cell passing line Lb2 through a connection hole V73 and terminates thereat. Feed through FT2 is, at the other end, physically connected to on-the-cell line Lc1 through connection hole V74 and terminates thereat. A feed through FT3 extends over cell passing line band LDB, and connected to a line or a port of a circuit cell, not shown. Feed through FT3 is connected to on-the-cell line Lc3 through connection hole V75 and terminates thereat.

These feed throughs, that is, divided feed throughs FT1, FT2 and FT3 are arranged aligned along the Y direction. As the feed throughs which can be aligned along the Y direction are all arranged aligned along the Y direction, the feed through regions respectively required for the feed throughs FT1 to FT3 can be reduced to only one feed through region, and hence area occupied by the feed through region can be reduced. Further, since unnecessary portions of the feed through are all removed, unnecessary stray capacitance of the feed through can be avoided, and hence optimal line connection can be realized.

FIG. 33 is a flow chart showing a process sequence for realizing the arrangement of the lines shown in FIG. 32. In the following, referring to FIG. 33, the arrangement of lines will be described. The process sequence described below may be interactively designated by the designer (user) with the apparatus.

First, in accordance with circuit cell information, port information and signal line information input by the designer (user), circuit cells are arranged, lines are arranged on regions outside of the circuit cell region which has the smallest height in Y direction, and respective connections are implemented (step S71).

Thereafter, a feed through region having the same height (length in Y direction) as the circuit cell having the smallest height is formed (step S72). Thereafter, in each feed through region, feed throughs are arranged, and whether or not the arranged feed throughs are connected to lines (including cell passing lines and on-the-cell lines) arranged in step S71 is determined (step S73). If there is not a feed through to be connected to the line, the feed through is removed, and circuit cells are re-arranged (step S77).

When there is a line to be connected to the feed through, a connection hole (through hole) necessary for the feed through is formed (step S74). Thereafter, whether or not the feed through is terminating at the line of the destinations of connection (any of the on-the-cell lines, cell passing lines and common lines) is identified, and direction of extension of the feed through is determined. In accordance with the result of determination, unnecessary regions of the feed through are removed (step S75). Removal of unnecessary regions of the feed through is performed based on the leading end and terminating end information of the feed through as well as the feed through specifying information described with reference to FIG. 4.

Thereafter, whether or not the feed throughs of which unnecessary portions are removed can be aligned along the Y direction is identified, and according to the result of identification, all the feed throughs which can be aligned are aligned along the Y direction (step S76). The steps S73 to S76 are performed for every feed through.

Figure 34A:
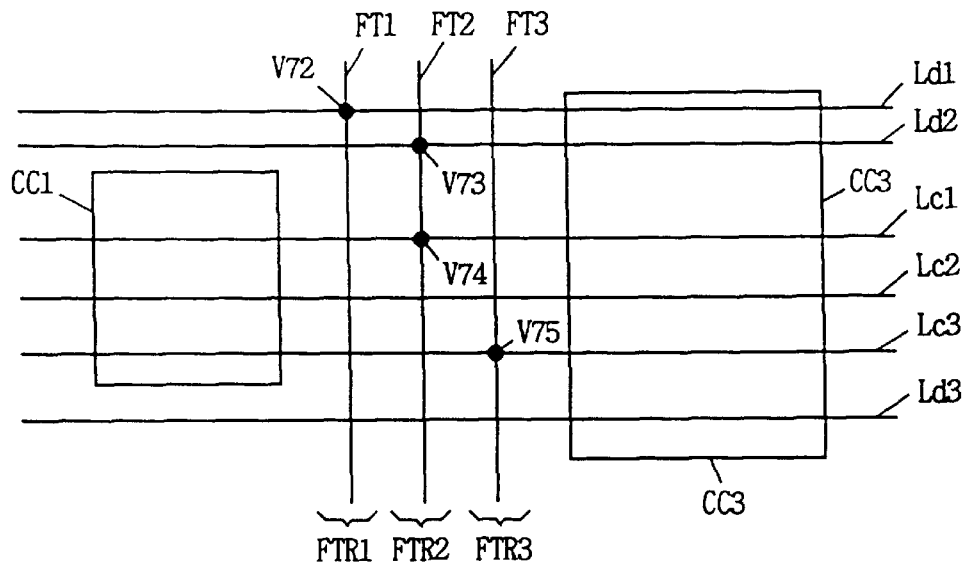
FIGS. 34A to 34C are illustrations showing alignment process operation of the feed through in accordance with the seventh embodiment of the present invention.
Figure 34B:
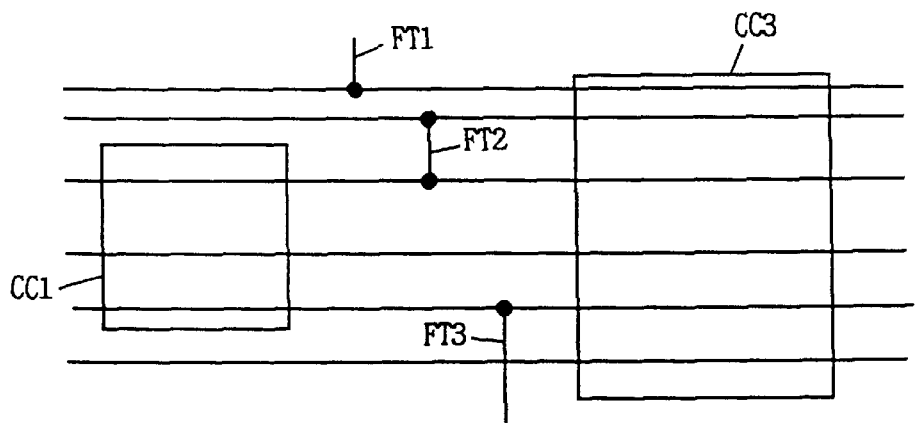
Figure 34C:
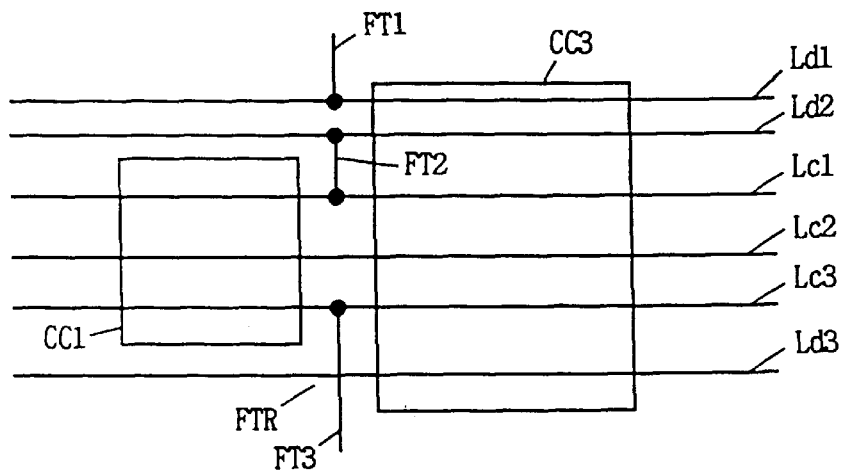

FIGS. 34A to 34C show manner of arrangement and interconnection of the feed throughs in accordance with the seventh embodiment of the present invention. First, as shown in FIG. 34A, a number of lines necessary in accordance with the number of signals input/output to and from the circuit band are arranged. FIG. 34A shows on-the-cell lines Lc1 to Lc3 and cell passing lines Ld1 to Ld3. Thereafter, feed throughs are arranged in plurality in accordance with the number of lines, and whether or not the feed throughs are connected to respective lines is determined. In FIG. 34A, feed throughs FT1 to FT3 which has connection to the lines are shown. In accordance with the result of identification, connections are formed. More specifically, feed through FT1 is connected to cell passing line LD1 through connection hole V72. Feed through FT2 is connected to cell passing line Ld2 and on-the-cell line Lc1 through connection holes V73 and V74, respectively. Feed through FT3 is connected to on-the-cell line Lc3 through connection hole V75. In this state, feed through regions FTR1 to FTR3 are necessary for feed throughs FT1 to FT3, respectively.

Thereafter, referring to FIG. 34B, in accordance with connection information of feed throughs FT1 to FT3, unnecessary portions of feed throughs FT1 to FT3 are removed.

Then, as shown in FIG. 34C, based on leading end information and terminating end information of feed throughs (divided feed throughs) FT1 to FT3, whether or not these can be aligned along the Y direction is identified. If alignment along the Y direction is possible, these feed throughs (divided feed throughs) FT1 to FT3 are aligned along the Y direction. This alignment operation is the same as that of the divided feed throughs shown in FIG. 8 above. After the feed throughs (divided feed throughs) are aligned, circuit cells are re-arranged, and three feed through regions FTR1 to FTR3 are reduced to one feed through region FTR. Feed throughs may be successively arranged in one feed through region and removal of unnecessary portions and alignment may be performed for each feed through.

As described above, in accordance with the seventh embodiment of the present invention, since unnecessary portions of the feed throughs are removed and feed throughs which can be aligned are all aligned, the area occupied by the feed through region can be significantly reduced.

Embodiment 8

Figure 35:
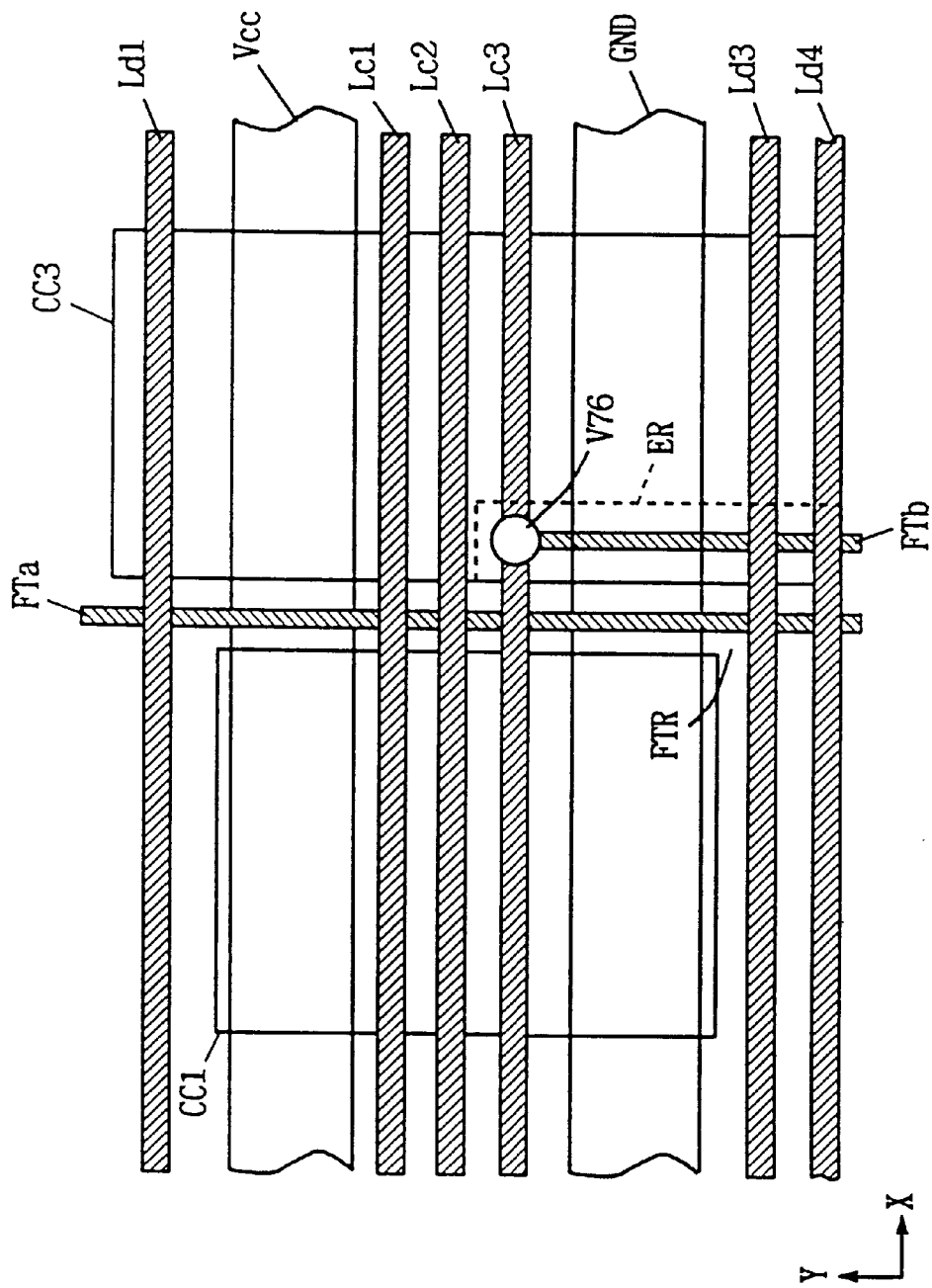
FIG. 35 shows a structure of a main portion of a semiconductor integrated circuit device in accordance with an eighth embodiment of the present invention.

FIG. 35 shows arrangement and interconnection of circuit cells in accordance with the eighth embodiment of the present invention. FIG. 35 shows arrangement of two circuit cells CC1 and CC3 and lines in feed through region FTR therebetween. The arrangement of FIG. 35 is the same as the arrangement of FIG. 13 except that the length in Y direction of circuit cells CC1 and CC3 on both sides of the feed through region FTR are different. Circuit cell CC3 has an empty region ER in which a transistor element (or internal line) is not arranged, divided feed through FTb is arranged extending to the empty region ER, and the divided feed through FTb is connected to an on-the-cell line Lc3 by means of connection hole V76 at the empty region ER. In feed through region FTR, a feed through FTa is arranged. As in the structure shown in FIG. 13, it is not necessary to provide the feed through region for the feed through FTb, and hence the area occupied by the feed through region can be reduced.

Figure 36:
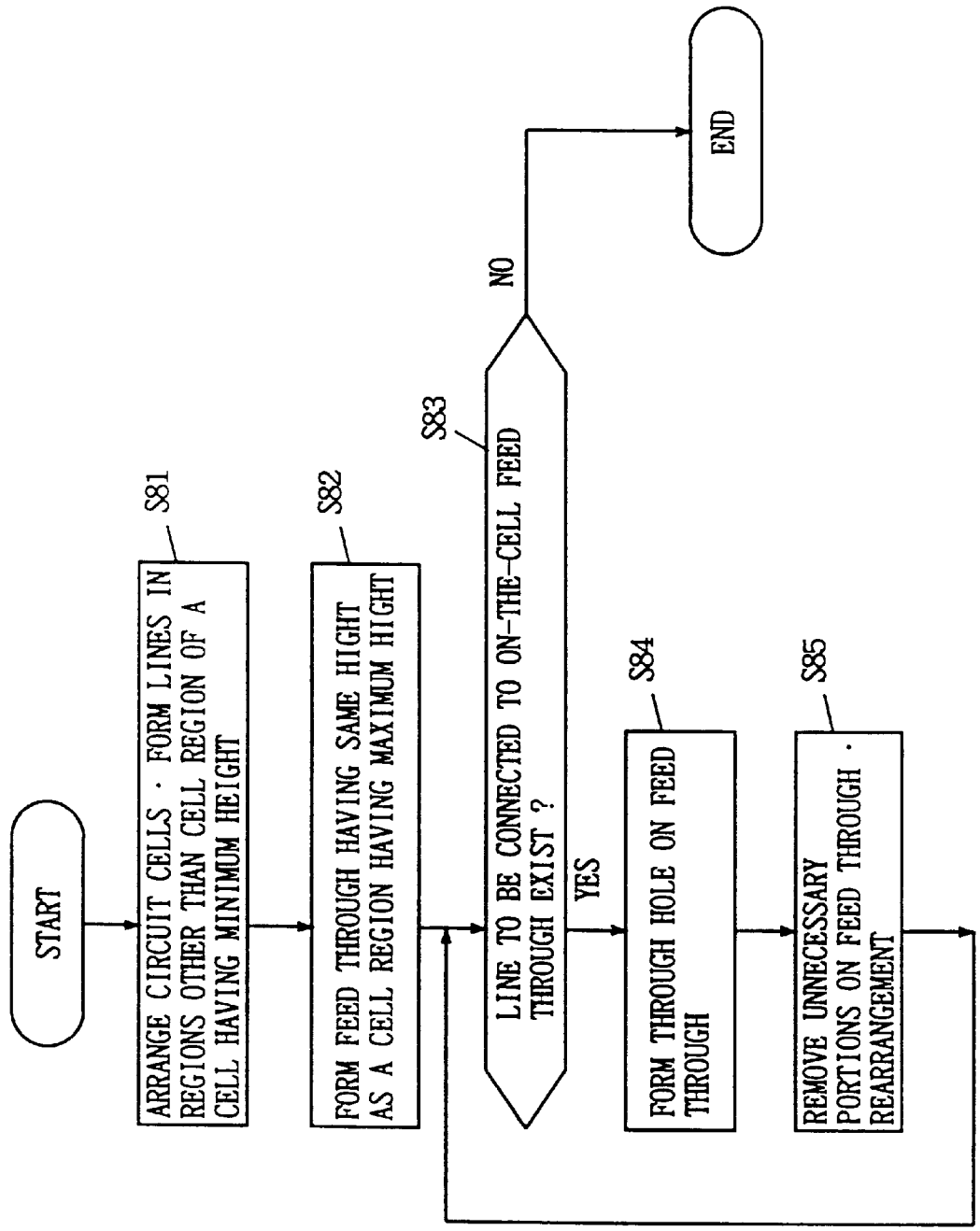
FIG. 36 is a flow chart showing a process sequence for implementing the arrangement and interconnection of the circuit cells in accordance with the eighth embodiment of the present invention.

FIG. 36 shows process sequence for implementing the connection of feed throughs shown in FIG. 35. Referring to the flow of FIG. 36, arrangement of feed through FTb shown in FIG. 35 will be described.

First, in the similar manner as the above described embodiments, in accordance with information input by the designer (user), circuit cells are arranged and lines are formed. In the formation of lines, lines are formed in regions outside along the Y direction of the circuit cell region having the smallest height in the circuit cell band and necessary connections are provided (step S81). Thereafter, a feed through region having the height of the circuit cell region of the lowest cell is formed between each of the circuit cells (step S82). Then, in each feed through region, a feed through is arranged. At this time, whether or not there is an empty region in circuit cells on both sides of the feed through region is determined. If there is an empty regina, a feed through (divided feed through) extending to the empty region is arranged. Thereafter, whether or not there is a line (on-the-cell line, cell passing line, line and port of a circuit cell) to be connected to the feed through (on-the-cell feed through) extending to the empty region of the circuit cell region is determined (step S83). At this time, whether or not there is a feed through connected to a line passing over the empty region ER along the X direction in the feed through region is determined, and if direction of extension of such feed through is the same as the on-the-cell feed through, the information of that feed through is transferred on to the on-the-cell feed through, and connection to the on-the-cell feed through is provided (step S84). Thereafter, unnecessary portions of other feed throughs are removed, and in accordance with the removal of the unnecessary portions, feed throughs are aligned and circuit cells are re-arranged (step S85).

The series of process sequence is the same as that described with reference to FIGS. 13 to 17.

In the process sequence flow chart of FIG. 16, feed throughs which can be replaced by on-the-cell feed throughs are detected, and the replaceable feed throughs (divided feed throughs) are replaced by the on-the-cell feed throughs. However, on the cell feed throughs may be arranged and connection of feed throughs may be directly formed in accordance with the leading and terminating end information of the feed throughs, without performing such replacement. More specifically, without performing the steps of arranging the feed throughs, forming connection of the feed throughs and removing unnecessary portions of the feed throughs, on the cell feed through connection may be directly formed. Such a structure can be readily implemented by using the data structure of FIG. 4, by linking a flag indicating whether or not there is an empty region in adjacent circuit cells to each feed through information.

In the arrangement shown in FIG. 35, on-the-cell feed through FTb is connected to on-the-cell line Lc3 through connection hole V76. However, on the cell feed through FTb may be connected to cell passing line Ld3 or Ld4.

The empty region ER may be arranged not on an end portion of the circuit cell CC3 along the X direction, but on an intermediate portion along the X direction.

As described above, according to the eighth embodiment of the present invention, even when the length (height of the cell) in the Y direction of the circuit cell differ in the circuit cell band, the empty region of the circuit cell may be used as the feed through region, and hence the area occupied by the feed through region can be reduced.

Embodiment 9

Figure 37:
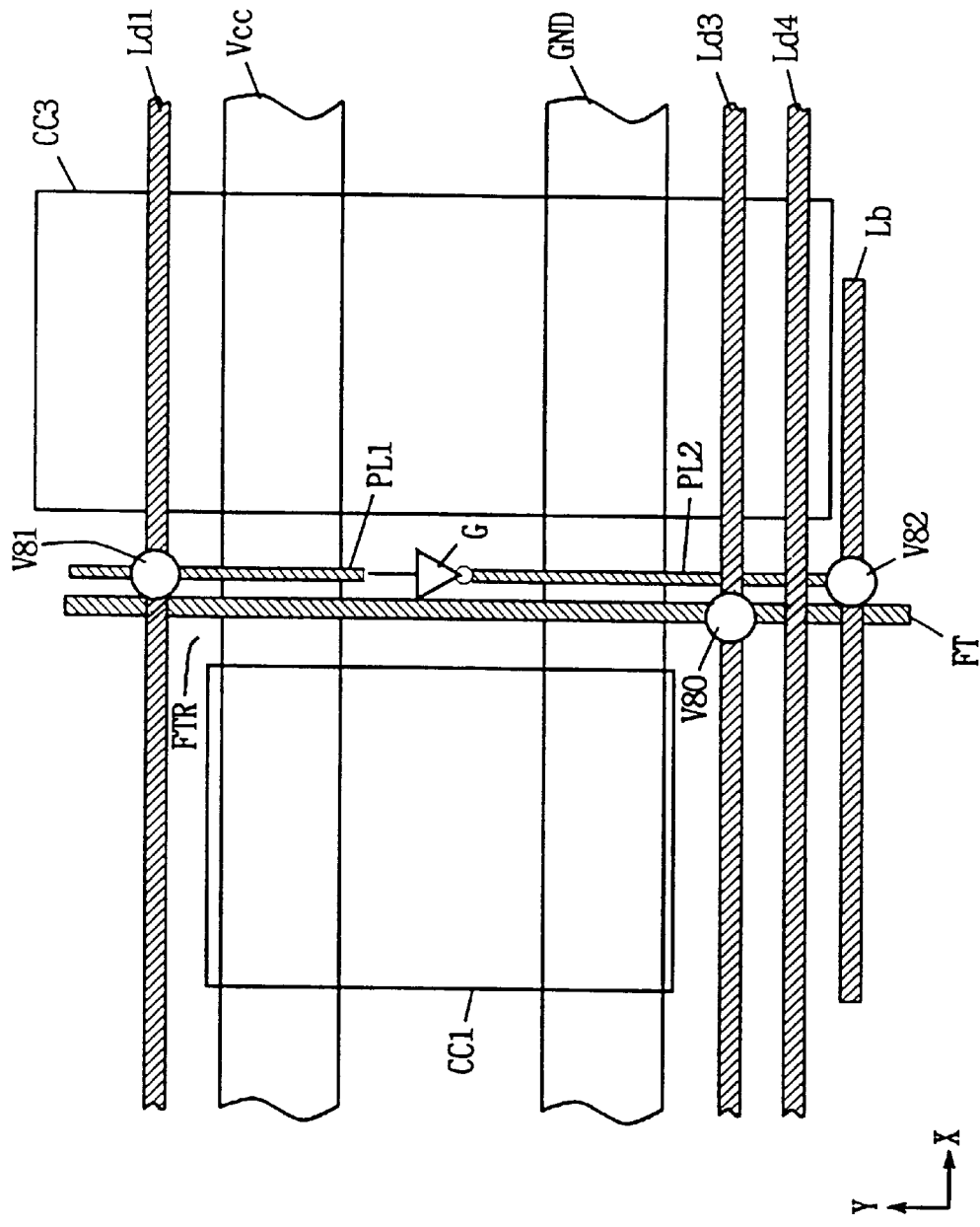
FIG. 37 shows a structure of a main portion of a semiconductor integrated circuit device in accordance with a ninth embodiment of the present invention.

FIG. 37 shows arrangement and interconnection of circuit cells in accordance with a ninth embodiment of the present invention. Referring to FIG. 37, in a feed through region FTR between circuit cells CC1 and CC3, a transistor element (gate) G is arranged. The transistor element (gate) G has a structure of an inverter as an example, and it is connected to cell passing line Ld1 and main line Lb through conductive lines PLa and PL2. Line PL1 is connected through connection hole V81 to cell passing line LD1, while line PL2 is connected to main line Lb through connection hole V82. In feed through region FTR, a feed through FT is arranged, and the feed through FT is connected to cell passing line Ld3 through a connection hole V80.

The arrangement shown in FIG. 37 is substantially the same as the arrangement shown in FIG. 18. It differs only in that the length along the Y direction (cell height) of circuit cells CC1 and CC3 arranged on both sides of the feed through region are different from each other.

Figure 38:
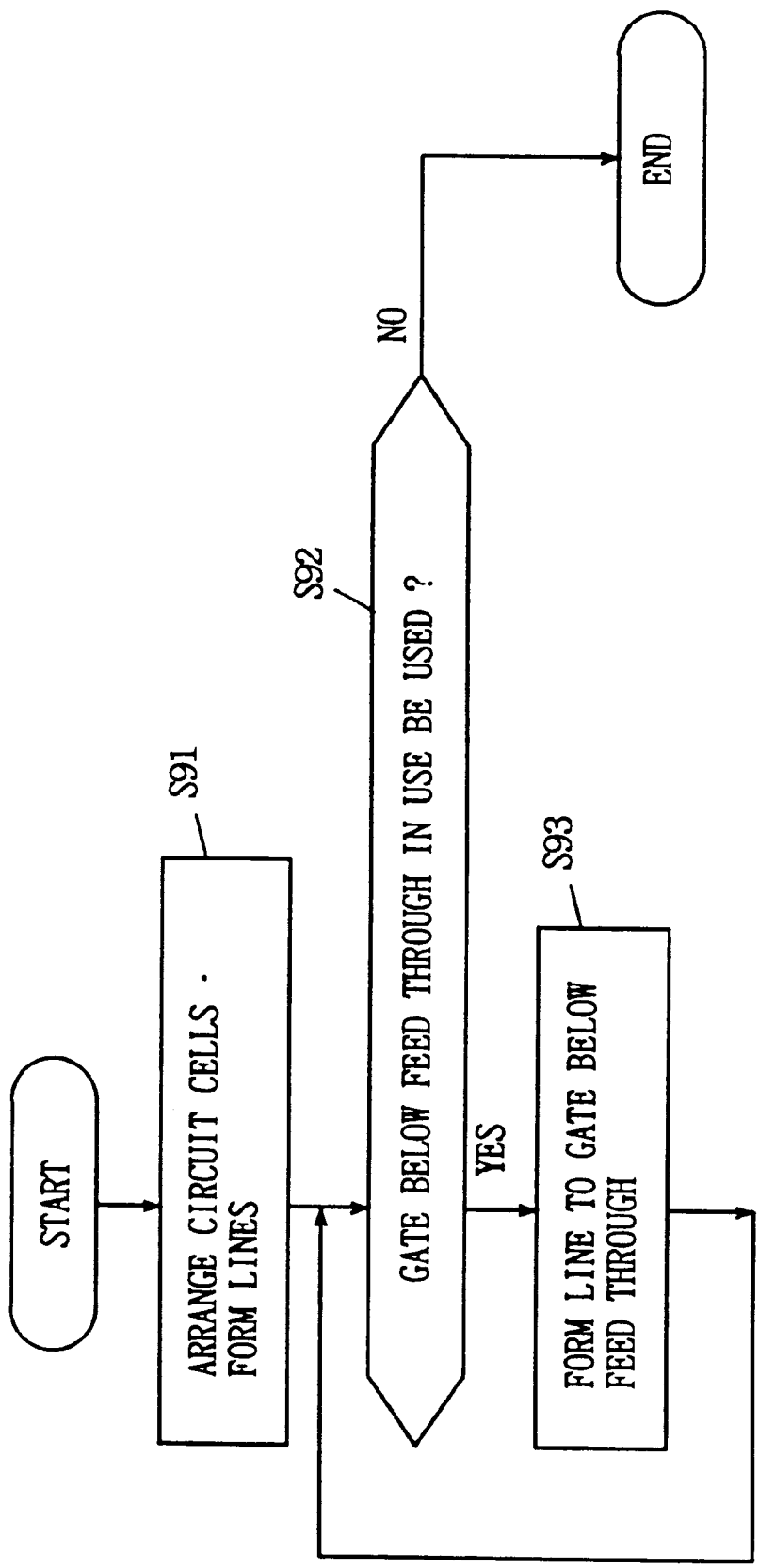
FIG. 38 is a flow chart showing a process sequence for implementing arrangement and interconnection of circuit cells in accordance with the ninth embodiment of the present invention.

FIG. 38 shows process sequence for implementing the arrangement of FIG. 37. First, as shown in step S91, circuit cells are arranged and lines are formed. In the arrangement of the circuit cells, circuit cells having different lengths in Y direction (cell heights) from each other are arranged aligned in one line. At this time, simultaneously, a feed through region is arranged between circuit cells, and a transistor element (gate) is arranged in the feed through region. Necessary connections for the feedthroughs, on-the-cell lines, cell passing lines and main lines are formed. In the step of forming lines, the interconnection sequence of any of the above described embodiments may be used.

After the lines are formed, whether or not the gate G arranged in the feed through should be used is determined (step S92). This determination may be interactively performed between the designer (user) and the arrangement and interconnection device. If the transistor element (gate) in the feed through region FTR should be used, necessary lines and connections for the transistor element (gate below feed through) in the feed through region are formed (step S93). Referring to FIG. 37, lines PL1 and PL2 are provided for the gate G, connection holes V81 and V82 are formed for the lines PL1 and PL2, respectively, and thus connection to the cell passing line Ld1 and main line Lb are formed. The series of processes are successively performed for every transistor element (gate; gate below feed through) in the feed through region. After the process for every gate below feed through is completed, circuit cells and lines are re-arranged. At this time, in a feed through region below which there is a gate not used, the gate below the feed through which is not used may be left as it is.

As described above, according to the ninth embodiment of the present invention, the feed through region can also be used as a transistor forming region, and even when change in design such as addition of circuit function becomes necessary, necessary function can be additionally implemented by using the transistor element (gate) in the feed through region. Therefore, change in design can be readily met without requiring change in internal lines in the circuit cells or the change in internal circuitry of the circuit cells in the circuit cell band. Further, since a transistor element (gate) is arranged in the feed through region, an extra area for arranging the spare transistor element (gate) is not necessary, and increase in area can be suppressed.

Embodiment 10

Figure 39:
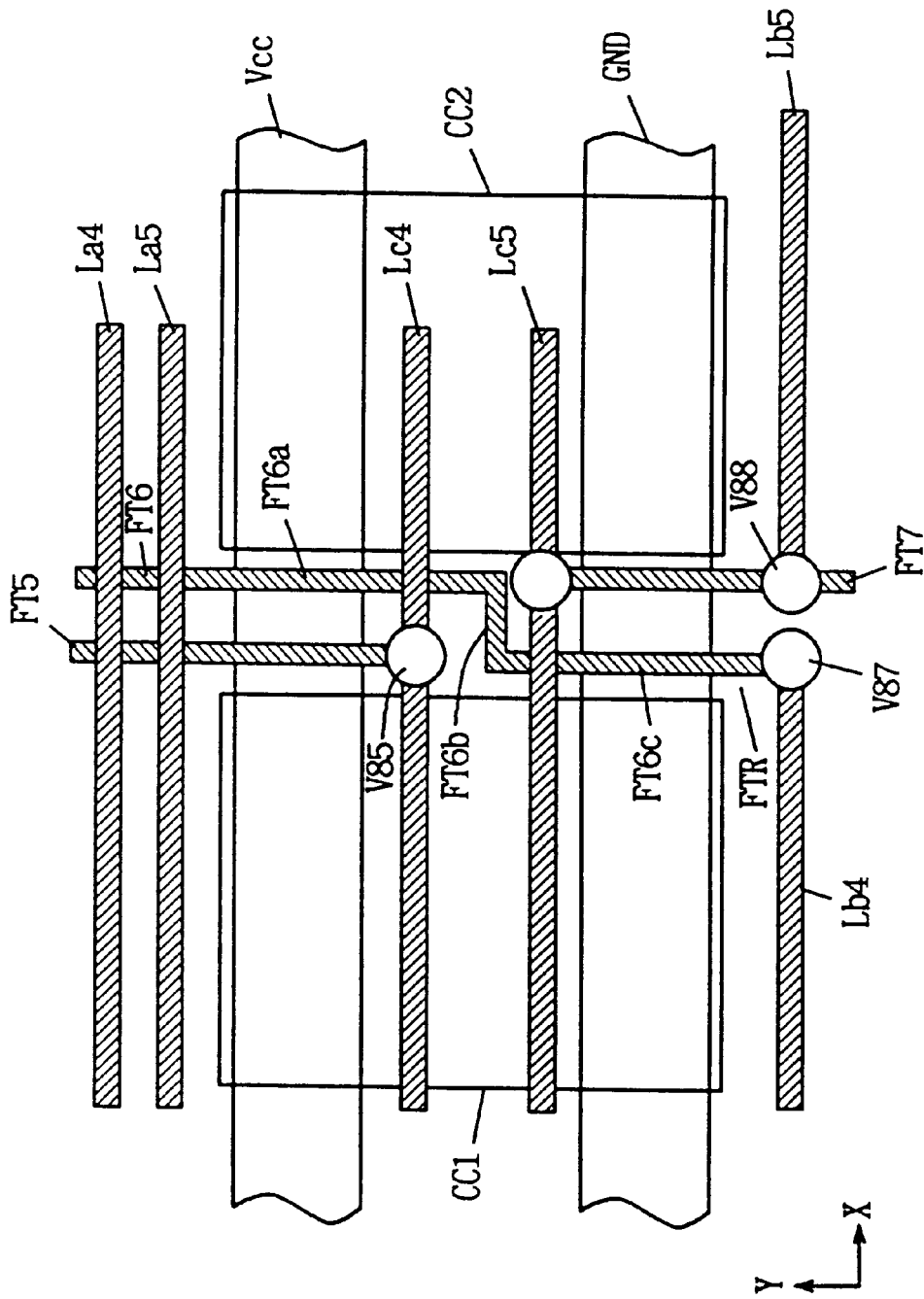
FIG. 39 shows a structure of a main portion of a semiconductor integrated circuit device in accordance with a tenth embodiment of the present invention.

FIG. 39 shows the manner of arrangement and interconnection of circuit cells in accordance with the tenth embodiment of the present invention. FIG. 39 shows the manner of connection between circuit cells CC1 and CC2 and lines in feed through region FTR between the cells. In FIG. 39, circuit cells CC1 and CC2 are shown to have the same length (cell height) in the Y direction. However, the circuit cells CC1 and CC2 may have different lengths in Y direction.

In feed through region FTR, feed throughs FT5, FT6 and FT7 are arranged. Feed through FT5 is connected to an on-the-cell line Lc4 through a connection hole V85 and terminates thereat. Feed through FT7 is physically connected to on-the-cell line Lc5 through a connection hole V86 and to a main line Lb5 through connection hole V88. Feed through FT6 includes a portion FT6a which is parallel to the divided feed through FT5, a bent portion FT6b for changing the position along the X direction, and a portion FT6c which is aligned in Y direction with the divided feed through FT5 and arranged parallel to the divided feed through FT7, in the feed through region FTR. The portion FT6c of feed through FT6 is connected to main line Lb4 through a connection hole V87. Main lines Lb4 and Lb5 are arranged aligned along the X direction.

As shown in FIG. 39, as the feed through FT6 is adapted to have a bent portion (JOG) FT6b in the feed through region FTR, it becomes possible to arrange the feed through FT6 aligned with the divided feed throughs ST5 and ST7, and hence the area occupied by the feed through region FTR can be reduced. The process of alignment of the feed through shown in FIG. 39 may be interactively performed by the designer (user) with the processing apparatus.

FIG. 40 is a flow chart representing automatic line re-arrangement of the feed through region. In the following, the process of re-arrangement of the feed throughs will be described with reference to FIG. 40.

First, according to the information input by the designer (user), circuit cells are arranged and lines are formed (step S101). Formation of lines include arrangement of on-the-cell lines and main lines as well as connection to each circuit port.

Thereafter, a feed through region is arranged between circuit cells, and in each feed through region, feed throughs are arranged. For these arranged feed throughs, whether or not there are lines to be connected to the feed throughs is identified (step S102). If there is a line (main line or an on-the-cell line) to be connected to the feed through, necessary connection is formed (step S103). More specifically, connection holes V85, V86, V87 and V88 of FIG. 39 are formed. Thereafter, unnecessary lines are removed and lines are re-arranged (step S104). By the process of step S104, main lines Lb4 and Lb5 shown in FIG. 39 are arranged aligned along the X direction.

Thereafter, unnecessary portions of the feed throughs are removed and the feed throughs are aligned along the Y direction. More specifically, feed through FT5 shown in FIG. 39 terminates at the connection portion (connection hole V85) with the on-the-cell line Lc4, and feed through FT7 terminates at the connection hole V86. In this re-arrangement process, divided feed throughs which can be aligned in the Y direction are aligned in Y direction (vertically superposed) (step S105). Thereafter, whether or not a feed through should be bent is identified (step S106). This step is performed if it is determined that superposing of the divided feed throughs is impossible. Then, if it is possible to bent the feed through, a bent portion (FT6b of FIG. 39) is provided to the feed through. Thereafter, re-arrangement of the feed throughs is again performed, and the feed throughs are re-arranged along the Y direction. These processes are formed for each feed through region. At this time, in each feed through region, the process shown in FIG. 40 is successively performed for the feed throughs.

Figure 41A:
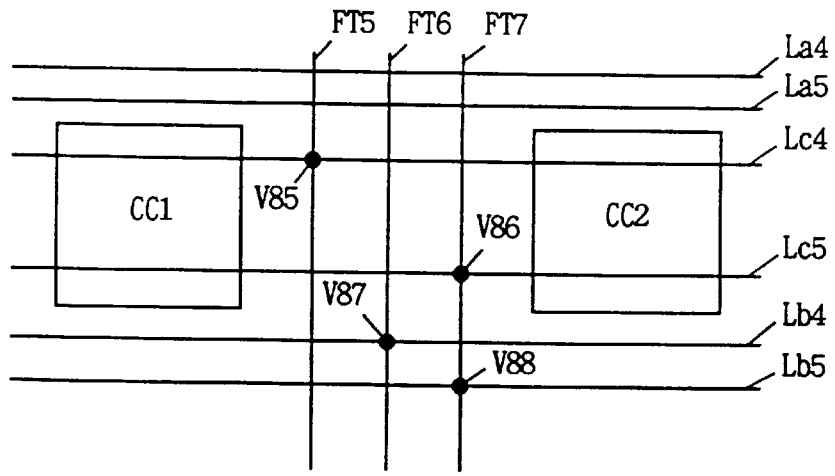
FIGS. 41A to 41C are illustrations showing arrangement process operation of the feed through in accordance with the tenth embodiment of the present invention.
Figure 41B:
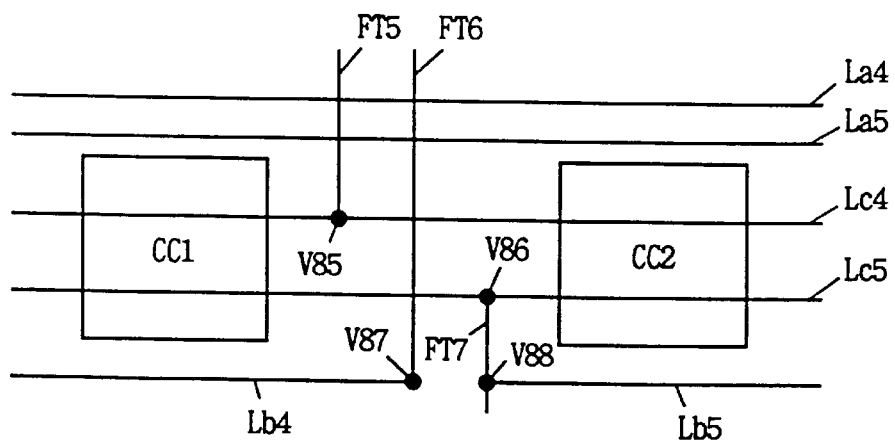
Figure 41C:
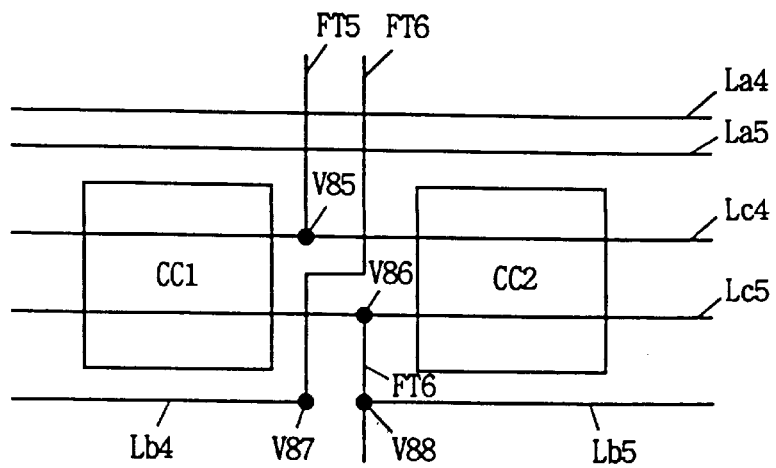

FIGS. 41A to 41C show arrangements of the feed throughs in accordance with the tenth embodiment of the present invention. First, as shown in FIG. 41A, a feed through region is arranged between circuit cells CC1 and CC2, and feed throughs FT5, FT6 and FT7 are arranged successively. For the feed throughs FT5, FT6 and F7, whether or not there is a line to be connected (main line or a on-the-cell line) is determined. In accordance with the result of determination, connection hole is provided for each feed through. In this state, unnecessary portions of the feed throughs FT5 to FT7 have not yet been removed. Therefore, the feed through region has an area sufficient for the three feed throughs.

Thereafter, as shown in FIG. 41B, unnecessary lines are removed and lines are re-arranged. In this process, unnecessary portions of main lines Lb4 and LB5 are removed. Thereafter, for the main lines Lb4 and Lb5, whether or not alignment along the X direction is possible is determined, and in accordance with the result of determination, main lines Lb4 and Lb5 are aligned.

Thereafter, unnecessary portions of the feed throughs are removed, feed through FT5 terminates at connection hole V85 and feed through FT7 terminates at the connection hole V86.

Thereafter, in accordance with the divided feed through information, whether or not alignment along the Y direction is possible in the feed through region is identified. In this case, in each feed through region, whether or not alignment of two adjacent lines along the X direction is possible or not is determined. In the example shown in FIG. 41B, alignment of the feed throughs along the Y direction is not possible. Thereafter, in the feed through region, whether or not there is a divided feed through on either side of the feed through FT6 is determined, and when there are divided feed throughs, whether or not alignment along the Y direction is possible is determined. In accordance with the result of determination on feed throughs FT5 and FT7, a bent portion is provided in feed through FT6 as shown in FIG. 41C, and alignment along the Y direction is performed.

Figure 42:
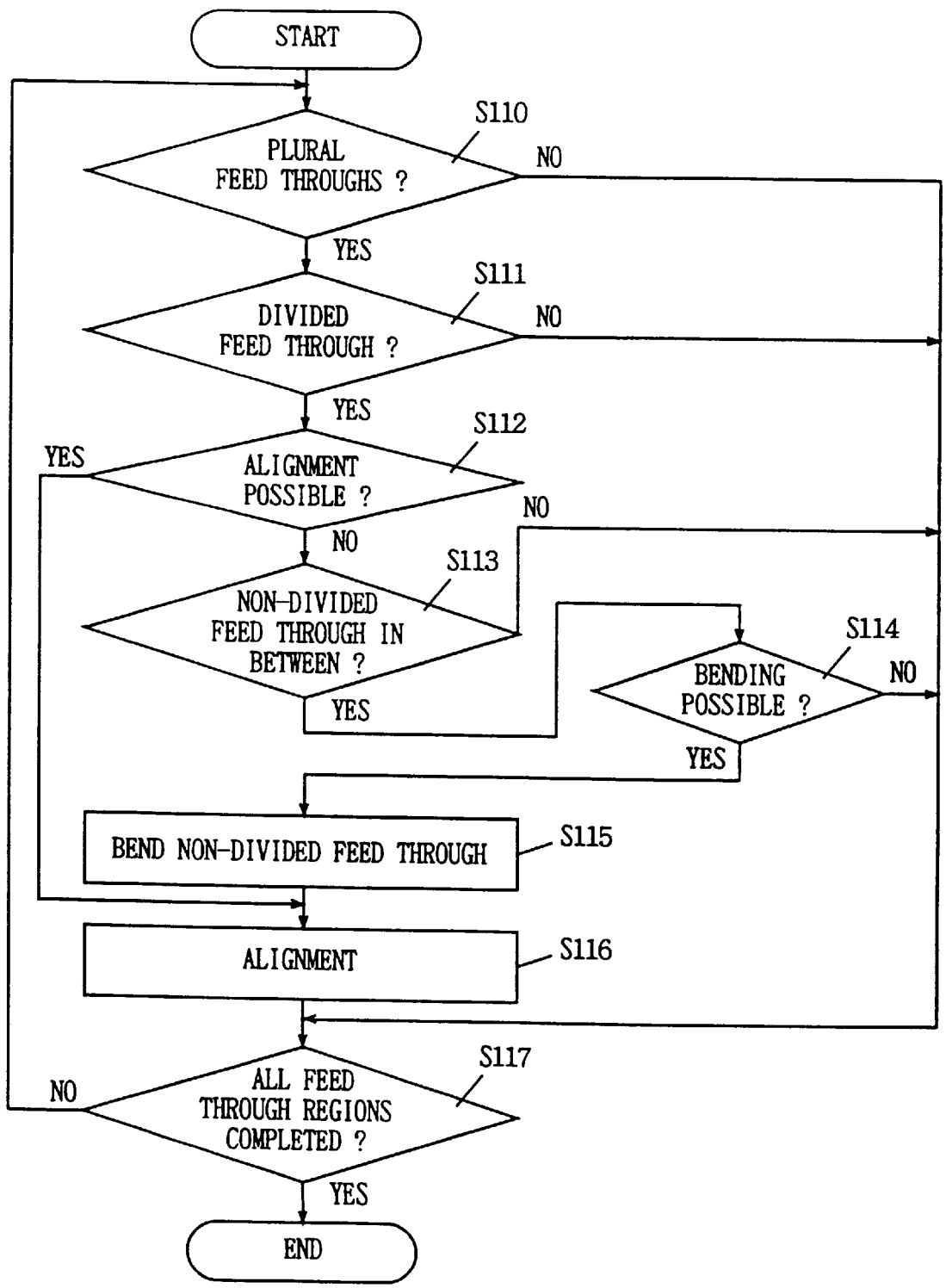
FIG. 42 is a flow chart showing the sequence of feed through arrangement process operation shown in FIG. 41.

FIG. 42 shows the process sequence of alignment of the feed throughs shown in FIGS. 41A to 41C. The process sequence shown in FIG. 42 corresponds to the process step S106 shown in FIG. 40.

First, as shown in step S110, whether or not there are a plurality of feed throughs in one feed through region is determined. When there are a plurality of feed throughs, whether or not these include a divided feed through is determined (S111). When there is a divided feed though, whether or not alignment is possible is determined (step 112). If possible, the flow jumps to step S116, in which alignment is performed. If not, the reason why alignment is impossible is determined. More specifically, whether or not there is an inbetween non-divided feed through hindering alignment is determined (step S113). The fact that alignment is impossible because of the existence of non-divided feed through is identified by detecting a range of existence of the feed through and by determining whether or not there is an overlap in the ranges (in Y direction) of the feed throughs, in accordance with the leading end information and terminating end information of each feed through.

If it is determined that alignment is impossible because of the non-divided feed through, whether or not it is possible to bent the non-divided feed through is determined (step S114). Whether or not bending is possible is determined by looking up directions of extension of the main line to which a feed through is connected and of the main line to which adjacent divided feed through is to be connected. This can be determined by referring to the information of existence (leading end information and terminating end information) of each main line when the unnecessary lines are removed.

If it is determined that the non-divided feed through may be bent, the non-divided feed through is bent (step S115). Thereafter, alignment of the feed throughs in the feed through region is performed (step S116). This process is executed for every feed through region (step S117). If there is a negative determination in steps S110 to S114, the flow proceeds to S117, in which whether every feed through region has been processed is determined, and if not, the flow returns to step S110, and alignment of the feed through is performed.

In accordance with the above described series of process sequence, by bending the non-divided feed through, feed throughs can be arranged efficiently in the feed through region, and hence area occupied by the feed through region can be reduced.

As described above, in accordance with the tenth embodiment of the present invention, if it is possible to bent a feed through, the feed throughs are aligned by bending, and hence the area occupied by the feed through region can be reduced.

Embodiment 11

Figure 43A:
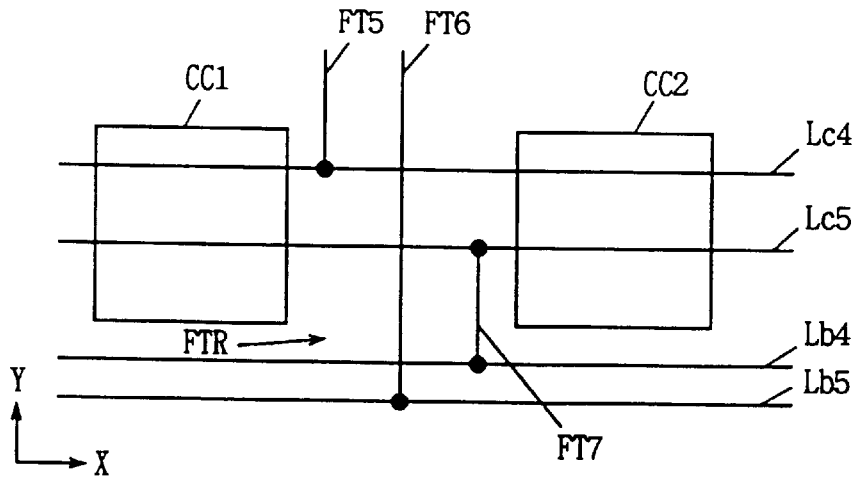
FIGS. 43A to 43C show the sequence of feed through alignment process in accordance with an eleventh embodiment of the present invention.
Figure 43B:
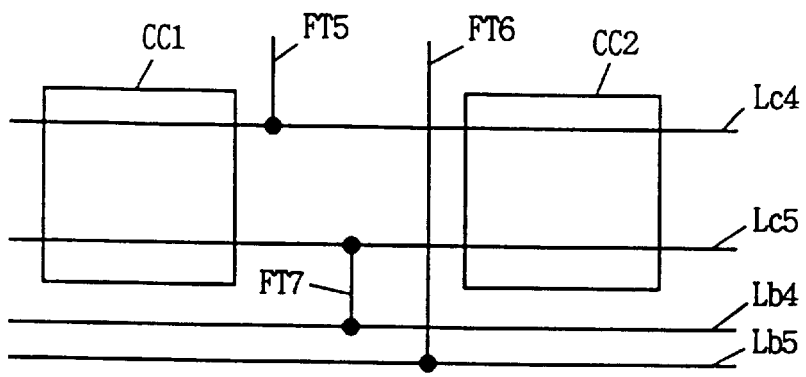
Figure 43C:
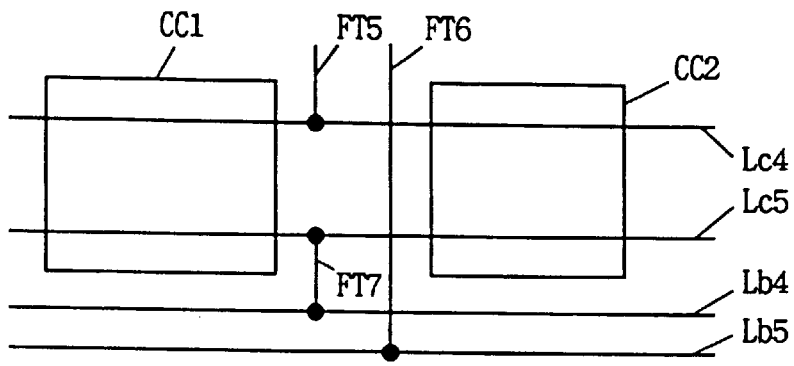

FIGS. 43A to 43C show the method of arrangement and interconnection of circuit cells in accordance with an eleventh embodiment of the present invention. First, as shown in FIG. 43A, three feed throughs FT5, FT6 and FT7 are arranged in a feed through region FTR between circuit cells CC1 and CC2. On circuit cells CC1 and CC2, on-the-cell lines LC4 and LC5 are arranged, and in a line band region, main lines Lb4 and Lb5 are arranged.

Feed through FT5 is physically connected to on-the-cell line Lc4 through a connection hole and terminates thereat. Feed through FT6 is connected to main line Lb5 and terminates thereat. Feed through FT7 has one end connected to on-the-cell line LC5 through a connection hole and terminates thereat, and the other end is physically connected to main line Lb4 through a connection hole and terminates thereat.

In the state shown in FIG. 43A, feed throughs FT5 and FT7 are divided feed throughs, and they do not have any overlapping region in the Y direction. Since there is a feed through region FT6 therebetween, the divided feed throughs ST5 and ST7 cannot be aligned along the Y direction as they are. Therefore, as shown in FIG. 43B, the positions of divided feed through ST7 and feed through FT6 are exchanged in X direction. In the state of FIG. 43B, adjacent divided feed throughs ST5 and ST7 can be aligned. Thereafter, as shown in FIG. 43C, divided feed throughs ST5 and ST7 are aligned along the Y direction.

Figure 44:
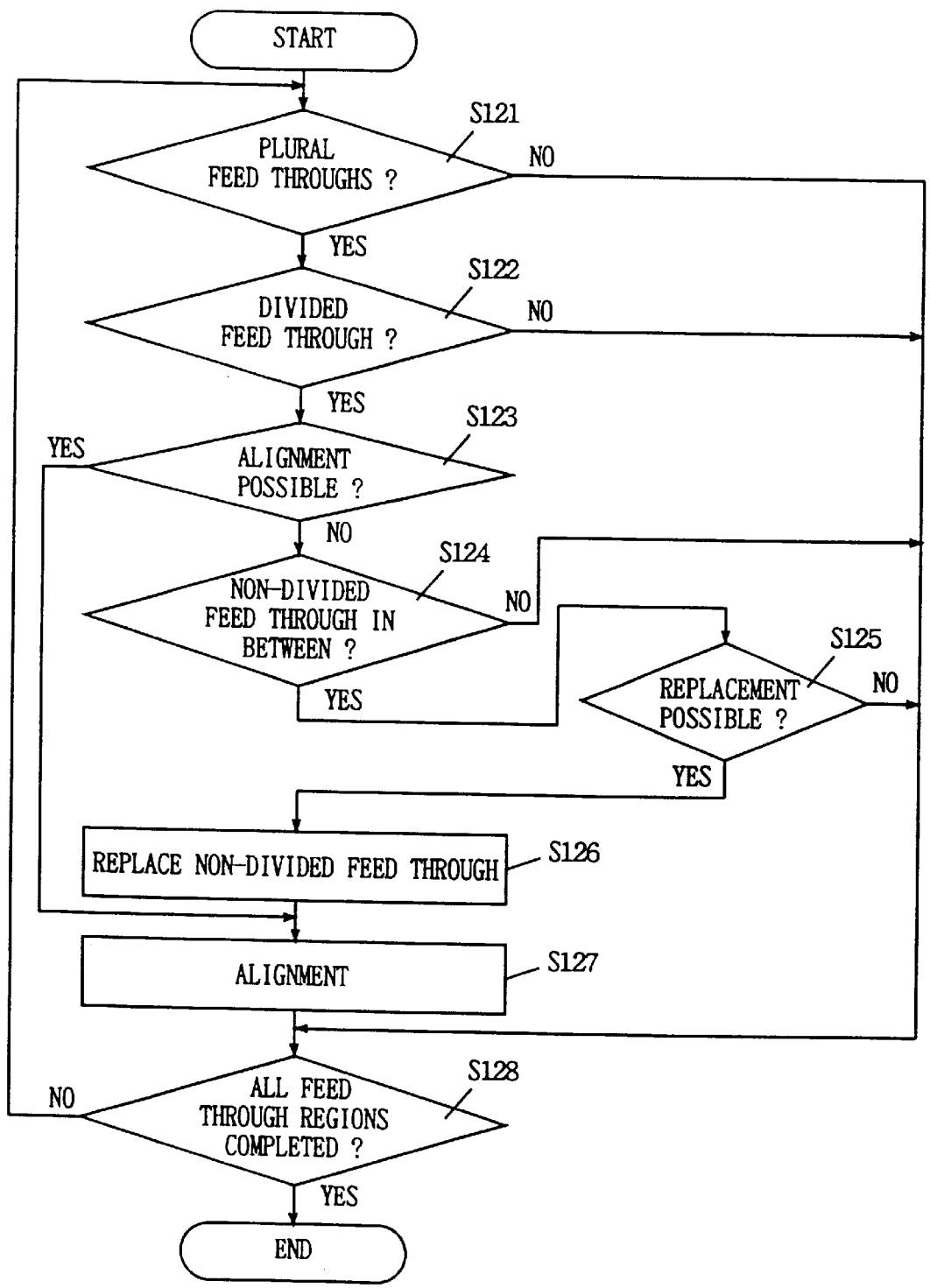
FIG. 44 is a flow chart for implementing the process sequence shown in FIG. 43.

FIG. 44 is a flow chart showing the process of re-arrangement of the feed throughs shown in FIGS. 43A to 43C. The re-arrangement operation of the feed throughs will be described with reference to FIG. 44. First, circuit cells are arranged and lines are formed, and a feed through region is arranged between circuit cells. In the feed through region, feed throughs are arranged and necessary connection portions are formed. Therefore, in each feed through region, the following process is performed. First, in an object feed through region, whether or not there are a plurality of feed throughs is determined (step S121). If there are a plurality of feed throughs, whether or not there are divided feed throughs among the plurality of feed throughs is determined (step S122). If there are divided feed throughs, whether or not these can be aligned along the Y direction is determined (step S123). If not, whether or not the alignment is impossible because of a non-divided feed through existing therebetween is determined (step S124). The series of operations in steps S121 to S124 are the same as those described with reference to FIG. 42 showing the tenth embodiment above.

Thereafter, whether or not the non-divided feed through can be replaced by divided feed through is determined (step S125). If it is determined to be replaceable, the non-divided feed through is replaced by a divided feed through (step S126). Thereafter, alignment of the divided feed throughs along the Y direction is determined. The series of operations are performed for every feed through region (step S128).

As for the process sequence shown in FIG. 44, replacement and alignment may be performed by the designer (user) interactively with the apparatus (processing apparatus) while the user monitoring the screen of the display. However, as will be described in the following, the processing apparatus may process in accordance with the information provided to its feed through.

Figure 45:
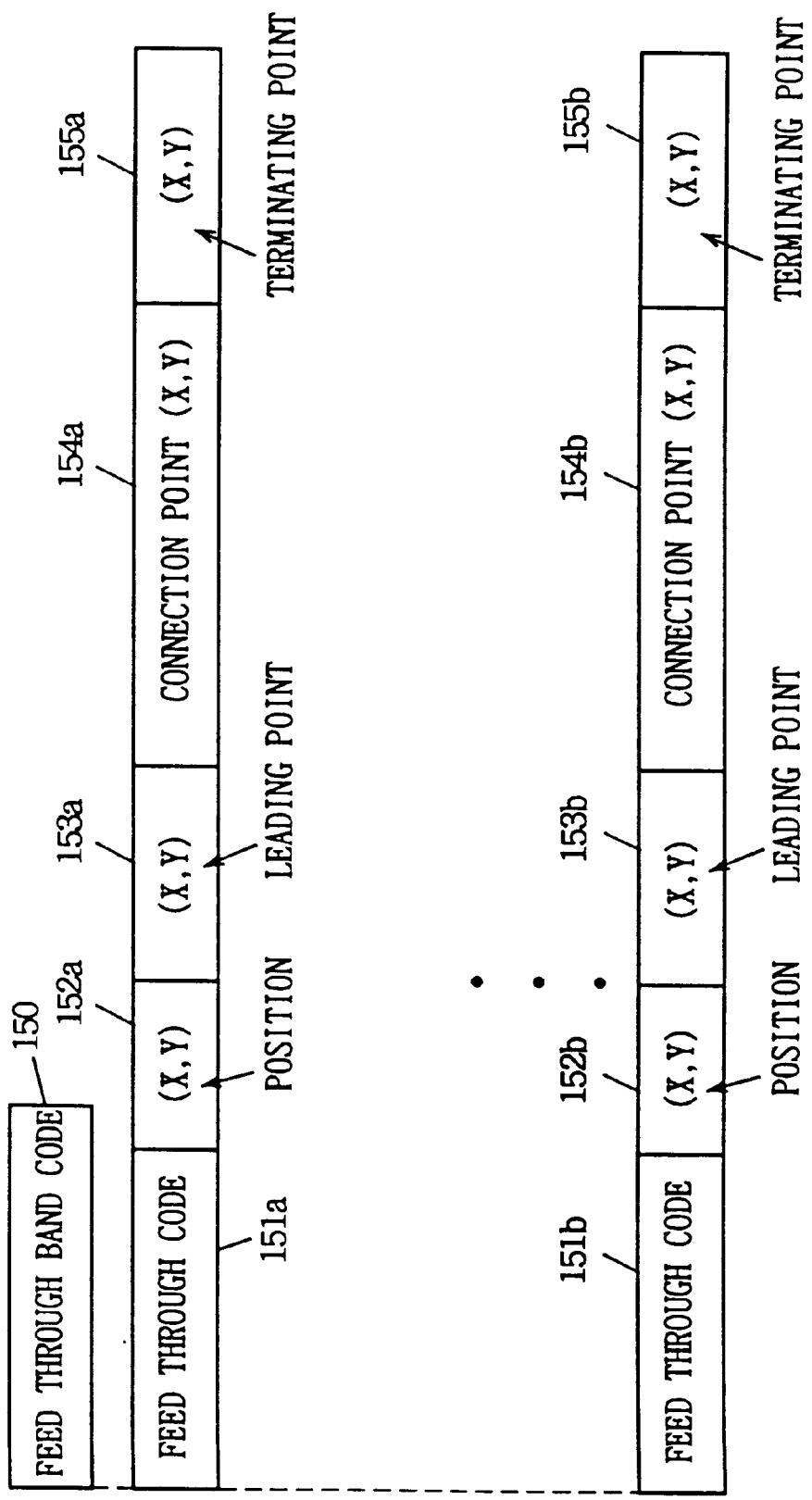
FIG. 45 is an illustration showing a data processing operation realizing the process sequence of FIG. 44.

FIG. 45 shows a data structure allowing switching of positions of the feed throughs (feed through swap). In FIG. 45, the feed through region is specified by a feed through band code 150. The feed through band code 150 may include information of positions in X and Y directions and size (in X and Y directions). The feed through included in the feed through region is identified by a feed through code 151 (151a, 151b) for specifying the feed through, positional information 152 (152a, 152b) indicative of the position of the feed through (X and Y directions), a leading point information 153 (153a, 153b) indicating a leading point (one end) of the feed through, a connection point information 154 (154a, 154b) specifying an intermediate position of a connection hole, and a terminating end information 155 (155a, 155b) indicating the position of the terminating point of the feed through. The leading point information 153, connection point information 154 and terminating point information 155 may include information with respect to both X and Y directions, or only the positional information in Y direction. The position in the X direction is specified by positional information 152a. To the leading point information 153, to connection point information 154 and to terminating point information 155, extension direction information 156 (156aa, 156ab, 156ba, 156bb) indicating the direction of extension of the line (on-the-cell line, main line or cell passing line) to which the feed through is connected, is linked. The extension direction information 156 is extracted based on the corresponding line information. The extension direction information 156 includes information on the X direction.

Whether or not it is a divided feed through is determined dependent on whether the position indicated by the leading point information 153 or terminating point information 155 exists in the feed through region specified by the feed through band code 150, that is, whether or not the position specified by the leading point information 153 or the terminating point information 155 exists in the region in the Y direction of the feed through region specified by the feed through band code. After the divided feed through and non-divided feed through are identified, a connection point of a feed through closest to the leading point or terminating point of a feed through is extracted (each of the connection points may be regarded as a leading point or terminating point). Then, whether or not the extracted connection point information 154 of the non-divided feed through and the leading point information 153 or terminating point information 155 of the divided feed through have the same position in Y direction is determined. If not, in other words, if the corresponding line (on-the-cell line, main line, cell passing line) is not aligned in the X direction, the position of the divided feed through and the non-divided feed through can be switched (swappable). If the position in Y direction is the same, these have already been connected to lines extending in opposite directions in the re-arrangement of lines. Therefore, if the non-divided feed through and the divided feed through are swapped, additional lines must be provided in the line region, and hence the non-divided feed through and the divided through are not switched in position (not swapped).

When the feed throughs are swapped, in the data structure shown in FIG. 45, the position in the X direction in the positional information 152, leading point information 153, connection point information 154 and terminating point information 155 are changed accordingly.

As described above, according to the eleventh embodiment of the present invention, since positional swapping of non-divided feed through and divided feed through is possible, alignment of the divided feed throughs in the Y direction becomes possible, and hence the area occupied by the feed through region can be reduced.

Embodiment 12

Figure 46:
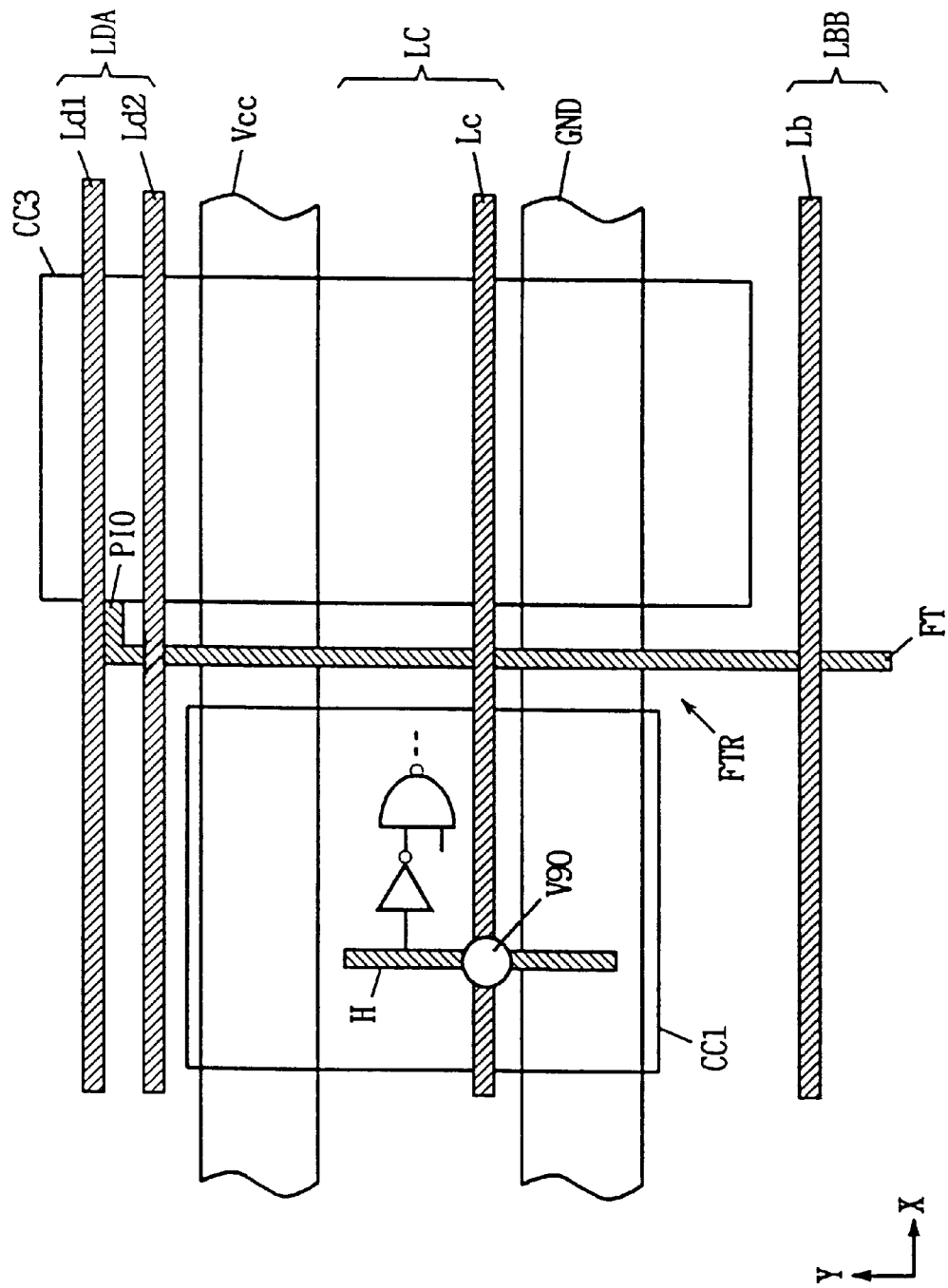
FIG. 46 shows a structure of a main portion of the semiconductor integrated circuit device in accordance with a twelfth embodiment of the present invention.

FIG. 46 shows a manner of arrangement and interconnection of circuit cells in accordance with the twelfth embodiment of the present invention. Referring to FIG. 46, circuit cells CC1 and CC3 having different heights are shown as examples. In a cell passing line band LDA, cell passing lines Ld1 and Ld2 are arranged crossing a region of circuit cell CC3 which is protruding in the Y direction. An on-the-cell line Lc is arranged crossing the circuit cells CC1 and CC3 along the X direction. On a region outside the circuit cell CC3 along the Y direction, a main line Lb included in the line band LBB is arranged. In a feed through region FTR between circuit cells CC1 and CC3, a feed through FT is arranged. The feed through FT is connected at port PI0 to circuit cell CC3, in the cell passing line band region. The feed through FT is adapted to be connected to circuit cell CC3 in a region of the circuit cell where it is in contact with the feed through region FTR (the feed through region is determined dependent on the height of circuit cell CC3), and hence for the connection between feed through FT and circuit cell CC3, extra line is not necessary, so that area occupied by the lines can be reduced. More specifically, different from the conventional structure in which ports of the circuit cell are allowed only on opposing sides of circuit cells along the Y direction, arrangement of ports of the circuit cell in a region in contact with or opposing to the feed through region is allowed, and therefore, it becomes unnecessary to connect the feed through FT once to another main line and then to the circuit cell CC3 by means of a sub line, whereby the area occupied by the lines can be reduced.

FIG. 46 shows a state in which on-the-cell line Lc is physically connected to internal line H of circuit cell CC1 through a connection hole V90.

Figure 47:
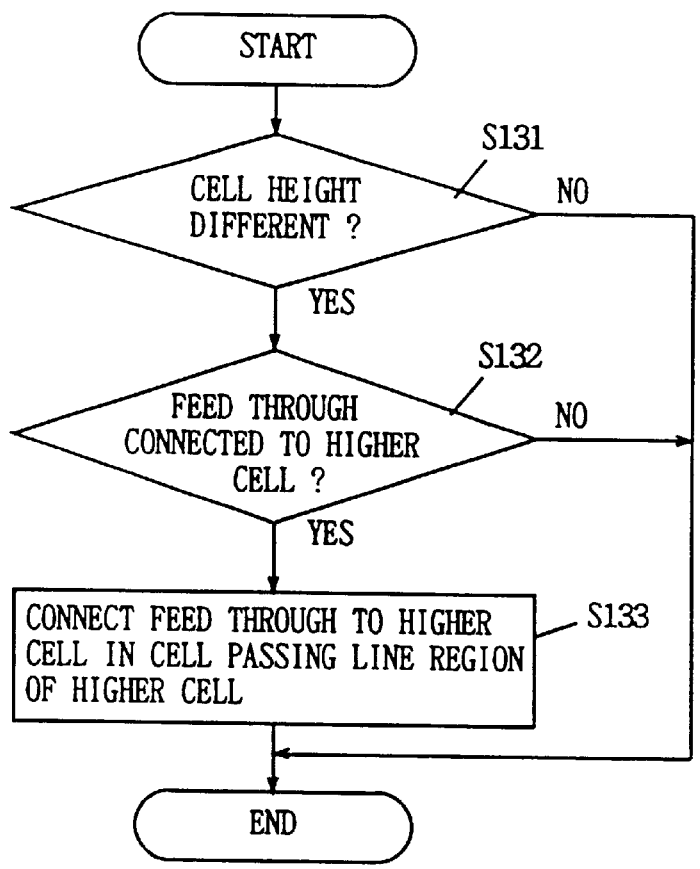
FIG. 47 is a flow chart showing a process sequence for implementing feed through connection shown in FIG. 46.

FIG. 47 shows the manner of connection of the feed throughs shown in FIG. 46. The method of connection of the feed throughs will be described with reference to the flow chart of FIG. 47.

First, circuit cells are arranged and lines are formed (including formation of connection holes). Thereafter, in the feed through region, feed throughs are arranged, and whether or not the feed through is connected to other lines is identified. In accordance with the result of identification, whether or not the feed through FT is finally connected to an adjacent circuit cell is identified. Thereafter, whether or not circuit cells on both sides of the feed through region have different heights is determined (step S131). If the cells have different heights, whether or not the feed through FT is connected to the higher circuit cell is determined (step S132). If the feed through is to be connected to the higher circuit cell, in the portion of the cell passing line region which is in contact with the feed through region, a port for the higher circuit cell (CC3) is arranged and feed through is connected to the port of the higher cell (step S133). The flow shown in FIG. 47 may be interactively performed by the designer (user) with the processing apparatus. Alternatively, in accordance with the connection path information of the feed through, based on the leading end information or terminating end information of the feed through FT, the position of the circuit cell which is higher may be determined.

Figure 48:
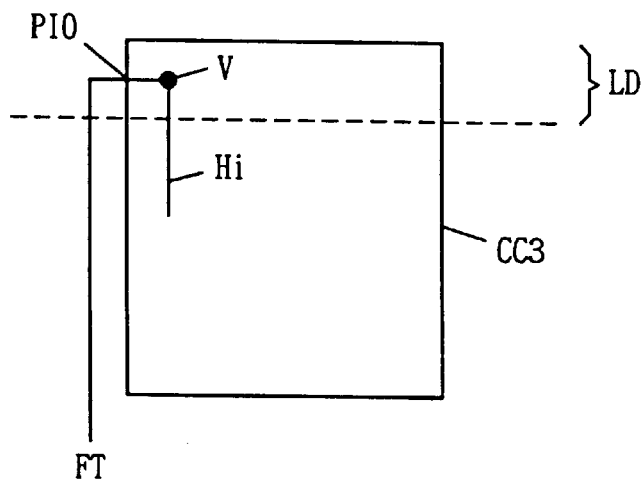
FIG. 48 is an illustration showing connection between the circuit cells and the feed through shown in FIG. 46.

FIG. 48 shows a state of connection of the feed through FT and a port PI0. As shown in FIG. 48, the connection between the feed through FT and circuit cell is shown attained by a connection hole V to an internal line Hi (formed of a first layer of aluminum interconnection, a first layer of polysilicon interconnection or the like) in the circuit cell CC3 at port PI0.

Modification

Figure 49:
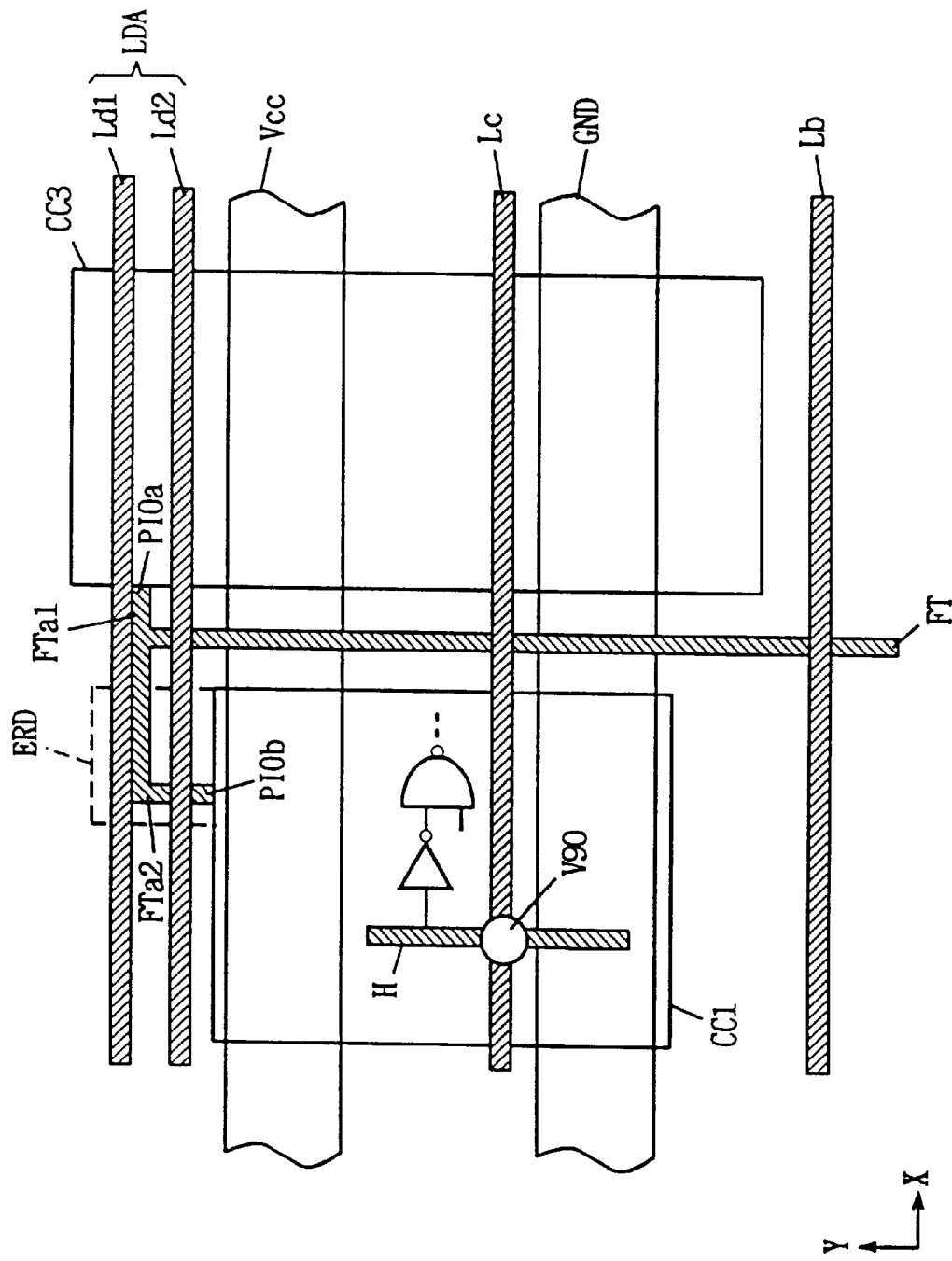
FIG. 49 shows a structure of a modification of the twelfth embodiment of the present invention.

FIG. 49 shows a structure of a modification of the twelfth embodiment of the present invention. In the structure shown in FIG. 49, the feed through FT is connected to a circuit cell CC3 which is higher, at port PIOa formed at the cell passing line region LDA, by means of a portion FTa1. In addition, the feed through FT is connected to a port PIOb through an empty region ERD of cell passing line region LDA of the circuit cell CC1, by means of a portion FTa2 of the feed through FT. The empty region ERD outside the circuit cell CC1 in Y direction represents the region in which any interconnection layer belonging to the same layer as the feed through FT (the first layer of aluminum interconnection) is not provided. In this case, the feed through FT can be directly connected to the port PIOb of the circuit cell CC1 at the portion FTa2. As shown in FIG. 49, as the feed through FT can be directly connected to the circuit cell, a line for connecting the feed through FT to the circuit cell (the second layer of aluminum interconnection) becomes unnecessary, and hence area occupied by the lines can be reduced. Further, line length can be reduced and stray capacitance thereof is decreased.

Figure 50:
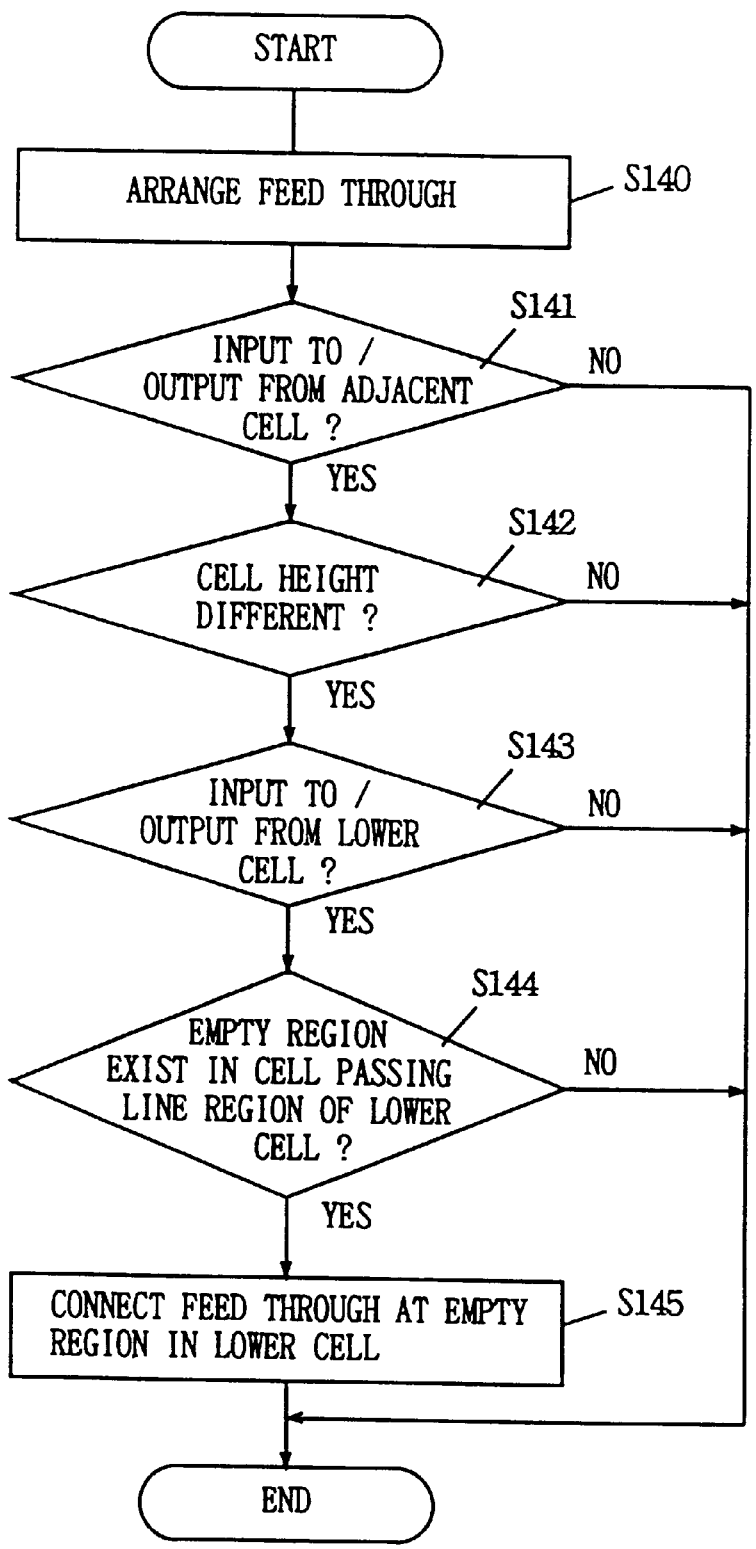
FIG. 50 is a flow chart showing a process sequence implementing the connection of the feed through shown in FIG. 49.

FIG. 50 is a flow chart showing a feed through connection process sequence for connecting the feed through to a circuit cell which is lower in height shown in FIG. 49. The method of connecting feed through in accordance with the twelfth embodiment of the present invention will be described with reference to FIG. 50.

First, circuit cells are arranged, lines are arranged and connections are formed. Thereafter, a feed through region is formed and a feed through is arranged (step S140). Whether or not the feed through is input to or output from a circuit cell adjacent to the corresponding feed through region is determined (step S141). This determination is performed by extracting the connection path information of the feed through. If the feed through is to be input to or output from the adjacent circuit cell, whether or not the adjacent circuit cells have different heights is determined (step S142). If adjacent circuit cells have mutually different heights, then whether or not the feed through is to be connected to lower circuit cell is determined (step S143). If the feed through is to be connected to the circuit cell which is lower, whether or not there is an empty region in the cell passing line region of the lower circuit cell is determined (step S144). Whether or not there is an empty region in the cell passing line region is determined by referring to the sub line information connected to the circuit cell which is lower. When there is an empty region, the feed through is connected to the circuit cell which is lower through the empty region (step S145). The process sequence shown in FIG. 50 is performed for each feed through.

As described above, according to the twelfth embodiment of the present invention, when the cells have different heights, the feed through is adapted to be directly connected to the circuit cell in the cell passing line region outside the circuit cell which is lower in the Y direction, so that additional main line for connecting the feed through to the circuit cell becomes unnecessary, and the area occupied by the lines can be reduced.

Embodiment 13

Figure 53:
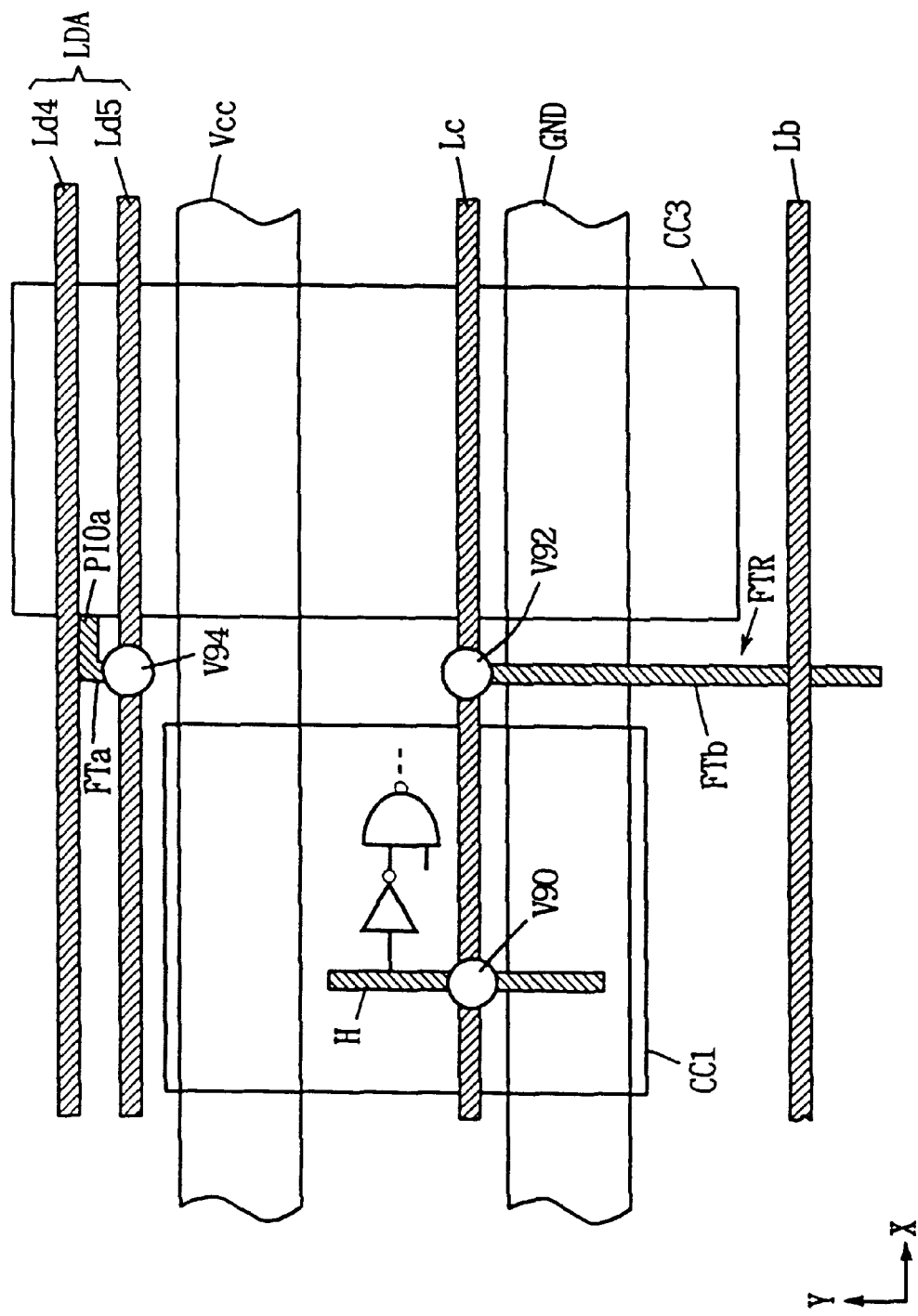
FIG. 53 shows a structure of a main portion of a semiconductor integrated circuit device in accordance with a fourteenth embodiment of the present invention.

FIG. 53 shows arrangement and interconnection of the circuit cells in accordance with the thirteenth embodiment of the present invention.

Figure 51:
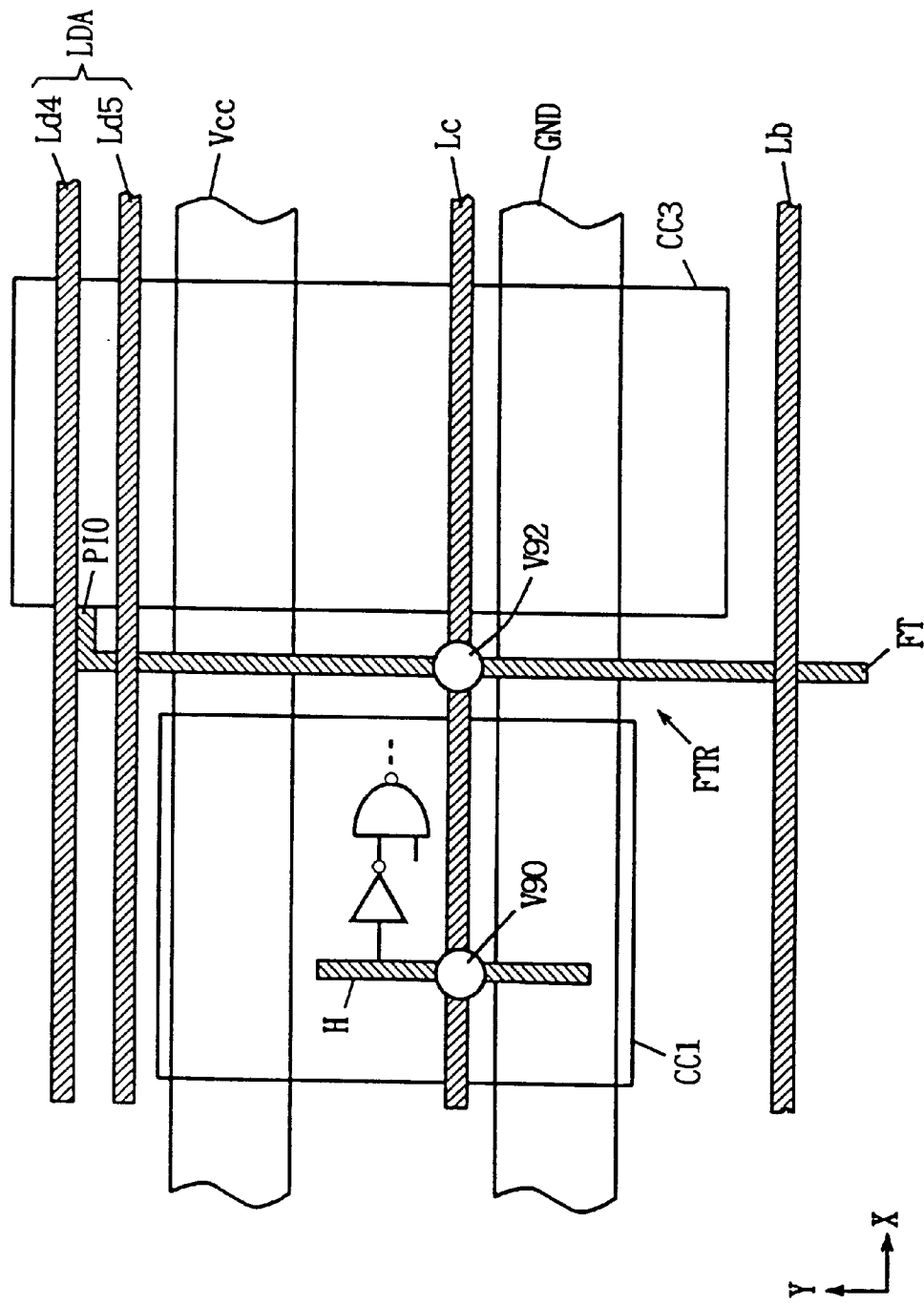
FIG. 51 shows a structure of a main portion of a semiconductor integrated circuit device in accordance with a thirteenth embodiment of the present invention.

Referring to FIG. 51, in a feed through region FTR between circuit cells CC1 and CC3 having mutually different cell heights, a feed through FT is arranged. The feed though FT is connected to circuit cell CC3 which is higher, at a port PIO formed at a cell passing line forming region LDA. The feed through FT is further connected physically to an on-the-cell line Lc extending in the X direction crossing circuit cells CC1 and CC3, by connection hole V92 formed in the passing line region FTR. The cell line LC is connected, in FIG. 51, to an internal line H in circuit cell CC1 which is lower, through connection hole V90. The on-the-cell line Lc may be connected to a circuit cell which is different from the circuit adjacent to the feed through region FTR.

In accordance with the arrangement of FIG. 51, in a signal transmission path from a certain circuit cell (circuit cell CC1) to another circuit cell (circuit cell CC3), no other lines (main lines and cell passing lines) than the on-the-cell line Lc is used as a line extending in the X direction (the second layer of aluminum interconnection). Therefore, the area occupied by the lines can further be reduced.

Figure 52:
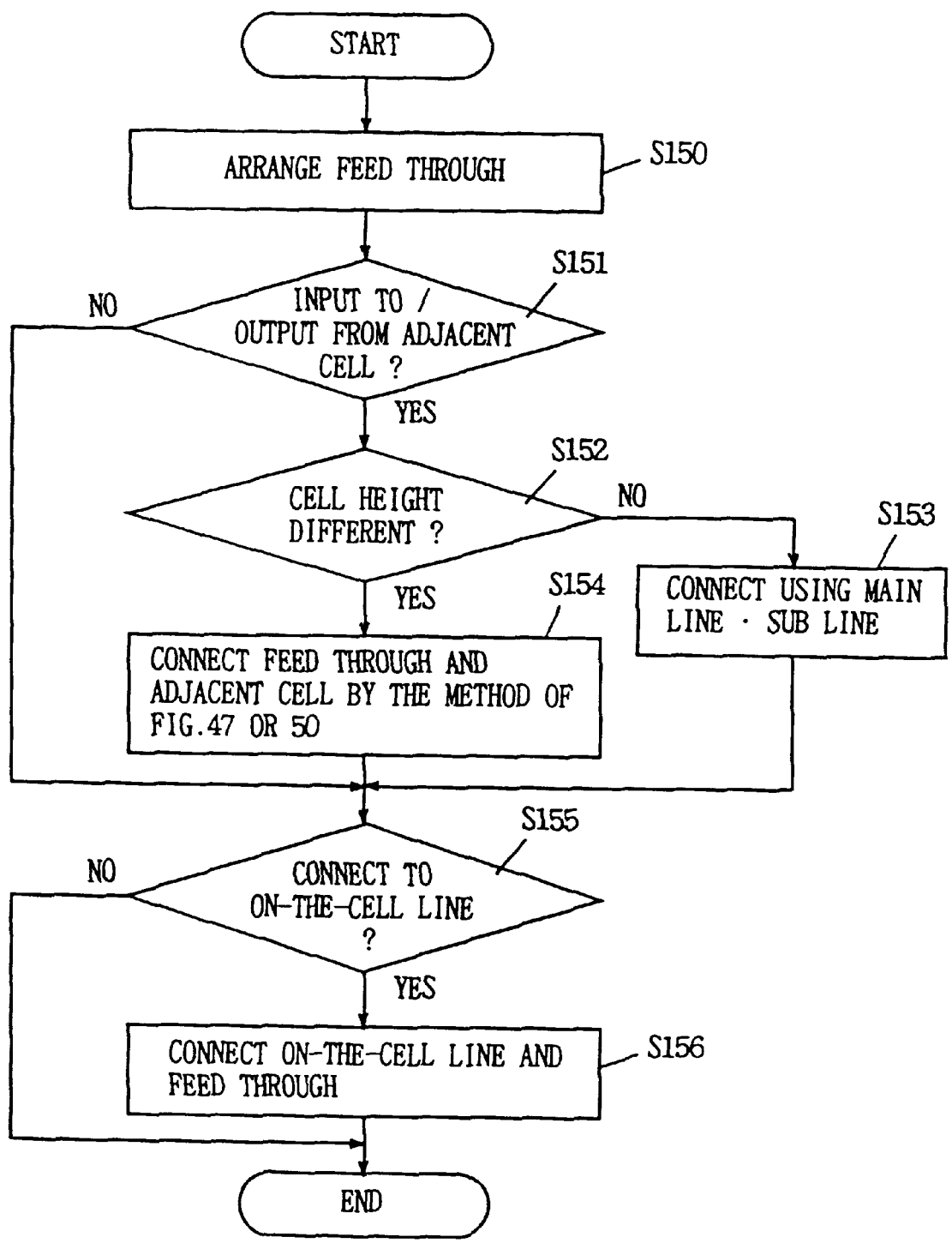
FIG. 52 is a flow chart showing a process sequence for implementing feed through connection shown in FIG. 51.

FIG. 52 is a flow chart illustrating the method of implementing the connection of the feed through shown in FIG. 51. FIG. 52 shows a process sequence for forming a connection for one feed through.

First, in a feed through region between circuit cells CC1 and CC3, a feed through is formed (step S150). Thereafter, whether or not the feed through is connected to a circuit cell adjacent to the corresponding feed through region is determined (step S151). If it is determined that it is connected to the adjacent circuit cell, then whether or not the adjacent circuit cells have mutually different heights is determined (S152). If adjacent circuit cells have the same height, the feed through is connected to the corresponding circuit cell by using a main line and a sub line (step S153). When the cell passing line is arranged in a region outside in Y direction of both adjacent circuit cells, a cell passing line is used instead of the main line.

In step S152, when it is determined that circuit cells have different heights, the feed through is connected to the corresponding circuit cell in accordance with any of the methods shown in FIGS. 47 to 50 (step S154). If it is determined that the feed through is not connected to the adjacent circuit cell in step S151, and if connection between the feed through and the adjacent circuit cell is formed (after the completion of steps S153 and S154), thereafter whether the feed through is further connected to a cell passing line or not is determined (step S155). In determining whether or not it is connected to the cell passing line, whether or not the feed through is connected to a circuit cell different from the circuit cell connected in the steps S153 or S154 in the corresponding circuit cell band is determined, and if so (YES), the process for arranging the cell passing line may be performed. When it is determined that the cell passing line and the feed through are to be connected, connection between the cell passing line and the feed through is formed (step S156). If connection between the cell passing line and the feed through is unnecessary, the process is completed. If the connection between the feed through, and the cell passing line and adjacent circuit cell is not formed, then whether or not the feed through is to be connected to the cell passing line or the main line or a circuit cell in another circuit cell band is determined, and in accordance with the result of determination, necessary connection is provided for the feed through. After the series of processes is performed on every feed through, re-arrangement of circuit cells, re-arrangement of lines and removal of unnecessary portions of the lines are performed.

As described above, according to the thirteenth embodiment of the present invention, connection of the feed through to the circuit cell at the cell passing line region is allowed, and connection between the on-the-cell line and the feed through in the feed through region is allowed, and hence in the signal transmission path from one circuit cell to another circuit cell, lines other than the on-the-cell line (cell passing lines and main lines) becomes unnecessary, and the area of occupation by the lines extending in the X direction can be reduced.

Embodiment 14

FIG. 53 shows a manner of arrangement and interconnection of circuit cells in accordance with the fourteenth embodiment of the present invention. In FIG. 53, in the feed through region FTR between the circuit cells CC1 and CC3 having different heights, two feed throughs FTa and FTb are arranged aligned along the Y direction. Feed through FTa is connected, in cell passing line band LDA, to port PIOa of circuit cell CC3, physically connected to cell passing line Ld5 through connection hole V94, and terminates thereat. Feed through FTb extends from a direction different from feed through FTa, physically connected to on-the-cell line Lc through connection hole V92, and terminates thereat. On-the-cell line Lc is connected to internal line H of circuit cell CC1 through connection hole V90. Feed throughs FTa and FTb have their unnecessary portions removed, and hence these become divided feed throughs. The feed throughs FTa and FTb do not have any overlapping portions in Y direction. Therefore, these feed throughs FTa and FTb are aligned along the Y direction. Since two feed throughs FTA and Ftb are arranged in one feed through region FTR, the area occupied by the feed through can be reduced.

Figure 54:
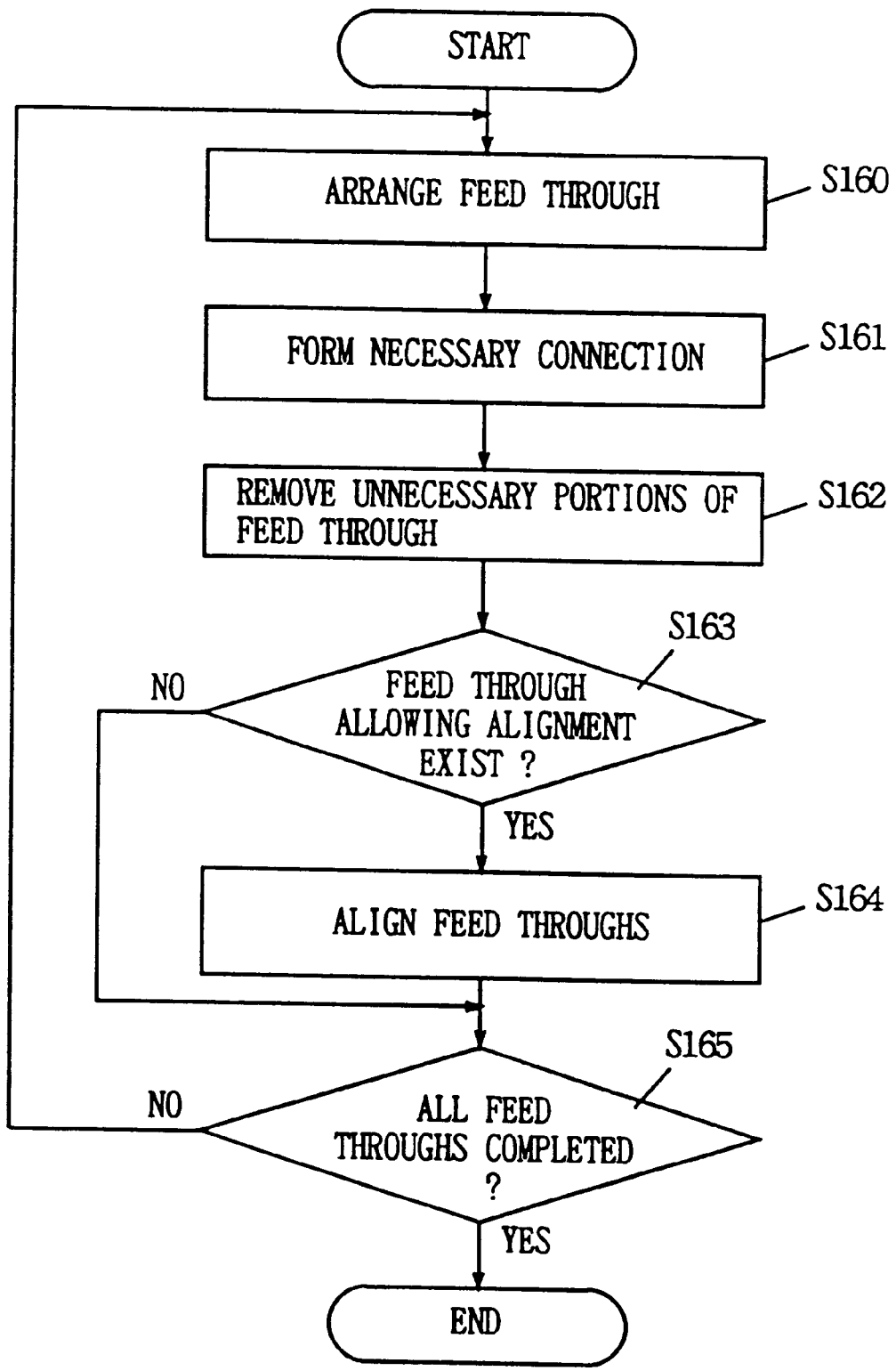
FIG. 54 is a flow chart showing a sequence of feed through alignment process shown in FIG. 53.

FIG. 54 is a flow chart showing a process sequence for implementing the alignment of the feed throughs shown in FIG. 53. Referring to FIG. 54, the alignment process of the feed throughs will be described.

First, circuit cells are arranged, feed through region is arranged, and feed throughs are arranged in the feed through region (step S160). When there is a line to be connected to the feed through, necessary connection for the feed through is formed (steps S161). In the arrangement shown in FIG. 53, a connection hole V94 is formed for feed through FTa, and connection hole V92 is formed for feed through FTb. Thereafter, unnecessary portions of the feed throughs are removed (step S62). Removal of the unnecessary portions of the feed throughs is performed in the similar manner as the process sequence shown in FIG. 30. After unnecessary portions of the feed throughs are removed, whether or not feed throughs which can be aligned in the Y direction exist in the feed through region is determined (step S163). If there are feed throughs which can be aligned, the feed throughs are aligned along the Y direction (step S164). The series of processes are performed for every feed through (step S165).

In the process sequence shown in FIG. 54, each feed through has its unnecessary portions removed and is aligned. In this case, only the alignment process may be performed by the unit of the feed through region. More specifically, after the unnecessary portions of feed throughs are removed in each feed through region and the unnecessary portion of the feed throughs are removed in all the feed through region, the feed throughs may be aligned, and thereafter circuit cells and lines may be re-arranged.

Figure 55A:
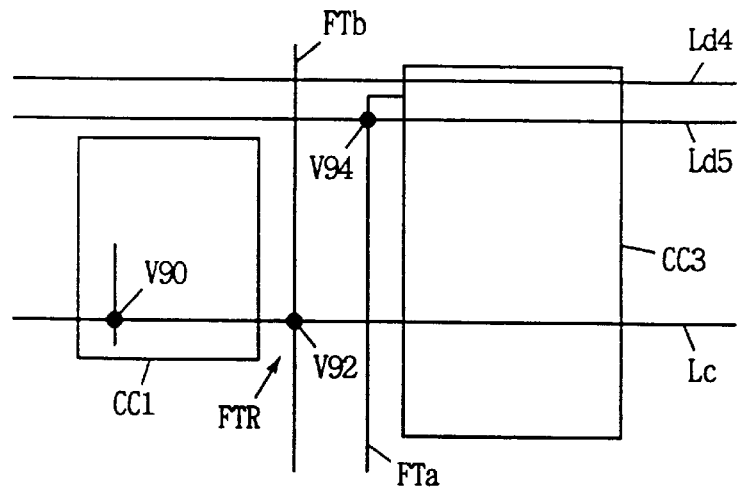
FIGS. 55A to 55C are illustrations showing the operation of feed through alignment process in accordance with the fourteenth embodiment of the present invention.
Figure 55B:
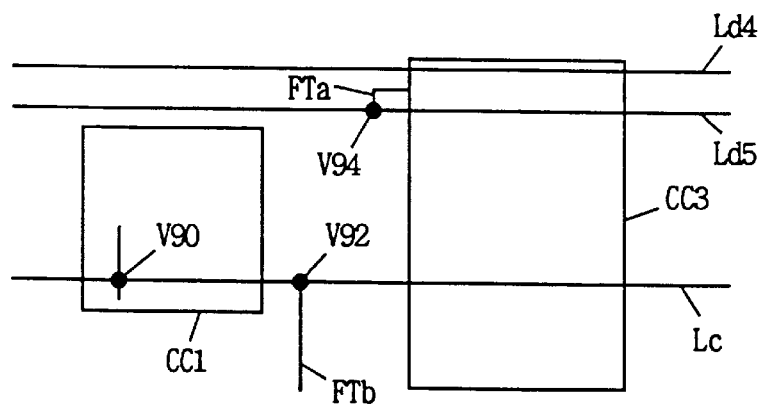
Figure 55C:
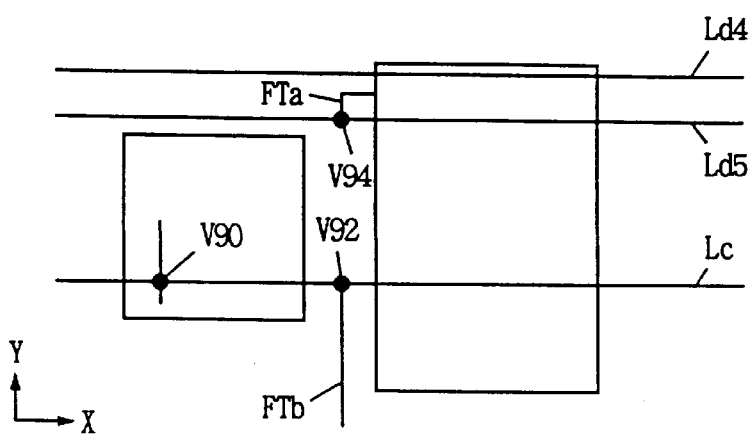

FIGS. 55A to 55C show the arrangement of the feed throughs. In the process sequence shown in FIGS. 55A to 55C, removal of unnecessary portions of the feed throughs and alignment are performed by the unit of a feed through region.

Referring to FIG. 55A, first, in the feed through region FTR, feed throughs FTa and FTb are arranged. For the feed throughs FTa and FTb, necessary contact holes V94 and V92 are formed, feed through FTa is physically connected to cell passing line Ld5, and feed through FTb is physically connected to on-the-cell line Lc. Arrangement of the feed throughs and formation of connection holes are performed successively for the feed throughs FTa and FTb.

Thereafter, referring to FIG. 55B, unnecessary portions of the feed throughs are removed. Feed through FTa terminates at connection hole V94, and feed through FTB terminates at connection hole V92. In this state, since feed throughs FTa and FTb do not have any overlapping region in Y direction, these can be aligned along the Y direction. Therefore, as shown in FIG. 55C, feed throughs FTa and FTb are aligned in the Y direction.

As described above, according to the fourteenth embodiment of the present invention, since the feed through can be directly connected to a circuit cell which is higher, and unnecessary portions of the feed through are removed, it becomes possible to align feed throughs in the Y direction in the feed through region, whereby not only the area occupied by the lines but also the area occupied by the feed through region can be reduced.

Embodiment 15

Figure 56:
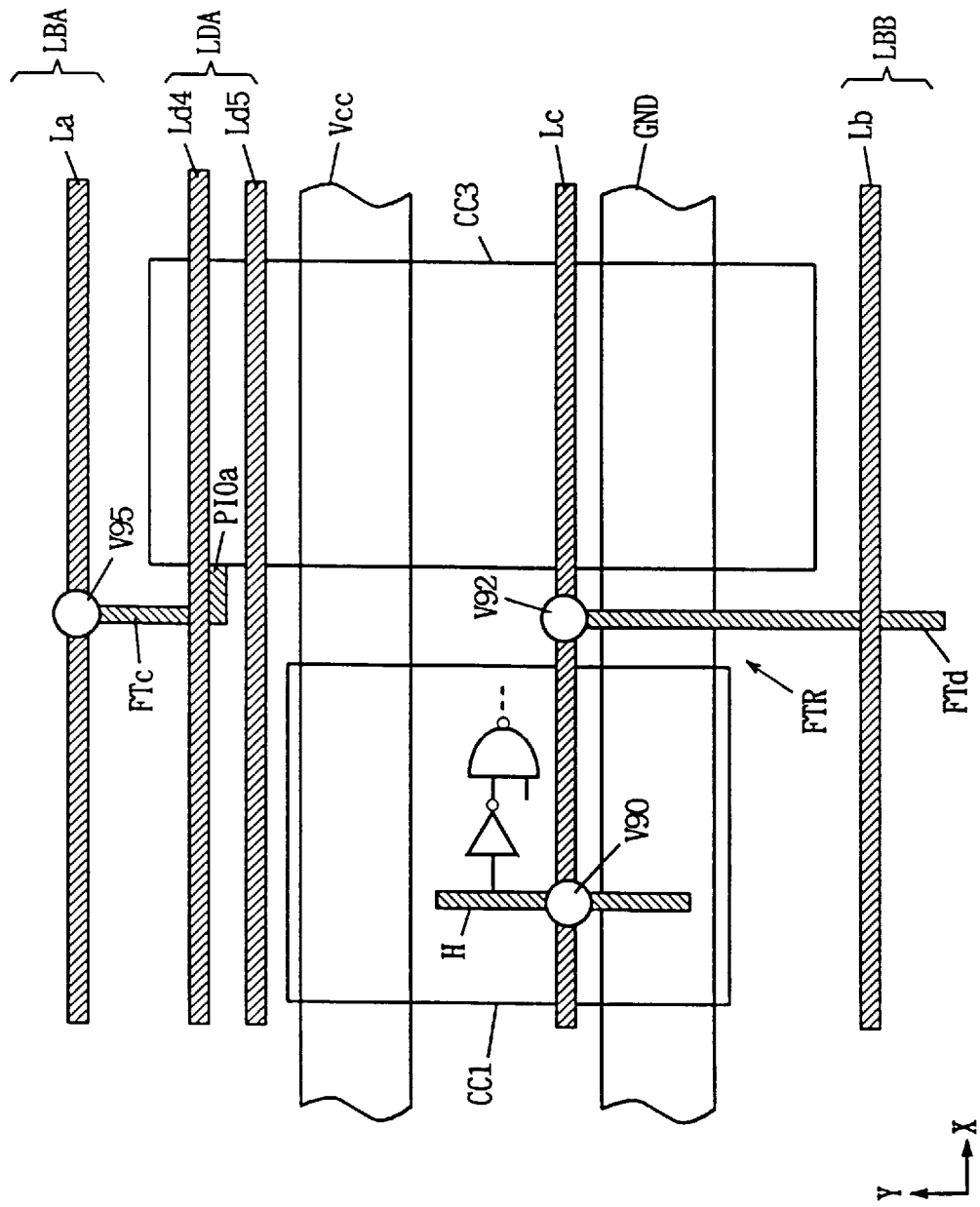
FIG. 56 shows a structure of a main portion of a semiconductor integrated circuit device in accordance with a fifteenth embodiment of the present invention.

FIG. 56 shows a manner of interconnection and arrangement of circuit cells in accordance with the fifteenth embodiment of the present invention. In the arrangement shown in FIG. 56, in a feed through region FTR, two feed throughs FTc and FTd are arranged aligned along the Y direction. Feed through FTc is connected to a port PIOa of a circuit cell CC3 which is higher, at a region of cell passing line band LBA, and physically connected to a main line La included in line band LBA arranged outside the cell region in Y direction through a connection hole V90. Feed through FTd is connected to on-the-cell line Lc by connection hole V92 and terminates thereat. The on-the-cell line Lc is connected to internal line H of circuit cell CC1 through connection hole V95.

In the arrangement of FIG. 56 also, the direction of extension of the feed throughs FTc and FTd are opposite in Y direction. Therefore, in this case also, the feed throughs FTc and FTd can be aligned along the Y direction, and the feed through region can be reduced. The operation of alignment of feed throughs shown in FIG. 56 is the same as the process sequence shown in FIG. 54 or the process operation shown in FIG. 55. It differs from the fourteenth embodiment only in that the feed through FTc is connected not to the cell passing line but to a main line.

As described above, in the structure of the fifteenth embodiment also, by removing unnecessary portions of the feed throughs, it becomes possible to arrange the feed throughs aligned along the Y direction in the feed through region, and hence the area of the feed through region can be reduced.

Embodiment 16

Figure 57:
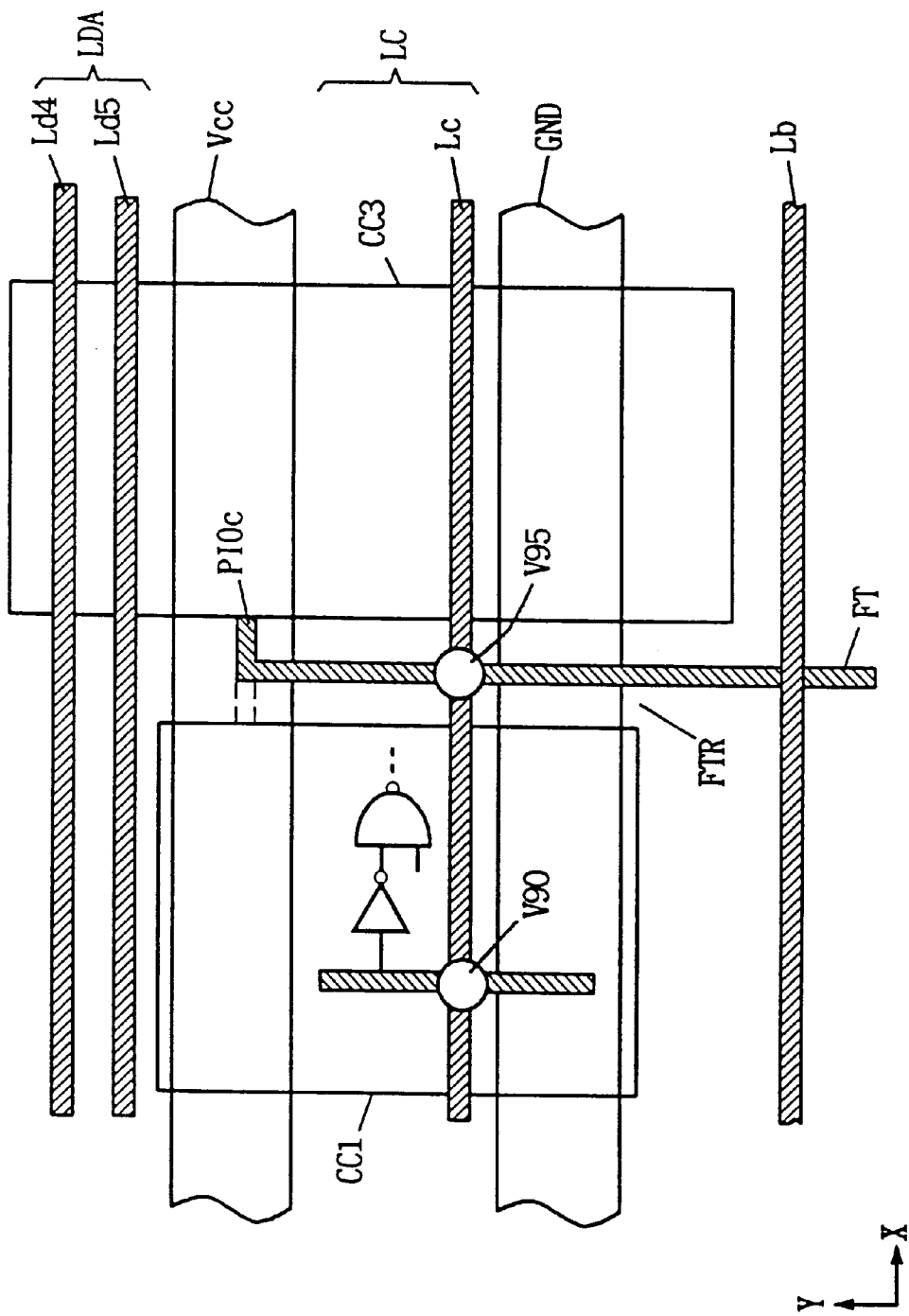
FIG. 57 shows a structure of a main portion of a semiconductor integrated circuit device in accordance with a sixteenth embodiment of the present invention.

FIG. 57 shows a manner of arrangement and interconnection of circuit cells in accordance with a sixteenth embodiment of the present invention. In the arrangement shown in FIG. 57, in circuit cells CC1 and CC3, regions below power supply line VCC and ground line GND are also available as circuit ports. More specifically, a feed through FT arranged in feed through region FTR is connected to on-the-cell line Lc through connection hole V95, and further to a port PIOc of circuit cell CC3 which has higher cell height. Port PIOc is provided in a region overlapping the power supply line VCC in the arrangement shown in FIG. 57. Power supply line VCC is formed in the second layer of aluminum interconnection. Therefore, by arranging the input port PIOc for the feed through FT in the region overlapping the power supply line VCC, it becomes possible to connect the feed through FT to the internal line of circuit cell CC3 at port PIOc, without affecting the internal circuitry of circuit cell CC3 (see the cross sectional structure of FIG. 14). Namely, as is apparent from FIG. 14, when an internal line IH or Hi is arranged in port PIOc, the feed through can be directly connected to the internal line IH or Hi.

As the port PIOc is arranged in a region overlapping the power supply line VCC and the port is not provided in the region where on-the-cell line Lc is arranged, that is, in the region of on-the-cell line Lc, it is possible to connect the feed through FT to the on-the-cell line Lc through connection hole V95. Therefore, in the arrangement shown in FIG. 57 also, a signal transmission path from a certain circuit cell (it may be a circuit cell other than circuit cell CC1) to a circuit cell CC3 can be formed by the on-the-cell line Lc and the feed through FT, it is not necessary to use an on-the-cell line or a main line, and hence the area occupied by the lines can be reduced. The process sequence for the arrangement of FIG. 57 is the same as the process sequence (FIG. 52) for realizing the arrangement of FIG. 51, and therefore detailed descriptions thereof is not repeated.

Here, the feed through FT is connected to the circuit cell CC3 which is higher, through port PIOc. However, a structure may be employed in which the feed through FT is connected to a circuit cell CC1 which is lower (as shown by the dotted line in FIG. 57).

The port forming portion of the circuit cell may be a region overlapping the ground line GND.

Further, circuit cells adjacent to the feed through region have different cell heights. However, even when the adjacent circuit cells have the same height, the rule for forming the port in a region overlapping the operational voltage transmitting line (including both the power supply line VCC and the ground line GND) can be applied.

In the arrangement of FIG. 57, the feed through FT is shown connected to on-the-cell line Lc by a connection hole V95, in order to show that the feed through FT does not affect formation of connection hole in the on-the-cell line band LC. However, the feed through FT may not be physically connected to on-the-cell line Lc. More specifically, only that rule which allows provision of the port of the circuit cell in a portion in contact with the feed through region overlapping the operational voltage transmission line may be applied. By expanding the port forming region of the circuit cell up to such a region of the feed through region that overlaps the operational voltage transmitting line, different ports can be arranged in regions overlapping the cell passing line band and the operational voltage transmitting line for the circuit cell having high cell height. If feed throughs extend in opposite direction along the Y direction, the feed throughs can be aligned along the Y direction in the feed through region.

As described above, according to the sixteenth embodiment of the present invention, since the region below an operational voltage transmitting line is available as a port forming region, additional line is not necessary for connecting the circuit cell to the feed through, and hence the area occupied by the lines can be reduced.

Embodiment 17

Figure 58:
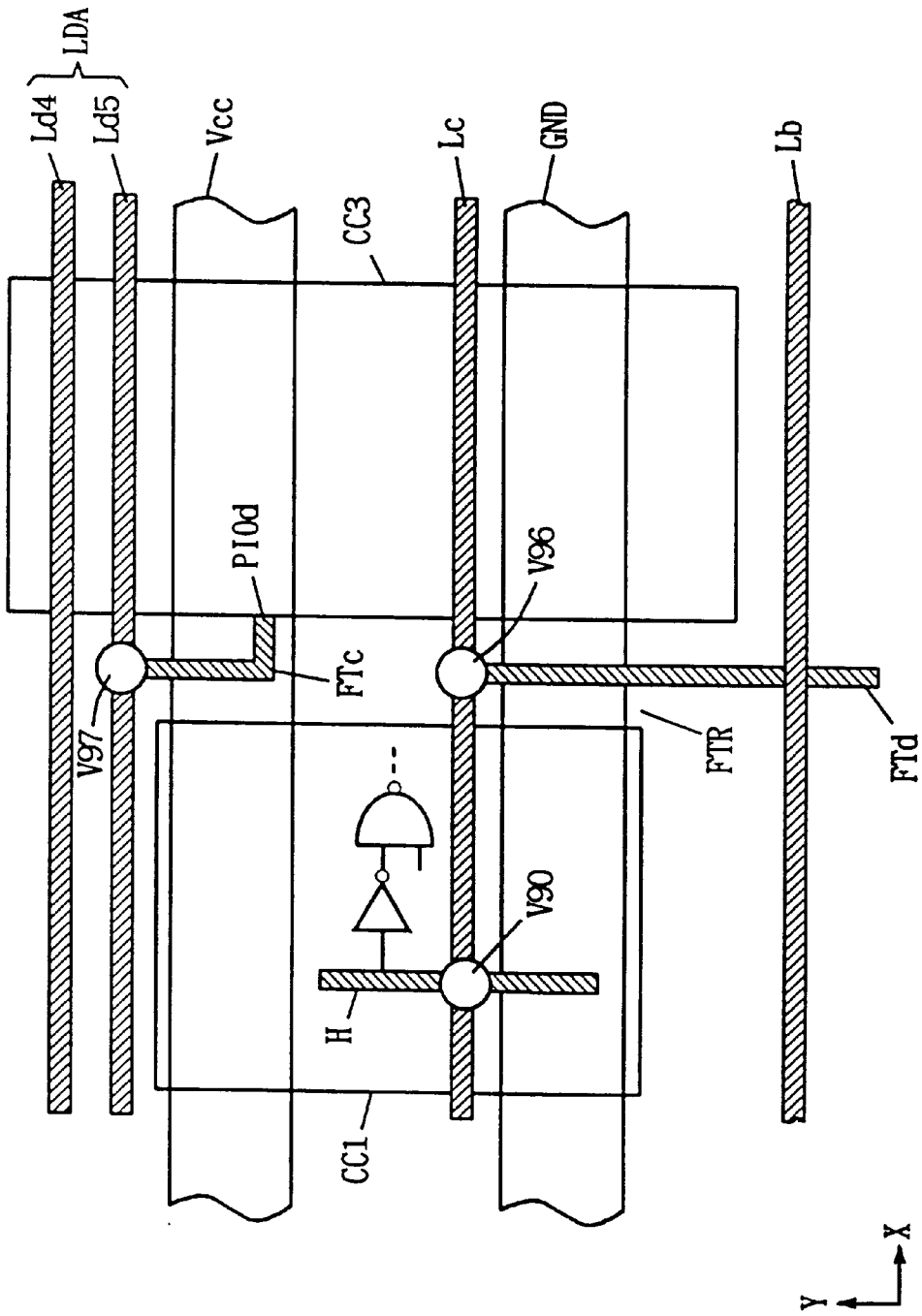
FIG. 58 shows a structure of a main portion of a semiconductor integrated circuit device in accordance with a seventeenth embodiment of the present invention.

FIG. 58 shows a manner of arrangement and interconnection of circuit cells in accordance with the seventeenth embodiment of the present invention.

In the arrangement shown in FIG. 58, two rules are applied. Namely, (1) the feed through can be connected to a circuit cell in a region of the feed through region which overlaps with the operational voltage transmitting line, and (2) unnecessary portions of the feed through are removed. Referring to FIG. 58, two feed throughs FTc and FTd are arranged in feed through region FTR. Feed through FTc is connected to circuit cell CC3 which is higher through a port PIOd, physically connected to cell passing line Ld5 by connection hole V97, and terminates thereat. Port IPOd is arranged in a region overlapping the power supply line VCC.

Feed through FTd extends in a direction opposite to the feed through FTc along the Y direction, physically connected to on-the-cell line Lc through connection hole V96 and terminates thereat. Here, by applying the rule that unnecessary portions of the feed throughs are removed, overlapping regions of the feed throughs FTb and FTc are removed in the feed through region, and if directions of extension of these are opposite along the Y direction, it is possible to align the feed throughs FTc and FTd along the Y direction. Therefore, the efficiency of reducing area of the feed through region can be improved.

In the arrangement shown in FIG. 58, feed through FTc is connected to the cell passing line Lb5 through connection hole V97 and terminates thereat. However, the feed through FTc may be connected to a main line or a circuit cell of another circuit cell band provided outside (outside the feed through region) in Y direction of the cell passing line band LD.

Further, in the arrangement of FIG. 58, circuit cells CC1 and CC3 have mutually different heights. However, circuit cells adjacent to the feed through region may have the same cell height.

The process sequence for realizing the arrangement of FIG. 58 is substantially the same as the process sequence shown in FIGS. 53 and 54. What is different is the position of the port formed at the circuit cell which is higher. The position of the port may be determined in accordance with the arrangement of the internal circuitry of the circuit cell CC3. Therefore, the process sequence flow for the arrangement of FIG. 58 is not given.

In the arrangement shown in FIG. 58, the feed through FTc may be connected to a port arranged below the operational voltage transmitting line of circuit cell CC1.

As described above, according to the structure of the seventeenth embodiment of the present invention, the port of the circuit cell is extended to the region below the operational voltage transmitting line and unnecessary portions of the feed throughs are removed. Therefore, in addition to the effect of reducing area occupied by the lines, an additional effect that a plurality of feed throughs can be arranged aligned with each other in the feed through region can be obtained, so that the area occupied by the feed through region can be reduced and the efficiency in using area can be improved.

Embodiment 18

Figure 59:
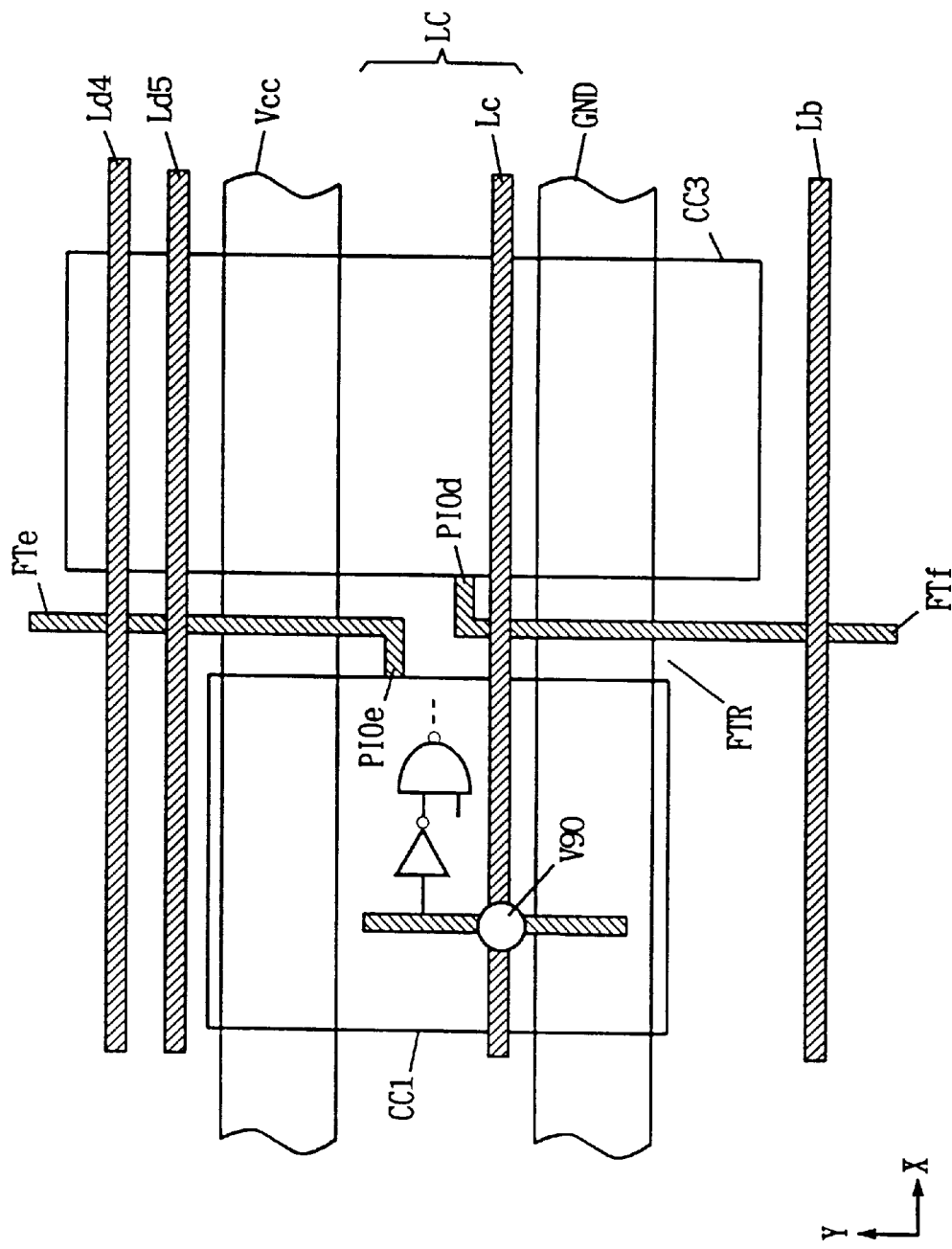
FIG. 59 shows a structure of a main portion of a semiconductor integrated circuit device in accordance with an eighteenth embodiment of the present invention.

FIG. 59 shows a manner of arrangement and interconnection of circuit cells in accordance with an eighteenth embodiment of the present invention. In the arrangement shown in FIG. 59, the rule (1), that is, when a feed through arranged in a feed through region is connected to a circuit cell adjacent to the feed through region, arrangement of ports in the on-the-cell line band is allowed, is applied. FIG. 59 shows a feed through FTe connected to circuit cell CC1 and a feed through FTf connected to circuit cell CC3, as representatives, in feed through region FTR. Feed through FTe is connected to circuit cell CC1 which is lower, at a port PIOe formed below on-the-cell line and LC, and extends in one direction along the Y direction. Feed through FTf is connected to circuit cell CC3 at a port PlOd formed in a region below the on-the-cell line band LC. Feed through FTf extends in another direction along the Y direction. The feed throughs FTe and FTf extend in opposite directions along the Y axis. The feed throughs FTe and FTf may be connected to an on-the-cell line, a cell passing line, a main line or a circuit cell of another circuit band and terminate at connection points.

Even when there is not a connection hole for the feed through in the feed through region FTR, arrangement of the port of the circuit cell in the region below the on-the-cell line band forming region in the feed through region is allowed, so that the following advantages can be obtained. Namely, when the feed throughs extend in opposite directions, the feed throughs can be aligned along the Y direction, and hence the area of occupation of the feed through region FTR can be reduced. Further, internal lines connected to ports PIOe and PIOd can be minimized in length (as it is not necessary to extend the internal lines for port connection along the Y direction in the circuits cells CC1 and CC3), and hence stray capacitances of ports PIOe and PIOd can be reduced.

Figure 60:
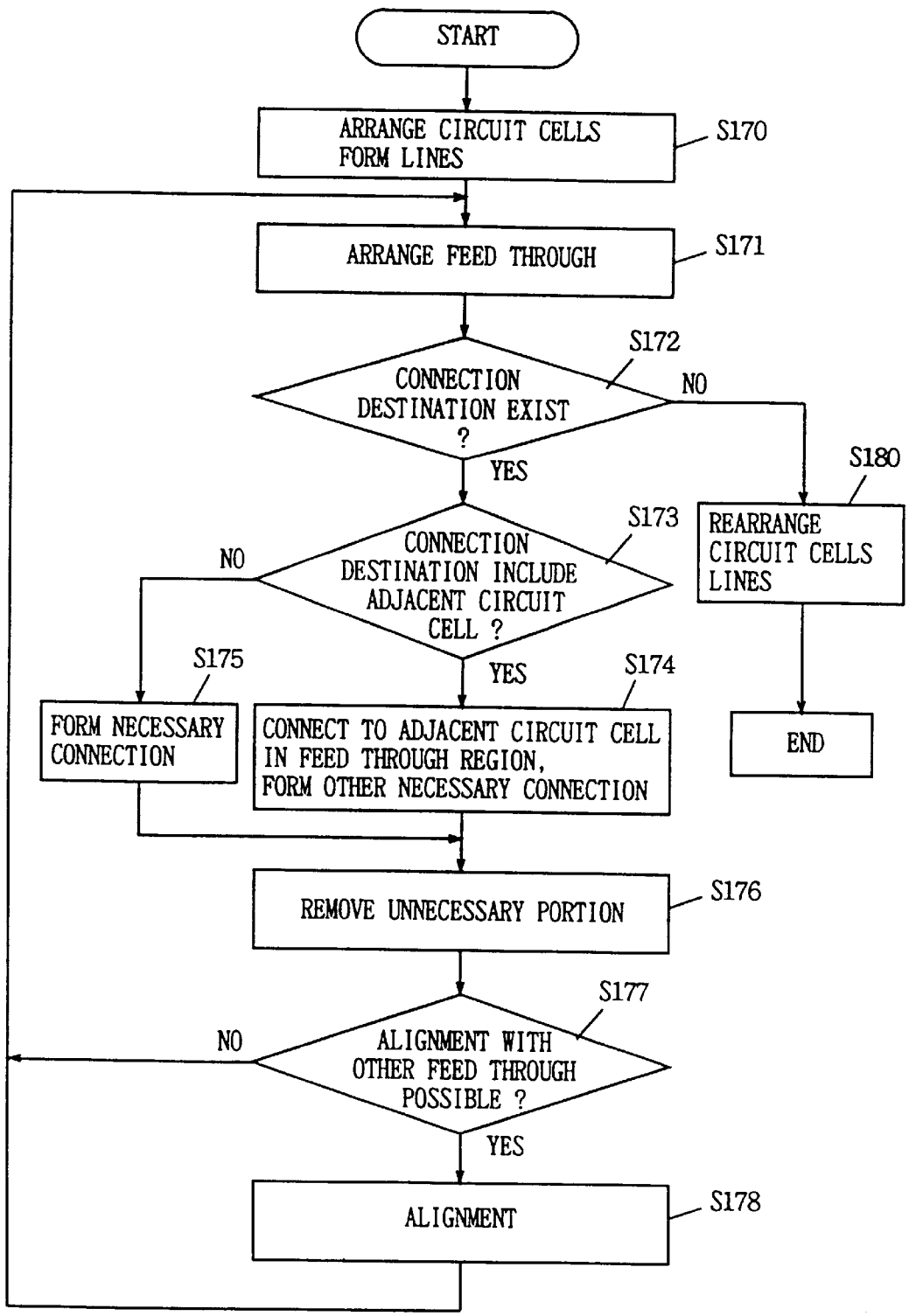
FIG. 60 is a flow chart showing a process sequence for implementing the arrangement and interconnection of circuit cells shown in FIG. 59.

FIG. 60 is a flow chart showing a process sequence for implementing the connection of feed throughs shown in FIG. 59. Referring to FIG. 60, the manner of connection of the feed through will be described.

After the circuit cells are arranged and lines are formed (step S170), passing line region is acquired, and feed throughs are arranged in corresponding feud through regions (step S171). For the arranged feed through, whether or not there is a destination of connection is determined (S172). If not, it means that every necessary feed through has been arranged, and hence final re-arrangement of circuit cells and lines is performed (step S180).

If there is a connection destination for the feed through, whether or not an adjacent circuit cell is included in the destination is determined, based on connection information of the feed through (step S173). If an adjacent circuit cell is included, the adjacent circuit cell is connected to the feed through in the passing line region, and remaining necessary connections are provided for the feed through (step S174). If the adjacent circuit cell is not included in the destination, connection necessary for the feed through (to the cell passing line, on-the-cell line or main line) is formed (step S175). After the connections for the feed through are formed, unnecessary portions are removed (step S176). At this time, as shown in FIG. 59, when there is not a connection formed in the passing line region for the feed through, a portion of the feed through region of the feed through which portion is different from the signal transmission path (for example, lower portion in the figure of feed through FTe) is removed. After the removal of unnecessary portions, whether or not the feed through can be aligned with another feed through in the feed through region is determined (step S177). If possible, alignment is performed (step S178). Steps 171 to S178 are performed for every feed through.

In the structure of the feed through shown in FIG. 59, connection of the feed through to an on-the-cell line or to a cell passing line is not formed in the feed through region. However, connection to an on-the-cell line Lc or to a cell passing line Ld (Ld4 or Ld5) may be formed.

Further, circuit cells CC1 and CC3 may have the same cell height. Only one of the circuit cells CC1 and CC3 may be connected to the feed through. As described above, according to the eighteenth embodiment of the present invention, since a port of a circuit cell can be arranged in a region of the feed through region overlapping the on-the-cell line forming region, it is not necessary to excessively elongate the internal line connected to the port of the circuit cell, stray capacitance incidental to the port can be reduced, and an interconnection layout reducing signal propagation delay can be realized. Further, since unnecessary portions of the feed through connected to the port are removed, even when a connection hole is not formed for the feed through in the feed through region, feed throughs extending in opposite directions can be aligned along the Y direction in the feed through region, and hence the area occupied by the feed through region can be reduced.

Embodiment 19

Figure 61:
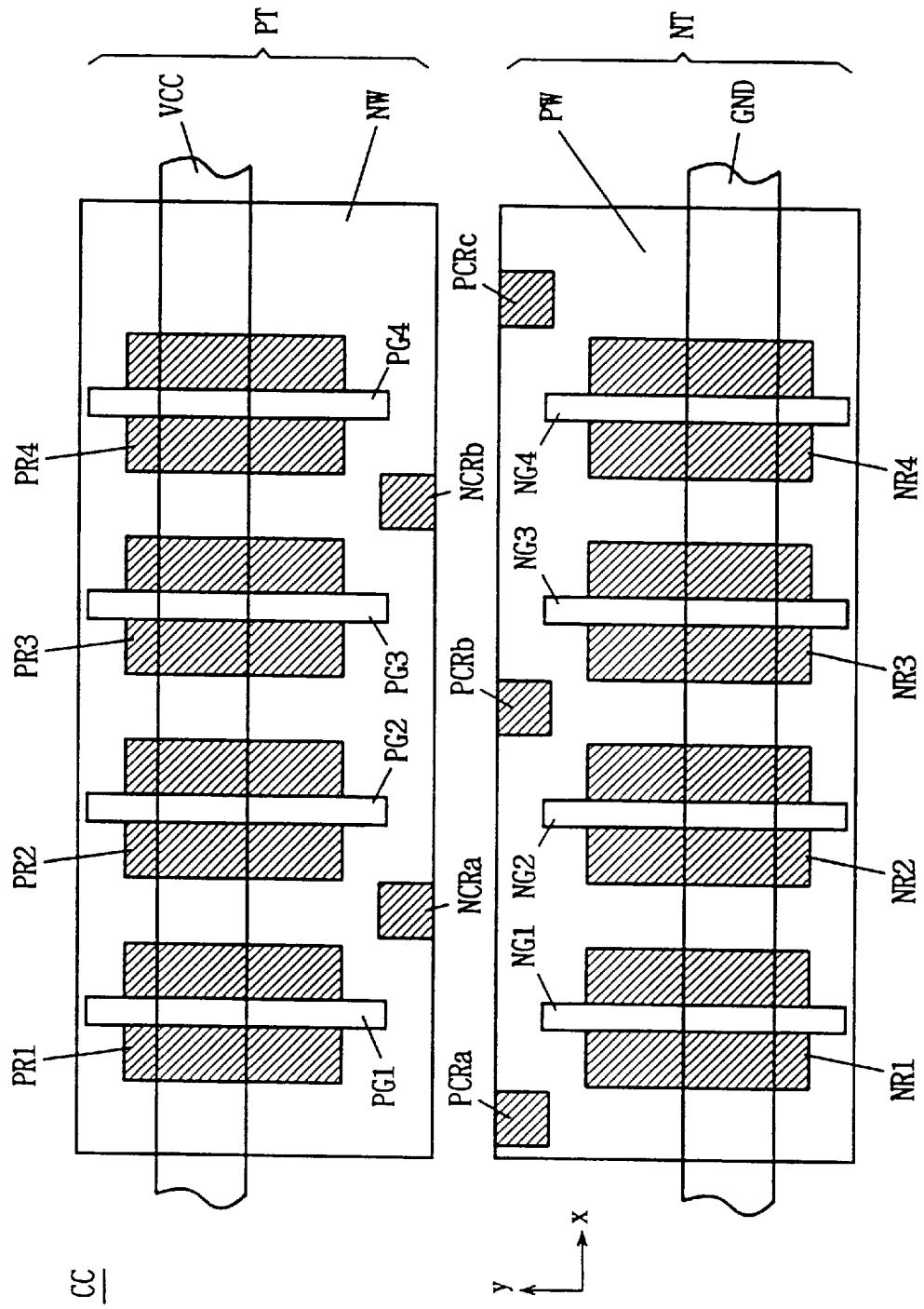
FIG. 61 shows a structure of a main portion of a semiconductor integrated circuit device in accordance with a nineteenth embodiment of the present invention.

FIG. 61 shows a structure of a main portion of a semiconductor integrated circuit device in accordance with a nineteenth embodiment of the present invention. FIG. 61 shows arrangement of transistors in one circuit cell. Referring to FIG. 61, a circuit cell CC includes a transistor forming (arrangement) region PT in which p channel MOS transistors are arranged, and a transistor forming (arrangement) region NT in which n channel MOS transistors are arranged. For the transistor arrangement region PT, an N well NW serving as a substrate region for the p channel MOS transistors to be arranged is formed. For the transistor arrangement region NT, a P well PW serving as a substrate region for forming the n channel MOS transistors is arranged. The wells NW and PW are arranged opposing to each other.

In N well NW, highly doped P type impurity regions (active region) PR1 to PR4 for forming p channel MOS transistors are arranged aligned with each other. For impurity regions PR1 to PR4, gate electrode lines PG1 to PG4 formed, for example, of a first layer of polysilicon, serving as gates of transistors are arranged. The impurity regions PR1 to PR4 are formed self-alignedly with respect to the gate electrode lines PG1 to PG4. A power supply line VCC is arranged along the X direction, which is formed by the second layer of aluminum interconnection, crossing all the impurity regions PR1 to PR4.

In P well PW, highly doped N type impurity regions (active regions) NR1 to NR4 are arranged aligned with each other, for forming n channel MOS transistors. For impurity regions NR1 to NR4, gate electrode lines NG1 to NG4 are arranged. Impurity regions NR1 to NR4 are formed self-alignedly with respect to gate electrode lines NG1 to NG4.

In a peripheral region of N well NW in Y direction opposing to P well PW, island-shaped N collar regions NCRa and NCRb which are formed by highly doped N type impurity regions are arranged apart from each other. N collar regions NCRa and NCRb are arranged at regions not opposing to each of the gate electrode lines PG1 to PG4. In P well PW also, in the peripheral region opposing to N well NW, island-shaped P collar regions PCRa to PCRc formed of highly doped P type impurity regions are arranged spaced apart from each other. Gate electrode lines NG1 to NG4 are arranged in regions between P collar regions PCRa to PCRc, so as not to oppose to the P well collar regions PCRa to PCRc. As one method for such arrangement, at the time of layout, first, gate electrode lines PG1 to PG4 and NG1 to NG4 are arranged, and thereafter, collar regions NCRa, NCRb and PCRa to PCRc are arranged in regions between the gate electrode lines.

Figure 85:
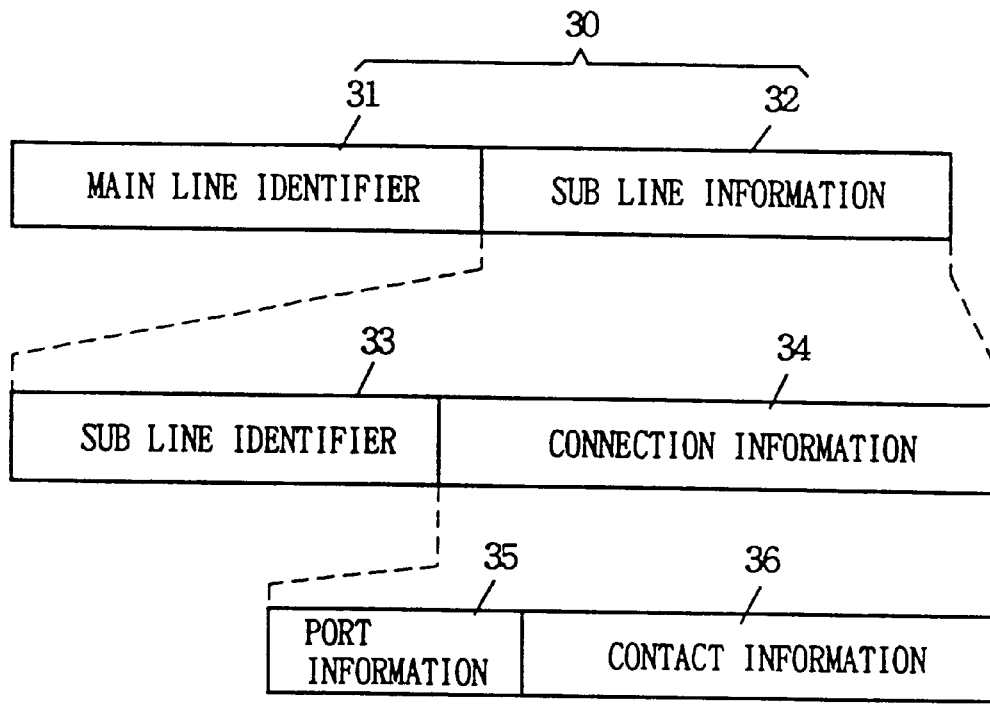
FIG. 85 shows an example of a data structure implementing automatic arrangement and interconnection.
Figure 86:
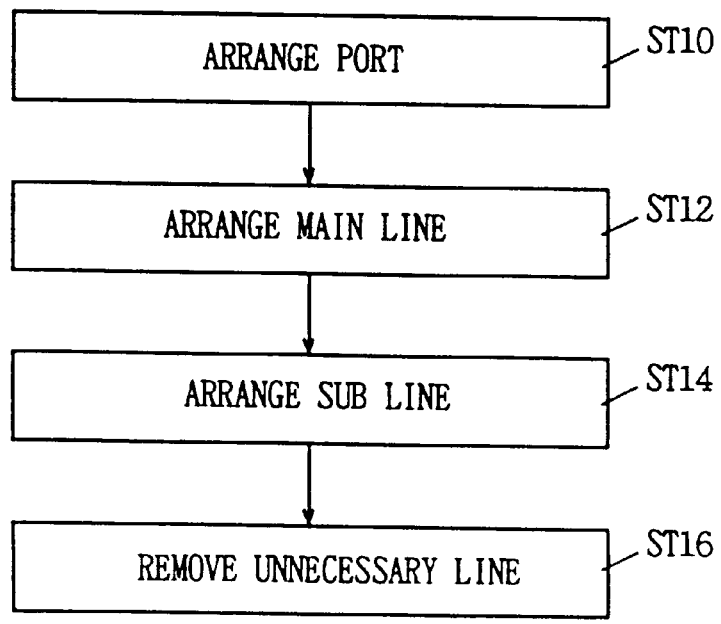
FIG. 86 is a flow chart schematically showing line interconnection forming sequence in the conventional automatic arrangement and interconnection.
Figure 87:
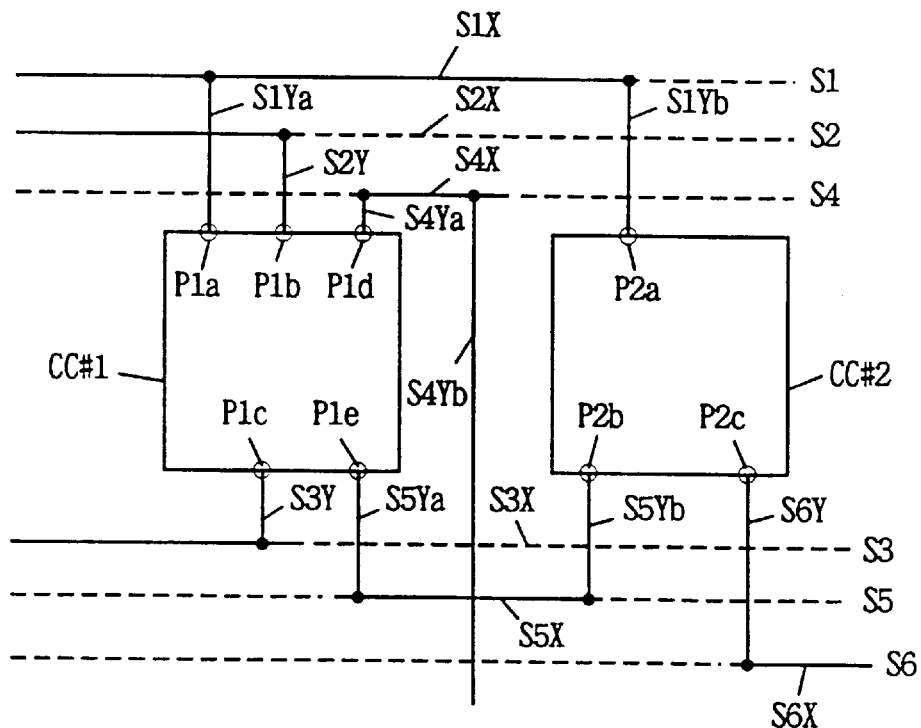
FIG. 87 is an illustration showing problems of the conventional automatic arrangement and interconnection.
Figure 88:
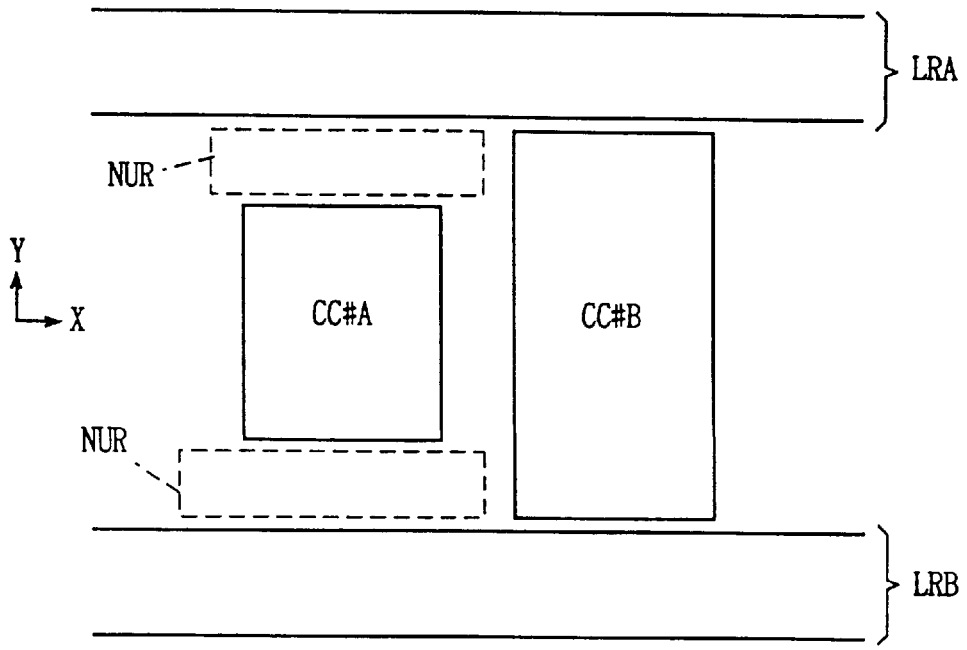
FIG. 88 is an illustration showing another problem of the conventional automatic arrangement and interconnection.
Figure 89:
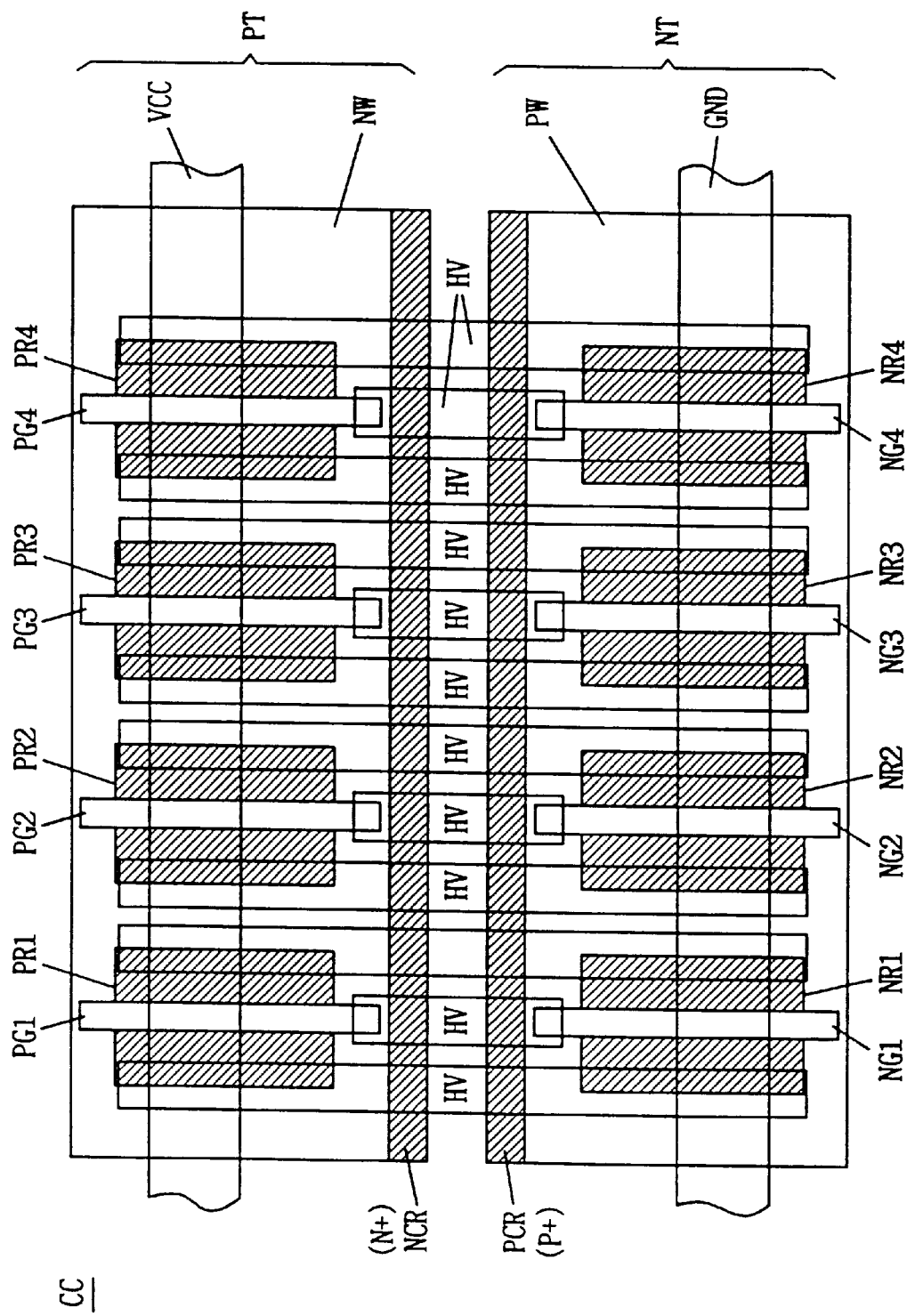
FIG. 89 shows internal arrangement of a conventional circuit cell.
Figure 90A:
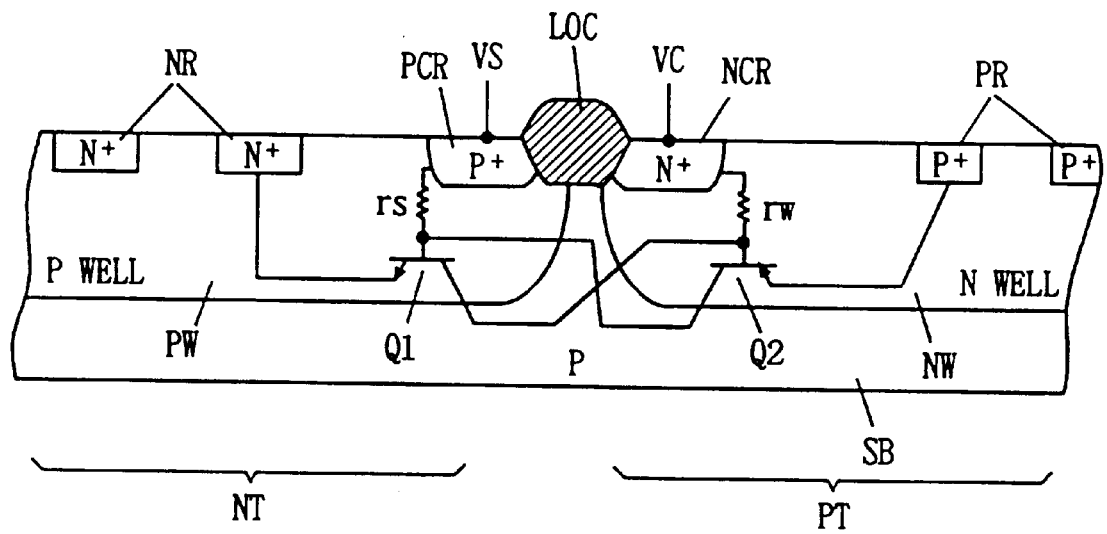
FIG. 90A shows a cross sectional structure of a CMOS portion of a circuit cell shown in FIG. 89.
Figure 90B:
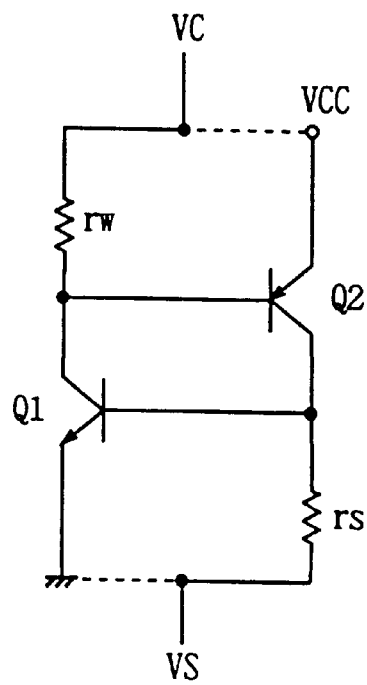
FIG. 90B shows an equivalent circuit of a parasitic thyristor circuit formed in the CMOS portion.

N collar regions NCRa and NCRb and P collar regions PCRa to PCRc are arranged alternatively or staggeredly along the direction of extension (X direction) of the power supply line VCC and ground line GND, not opposing to each other. The numbers of P collar regions PCRa to PCRc and of N collar regions NCRa and NCRb are arbitrarily selected. What is necessary is that the potentials of N well NW and P well PW are made fixed. Since N collar regions NCRa and NCRb do not oppose to P collar regions PCRa to PCRc, the circuit cell CC equivalently has a "single collar structure" in which only one of the N well NW and P well PW has collars. In this case, as already described with reference to FIG. 85, latch up resistance (immunity) is improved than when collar regions are provided both in the N and P wells NW and PW, and hence reliability of the device can be improved. Since collar regions NCRa, NCRb, PCRa to PCRc are arranged as islands, it is possible to extend gate electrode lines in regions where the collar regions do not exist. Therefore, the length of N well NW and P well PW in Y direction can be reduced and the circuit cell can be reduced accordingly. Further, since collar regions are provided for N well NW and P well PW, the wells NW and PW can be surely fixed at a prescribed potentials.

Figure 62:
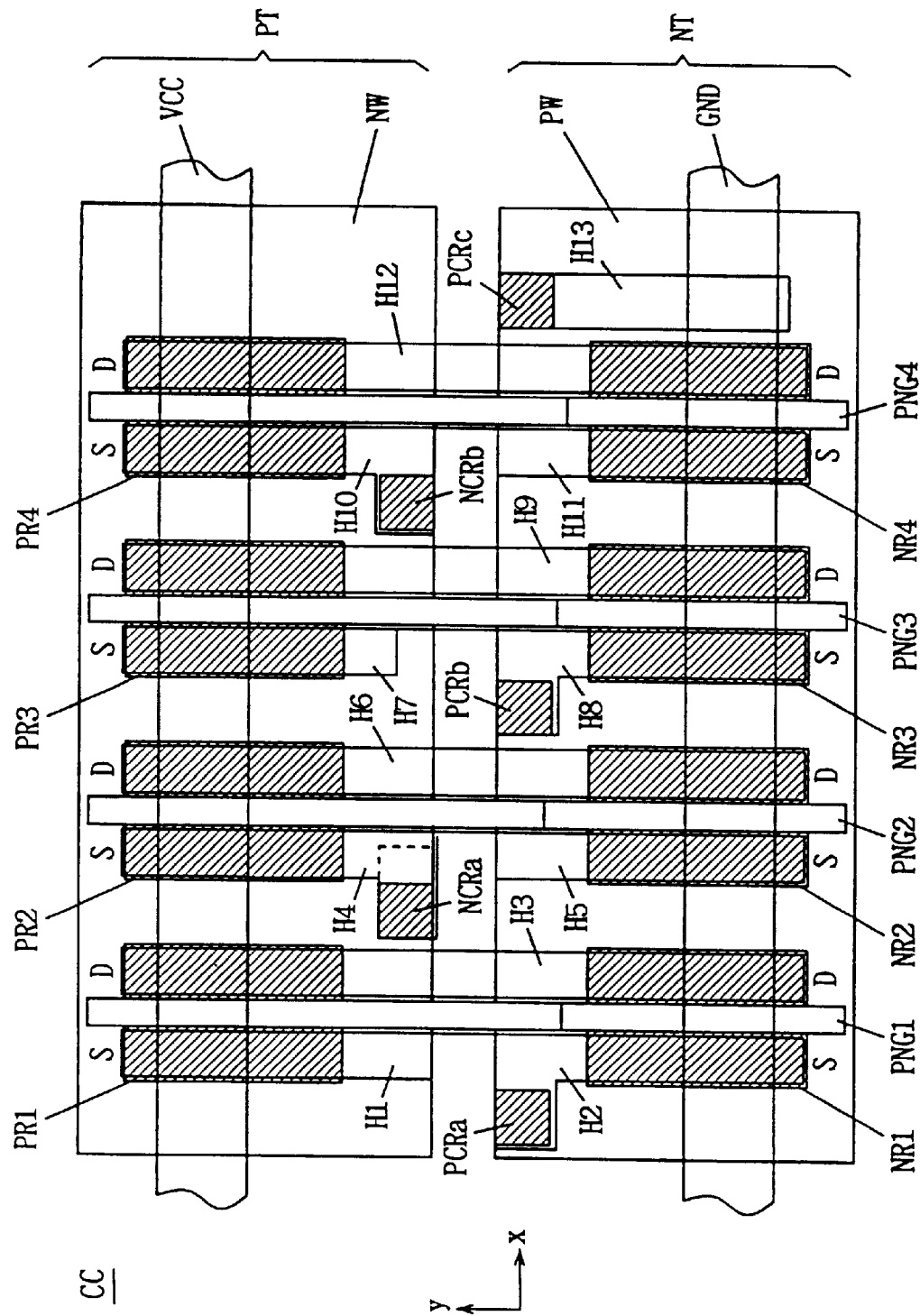
FIG. 62 shows an example of an entire line arrangement in a semiconductor integrated circuit device in accordance with the nineteenth embodiment of the present invention.
Figure 63:
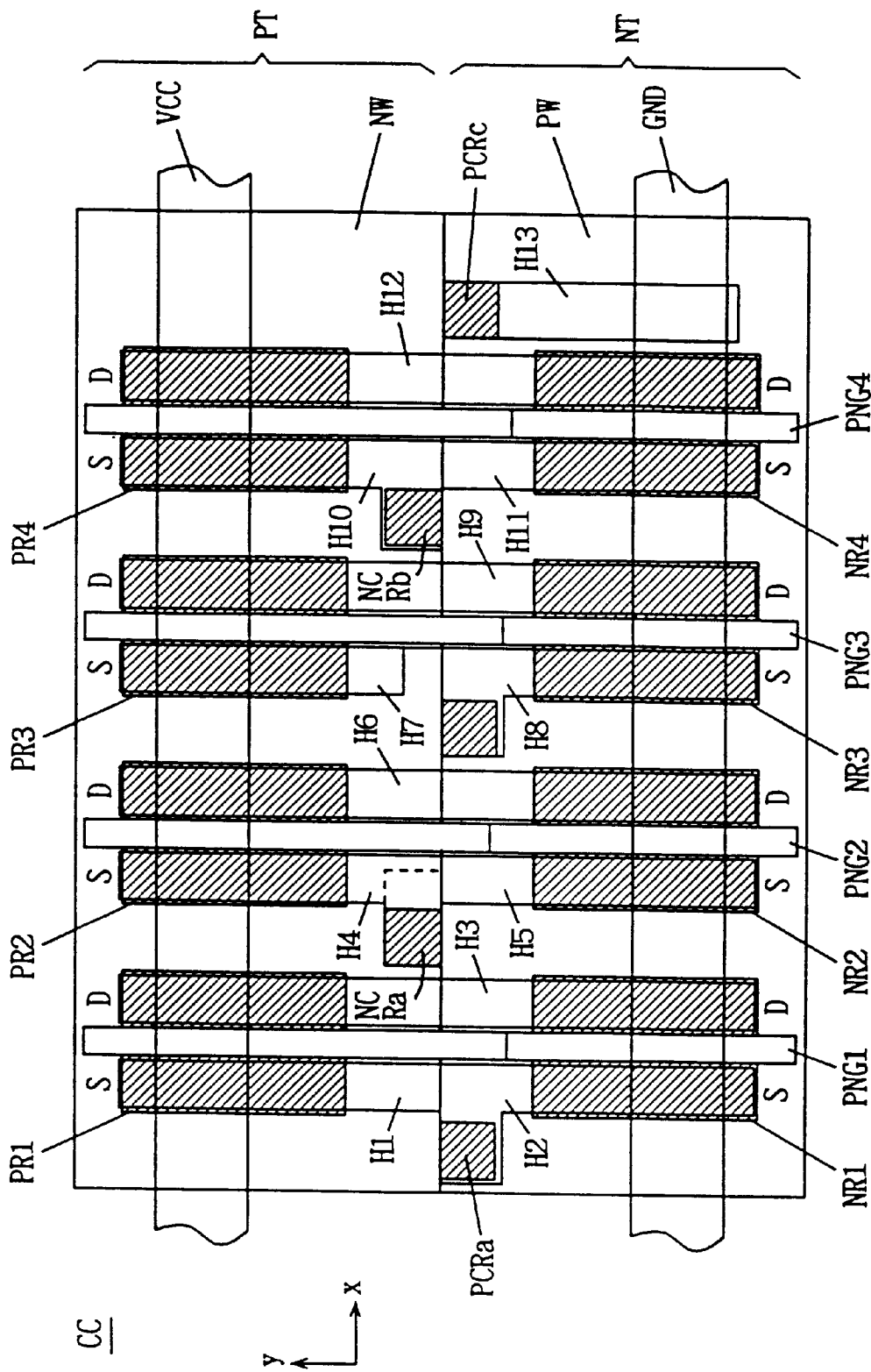
FIG. 63 shows another example of an entire line arrangement in a semiconductor integrated circuit device in accordance with the nineteenth embodiment of the present invention.

FIG. 62 shows an example of arrangement and interconnection of transistors in a circuit cell CC. FIG. 63 shows a modification of the arrangement shown in FIG. 61. In the arrangement of FIG. 63, N well NW and P well PW are made contacted with each other. Wells PW and NW each have a low impurity concentration, and the junction between the wells PW and NW provides a sufficiently large reverse (backward) breakdown voltage. Due to the island-shaped and distributed collars PCR and NCR, there is no place where P collar PCR and N collar NCR are contacted with each other, and the wells PW and NW are made contacted with each other without degradation of electrical properties, and no space for isolating the wells PW and NW is required. Thus, cell size or occupation area can be reduced. Other arrangement is the same or that of FIG. 62. Even if P collar PCR is made contacted with N well NW, or N collar NCR is made contacted with P well PW, one region of P/N junction is a low concentration impurity region, and the reverse (backward) breakdown voltage is not degraded. Arrangement and interconnection in the circuit cell shown in FIG. 62 or 63 will be described, referring to a layout operation flow chart of FIG. 64.

In a circuit cell CC, N well NW and P well PW are arranged opposing to each other. In N well NW and P well PW as transistor forming regions, necessary MOS transistors are arranged (step S200). In the example of FIG. 63, impurity regions PR1 to PR4 for forming four p channel MOS transistors are arranged aligned in one line along the X direction, and in P well PW, impurity regions NR1 to NR4 for forming n channel MOS transistors are arranged aligned in one line along the X direction.

Thereafter, by using an aluminum line H belonging to the first layer of aluminum interconnection and a line belonging to a first layer of polysilicon gate interconnection (1TG), lines between transistors (inter-transistor lines) and gate electrode lines of the transistors are arranged (step S202). Referring to FIG. 62 or 63, gate electrodes of transistors formed by impurity regions PR1 and PNG1 are connected to each other by a gate electrode line PNG1. Similarly, for the transistor regions formed by p type impurity regions PR2 to PR4 and transistor regions formed by n type impurity regions NR2 to NR4, gate electrode lines PNG2 to PNG4 are arranged commonly. A line H3 belonging to the first layer of aluminum interconnection is arranged extending in the Y direction, so as to connect drain forming region D of impurity region PR1 and drain forming region D of impurity region NR1 to each other. As for the source forming region S of impurity region PR1, a line H1 belonging to the first layer of aluminum interconnection is arranged for electrical contact with the power supply line VCC. For the source forming region S of impurity region NR1, a line H2 belonging to the first layer of aluminum interconnection is arranged for electrical connection with the ground line GND. Lines H4 and H5 belonging to the first layer of aluminum interconnections are arranged for electrical contact of source forming region S of impurity region PR2 and source forming region S of impurity region NR2 to power supply line VCC and ground line GND, respectively. A line H6 belonging to the first layer of aluminum interconnection is arranged to connect drain forming regions D of impurity regions PR2 NR2 to each other.

Similarly, aluminum lines H7 and H9 belonging to the first layer of aluminum interconnection are arranged for impurity region PR3, and aluminum lines H8 and H9 belonging to the first layer of aluminum interconnection are arranged for impurity region NR3. The aluminum line H9 of the first layer is arranged for connecting drain forming regions D of impurity regions PR3 and NR3 to each other. For the source forming region S of impurity region PR4, an aluminum line H10 belonging to the first layer of aluminum interconnection is arranged, and for the source forming region S of impurity region NR4, an aluminum line H11 belonging to the first layer is arranged. An aluminum line H12 belonging to the first layer of aluminum interconnection is arranged for connecting drain forming regions D of impurity regions PR4 and NR4 to each other. The first layer of aluminum interconnection for connecting drain forming regions D to each other may be lines electrically connected to the main line or internal line extending only in the circuit cell CC, as already described. Other internal lines are also arranged in this step.

Thereafter, in regions where gate electrode lines (1TG) PNG1 to PNG4 are not arranged, along peripheral regions of N well NW and P well PW opposite to each other, island-shaped impurity regions (collar regions) for fixing well potential are arranged. In FIG. 62 or 63, in N well NW, N well collar NCRa is arranged in a region between gate electrode lines PNG1 and PNG2, and N well collar NCRb is arranged between gate electrode lines PNG3 and PNG4. In P well PW, P well collar region PCRa is arranged at an end portion of P well PW with respect to gate electrode line PNG1. P well collar region PCRb is arranged between gate electrode lines PNG2 and PNG3. P well collar region PCRc is arranged at an end portion of P well PW outside gate electrode line PNG4. These collar regions NCRa, NCRb, PCRa to PCRc are arranged alternately along the X direction in N well NW and P well PW so as not to oppose to each other along the Y direction. By the alternate arrangement, it is possible to arrange as many collar regions as possible in N well NW and P well PW not opposing to each other in Y direction. However, the arrangement is not limited to the alternate arrangement (along the X direction). For example, an arrangement of collar regions in which two collar regions are arranged successively and adjacently on one well region may be used.

As the well collar regions are arranged in regions where gate electrode lines PNG1 to PNG4 are not arranged, even when impurity ions are introduced using gate electrode lines as masks upon forming impurity regions, formation of MOS transistors at collar regions in this step of impurity ion implantation can be prevented, since the collar regions are not arranged below the gate electrode lines. Therefore, parasitic resistance or capacitance at the gate electrode lines can be reduced.

Thereafter, lines are provided for the arranged impurity regions (step S204). In this step, the aluminum line H2 of the first layer of aluminum interconnection which has been already arranged is extended to the collar region PCRa, so as to electrically connect the collar region PCRa to the ground line GND. Similarly, the aluminum line H4 of the first layer of aluminum interconnection which has been already arranged has its shape modified so as to extend to N well collar NCRa. For impurity regions PCRb and NCRb, aluminum lines H8 and H10 of the first layer are modified to have an L-shape, so that these aluminum lines H8 and H10 of the first layer extend to these impurity regions.

As for the impurity region PCRc, since there is not an aluminum line belonging to the first layer for applying source potential thereto, another aluminum line H13 belonging to the first layer is provided extending from collar region PCRc to the ground line GND.

The collar regions may be arranged to extend below a region nearby aluminum layer of the first layer (provided that the collar region is not overlapped with the gate electrode line). This state is shown by the dotted lines in FIG. 62 with respect to collar region NCRa. As shown in FIG. 62, by employing a structure in which a prescribed voltage is applied to the collar region by using already arranged internal lines (aluminum lines belonging to the first layer), it becomes unnecessary to provide an additional line for applying bias voltage only, whereby the size of the circuit cell can be reduced.

Figure 64:
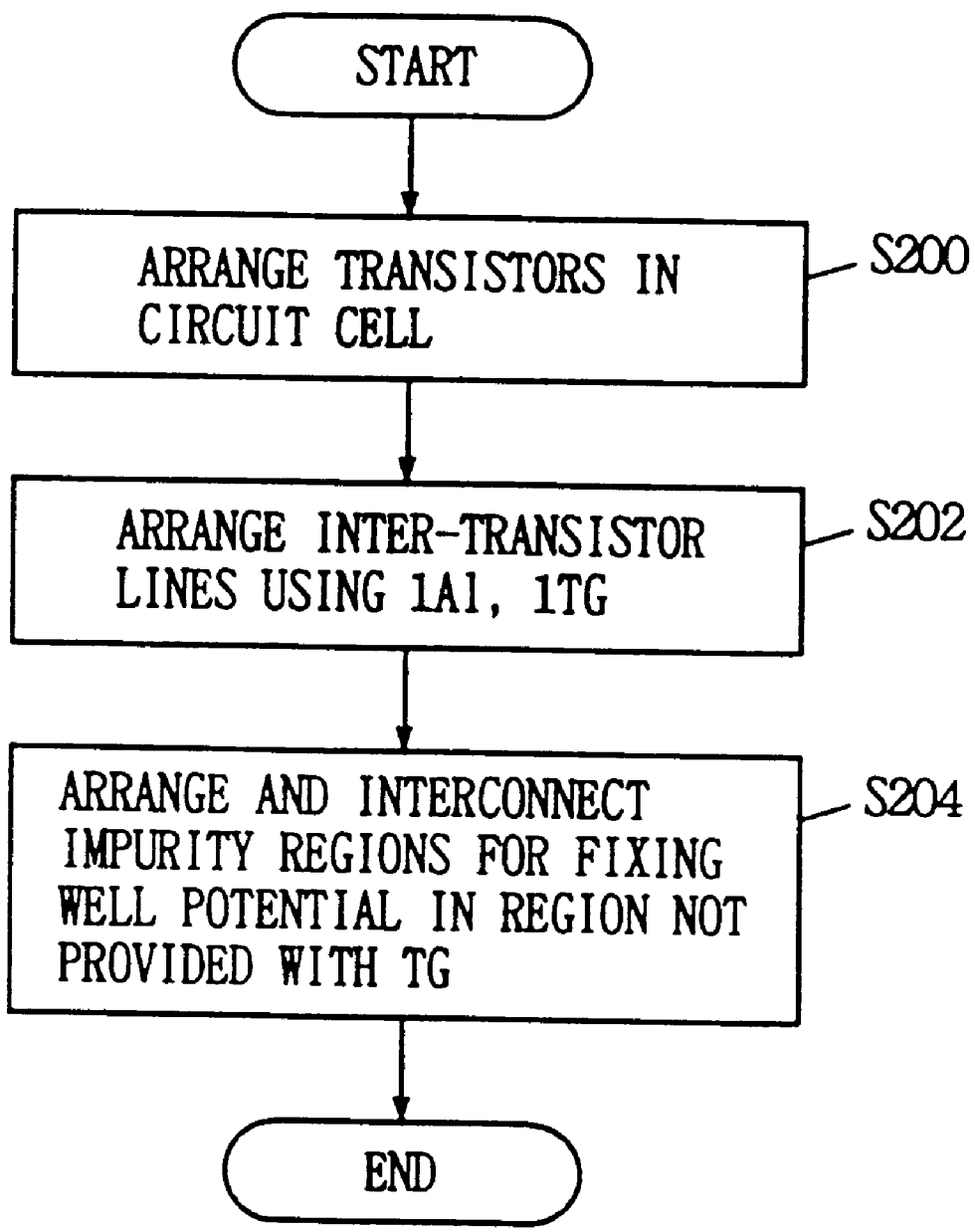
FIG. 64 is a flow chart showing a method of implementing the interconnection and arrangement shown in FIG. 62 or 63.
Figure 65:
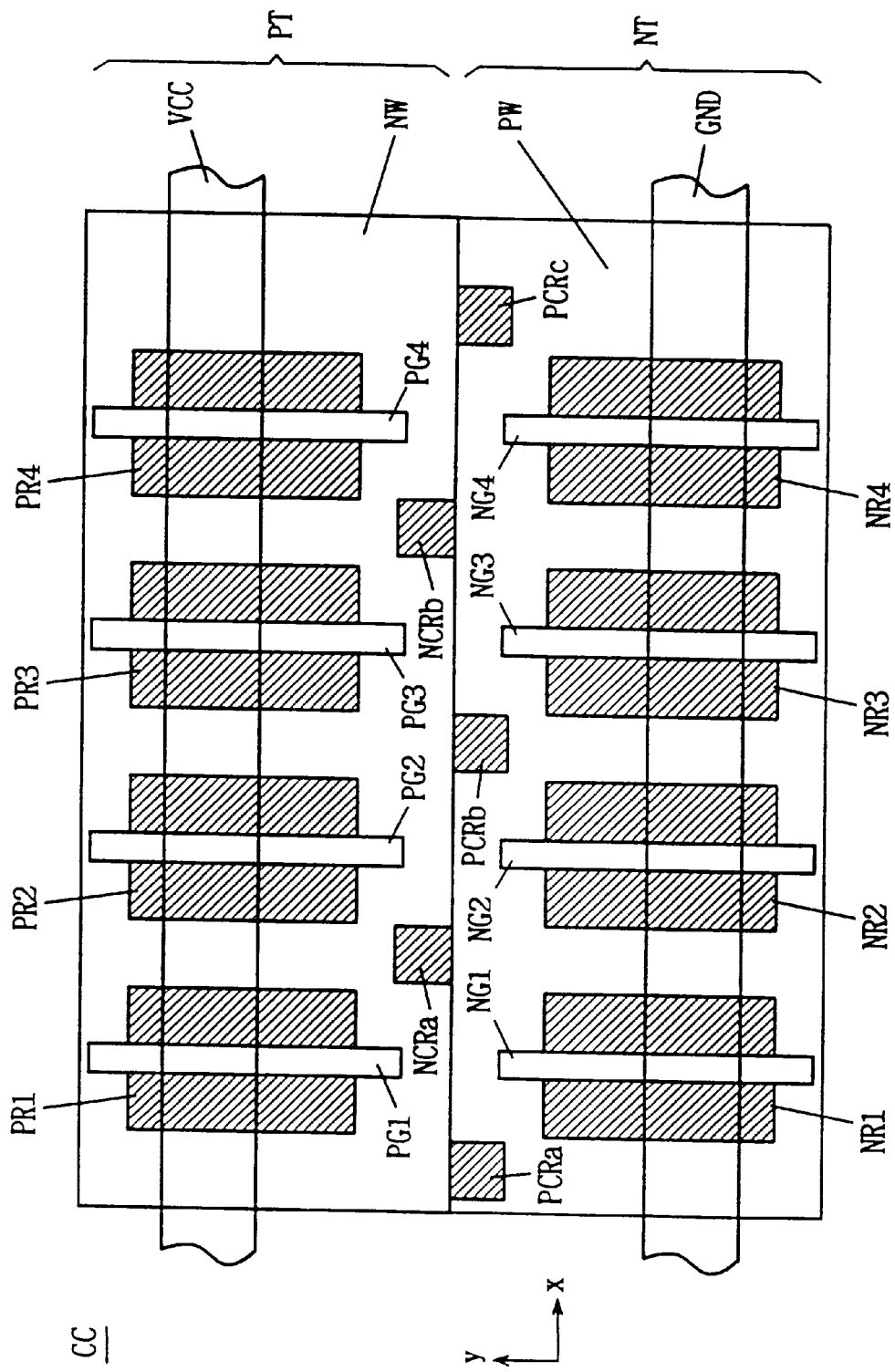
FIG. 65 shows a modification of the arrangement of FIG. 61.

FIG. 65 shows another layout of the collar regions of FIG. 61. The arrangement of FIG. 65 is the same as that shown in FIG. 64, except for that N well NW is made contacted with P well PW. FIG. 65 arrangement can reduce the cell size, or cell occupation area, as compared to FIG. 61 arrangement.

Figure 66:
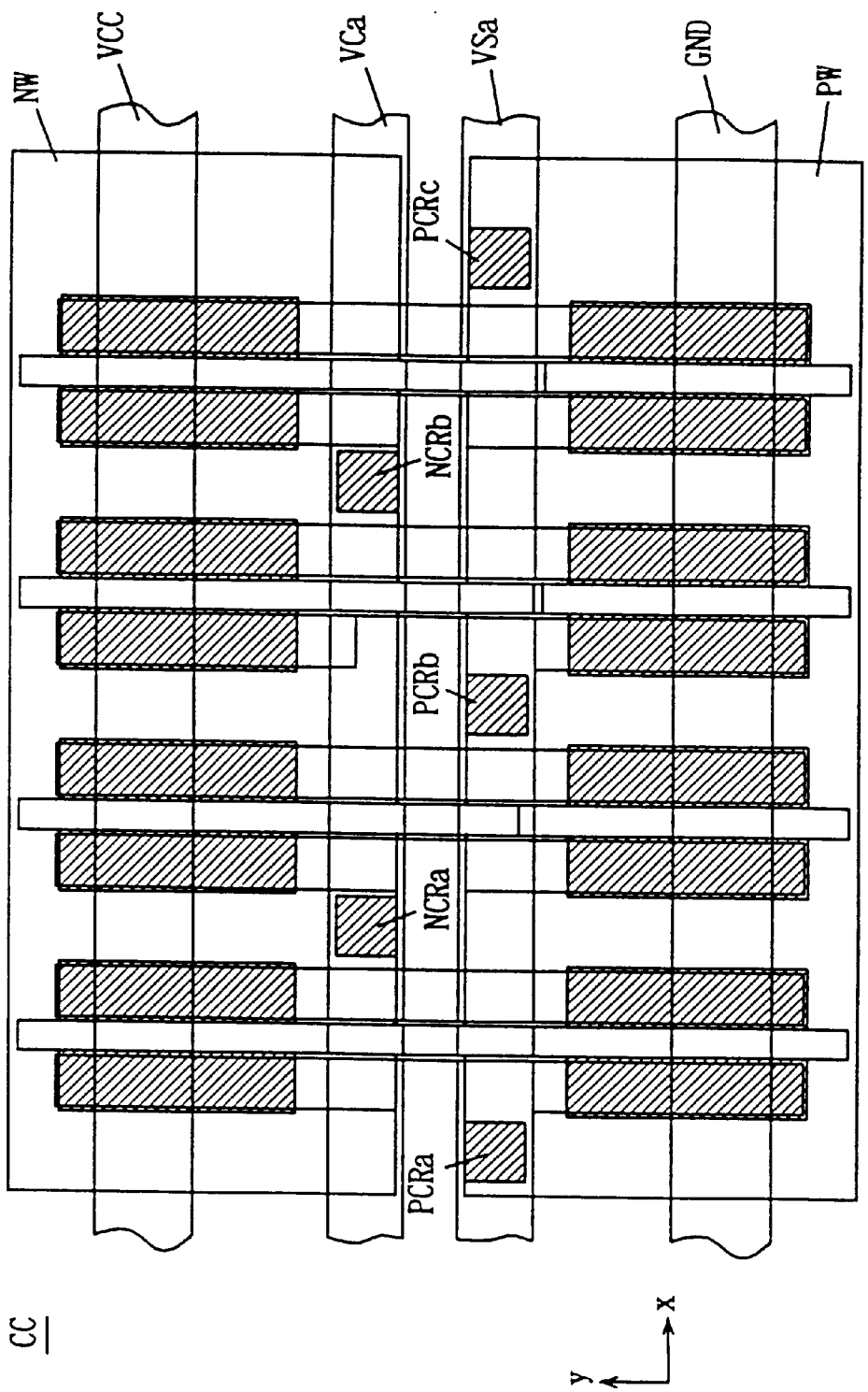
FIG. 66 shows a structure of a first modification of the nineteenth embodiment of the present invention.

FIG. 66 shows another layout of the collar regions. Referring to FIG. 66, in a peripheral region of P well PW, P well collar regions PCRa to PCRc are arranged spaced from each other, and in a peripheral region of N well NW, N well collar regions NCRa and NCRb are arranged apart from each other. On N well regions NCRa and NCRb, a bias voltage line VCa formed by an aluminum line belonging to a second layer of aluminum interconnection is provided parallel to the power supply VCC and the ground line GND. Across P well collar regions PCRa to PCRc, a bias voltage line VSa formed of an aluminum line belonging to the second layer of aluminum interconnection is arranged parallel to the bias voltage line VCa. Collar regions NCRa and NCRb receive a prescribed bias voltage from the bias voltage line VCa, and fix N well NW at a prescribed potential. Meanwhile, collar regions PCRa to PCRc receive a prescribed bias voltage from bias voltage line VSa, and fix P well Pw at a prescribed potential. By utilizing the arrangement shown in FIG. 66, it becomes possible to fix N well NW and P well PW to different voltage levels which are different from power supply voltage VCC and ground voltage GND. Further, by arranging bias voltage lines VCa and VSa different from the power supply line VCC and the ground line GND applying operational power supply voltages to the transistors, it becomes possible to apply bias voltages of prescribed voltage levels stably to N well NW and P well PW without influenced by the noises on the power supply line VCC and the ground line GND, and hence potentials of the wells NW and PW can be fixed at prescribed potential levels stably.

Figure 67:
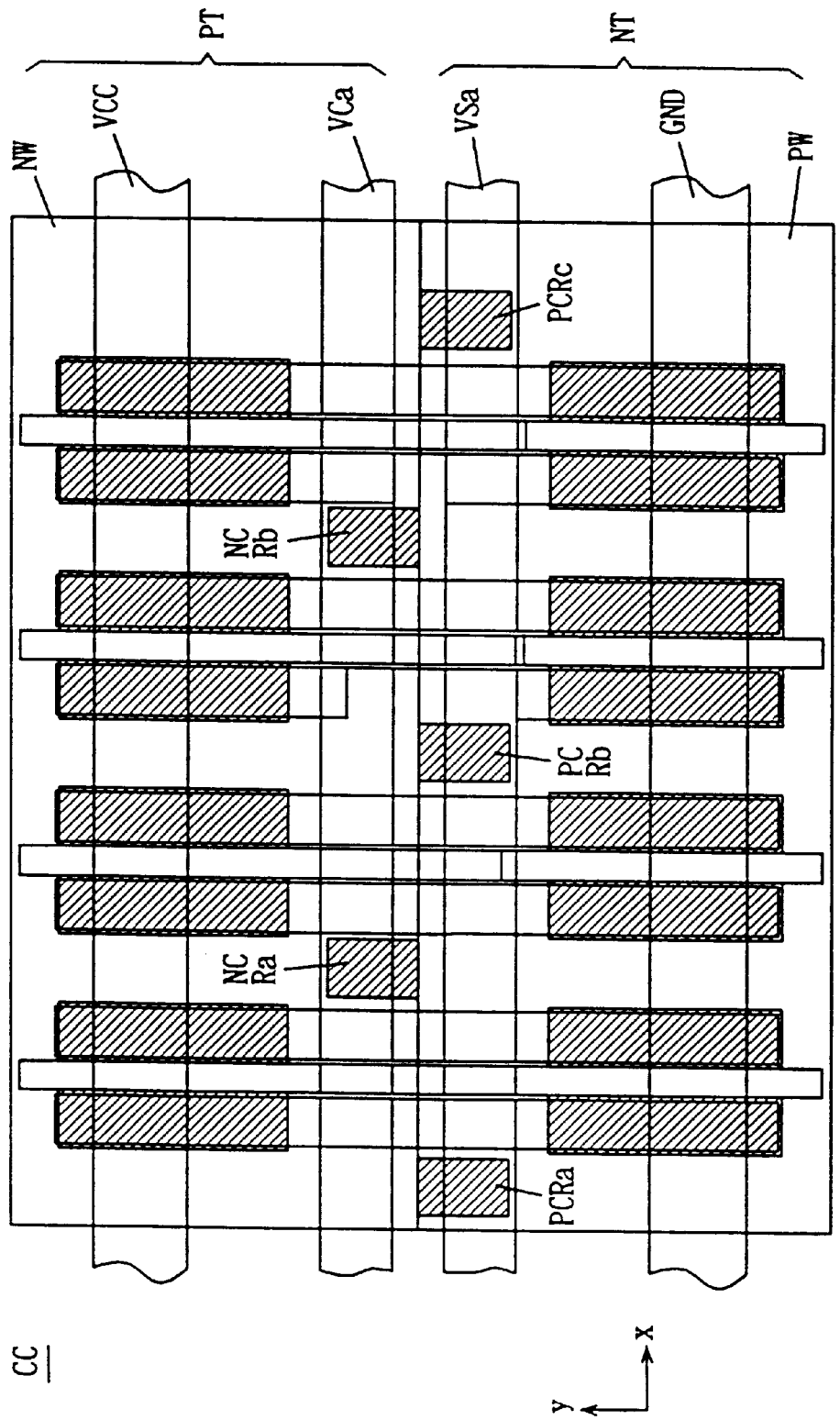
FIG. 67 shows a modification of the arrangement of FIG. 66.

FIG. 67 shows another layout of the collar regions. The arrangement of FIG. 67 is the same as that shown in FIG. 66, except for that N well NW is made contacted with P well PW. FIG. 67 arrangement can reduce the cell size, or cell occupation area, as compared to FIG. 66 arrangement.

In the flow chart of FIG. 64, steps S202 and S204 may be exchanged in position. Namely, after the transistors are arranged, necessary collar regions are arranged at positions not aligned with the gates of the transistors in Y direction, and thereafter inner lines of 1 A1 layer and inner lines formed by the gate electrode line layer may be arranged between the collar regions.

Modification

Figure 68:
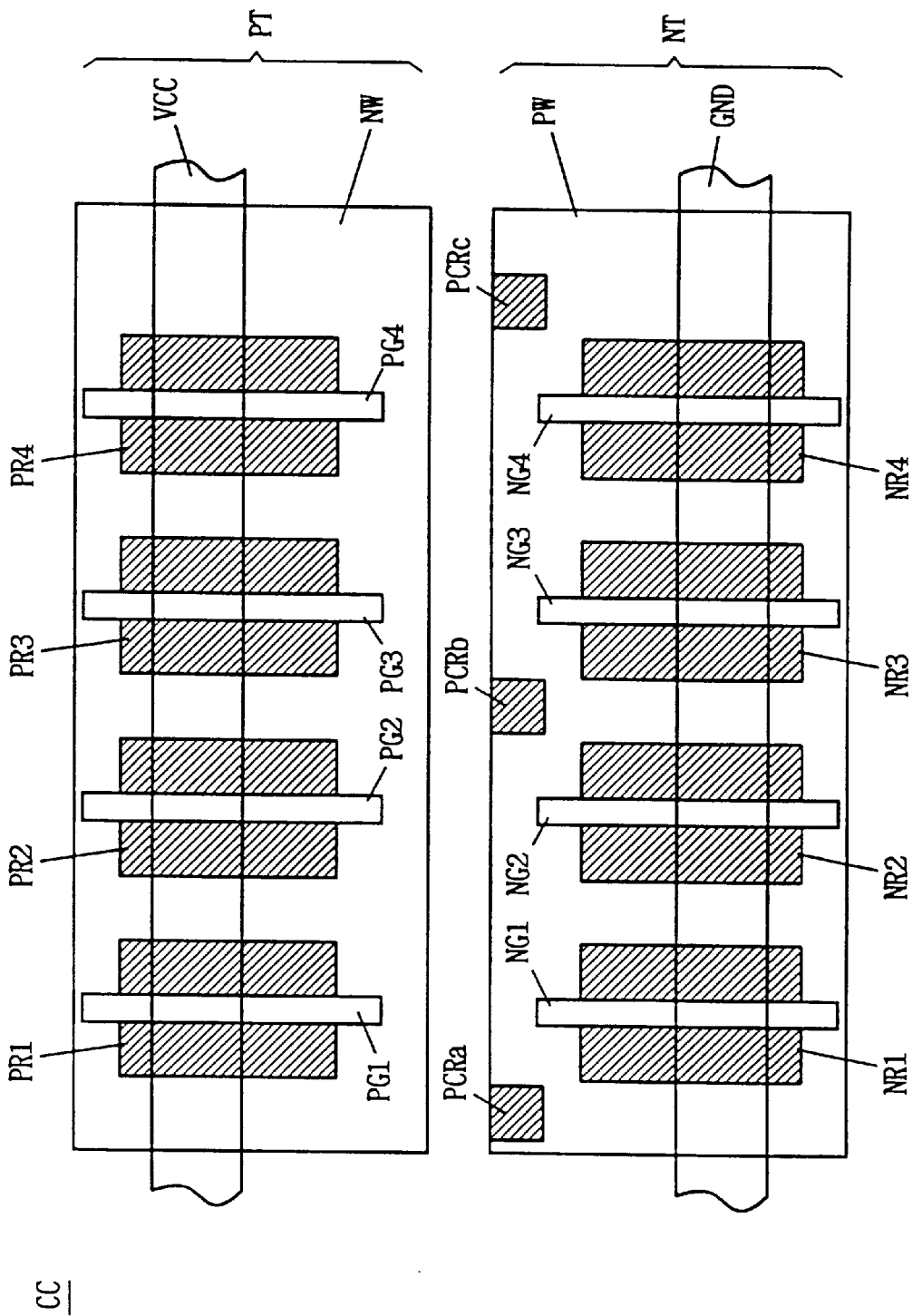
FIG. 68 shows a structure of a second modification of the nineteenth embodiment of the present invention.
Figure 91:
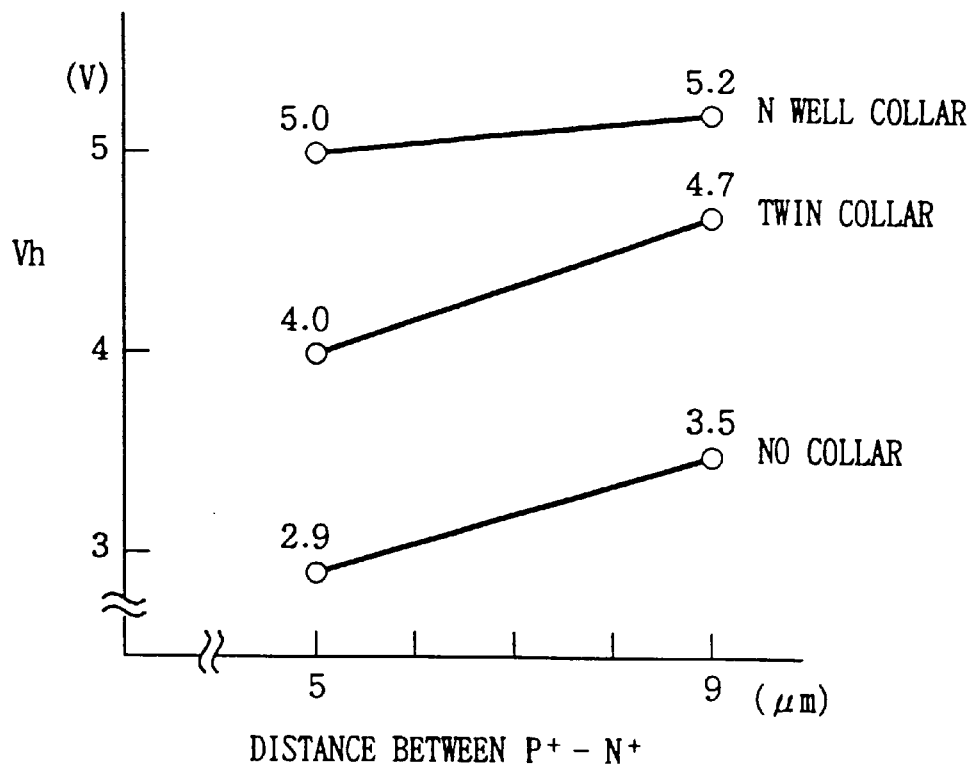
FIG. 91 is an illustration showing the effect of well collar region.
Figure 92A:
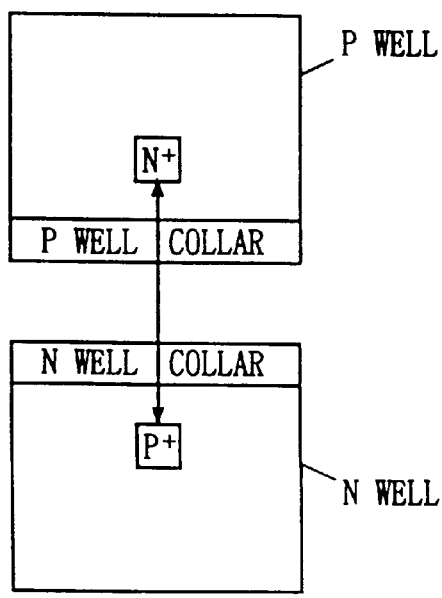
FIGS. 92A and 92B are illustrations for help understanding the terminology of FIG. 91.
Figure 92B:
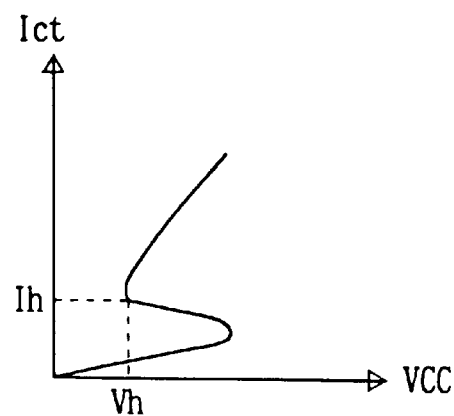
Figure 93:
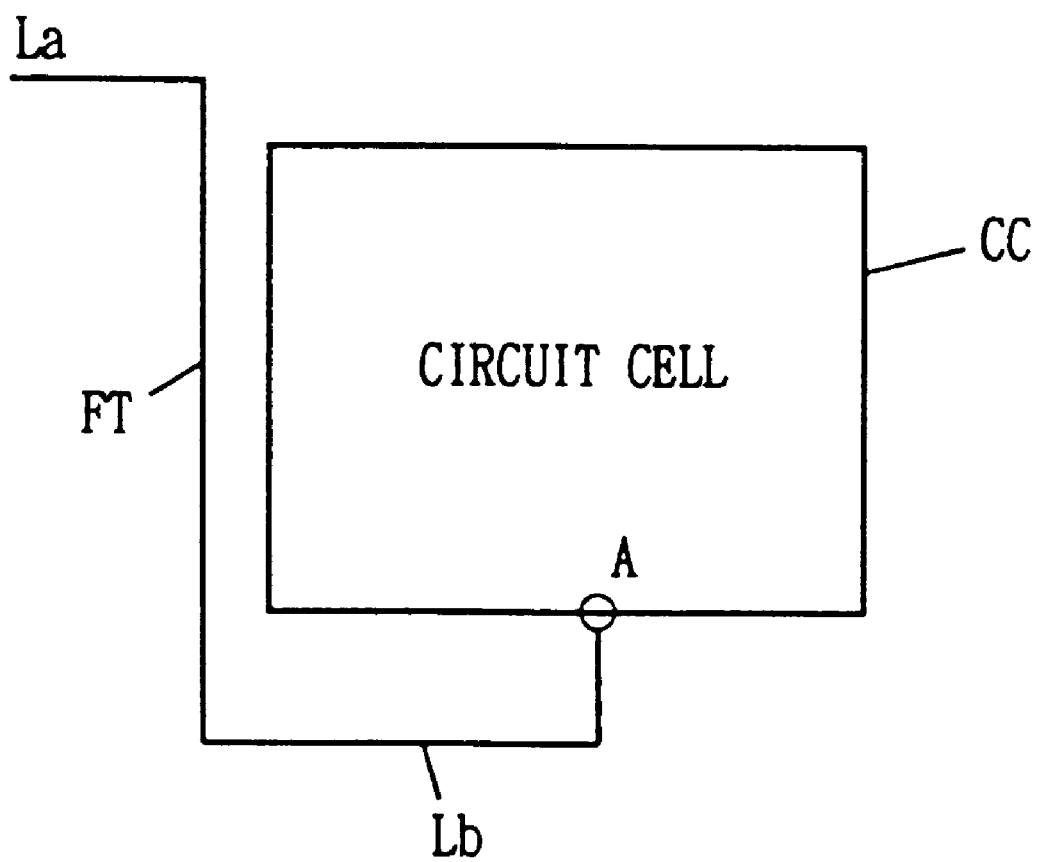
FIG. 93 is an illustration showing a problem of a conventional circuit cell.

FIG. 68 shows a modification of the nineteenth embodiment of the present invention. In the structure shown in FIG. 68, the collar region for fixing the well potential is arranged only in the P well PW. In FIG. 68, P well collar regions PCRa, PCRb and PCRc are arranged spaced apart from each other along a peripheral region of P well PW opposing to N well NW, as an example. Collar regions are not provided in N well NW. Even in the structure in which collar regions are arranged only in one well region, as is apparent from the graph of FIG. 91, latch up resistance (immunity) can be improved as compared with the structure in which collar regions are provided in both wells. Further, as the collar regions are arranged like islands spaced from each other, it becomes possible to extend gate electrode lines between wells as described above, and hence similar advantages such as improvement in degree of freedom of internal line arrangement can be obtained.

Figure 69:
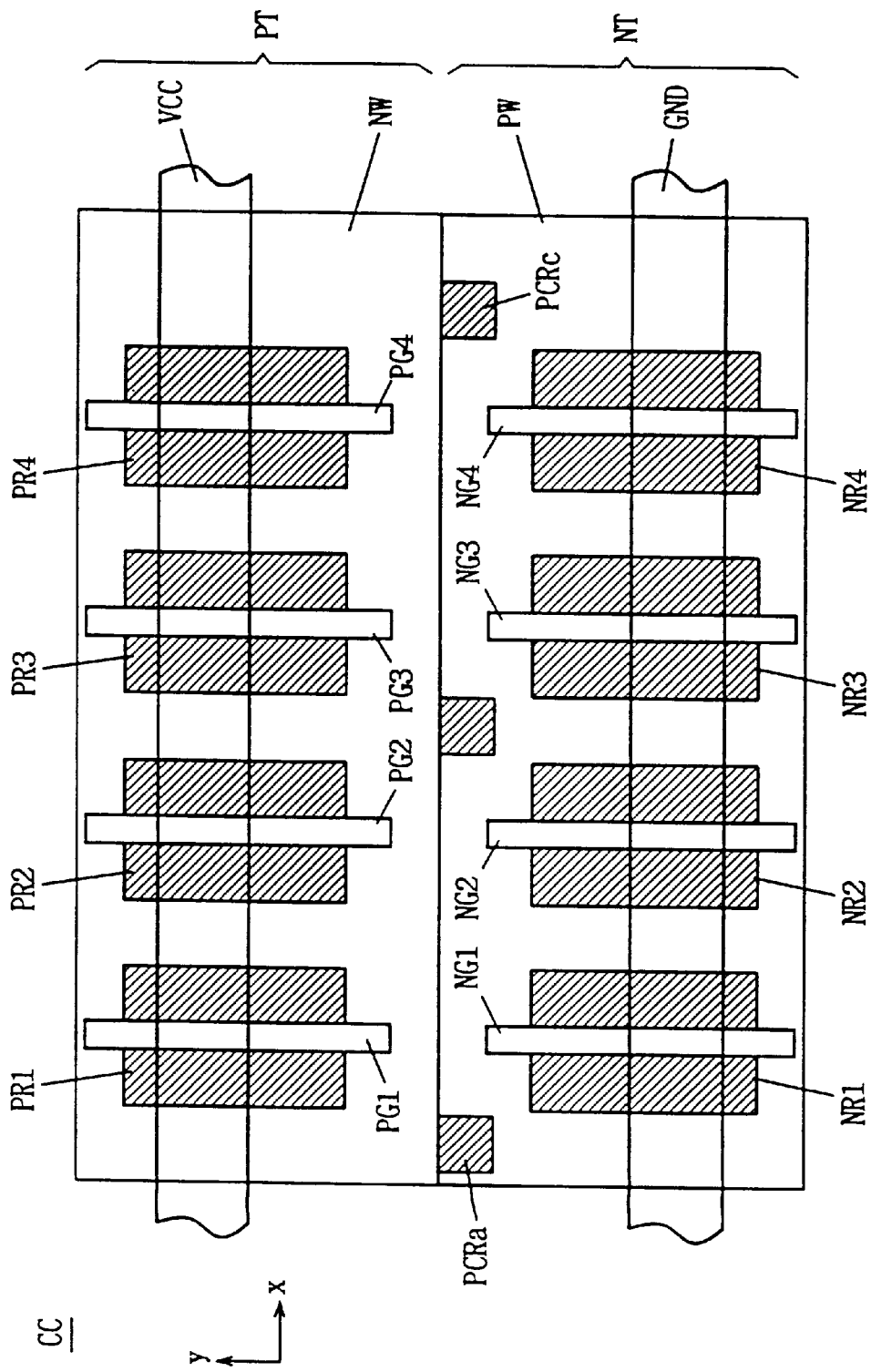
FIG. 69 shows a modification of the arrangement of FIG. 68.

FIG. 69 shows another layout of the collar regions. The arrangement of FIG. 69 is the same as that shown in FIG. 68, except for that N well NW is made contacted with P well PW. FIG. 69 arrangement can reduce the cell size, or cell occupation area, as compared to FIG. 68 arrangement.

The collar regions may be provided only in N well NW. In the nineteenth embodiment, in the transistor forming regions PT and NT (wells NW and PW), it is not necessary for the transistors to be arranged as gate arrays aligned in one line in the circuit cell CC. The n channel MOS transistors and p channel MOS transistors may be appropriately arranged in accordance with the logic to be implemented by the circuit cell CC (it is apparent from the description of the empty region in the circuit cell in the embodiments above).

As described above, according to the nineteenth embodiment of the present invention, since collar regions for fixing potentials of wells serving as substrate region are formed as island-shaped regions and arranged spaced apart from each other, it becomes possible to arrange lines of gate electrode layers between wells, it becomes unnecessary to use a first layer of aluminum interconnection for connecting transistor gate electrodes to each other, and hence degree of freedom of internal lines in the circuit cell is increased. Further, since the collar regions are formed as islands, when these collars are arranged in N wells and P wells so as not to oppose to each other, a structure in which collars are arranged in only one well can be realized equivalently, whereby latch up resistance (immunity) is improved and reliability of the device is improved.

Embodiment 20

Figure 70:
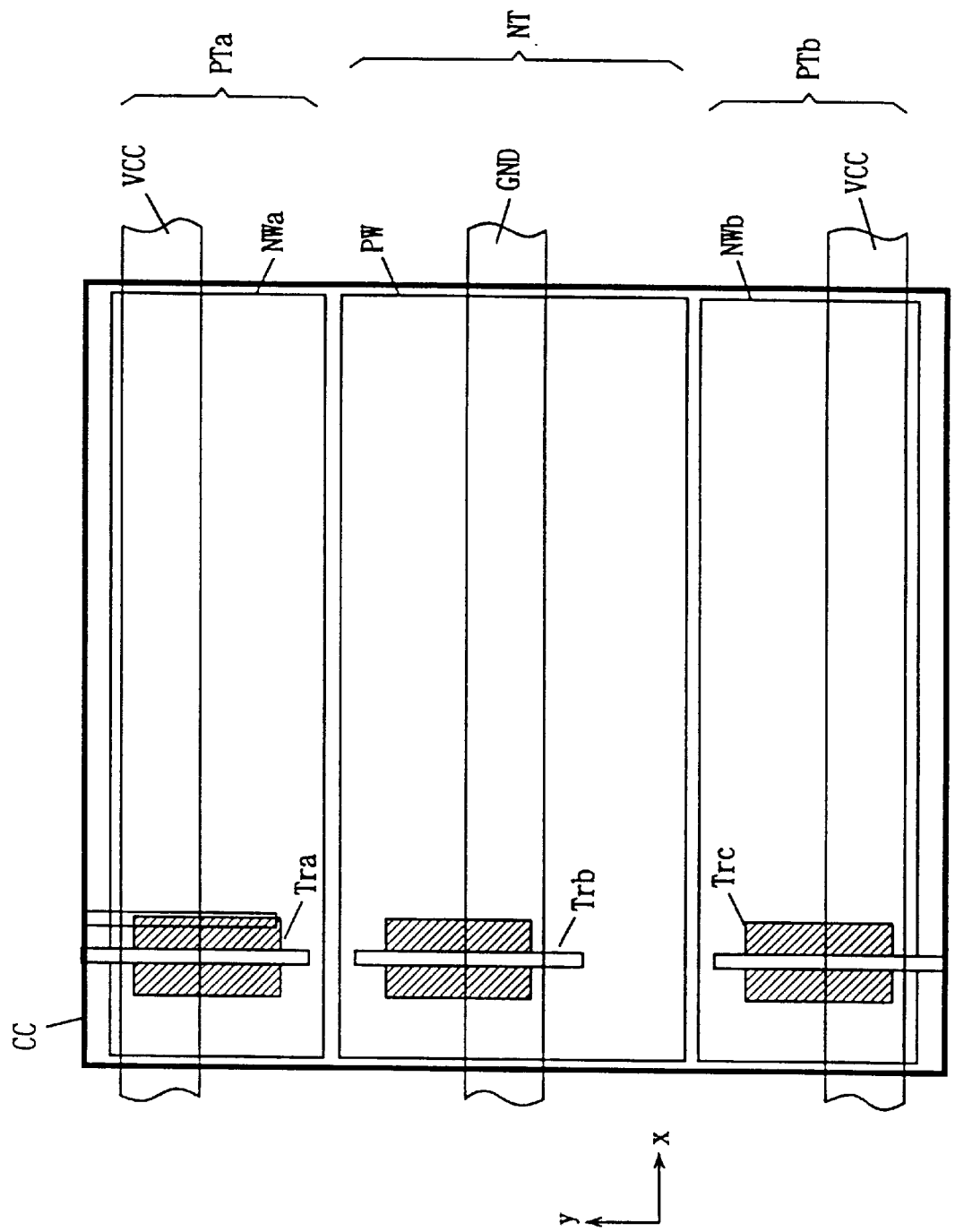
FIG. 70 shows a structure of a main portion of a semiconductor integrated circuit device in accordance with a twentieth embodiment of the present invention.

FIG. 70 shows a structure of a main portion of the semiconductor integrated circuit device in accordance with the twentieth embodiment of the present invention. FIG. 70 schematically shows a transistor forming region. Referring to FIG. 70, a circuit cell CC includes an n channel MOS transistor forming region NT in which n channel MOS transistors are arranged, and p channel MOS transistor forming regions PDa and PDb formed sandwiching transistor forming region NT, on both sides of n channel MOS transistor forming region NT along the Y direction. MOS transistor forming region NT includes a P well PW serving as a semiconductor substrate region for forming n channel MOS transistors. On P well PW, a ground line GND formed by the second layer of aluminum interconnection is arranged along the X direction. The p channel MOS transistor forming regions PDa and PDb include N wells NWa and NWb for forming p channel MOS transistors, respectively. On N wells NWa and NWb, power supply lines VCC formed by the second layer of aluminum interconnection are arranged extending in the X direction. In FIG. 70, MOS transistors Tra, Trb and Trc formed (arranged) in wells NWa, PW and NWb are shown as representatives. The n channel MOS transistor forming region NT of the circuit cell CC has a length along the Y direction approximately twice that of each of p channel MOS transistor forming regions PTa and PTb. More specifically, circuit cell CC shown in FIG. 66 has the size long enough to contain two cell circuits described in embodiments above along Y direction.

Figure 71:
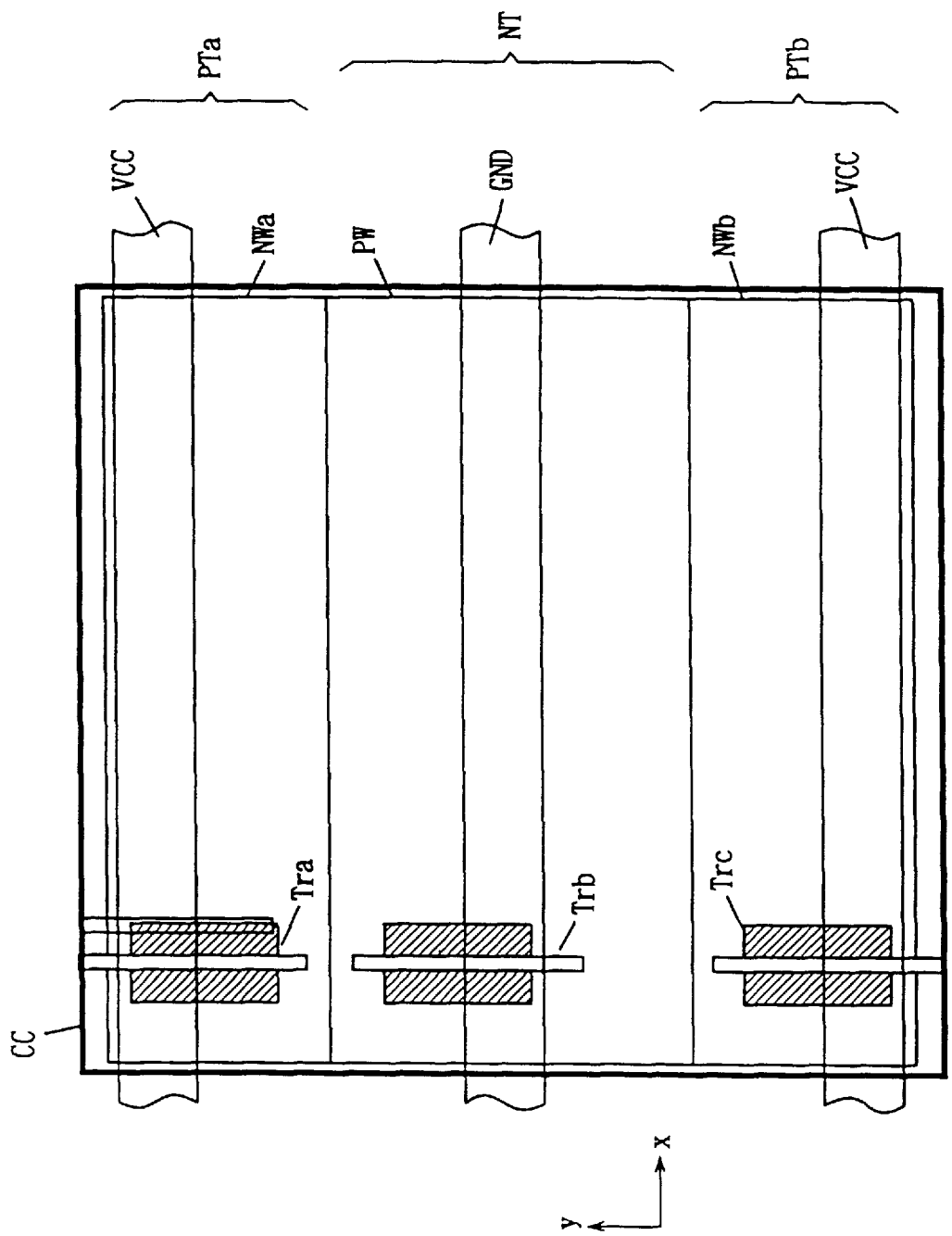
FIG. 71 shows a modification of the arrangement of FIG. 70.

FIG. 71 shows another layout of the collar regions. The arrangement of FIG. 71 is the same as that shown in FIG. 70, except for that N well NW is made contacted with P well PW. FIG. 71 arrangement can reduce the cell size, or cell occupation area, as compared to FIG. 71 arrangement. The arrangements of FIGS. 70 and 71 are subject to similar inversion operation.

Figure 72A:
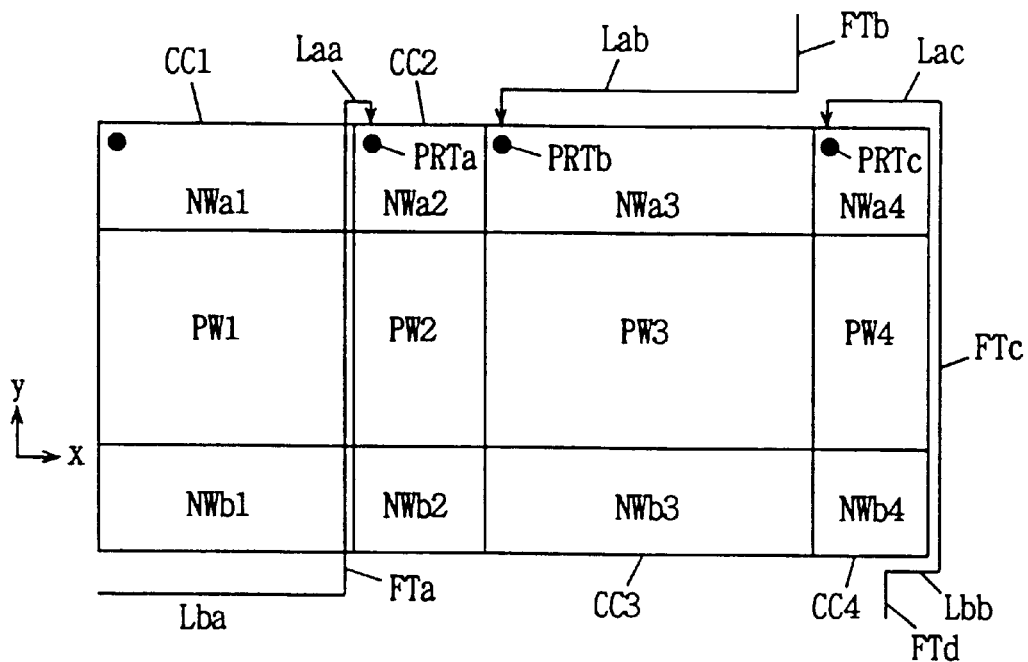
FIGS. 72A and 72B illustrate method of circuit cell arrangement interconnection of the semiconductor integrated circuit device in accordance with the twentieth embodiment of the present invention.

Now, referring to FIG. 72A, let us consider four circuit cells CC1 to CC4 arranged along the X direction. These circuit cells CC1 to CC4 include N wells NWa1, NWb1 to NWa4, NWb4 for forming p channel MOS transistors, and P wells PW1 to PW4 for forming n channel MOS transistors. These wells are arranged aligned along the X direction. Assume that circuit cells CC1 to CC4 are arranged and internal lines (main lines) are arranged therefor. In circuit cells CC1 to CC4, arrangement of transistors is optimized. When a signal is to be exchanged between port PRTa of circuit cell CC2 and a main line Lba therebelow (in Y direction), the main line Lba is connected to port PTRa through feed through FTa and main line Laa. As for circuit cell CC3, when port PTRb is connected to a feed through FTb extending from a circuit cell band or a main line band at an upper side, not shown, the feed through FTb is connected to port PTRb through main line Lab. Further, for the circuit cell CC4, when PRTc is to be connected to a feed through FTd extending from a circuit cell band or a main line at a lower side, the feed through FTd is connected to port PRTC through main line Lbb, feed through FTc and main line Lac. In such a state as shown in FIG. 72A, main line and feed through for changing the signal propagation path are necessary, so that area occupied by the lines is large, the size of the device itself is large, and hence there is a margin for optimizing interconnection layout in the line regions.

Figure 72B:
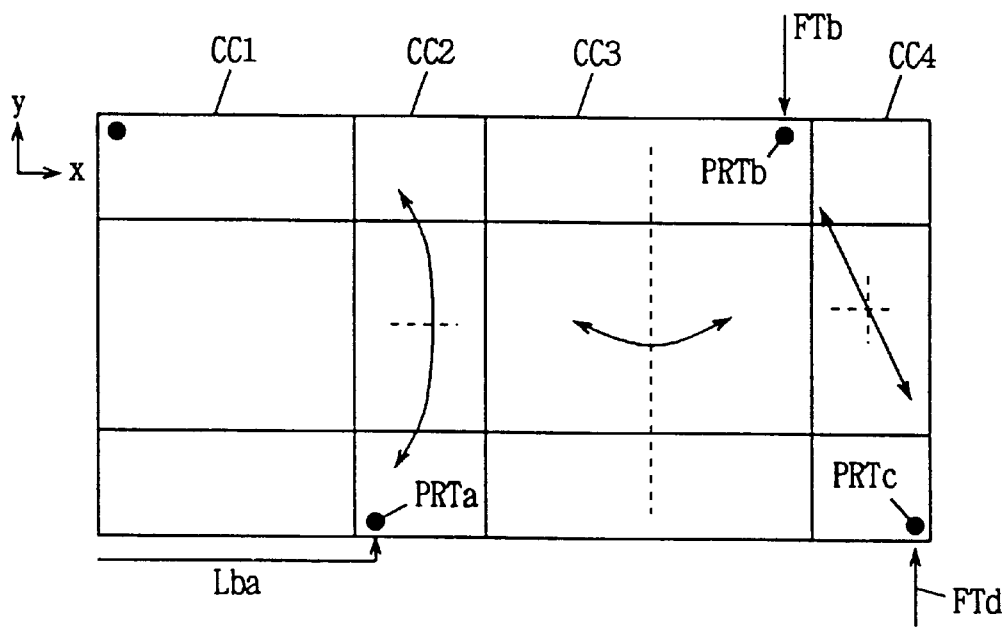

After the circuit cells are arranged and lines are provided as shown in FIG. 72A, circuit cells CC2 through CC4 are subject to inversion operation as shown in FIG. 72B. More specifically, referring to FIG. 72B, circuit cell CC2 is subject to up and down inversion operation with respect to Y direction. Therefore, port PRTa of circuit cell CC2 is arranged on the same side as a main line Lba. Therefore, feed through FTa and main line Laa shown in FIG. 72A become unnecessary, and the area occupied by the lines can be reduced. Circuit cell CC3 is inverted of left and right regions about a center line in the X direction. Consequently, port PRTb is arranged near the feed through FTb, the main line Lab shown in FIG. 72A becomes unnecessary, and it is possible to connect feed through FTb directly to port PTRb. Therefore, the area occupied by the main line Lab can be reduced.

Circuit cell CC4 is inverted both in the up and down direction and left and right direction, or is subject to the up and down inversion and the left and right inversion. Therefore, port PRTc moves from the upper left corner to the lower right corner, and the port PRTc can be directly connected to feed through FTb. Accordingly, feed through FTc and main lines Lac and Lbb become unnecessary, area occupied by the lines can be reduced and the interconnection can be optimized.

In circuit cells CC1 to CC4, N wells NWa and NWb for forming p channel MOS transistors are arranged on both sides of a P well PW for forming n channel MOS transistors. Therefore, even when the cells are inverted in the up and down direction, the p channel MOS transistors formed in the upper N well come to be formed in the lower N well NWb. Accordingly, MOS transistors formed in the P well are naturally inverted upside down, with the center in Y direction of P well being an axis. Therefore, even when such inversion is performed, optimal arrangement of transistors in the circuit cell can be maintained. Further, positions of well regions in circuit cell CC2 is not changed, and circuit cells CC1 to CC4 are arranged aligned in one line along the X direction.

When inversion in the left and right direction is performed, transistors formed in N well NWa are formed in the same N well NWa, while p channel MOS transistors formed in N well NWb are arranged in the same N well NWb. The n channel MOS transistors formed in P well PW are also formed in the same P well. Therefore, when inversion in the left and right direction is performed, what is different is only the arrangement of the transistors in the circuit cell with respect to the X direction (optimal arrangement is maintained), and size of circuit cell CC3 in Y direction is not changed at all. The inversion both in the up and down direction and the left and right direction performed on circuit cell CC4 is simply the combination of the inversions in the up and down (vertical) direction and the left and right (horizontal) direction described above, and therefore size of the circuit cell in Y direction is not changed in this case either.

Therefore, even when the above described inversion in the up and down direction and the left and right direction are performed, circuit cells can be arranged aligned in one line along the X direction. Signal input/output between circuit cells are implemented by main lines provided outside the circuit cells. Therefore, by performing the above inversion operations to optimize interconnection, area of the lines outside the circuit cells can be reduced, unnecessary main lines can be reduced, and positions of ports are optimized in accordance with the positions of main lines or feed throughs, whereby degree of freedom in arranging lines outside the circuit cells can be increased. Therefore, interconnection can be optimized and the size of the device as a whole can be reduced. In each circuit cell, transistor arrangement is optimized, and what is performed is simply inversion in up and down and/or left and right directions. Therefore, optimized arrangement of the transistor is not changed inside. Therefore, by the series of operations after the arrangement of the circuit cells, optimization of the circuit cell type semiconductor integrated circuit device can be readily implemented.

Figure 73:
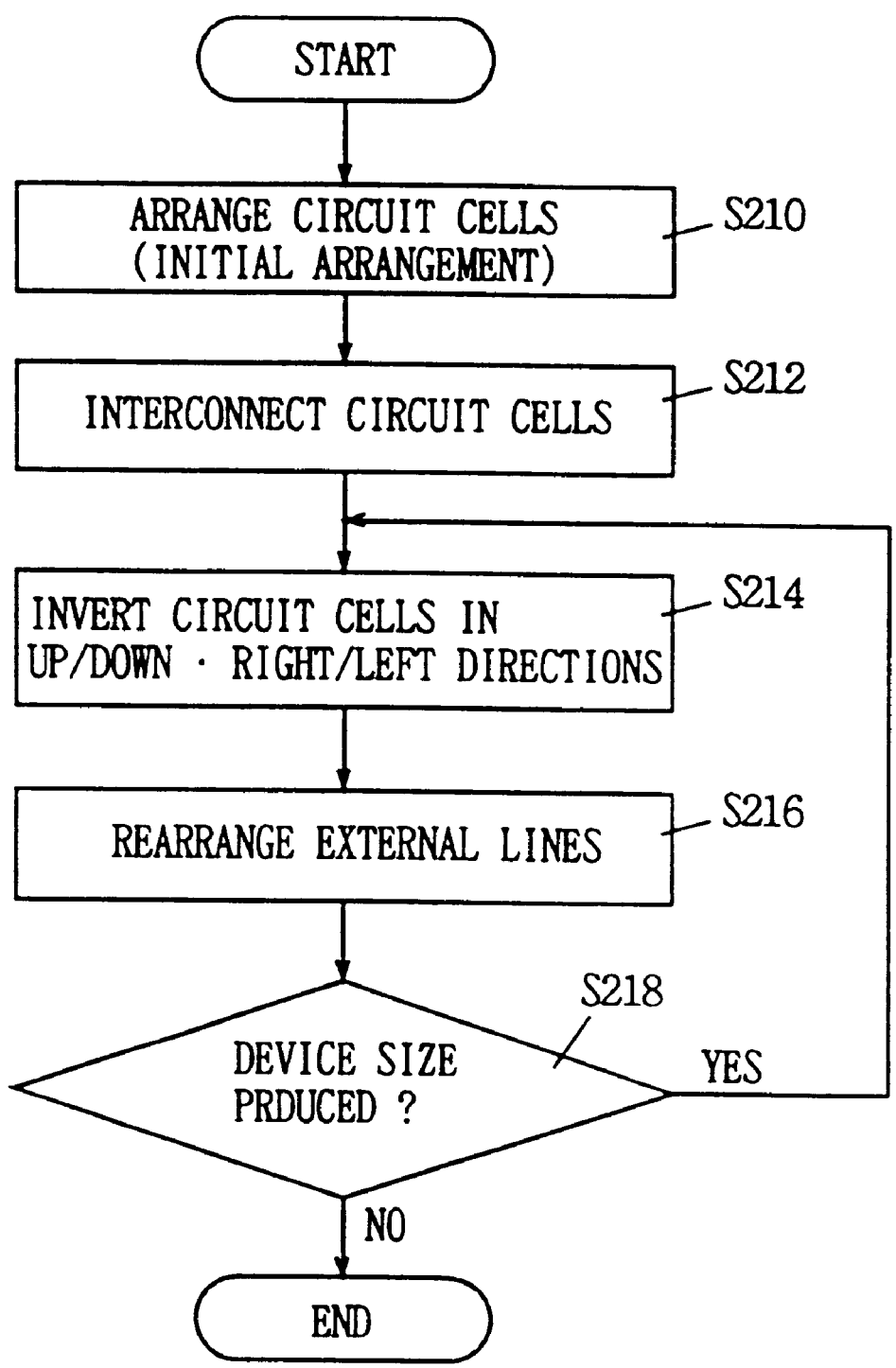
FIG. 73 is a flow chart representing the method of arrangement and interconnection of the semiconductor integrated circuit device in accordance with the twentieth embodiment of the present invention.

FIG. 73 is a flow chart illustrating the method of layout of the circuit cells. The method of circuit cell layout will be described with reference to FIG. 73.

When circuit cells implementing desired functions respectively are arranged (initial arrangement) aligned in one line (along X direction) (step S210). In each circuit cell, MOS transistors are arranged and interconnected. At this time, the method of layout in accordance with Embodiment 19 described above may be applied to the circuit cells. Thereafter, lines are arranged between circuit cells which have been aligned in one line (step S212). By the arrangement of lines, main lines and feed throughs are arranged, and thus the arrangement of FIG. 67A is obtained. Thereafter, inversion in up and down direction and/or left and right direction is performed for the circuit cells as needed (step S214). The inverting operation may be performed by the designer on the circuit cell as needed while monitoring the display. Alternatively, the automatic design apparatus may be adapted to perform inversion in up and down and/or left and right directions of the circuit cell in accordance with a prescribed rule successively.

After the inverting operation, lines are re-arranged between circuit cells (step S216). Thereafter, whether or not the area occupied by the line is reduced by the rearrangement of outside lines and area between cells is reduced because of reduction in line region or feed through region (whether or not the device size is reduced) is determined (step S218). If it is determined that the device size has been reduced, it is determined that there is still a possibility of further reducing the device size by inversion operation. Thus, the flow returns to step S214, inversion of circuit cell is performed, and steps S216 and S218 are repeated. If it is determined in step S218 that the device size is not changed (not reduced), it means that the device size cannot further be reduced even if inversion operation is repeated, and that the area occupied by the lines is minimum and arrangement of lines is optimized. Thus, alignment and interconnection of circuit cells are completed. By arranging and interconnecting in accordance with the flow chart of FIG. 73, line arrangement in the line regions can be optimized and the device size can be reduced.

When determination as to whether inversion of a circuit cell is necessary is automatically performed, a rule that inversion should be performed when a circuit cell has a port connected to a main line through a feed through and another main line, may be used. At that time, necessary operation of up and down (vertical) inversion and/or left and right (horizontal) inversion is determined in accordance with the direction of extension of the main line.

FIG. 74 shows an example of arrangement of transistor elements in a circuit cell. FIG. 74 shows a p channel MOS transistor PMA formed in an N well NWa, n channel MOS transistors NMa and NMb formed in a P well PW, and a p channel MOS transistors PMb formed in an N well NWb as representatives. These MOS transistors PMa, PMb, NMa, NMb are shown arranged aligned in one line along the Y direction. The transistors may be arranged in accordance with the function implemented by the circuit cell, and these need not be arranged aligned in one line.

In the p channel MOS transistor arrangement (forming) region PTa, power supply line VCC is arranged extending along the X direction. In MOS transistor arrangement (forming) region PTb, power supply line VCC is arranged along the X direction as well. In MOS transistor arrangement region NT, ground line GND is arranged aligned along the X direction, at a central portion of P well PW. The ground line GND may be arranged common to the MOS transistors NMA and NMb. In that case, the width of the ground line GND in the Y direction becomes wider than that of the power supply line VCC. By using a wide ground line GND, it becomes possible to supply the ground voltage stably with large current drivability.

Alternatively, as shown by the dotted lines in FIG. 74, the ground line in n channel MOS transistor arrangement region NT may be divided into two lines. One is used for the MOS transistor NMa on the upper side with respect to the Y direction, and the other is used for the n channel MOS transistor NMb on the lower side. In that case, ground voltage is transmitted by separate ground lines, and therefore noise in one ground line is not transmitted to the other ground line. Therefore, influence of power supply noise in the circuit cell can be suppressed, and transistor in the circuit cell can operate stably.

In the circuit cell, an N well may be formed at the central portion for forming p channel MOS transistors, and P wells for forming n channel MOS transistors may be provided on both sides of the N well. Up and down inversion and/or left and right inversion can similarly be performed.

As described above, according to the twentieth embodiment of the present invention, in each circuit cell, a semiconductor substrate region of a first conductivity type is arranged at the central portion and semiconductor substrate regions of a second conductivity type are arranged on both sides thereof, and the circuit cell may be inverted in up and down (vertical) direction and/or left and right (horizontal) direction, whereby arrangement of lines for connecting circuit cells can be optimized, and the area occupied by the device can be reduced.

Embodiment 21

Figure 75:
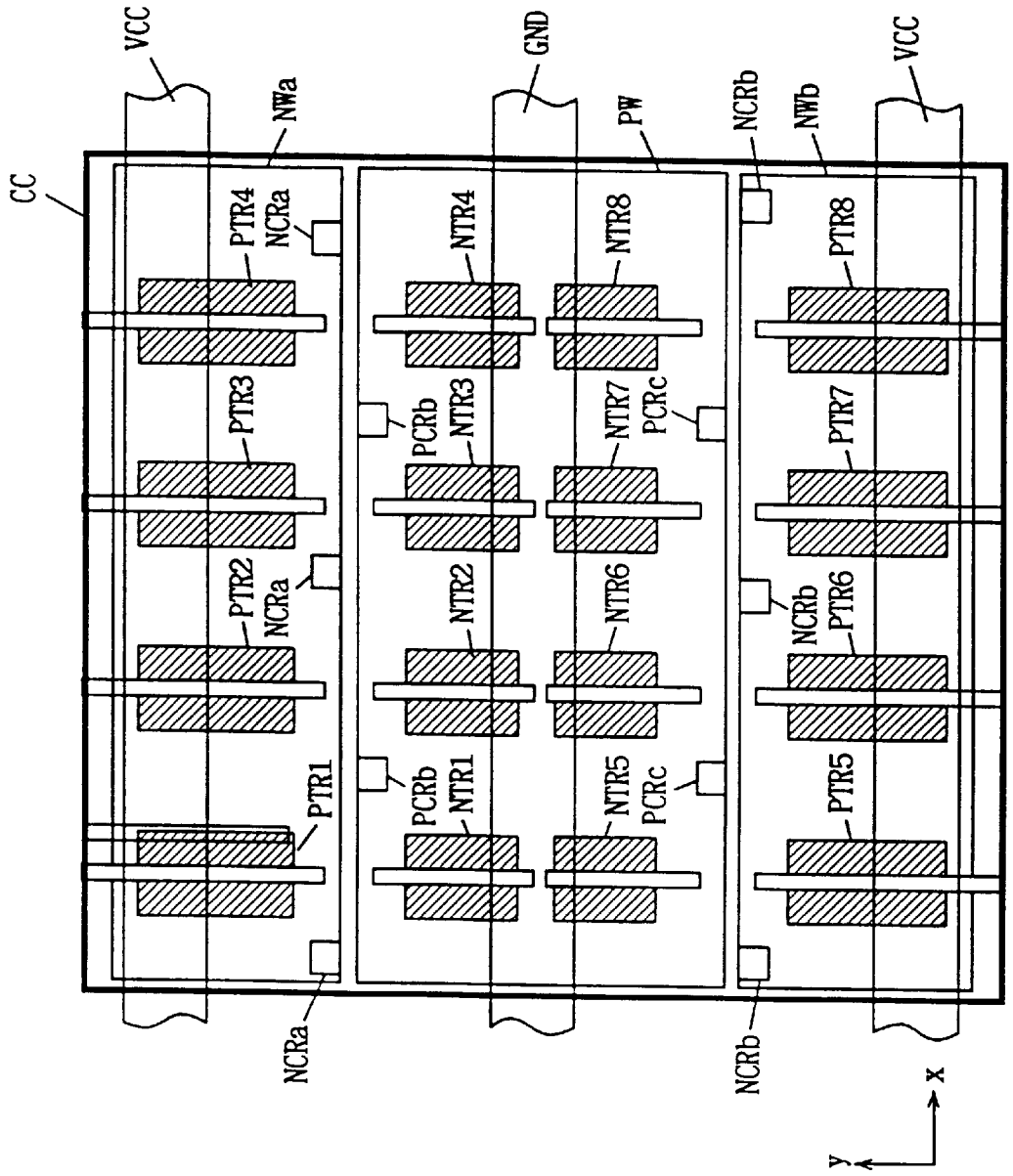
FIG. 75 shows a structure of a main portion of a semiconductor integrated circuit device in accordance with twenty-first embodiment of the present invention.

FIG. 75 schematically shows a structure of a main portion of a semiconductor integrated circuit device in accordance with a twenty-first embodiment of the present invention. FIG. 75 schematically shows an internal structure of one circuit cell CC. Referring to FIG. 75, circuit cell CC includes a P well PW for forming n channel MOS transistors which is arranged extending in the X direction at a central portion of the cell along the X direction, and N wells NWa and NWb for forming p channel MOS transistors arranged on both sides of the P well PW in Y direction and opposing to P well PW.

In N well NWa, four p channel MOS transistors PTR1 to PTR4 are arranged aligned along the X direction, as one example. In a region where gate electrode lines for p channel MOS transistors PTR1 to PTR4 are not arranged, N well collar regions NCRa having island-shapes are arranged spaced apart from each other, for applying a prescribed potential to N well NWa. On the upper side in the Y direction of N well NWa, power supply line VCC formed by the second layer of aluminum interconnection is arranged along the X direction.

In P well PW, at the central portion, n channel MOS transistors NRT1 to NTR8 are arranged aligned in two lines. In a peripheral region of P well PW opposing to N well NWa, P well collar regions PCRb each having island-shape are arranged not opposing to the N well collar regions NCRa. The P well collar region PCRb is arranged in a region in P well PW where internal lines for gate electrode lines of transistors NTR1 to NTR4 do not exist, not opposing to N well collar region NCRa.

In a peripheral region of P well PW opposing to N well NWb, island-shaped P well collar regions PCRc for applying a prescribed potential to P well PW are arranged. The P well collar regions PCRc are arranged in a region where internal lines formed by the layer of gate electrode lines of MOS transistors NTR5 to NTR8 are not arranged.

In N well NWb, p channel MOS transistors PRT5 to PTR8 are formed (arranged) aligned in one line along the X direction. In a peripheral region of N well NWb opposing to P well PW, N well collar regions NCRb are arranged not opposing to P well collar regions PCRc. These N well collar regions NCRb apply a prescribed potential to N well NWb. The N well collar regions NCRb are arranged in a region where internal lines formed in the layer of the gate electrode lines of MOS transistors PTR5 to PTR8 do not exist.

On the lower side of N well NWb, power supply line VCC formed by the second layer of aluminum interconnection is arranged extending along the X direction. At the central portion of P well PW, ground line GND formed by the second layer of aluminum interconnection for applying the ground voltage GND to MOS transistors NTR1 to NTR8 is arranged. The ground line GND may be separately provided for MOS transistors NTR1 to NTR4 and for MOS transistors NTR5 to NTR8 respectively.

In MOS transistors NTR1 to NTR8 arranged along X direction aligned in two lines, MOS transistors NTR1 to NTR4 are used in combination with MOS transistors PTR1 to PTR4 in N well NWa and form a logic gate implementing a desired function. MOS transistors NTR5 to NTR8 are used in combination with p channel MOS transistors PTR5 to PTR8 formed in N well NWb, and form a logic gate implementing a desired function. Therefore, the MOS transistors NTR1 to NTR4 and MOS transistors NTR5 to NTR8 need not be necessarily arranged in one to one correspondence, but these may be appropriately arranged in accordance with the logic gates to be implemented. There may be an empty region in N well NWa, NWb and P well PW depending on the function to be implemented by the circuit cell CC.

In the structure shown in FIG. 75, in wells NWa, PW and NWb, well collar regions NCRa, PCRb, PCRc and NCRb are arranged, respectively, which are formed like islands and arranged apart from each other, and the well collar regions in different wells are arranged not opposing to each other. Therefore, latch up resistance (immunity) in the circuit cell CC can be improved. Further, gate electrodes of MOS transistors can be connected to each other using the gate electrode line, the area for arranging the first layer of aluminum interconnection for internal lines can be increased, so that layout of lines is facilitated. Further, on both sides of the well PW at the central portion, wells NWa and NWb having different conductivity type from the well PW are arranged, and arrangement of outside lines (main lines and feed throughs) can be optimized by vertically and/or horizontally inverting arrangement and interconnection of the transistors formed in the circuit cell CC. Therefore, a semiconductor integrated circuit device having superior latch up resistance (immunity), which allows optimization of lines arranged in outer line region can be obtained, and hence reduced area of occupation can be realized.

Figure 76:
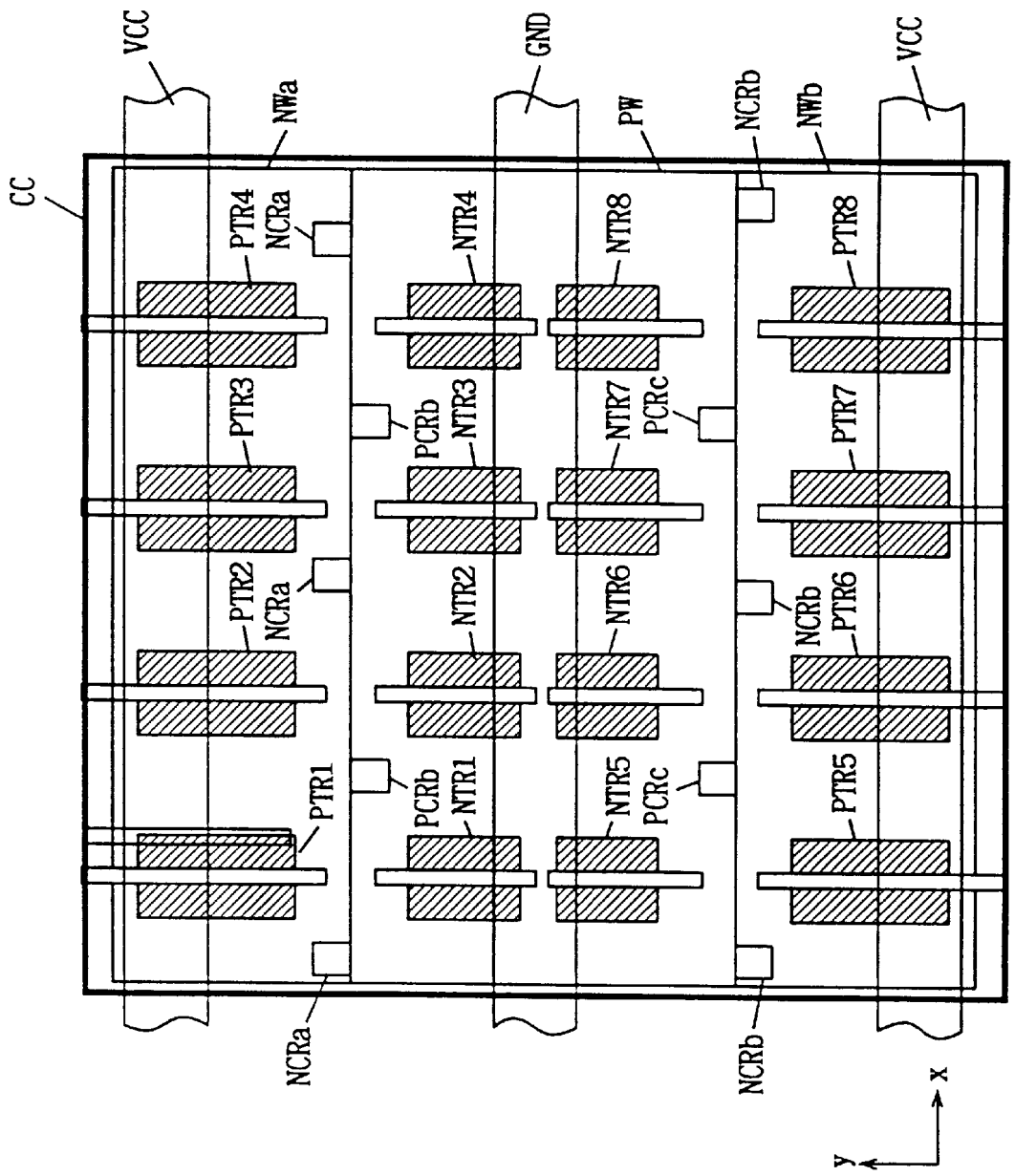
FIG. 76 shows a modification of the arrangement of FIG. 75.

FIG. 76 shows another layout of the circuit cell. The arrangement of FIG. 76 is the same as that shown in FIG. 75, except for that N well NW is made contacted with P well PW. FIG. 76 arrangement can reduce the cell size, or cell occupation area, as compared to FIG. 75 arrangement.

In the structure shown in FIGS. 75 and 76, well collar regions may be arranged only in one well. In that case, P well collar regions PCRb and PCRc may be arranged only in the P well PW and well collar regions may not be arranged in N wells NWa and NWb. Alternatively, only one of well collar regions PCRb and PCRc may be arranged in P well PW. Layout of circuit cells shown in FIG. 75 or 76 is performed in the similar manner as in the nineteenth embodiment in accordance with the flow chart of FIG. 64, and line arrangement for the circuit cells is performed in the similar manner as in the twentieth embodiment in accordance with the flow chart of FIG. 73.

As described above, according to the structure of the twenty-first embodiment of the present invention, well regions of a second conductivity type are arranged on both sides (in Y direction) of a well region of a first conductivity type and island-shaped well collar region are appropriately arranged in the well regions, whereby a semiconductor integrated circuit device having superior latch up resistance and increased degree of freedom for interconnection and arrangement of internal lines and having arrangement of lines in line region optimized can be implemented.

Other Applications

In the foregoing, a dynamic random access memory has been described as a semiconductor integrated circuit device. However, the present invention can be applied to any semiconductor integrated circuit device which is formed in accordance with the circuit cell method. Further, the present invention can be applied not only in the peripheral circuitry but also circuitry in memory array (for example, sense amplifier) of a dynamic random access memory.

In the embodiments above, lines extending in the X direction such as those in global interconnect line band, power supply line and ground line are described as formed by the second layer of aluminum interconnection and lines extending in the Y direction such as feed throughs and sub lines have been described as formed by the first layer of aluminum interconnection. However, the present invention is similarly applied to any structure provided that lines extending in the X direction are formed upper than the lines extending in the Y direction, or they are, for example, in the third and second layers of aluminum interconnections.

Further, the present invention can be applied to a structure in which lines extending in the X direction are formed by the first layer of aluminum interconnections and the lines extending in the Y direction are formed by the second layer of aluminum interconnection.

The present invention can also be applied even when power supply potential source lines (VCC, GND) are formed by the first layer of aluminum interconnection, provided that the main lines and the sub lines are formed by different layers of interconnection.

Further, the first to twenty-first embodiments of the present invention can be used appropriately combined with each other.

As described above, according to the present invention, formation of connection holes for a feed through in a region different from a line band forming region is allowed, arrangement of on-the-cell lines is allowed and these are adapted to be connected on the feed through region. Therefore, a circuit can be implemented without increasing the area occupied by the lines and the area occupied by circuit cell bands.

Further, impurity regions for fixing substrate potential are provided like islands in transistor forming regions of the circuit cell, and transistor forming regions are provided forming a sandwich-like structure with regions of different conductivity types placed alternately, so that latch up resistance can be improved, and optimization of line arrangement can be readily implemented by inverting the circuit cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:
a plurality of functional circuit blocks arranged in alignment in at least a linear array, each the circuit block implementing a prescribed function, adjacent ones of said functional circuit blocks in said linear array being separated from each other by a feed through region, at least one of said functional circuit blocks including a plurality of transistor elements and an empty region where an interconnection line for transistor elements of said plurality of transistor elements is not formed;
a feed through extending in a direction orthogonal to the direction of said linear array and extending as far as to said empty region; and
a line arranged along the direction of said linear array over a prescribed number of said functional circuit blocks, and physically connected in said empty region to said feed through.

2. The semiconductor integrated circuit device according to claim 1, further comprising
a transistor element formed in said feed through region below a feed through layer to be provided for said feed through region, for exchanging a signal with a line different from said feed through.

3. The semiconductor integrated circuit device according to claim 1, wherein
said plurality of functional circuit blocks include functional blocks having mutually different lengths along the direction orthogonal to the direction of said linear array.

4. The semiconductor integrated circuit device according to claim 3, wherein
in a region, protruding in the direction orthogonal to the direction of said alignment, of one of said functional circuit blocks having mutually different lengths which is longer in the direction orthogonal to the direction of said alignment than another, a line different from said line is arranged along the direction of said alignment.

5. A semiconductor integrated circuit device, comprising:
a plurality of functional circuit blocks arranged aligned in at least one linear array, each the circuit block implementing a prescribed function;
a feed through region provided between adjacent ones of said plurality of functional circuit blocks in said linear array; and
a feed through arranged in said feed through region in a direction crossing said linear array, and having a portion changing a position in the direction of said linear array in said feed through region, for transferring a signal in the direction crossing said linear array.

6. A semiconductor integrated circuit device, comprising;
a plurality of functional circuit blocks arranged aligned at least in a linear array along a first direction, each the functional circuit block implementing a prescribed function;
a feed through region arranged between adjacent ones of said plurality of functional circuit blocks along said first direction; and
a feed through arranged extending along a second direction orthogonal to said first direction in said feed through region, and connected to one of said adjacent functional circuit blocks in said feed through region.

7. The semiconductor integrated circuit device according to claim 6, further comprising
a second feed through connected to another one of said adjacent functional circuit blocks in said feed through region, extending in a direction opposite to a direction of extension of said feed through in said feed through region, and arranged aligned along said second direction in said feed through region with said feed through.

8. A method of arrangement and interconnection of functional circuit blocks, comprising the steps of:

arranging a plurality of functional circuit blocks each implementing a prescribed function aligned at least in one linear array along a first direction with adjacent ones of the functional circuit blocks being separated from each other by a feed through region, at least one of said plurality of functional circuit blocks including a plurality of transistor elements and having an empty region in which at least an interconnection line for the transistor elements is not formed;

arranging a feed through extending along a direction orthogonal to said first direction and extending as far as to said empty region of said at least one functional circuit block;

arranging a line along said first direction over a prescribed number of said plurality of functional circuit blocks; and connecting in the empty region of said at least one functional circuit block, said feed through and said line through a connection hole.

9. The method of arrangement and interconnection of functional circuit blocks according to claim 8, further comprising the step of arranging, in said feed through region, a transistor element below a feed through layer provided for said feed through region for exchanging a signal to a line different from said feed through.

10. The method of arrangement and interconnection of functional circuit blocks according to claim 8, wherein said step of arranging said functional circuit blocks in alignment includes the step of arranging functional circuit blocks having mutually different lengths in said second direction in alignment.

11. The method of arrangement and interconnection of functional circuit blocks according to claim 10, further comprising the step of arranging, in a region, protruding in said second direction, of one of said functional circuit blocks having mutually different lengths which is longer in said second direction than another, a line along said first direction.

12. A method of arrangement and interconnection of functional circuit blocks, comprising the steps of:

arranging a plurality of functional circuit blocks each implementing a prescribed function along a first direction at least in one linear array, with a feed through region provided between adjacent functional circuit blocks;

arranging first and second interconnection lines apart from each other along said first direction over a prescribed number of functional circuit blocks;

arranging a first divided feed through extending in a second direction orthogonal to said first direction in said feed through region, connected to said first interconnection line in said feed through region and terminating thereat; and arranging a second divided feed through separated from and aligned with said first divided feed through in said second direction, connected to said second interconnection line in said feed through region and terminating thereat.

13. The method of arrangement and interconnection of functional circuit blocks according to claim 12, further comprising the step of arranging, in said feed through region, a transistor element below a feed through layer to be provided for said feed through region, for exchanging a signal with a line different from said feed through.

14. The method of arrangement and interconnection of functional circuit blocks according to claim 12, wherein said step of arranging said functional circuit blocks in alignment includes the step of arranging functional circuit blocks having mutually different lengths in said second direction in alignment.

15. The method of arrangement and interconnection of functional circuit blocks according to claim 14, comprising the step of in a region, protruding in said second direction of one of said functional circuit blocks having mutually different lengths which is longer in said second direction, then another, arranging a further line along said first direction.

16. The method of arrangement and interconnection of functional circuit blocks according to claim 12, wherein said step of arranging said plurality of functional circuit blocks in alignment includes the steps of arranging a first functional circuit block having a first length in said second direction on one side of said feed through region with respect to the first direction of said linear array, and arranging a second functional circuit block having a second length longer than said first length in said second direction, adjacent to said first functional circuit block with said feed through region interposed;

said method further comprising the steps of:

arranging a third interconnection line in an outside region of said first functional circuit block in said second direction, the third interconnection line being connected to said first divided feed through along said first direction and having a connection portion where said first divided feed through is terminated;

arranging a fourth interconnection line in said outside region along said first direction further apart from said first functional circuit block than said third interconnection line; and arranging a third divided feed through extending along said second direction, connected to said fourth interconnection line and terminated at the connection portion thereto, and aligned with said first and second divided feed throughs along said second direction.

17. A method of arrangement and interconnection of functional circuit blocks according, comprising the steps of:

arranging a plurality of functional circuit blocks each implementing a prescribed function along a first direction to be aligned in at least one linear array, with a feed through region separating functional circuit blocks adjacent in said first direction from each other and provided between the adjacent functional circuit blocks;

arranging a feed through extending in said feed through region along said second direction and having a portion changed in position with respect to said first direction in said feed through region, said feed through transferring a signal across said at least one linear array in said second direction.

18. A semiconductor integrated circuit device, comprising:

a first semiconductor substrate region formed on a semiconductor layer, in which a transistor of a first conductivity type is formed;

a second semiconductor substrate region arranged on said semiconductor layer and opposing to said first semiconductor substrate region, in which a transistor of a second conductivity type is formed; and island-shaped impurity regions arranged spaced from each other in at least one of peripheral regions opposing to each other of said first and second semiconductor substrate regions, for fixing a corresponding one of the semiconductor substrate regions at a prescribed potential.

19. The semiconductor integrated circuit device according to claim 18, wherein said impurity regions are formed on said peripheral region of both of said first and second semiconductor substrate regions and arranged not opposing to each other.

20. The semiconductor integrated circuit device according to claim 18, wherein said transistors of the first and second conductivity types are insulated gate type transistors each having a gate;

said device further comprising an internal line formed in an interconnection layer for said gate and arranged between said impurity regions.

21. A method of layout of a semiconductor integrated circuit device, comprising the steps of:

arranging a first transistor arrangement region on which a transistor of a first conductivity type is arranged and a second transistor arrangement region on which a transistor of a second conductivity type is arranged, opposing to each other; and arranging, in a peripheral region of at least one of mutually opposing peripheral regions of said first and second transistor arrangement regions, island-shaped impurity regions apart from each other, for applying a prescribed voltage to a semiconductor substrate region implementing a corresponding transistor arrangement region.

22. The method of layout of a semiconductor integrated circuit device according to claim 21, wherein said step of arranging said impurity regions includes the step of arranging, in the peripheral regions of said first and second transistor arrangement regions, the impurity regions of said first transistor arrangement region and the impurity regions of said second transistor arrangement regions not opposing to each other.

23. The method of layout of a semiconductor integrated circuit device according to claim 21, wherein said transistors of the first and second conductivity types are insulated gate type transistors each having a gate, said method further comprising the step of arranging an internal line formed in an interconnection layer for implementing said gate, in a region between said impurity regions.

24. The method of layout of a semiconductor integrated circuit device according to claim 21, wherein the transistors of said first and second conductivity types are insulated gate type transistors each having a gate, said method comprising the step of arranging an internal line formed in an interconnection layer for said gate before arrangement of said impurity region, with said impurity regions arranged where said internal line is not arranged.

25. A semiconductor integrated circuit device having a plurality of circuit cells arranged aligned in a linear array and each of the circuit cells implementing a prescribed function, wherein each of said circuit cells includes a first transistor arrangement region on which a transistor of a first conductivity type arranged, and second transistor arrangement regions arranged on both sides of said first transistor arrangement region so as to sandwich said first transistor arrangement region therebetween, and having transistors of a second conductivity type to be arranged.

26. The semiconductor integrated circuit device according to claim 25, wherein said first transistor arrangement region is substantially equal in length along the sandwiching to a combination of said second transistor arrangement regions.

27. A method of layout of a semiconductor integrated circuit device, comprising the steps of:

arranging a circuit cell having a first transistor arrangement region on which a transistor of a first conductivity type is arranged, and second transistor arrangement regions arranged sandwiching said first transistor arrangement region therebetween, on which transistors of a second conductivity type are arranged;

performing at least one of an up and down inversion and a left and a right inversion of transistor arrangement in said circuit cell; and arranging an external cell line for said circuit cell, said external cell line being arranged external to said circuit cell.

28. The semiconductor integrated circuit device according to claim 25, further comprising:

a first power source line arranged extending over the first transistor arrangement region, for transferring a first power source voltage, and a second power source line arranged extending over one of the second transistor arrangement regions, for transferring a second power source voltage.

29. The semiconductor integrated circuit device according to claim 28, further comprising a third power source line arranged over another of the second transistor arrangement regions, for transferring the second power source voltage.

* * * * *

UNITED STATES PATENT AND TRADEMARK OFFICE
CERTIFICATE OF CORRECTION

PATENT NO.    : 6,100,550
DATED         : August 8, 2000
INVENTOR(S)   : Hideto Hidaka It is certified that error appears in the above-identified patent and that said Letters Patent is hereby corrected as shown below:

Claim 15, column 66,
Line 12, change "then" to -- than --.

Signed and Sealed this

Twenty-third Day of October, 2001

Attest:

NICHOLAS P. GODICI
Attesting Officer    Acting Director of the United States Patent and Trademark Office